United States Patent
Or-Bach et al.

(10) Patent No.: US 10,903,089 B1
(45) Date of Patent: Jan. 26, 2021

(54) 3D SEMICONDUCTOR DEVICE AND STRUCTURE

(71) Applicant: Monolithic 3D Inc., San Jose, CA (US)

(72) Inventors: Zvi Or-Bach, San Jose, CA (US); Brian Cronquist, Klamath Falls, OR (US); Deepak Sekar, Sunnyvale, CA (US)

(73) Assignee: MONOLITHIC 3D INC., Klamath Falls, OR (US)

( * ) Notice: Subject to any disclaimer, the term of this patent is extended or adjusted under 35 U.S.C. 154(b) by 0 days.

(21) Appl. No.: 17/061,563

(22) Filed: Oct. 1, 2020

Related U.S. Application Data

(63) Continuation-in-part of application No. 16/114,211, filed on Aug. 28, 2018, which is a
(Continued)

(51) Int. Cl.
*H01L 23/498* (2006.01)
*H01L 21/48* (2006.01)
(Continued)

(52) U.S. Cl.
CPC .. *H01L 21/4871* (2013.01); *H01L 21/823487* (2013.01); *H01L 23/34* (2013.01);
(Continued)

(58) Field of Classification Search
CPC ............. H01L 23/49827; H01L 23/367; H01L 21/823487; H01L 21/4871
See application file for complete search history.

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
(Continued)

*Primary Examiner* — Dale E Page
*Assistant Examiner* — Wilner Jean Baptiste
(74) *Attorney, Agent, or Firm* — Patent Law Office www.patentoffice.io; Bao Tran

(57) ABSTRACT

A 3D semiconductor device, the device comprising: a first level, wherein said first level comprises a first layer, said first layer comprising first transistors, and wherein said first level comprises a second layer, said second layer comprising first interconnections; a second level overlaying said first level, wherein said second level comprises a third layer, said third layer comprising second transistors, and wherein said second level comprises a fourth layer, said fourth layer comprising second interconnections; and a plurality of connection paths, wherein said plurality of connection paths provides connections from a plurality of said first transistors to a plurality of said second transistors, wherein said second level is bonded to said first level, wherein said bonded comprises oxide to oxide bond regions, wherein said bonded comprises metal to metal bond regions, wherein said second level comprises at least one memory array, wherein said second level comprises at least one Phase Lock Loop ("PLL)
(Continued)

circuit, and wherein said third layer comprises crystalline silicon.

20 Claims, 64 Drawing Sheets

Related U.S. Application Data continuation-in-part of application No. 15/913,917, filed on Mar. 6, 2018, now Pat. No. 10,115,663, which is a continuation-in-part of application No. 15/470,872, filed on Mar. 27, 2017, now Pat. No. 9,941,275, which is a continuation-in-part of application No. 13/864,245, filed on Apr. 17, 2013, now abandoned, which is a continuation of application No. 13/803,437, filed on Mar. 14, 2013, now Pat. No. 9,385,058, which is a continuation-in-part of application No. 13/731,108, filed on Dec. 30, 2012, now Pat. No. 9,871,034, which is a continuation of application No. 13/730,897, filed on Dec. 29, 2012, now abandoned.

(51) Int. Cl.

| | | |
|---|---|---|
| *H01L 23/34* | (2006.01) | |
| *H01L 27/02* | (2006.01) | |
| *H01L 21/8234* | (2006.01) | |
| *H01L 27/06* | (2006.01) | |
| *H01L 27/098* | (2006.01) | |
| *H01L 23/522* | (2006.01) | |
| *H01L 23/367* | (2006.01) | |
| *H01L 27/092* | (2006.01) | |
| *H01L 25/00* | (2006.01) | |
| *H01L 23/60* | (2006.01) | |
| *H01L 25/065* | (2006.01) | |
| *H01L 23/373* | (2006.01) | |

(52) U.S. Cl.
CPC ........ *H01L 23/367* (2013.01); *H01L 23/3677* (2013.01); *H01L 23/49827* (2013.01); *H01L 23/49838* (2013.01); *H01L 23/5226* (2013.01); *H01L 23/60* (2013.01); *H01L 25/0657* (2013.01); *H01L 25/50* (2013.01); *H01L 27/0207* (2013.01); *H01L 27/0248* (2013.01); *H01L 27/0688* (2013.01); *H01L 27/092* (2013.01); *H01L 27/098* (2013.01); *H01L 23/373* (2013.01); *H01L 23/3732* (2013.01); *H01L 2225/06527* (2013.01); *H01L 2225/06541* (2013.01); *H01L 2225/06589* (2013.01); *H01L 2924/0002* (2013.01)

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |

(56) References Cited

U.S. PATENT DOCUMENTS

| | | |
|---|---|---|
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 1,105,390 A1 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |

(56) References Cited

U.S. PATENT DOCUMENTS

| | | |
|---|---|---|
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 * | 11/2008 | Madurawe ....... H03K 19/17748 326/47 |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |

(56) References Cited

U.S. PATENT DOCUMENTS

| | | |
|---|---|---|
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |
| 8,264,065 B2 | 9/2012 | Su et al. |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto etal. |
| 8,525,342 B2 | 10/2013 | Chandrasekaran |
| 8,546,956 B2 | 10/2013 | Nguyen |
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |

(56) References Cited

U.S. PATENT DOCUMENTS

| | | |
|---|---|---|
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |

(56) References Cited

U.S. PATENT DOCUMENTS

| | | |
|---|---|---|
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Futatsuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1* | 6/2011 | Lee .................. H01L 27/0688 |
| | | 438/238 |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146493 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |

(56) References Cited

U.S. PATENT DOCUMENTS

| | | |
|---|---|---|
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker |
| 2018/0090219 A1 | 3/2018 | Harari |
| 2018/0090368 A1 | 3/2018 | Eun-Jeong et al. |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner |
| 2019/0157296 A1 | 5/2019 | Harari et al. |
| 2020/0020408 A1 | 1/2020 | Norman |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et. al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalliné Nanowires, with Gate-All-Around or Independent Gates (ΦFlash), Suitable for Full 3D Integration", International Electron Devices Meeting, 2009, pp. 637-640.

Celler, G.K. et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terminal Mechanical Photovoltaic Stacks," III-Vs Review, Sep.-Oct. 2006, pp. 24-27, vol. 19, Issue 7.

Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

(56) References Cited

OTHER PUBLICATIONS

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D. et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C. et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," Chptr. 13.4, pp. 407-410, in "Integrated Interconnect Technologies for 3D Nano Electronic Systems", 2009, Artech House.

Weis, M. et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology/high-density 3D-integration technology for multifunctional devices", (2009) IEEE International Conference on 3D System Integration, 3DIC 2009.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011 vol. 88, Issue 4, pp. 331-335.

Bobba, S. et al., "CELONCEL: Effective Design Technique for 3-D Monolithic Integration targeting High Performance Integrated Circuits", Asia pacific DAC 2011, paper 4A-4.

Choudhury, D., "3D Integration Technologies for Emerging Microsystems", IEEE Proceedings of the IMS 2010, pp. 1-4.

Lee, Y.-J., et. al, "3D 65nm CMOS with 320° C. Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-58.

Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.

Jung, S.-M., et al., "Highly Area Efficient and Cost Effective Double Stacked S3(Stacked Single-crystal Si) Peripheral CMOS SSTFT and SRAM Cell Technology for 512M bit density SRAM", IEDM 2003, pp. 265-268.

Joyner, J.W., "Opportunities and Limitations of Three-dimensional Integration for Interconnect Design", PhD Thesis, Georgia Institute of Technology, Jul. 2003.

Choi, S.-J., "A Novel TFT with a Laterally Engineered Bandgap for of 3D Logic and Flash Memory", 2010 Symposium of VLSI Technology Digest, pp. 111-112.

Radu, I., et al., "Recent Developments of Cu—Cu non-thermo compression bonding for wafer-to-wafer 3D stacking", IEEE 3D Systems Integration Conference (3DIC), Nov. 16-18, 2010.

Gaudin, G., et al., "Low temperature direct wafer to wafer bonding for 3D integration", 3D Systems Integration Conference (3DIC), IEEE, 2010, Munich, Nov. 16-18, 2010, pp. 1-4.

"Jung, S.-M., et al.,""Three Dimensionally Stacked NAND Flash Memory Technology Using Stacking Single Crystal Si Layers on ILD and TANOS Structure for Beyond 30nm Node", IEDM 2006, Dec. 11-13, 2006.

Souri, S. J., "Interconnect Performance in 3-Dimensional Integrated Circuits", PhD Thesis, Stanford, Jul. 2003.

Uemoto, Y., et al., "A High-Performance Stacked-CMOS SRAM Cell by Solid Phase Growth Technique", Symposium on VLSI Technology, 2010, pp. 21-22.

Jung, S.-M., et al., "Highly Cost Effective and High Performance 65nm S3(Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.

Steen, S.E., et al., "Overlay as the key to drive wafer scale 3D integration", Microelectronic Engineering 84 (2007) 1412-1415.

Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.

Chan, M., et al., "3-Dimensional Integration for Interconnect Reduction in for Nano-CMOS Technologies", IEEE Tencon, Nov. 23, 2006, Hong Kong.

Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.

Naito, T., et al., "World's first monolithic 3D-FPGA with TFT SRAM over 90nm 9 layer Cu CMOS", 2010 Symposium on VLSI Technology Digest of Technical Papers, pp. 219-220.

Bernard, E., et al., "Novel integration process and performances analysis of Low STandby Power (LSTP) 3D Multi-Channel CMOSFET (MCFET) on SOI with Metal/High-K Gate stack", 2008 Symposium on VLSI Technology Digest of Technical Papers, pp. 16-17.

Cong, J., et al., "Quantitative Studies of Impact of 3D IC Design on Repeater Usage", Proceedings of International VLSI/ULSI Multilevel Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

(56) References Cited

OTHER PUBLICATIONS

Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo; H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration",www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures? ," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.
Kuroda, T., "ThruChip Interface for Heterogeneous Chip Stacking," ElectroChemicalSociety Transactions, 50(14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.

(56) References Cited

OTHER PUBLICATIONS

Wu, B., et al., "Extreme ultraviolet lithography and three dimensional circuits," Applied Phyisics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Kim, J., et al.; "A stacked memory device on logic 3D technology for ultra-high-density data storage"; Nanotechnology 22 (2011) 254006 (7pp).
Hsieh, P-Y, et al., "Monolithic 3D BEOL FinFET switch arrays using location-controlled-grain technique in voltage regulator with better FOM than 2D regulators", IEDM paper 3.1, pp. IEDM19-46 to -49.
Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402-405.
Rachmady, W., et al., "300mm Heterogeneous 3D Integration of Record Performance Layer Transfer Germanium PMOS with Silicon NMOS for Low Power High Performance Logic Applications", IEDM 2019, paper 29.7, pp. IEDM19-697-700.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T. et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.
Burr, G. W., et al., "Overview of candidate device technologies for storage-class memory," IBM Journal of Research and Development, vol. 52, No. 4.5, pp. 449-464, Jul. 2008.
Bez, R., et al., "Introduction to Flash memory," Proceedings IEEE, 91(4), 489-502 (2003).
Auth, C., et al., "45nm High-k + Metal Gate Strain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et.al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, pp. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European, pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes, " Applied Physics Letters, May 28, 2001, pp. 3379-3381, vol. 78, No. 22.

(56) References Cited

OTHER PUBLICATIONS

El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n. Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54(11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference,•Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.

(56) References Cited

OTHER PUBLICATIONS

Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: The Interconnect ERA", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al.. "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L. et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.

(56) References Cited

OTHER PUBLICATIONS

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Agarwal, A., et al., "Efficient production of silicon-on-insulator films by co-implantation of He+ with H+" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Miller, D.A.B., "Optical interconnects to electronic chips," Applied Optics, vol. 49, No. 25, Sep. 1, 2010, pp. F59-F70.

En, W. G., et al., "The Genesis Process": A New SOI wafer fabrication method, Proceedings 1998 IEEE International SOI Conference, Oct. 1998, pp. 163-164.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate $SiO_2$," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Applied Physics, vol. 46, No. 1, 2007, pp. 21-23.

Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al.,"Advanced Integration Technology for a Highly Scalable SOI DRAM with SOC (Silicon-On-Capacitors)", IEDM 1996, pp. 96-605-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.

Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

* cited by examiner

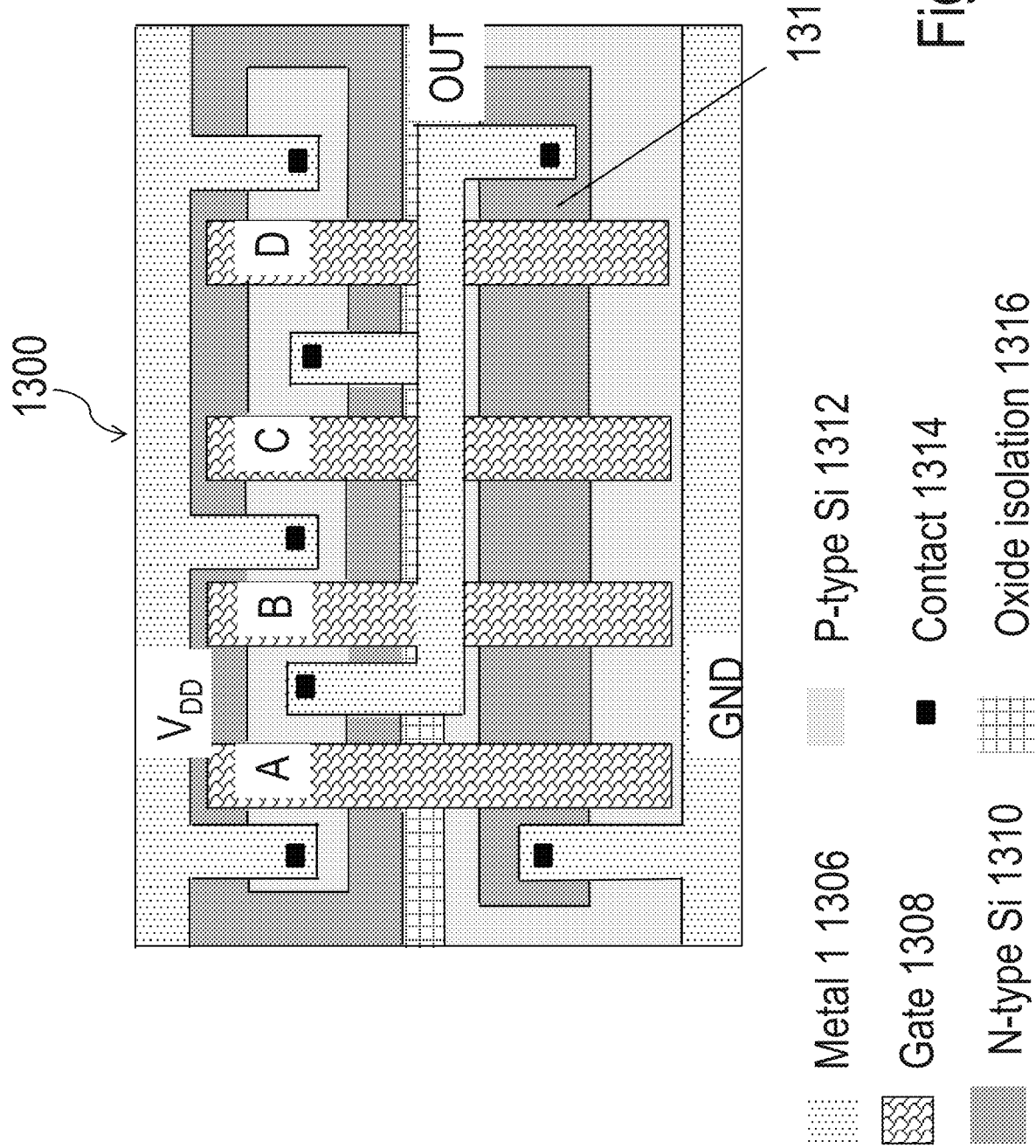

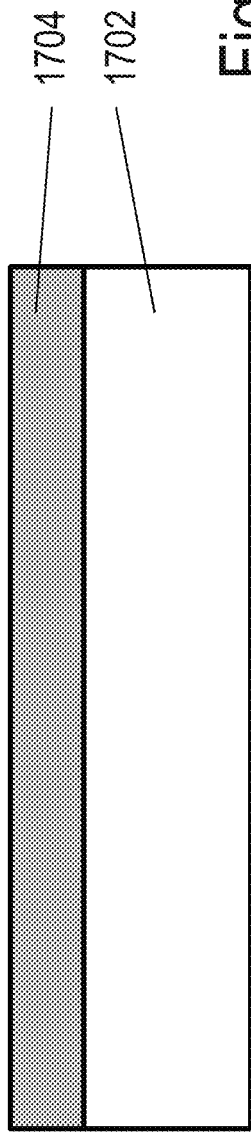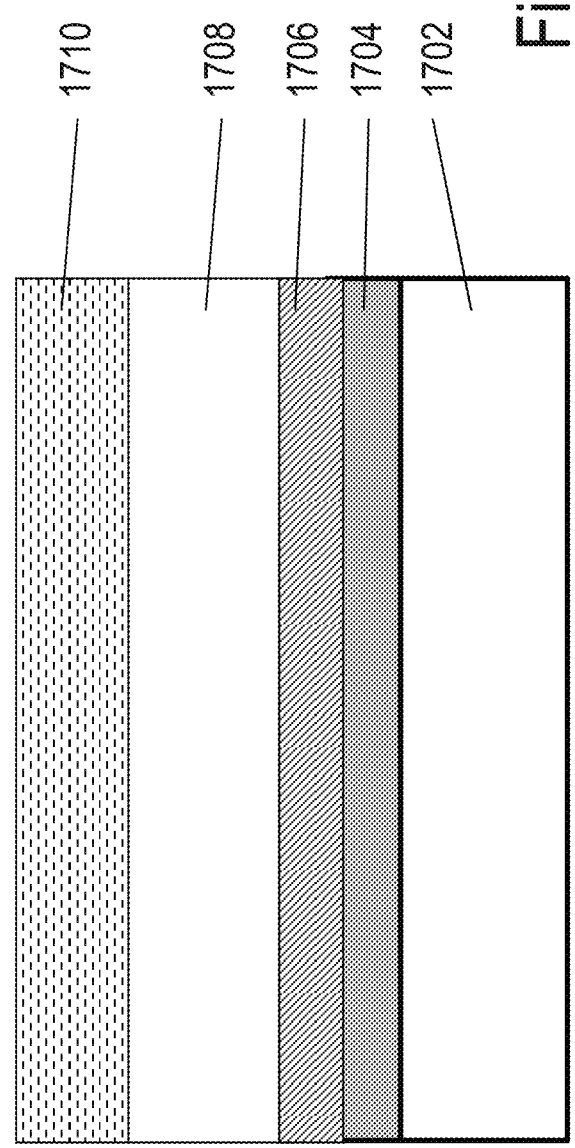

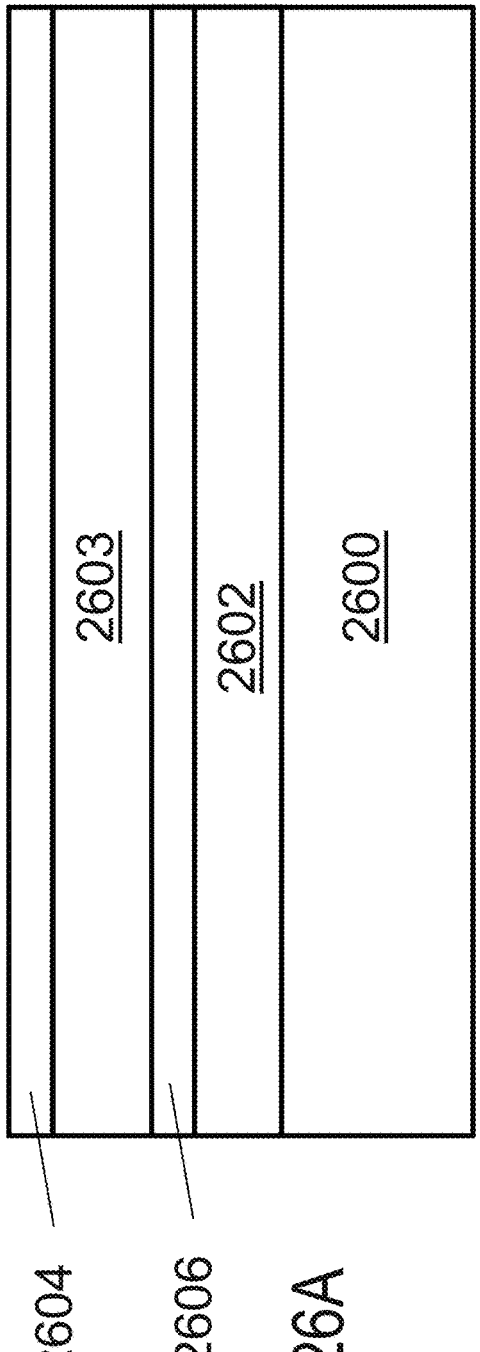
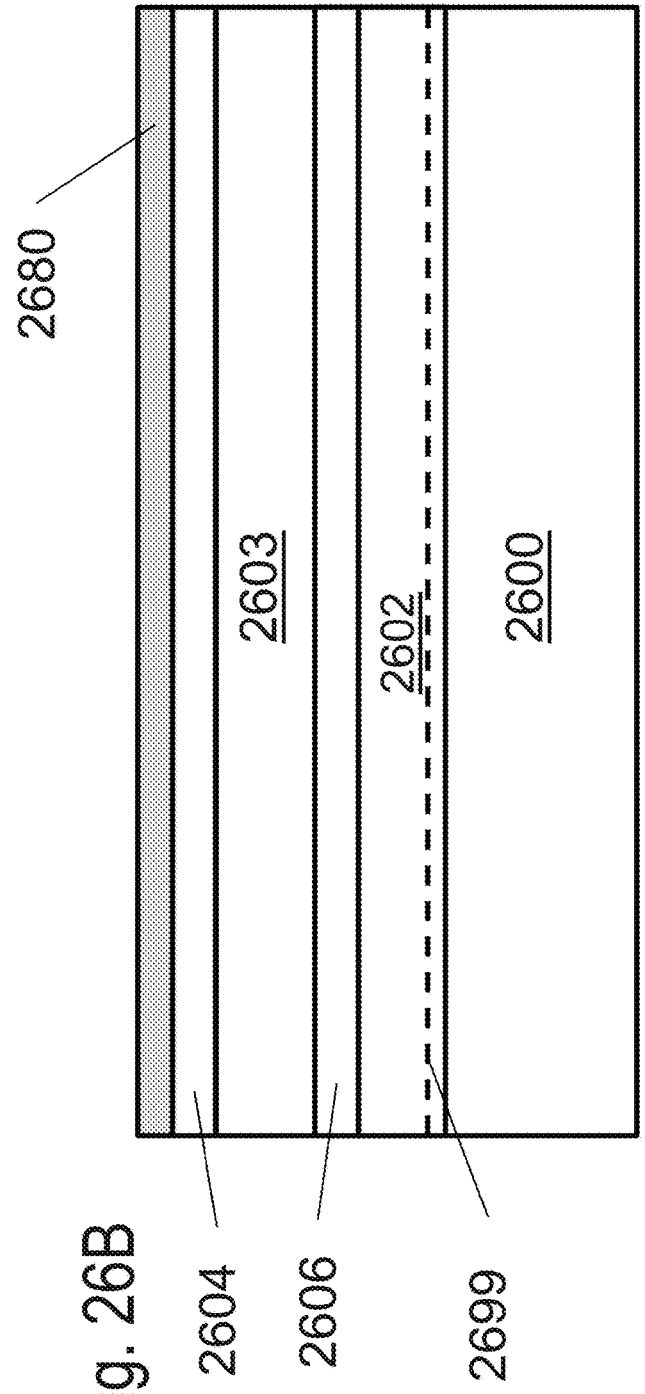
Fig. 26A
Fig. 26B

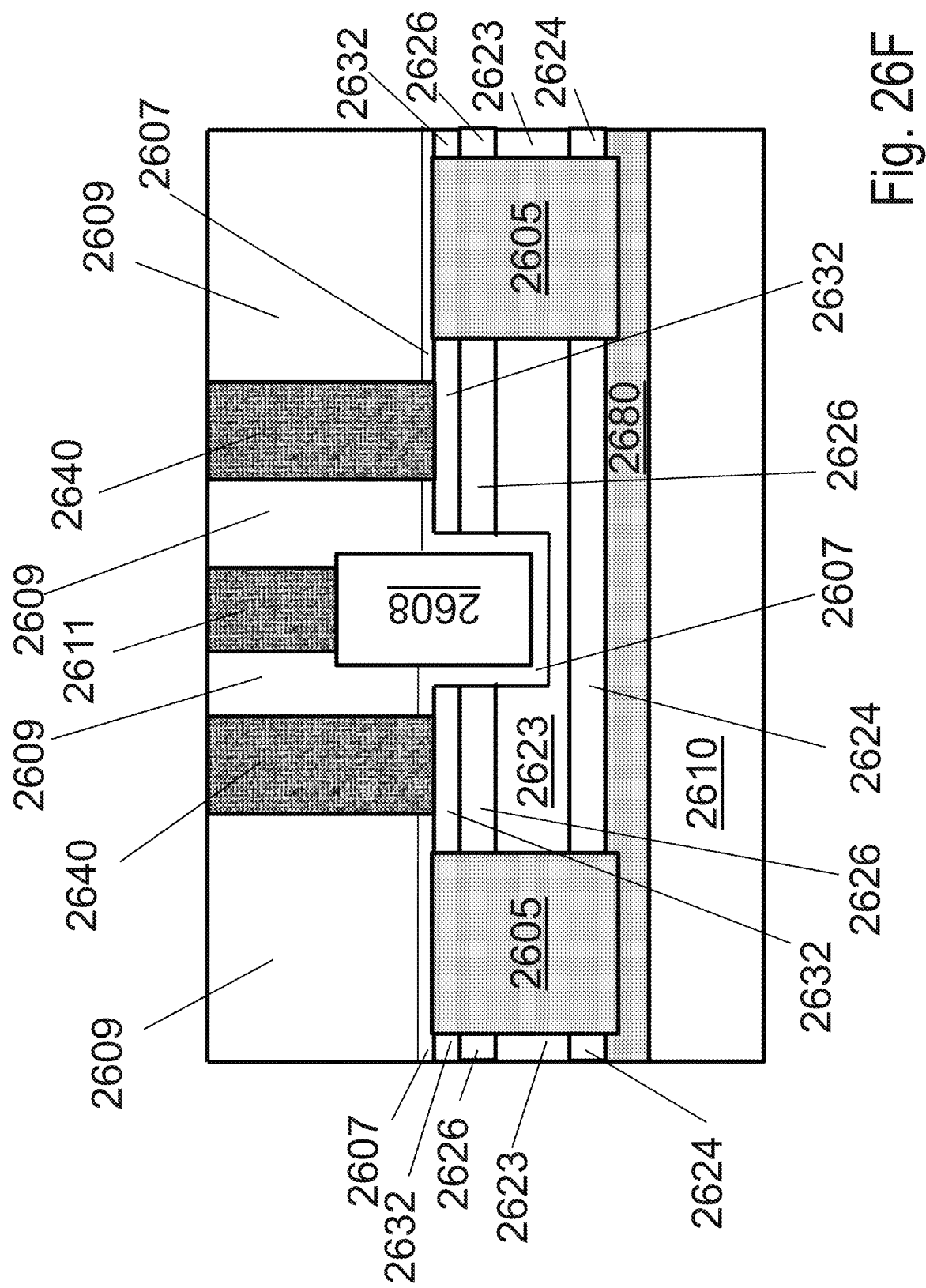

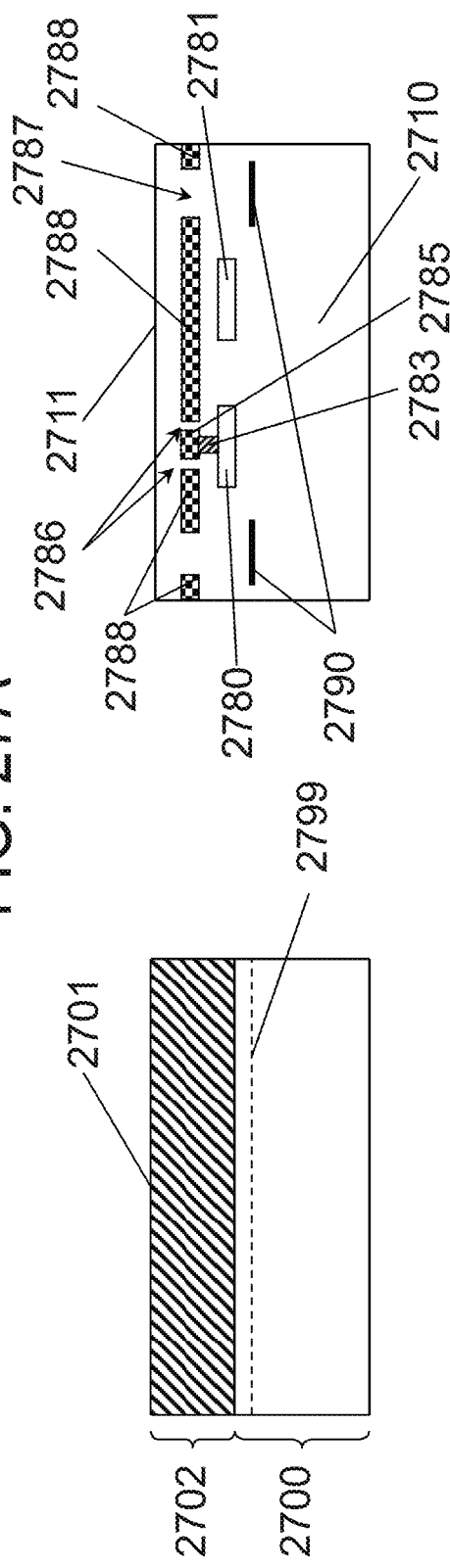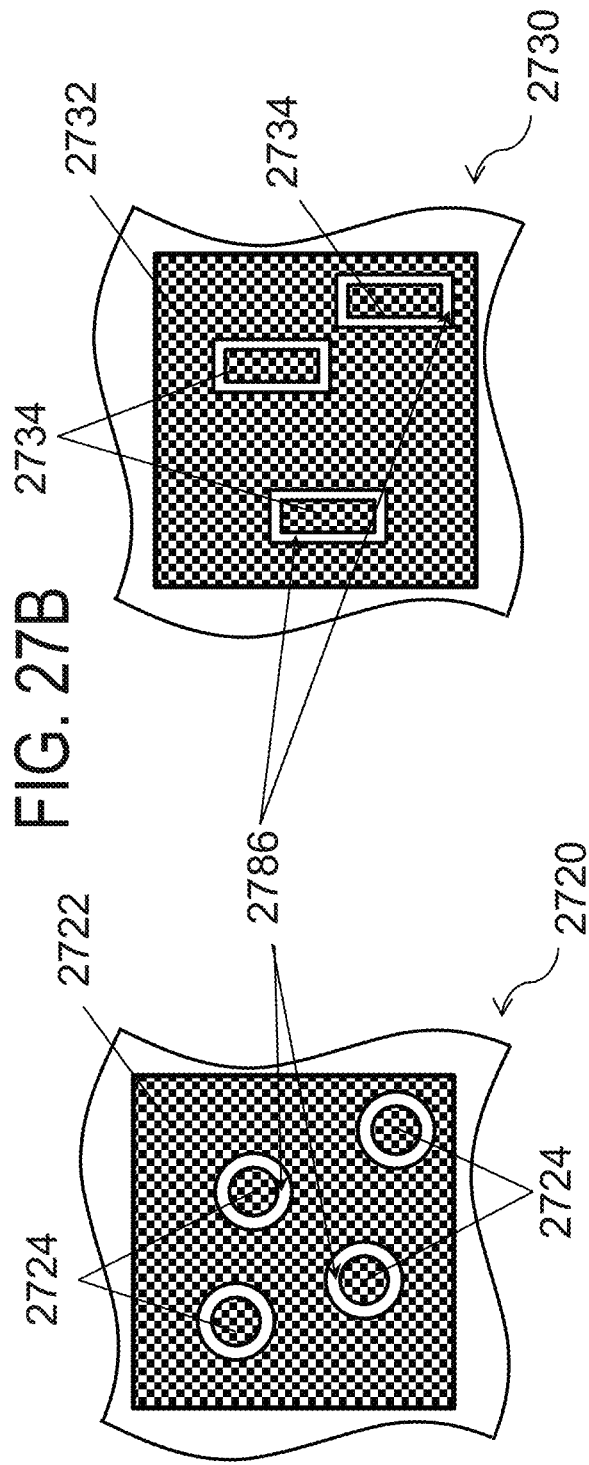
FIG. 27A
FIG. 27B

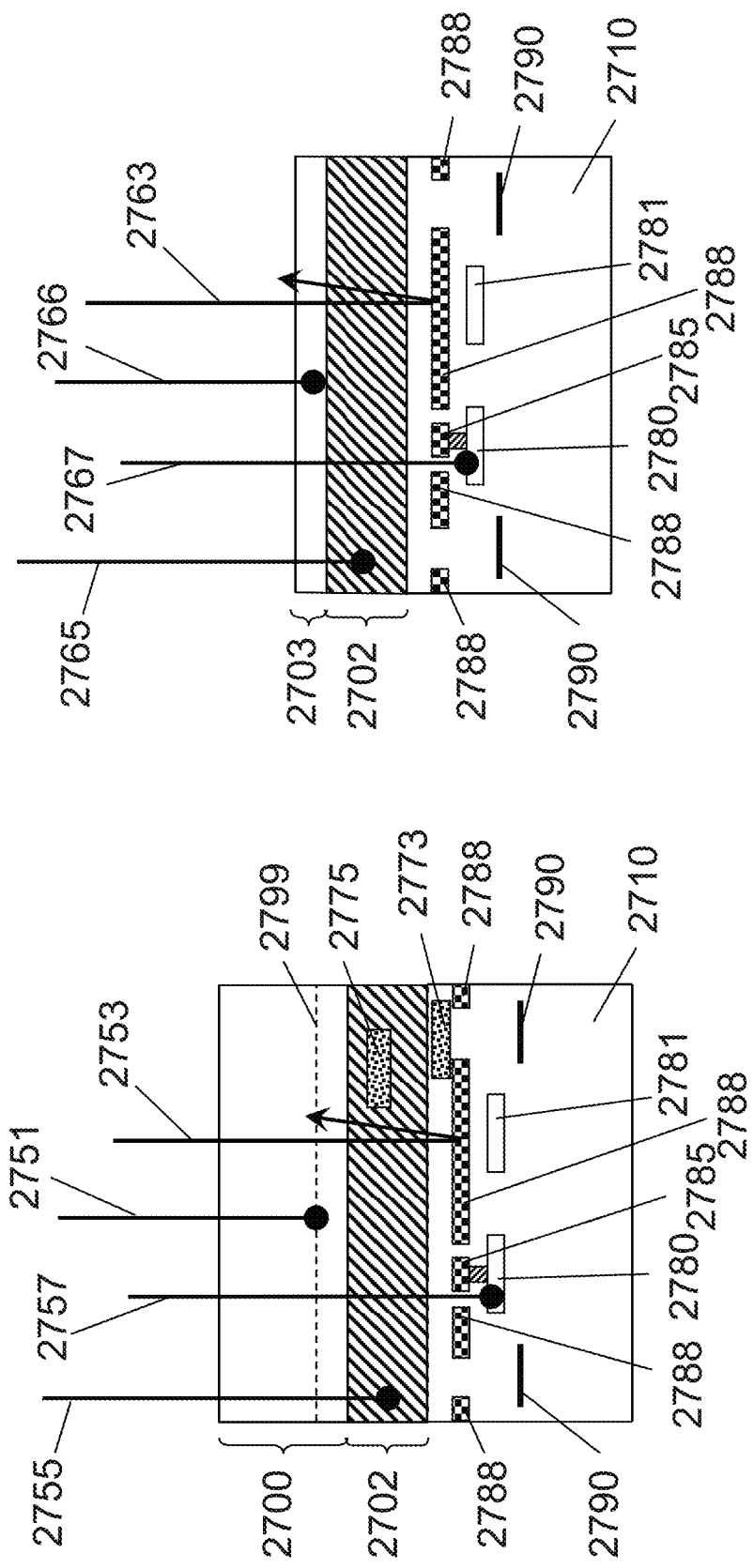

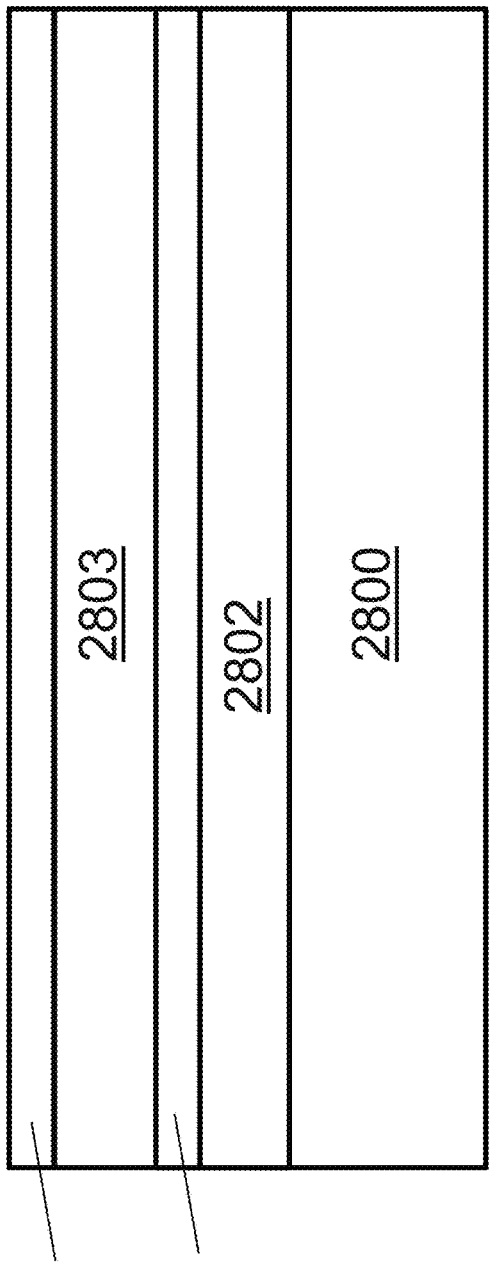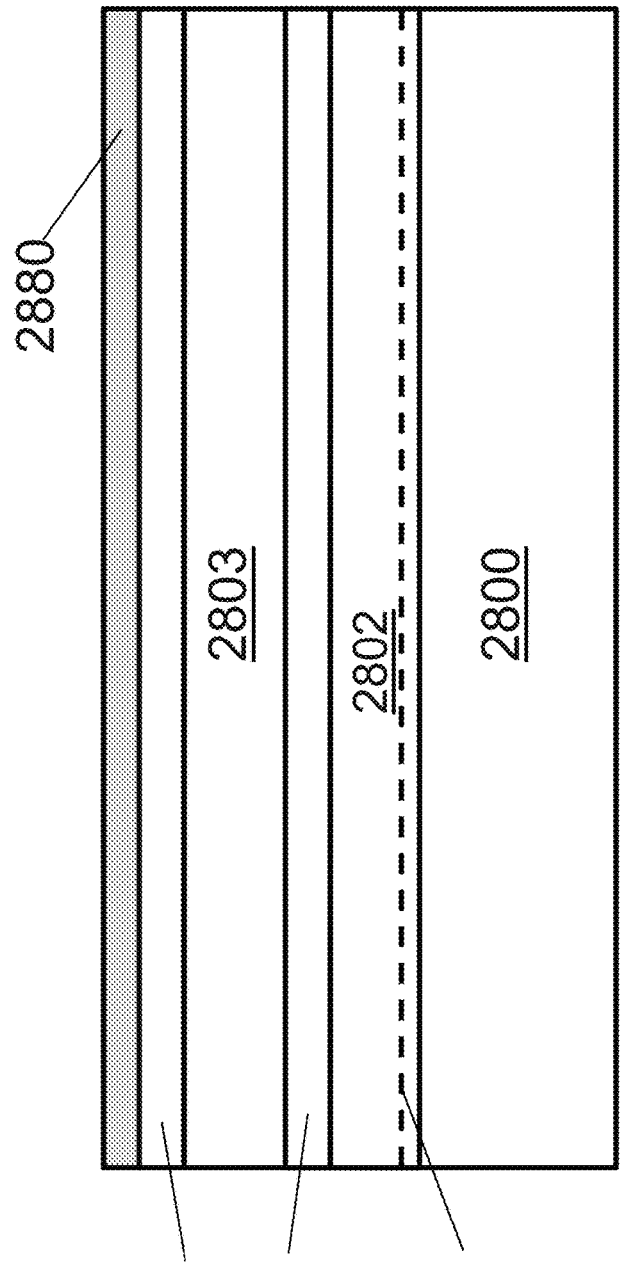

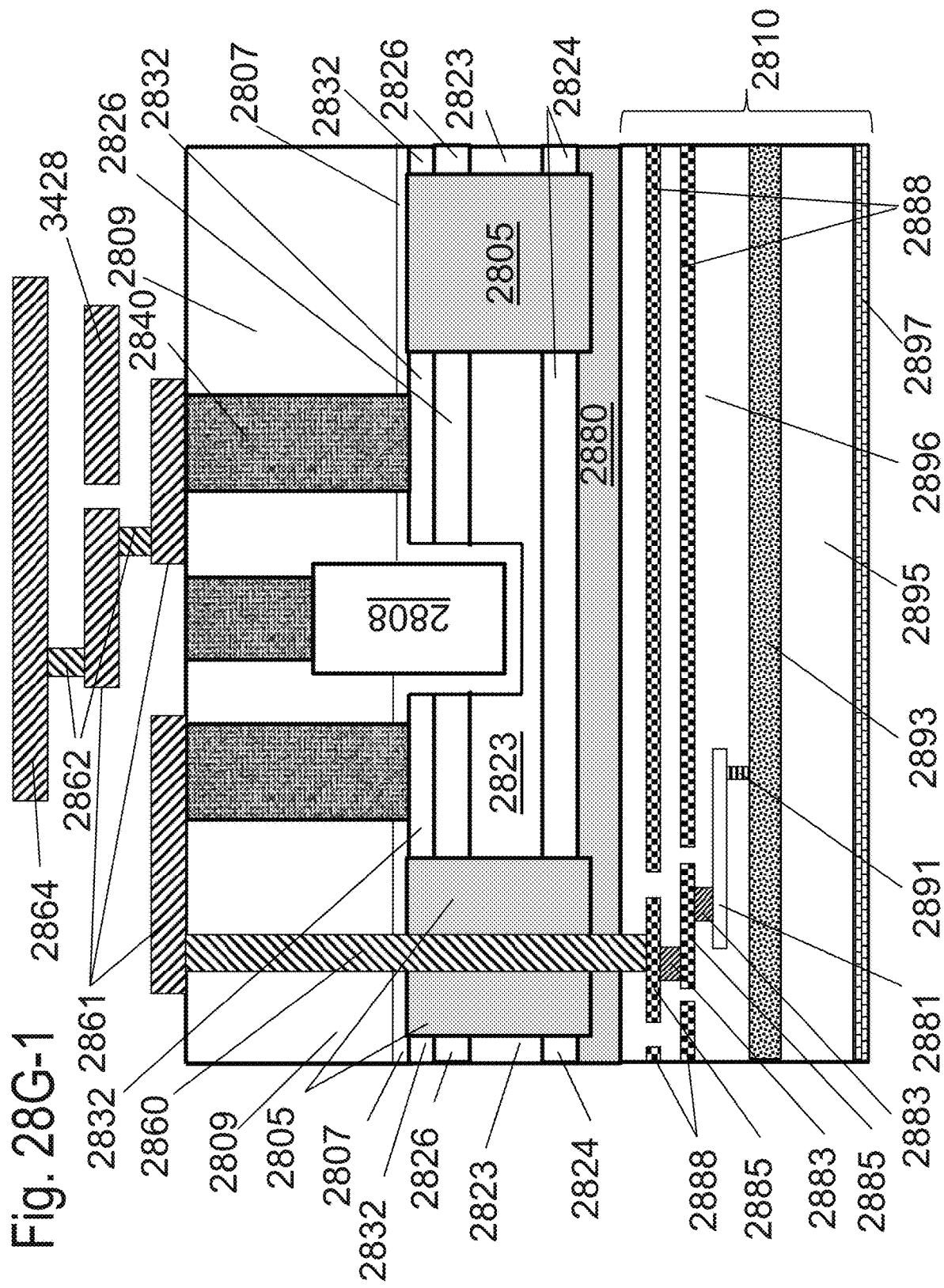

3D SEMICONDUCTOR DEVICE AND STRUCTURE

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318; and pending U.S. patent application Ser. Nos. 14/642,724, 15/150,395, 15/173,686, 62/651,722; 62/681,249, 62/713,345, 62/770,751, 62/952,222, 2020/0013791, 16/558,304; and PCT Applications (and Publications): PCT/US2010/052093, PCT/US2011/ 042071 (WO2012/015550), PCT/US2016/52726 (WO2017053329), PCT/US2017/052359 (WO2018/ 071143), PCT/US2018/016759 (WO2018144957), and PCT/US2018/52332(WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, and 10,679,977. The entire contents of the foregoing patents, publications, and applications are incorporated herein by reference.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices, structures, and fabrication methods.

In one aspect, a 3D semiconductor device, the device comprising: a first level, wherein said first level comprises a first layer, said first layer comprising first transistors, and wherein said first level comprises a second layer, said second layer comprising first interconnections; a second level overlaying said first level, wherein said second level comprises a third layer, said third layer comprising second transistors, and wherein said second level comprises a fourth layer, said fourth layer comprising second interconnections; and a plurality of connection paths, wherein said plurality of connection paths provides connections from a plurality of said first transistors to a plurality of said second transistors, wherein said second level is bonded to said first level, wherein said bonded comprises oxide to oxide bond regions, wherein said bonded comprises metal to metal bond regions, wherein said second level comprises at least one memory array, wherein said second level comprises at least one Phase Lock Loop ("PLL") circuit, and wherein said third layer comprises crystalline silicon.

In another aspect, a 3D semiconductor device, the device comprising: a first level, wherein said first level comprises a first layer, said first layer comprising first transistors, and wherein said first level comprises a second layer, said second layer comprising first interconnections; a second level overlaying said first level, wherein said second level comprises a third layer, said third layer comprising second transistors, and wherein said second level comprises a fourth layer, said fourth layer comprising second interconnections; a plurality of connection paths, wherein said plurality of connection paths provides connections from a plurality of said first transistors to a plurality of said second transistors, wherein said second level is bonded to said first level, wherein said bonded comprises oxide to oxide bond regions, wherein said bonded comprises metal to metal bond regions, wherein said second level comprises at least one memory array, wherein said third layer comprises crystalline silicon, wherein a plurality of said first transistors are circumscribed by a first guard ring, wherein a plurality of said second transistors are circumscribed by a second guard ring, and wherein said second guard ring overlays said first guard ring.

In another aspect, a 3D semiconductor device, the device comprising: a first level, wherein said first level comprises a first layer, said first layer comprising first transistors, and wherein said first level comprises a second layer, said second layer comprising first interconnections; a second level overlaying said first level, wherein said second level comprises a third layer, said third layer comprising second transistors, and wherein said second level comprises a fourth layer, said fourth layer comprising second interconnections; and a plurality of connection paths, wherein said plurality of connection paths provides connections from a plurality of said first transistors to a plurality of said second transistors, wherein said second level is bonded to said first level, wherein said bonded comprises oxide to oxide bond regions, wherein said bonded comprises metal to metal bond regions, wherein said second level comprises at least one memory array, wherein said third layer comprises crystalline silicon, and wherein said second layer comprises an Electro-Static-Discharge ("ESD") protection structure connected to at least one of said connection paths.

BRIEF DESCRIPTION OF THE DRAWINGS

Various embodiments of the invention will be understood and appreciated more fully from the following detailed description, taken in conjunction with the drawings in which:

FIG. 13 is an exemplary drawing illustration of a 4 input NAND gate;

FIG. 17A-17D is an exemplary process flow for constructing recessed channel transistors with thermal contacts;

FIGS. 26A-26F are exemplary drawing illustrations of a process flow for manufacturing fully depleted Recessed Channel Array Transistors (FD-RCAT);

FIGS. 27A-27B, 27B-1, 27C-27F are exemplary drawing illustrations of the integration of a shield/heat sink layer in a 3D-IC;

FIGS. 28A-28G, 28G-1 are exemplary drawing illustrations of a process flow for manufacturing fully depleted Recessed Channel Array Transistors (FD-RCAT) with an integrated shield/heat sink layer;

FIGS. 29A-29G, 29G-1 are exemplary drawing illustrations of a process flow for manufacturing fully depleted MOSFET (FD-MOSFET) with an integrated shield/heat sink layer;

FIGS. 31A-31E, 31E-1, 31F, 31G are exemplary drawing illustrations of a process flow for manufacturing horizontally oriented JFET or JLT with an integrated shield/heat sink layer;

DETAILED DESCRIPTION

Figure 1:
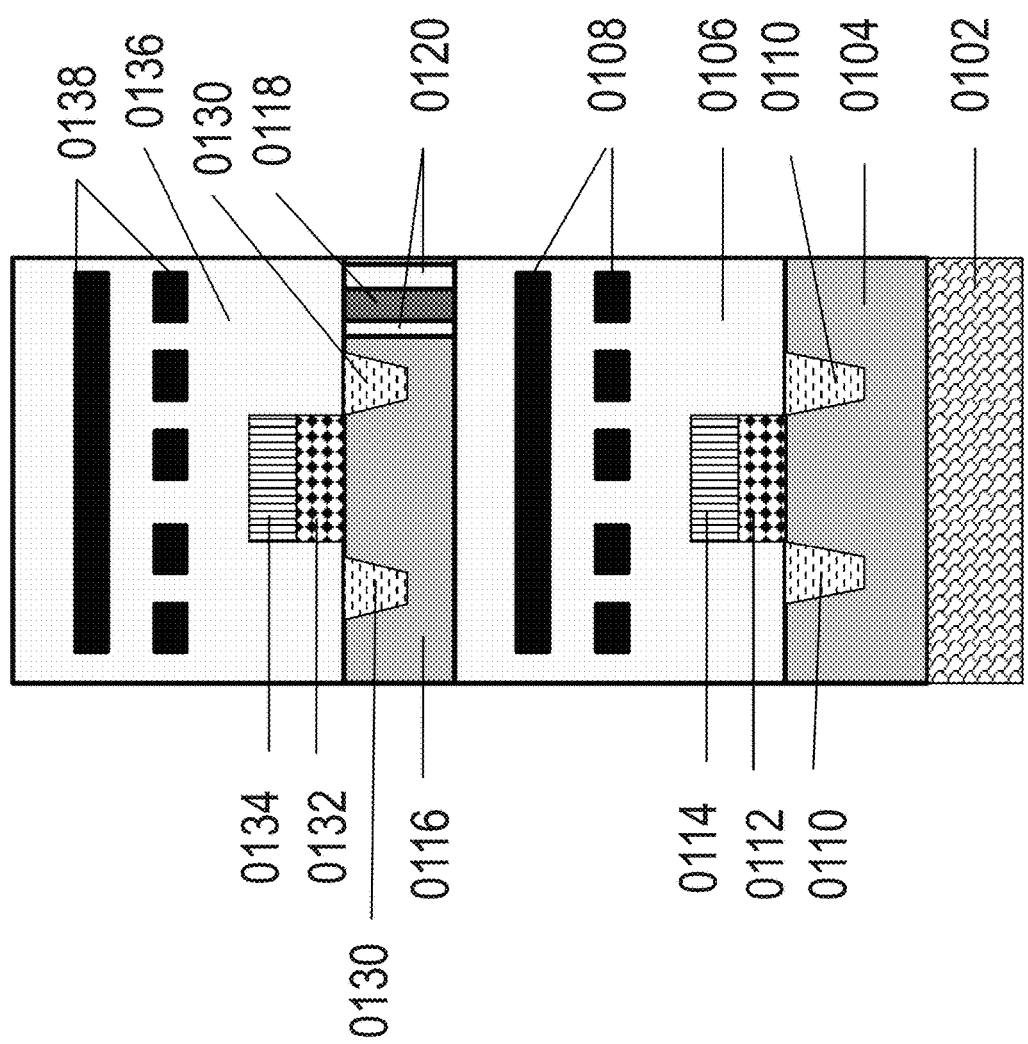
FIG. 1 is an exemplary drawing illustration of a 3D integrated circuit.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

FIG. 1 illustrates a 3D integrated circuit. Two crystalline layers, 0104 and 0116, which may include semiconductor materials such as, for example, mono-crystalline silicon, germanium, GaAs, InP, and graphene, are shown. For this illustration, mono-crystalline (single crystal) silicon may be used. Silicon layer 0116 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0104 may also be of thicknesses greater than 100 um, depending on, for example, the strength of bonding to heat removal apparatus 0102. Silicon layer 0104 may include transistors such as, for example, MOSFETS, FinFets, BJTs, HEMTs, HBTs, which may include gate electrode region 0114, gate dielectric region 0112, source and drain junction regions (not shown), and shallow trench isolation (STI) regions 0110. Silicon layer 0116 may include transistors such as, for example, MOSFETS, FinFets, BJTs, HEMTs, HBTs, which may include gate electrode region 0134, gate dielectric region 0132, source and drain junction regions (not shown), and shallow trench isolation (STI) regions 0130. A through-silicon via (TSV) 0118 could be present and may have an associated surrounding dielectric region 0120. Wiring layers 0108 for silicon layer 0104 and wiring dielectric regions 0106 may be present and may form an associated interconnect layer or layers. Wiring layers 0138 for silicon layer 0116 and wiring dielectric 0136 may be present and may form an associated interconnect layer or layers. Through-silicon via (TSV) 0118 may connect to wiring layers 0108 and wiring layers 0138 (not shown). The heat removal apparatus 0102 may include a heat spreader and/or a heat sink. The heat removal problem for the 3D integrated circuit shown in FIG. 1 is immediately apparent. The silicon layer 0116 is far away from the heat removal apparatus 0102, and it may be difficult to transfer heat among silicon layer 0116 and heat removal apparatus 0102. Furthermore, wiring dielectric regions 0106 may not conduct heat well, and this increases the thermal resistance among silicon layer 0116 and heat removal apparatus 0102. Silicon layer 0104 and silicon layer 0116 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0102 may include an external surface from which heat transfer may take place by methods such as air cooling, liquid cooling, or attachment to another heat sink or heat spreader structure.

It should be noted that while in general a heat sink may be an extra heat conducting element bonded with good heat conductivity (or made to be in contact with) to the back side of the base layer or substrate, such as for example, mono-crystalline bulk silicon or the bulk substrate of an SOI wafer, in many cases the base layer itself could be an effective heat sink. For example, many silicon wafers are many hundreds of microns thick before extra thinning or back-grinding, and has a relatively high heat capacity in comparison to the transistor layer, which may be less than one micron thick. Accordingly the heat sink structure for some devices discussed herein might be the bulk substrate or base layer itself. In addition, when the term 'bulk body' is used herein, it may refer to the base layer or substrate such as a mono-crystalline bulk silicon substrate or the bulk substrate of an SOI wafer, such that the bulk body has a greater heat capacity than the 3D layer/region structure to which it is thermally connected. Of course, the bulk body may additionally be connected to a heat sink.

Figure 2:
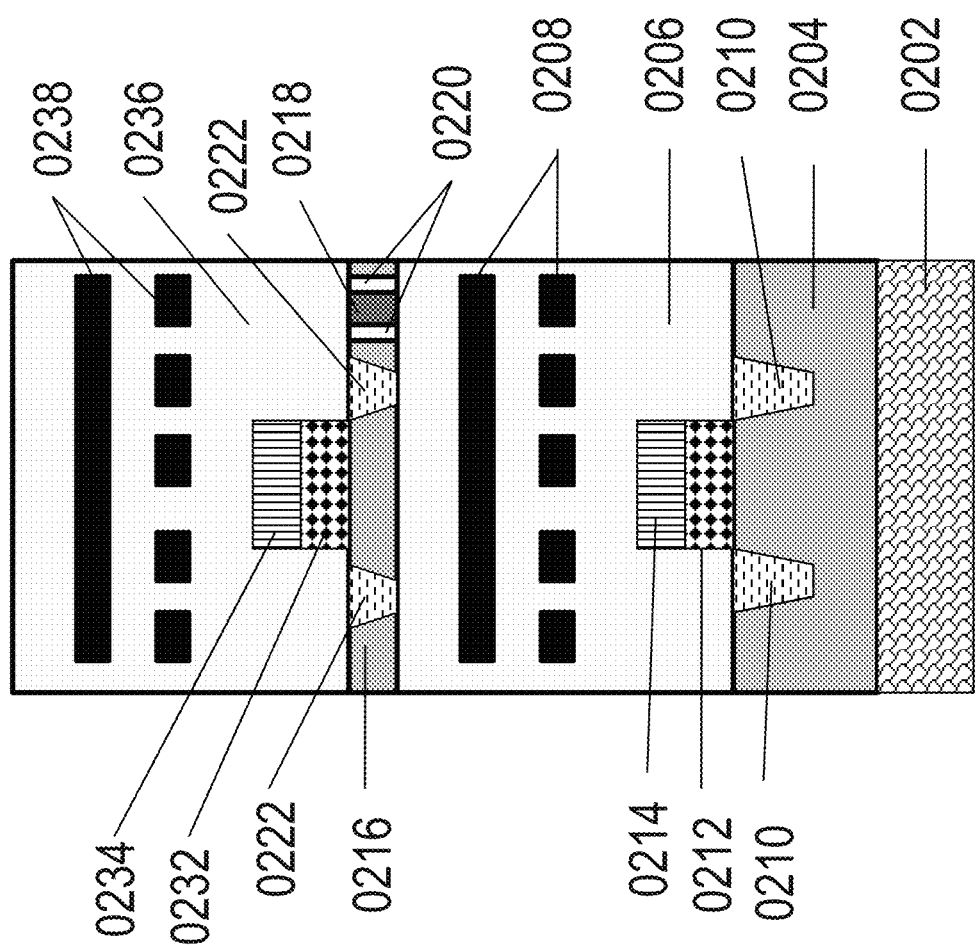
FIG. 2 is an exemplary drawing illustration of another 3D integrated circuit.

FIG. 2 illustrates an exemplary 3D integrated circuit that could be constructed, for example, using techniques described in U.S. Pat. No. 8,273,610, US patent publications 2012/0091587 and 2013/0020707, and pending U.S. patent application Ser. Nos. 13/441,923 and 13/099,010. The contents of the foregoing patent and applications are incorporated herein by reference. Two crystalline layers, 0204 and 0216, which may include semiconductor materials such as, for example, mono-crystalline silicon, germanium, GaAs, InP, and graphene, are shown. For this illustration, mono-crystalline (single crystal) silicon may be used. Silicon layer 0216 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0204 may also be of thicknesses greater than 100 um, depending on, for example, the strength of bonding to heat removal apparatus 0202. Silicon layer 0204 may include transistors such as, for example, MOSFETS, FinFets, BJTs, HEMTs, HBTs, which may include gate electrode region 0214, gate dielectric region 0212, source and drain junction regions (not shown for clarity) and shallow trench isolation (STI) regions 0210. Silicon layer 0216 may include transistors such as, for example, MOSFETS, FinFets, BJTs, HEMTs, HBTs, which may include gate electrode region 0234, gate dielectric region 0232, source and drain junction regions (not shown for clarity), and shallow trench isolation (STI) regions 0222. It can be observed that the STI regions 0222 can go right through to the bottom of silicon layer 0216 and provide good electrical isolation. This, however, may cause challenges for heat removal from the STI surrounded transistors since STI regions 0222 are typically composed of insulators that do not conduct heat well. Therefore, the heat spreading capabilities of silicon layer 0216 with STI regions 0222 are low. A through-layer via (TLV) 0218 may be present and may include an associated surrounding dielectric region 0220. Wiring layers 0208 for silicon layer 0204 and wiring dielectric regions 0206 may be present and may form an associated interconnect layer or layers. Wiring layers 0238 for silicon layer 0216 and wiring dielectric 0236 may be present and may form an associated interconnect layer or layers. Through-layer via (TLV) 0218 may connect to wiring layers 0208 and wiring layers 0238 (not shown). The heat removal apparatus 0202 may include a heat spreader and/or a heat sink. The heat removal problem for the 3D integrated circuit shown in FIG. 2 is immediately apparent. The silicon layer 0216 may be far away from the heat removal apparatus 0202, and it may be difficult to transfer heat among silicon layer 0216 and heat removal apparatus 0202. Furthermore, wiring dielectric regions 0206 may not conduct heat well, and this increases the thermal resistance among silicon layer 0216 and heat removal apparatus 0202. The heat removal challenge is further exacerbated by the poor heat spreading properties of silicon layer 0216 with STI regions 0222. Silicon layer 0204 and silicon layer 0216 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0202 may include an external surface from which heat transfer may take place by methods such as air cooling, liquid cooling, or attachment to another heat sink or heat spreader structure.

Figure 3:
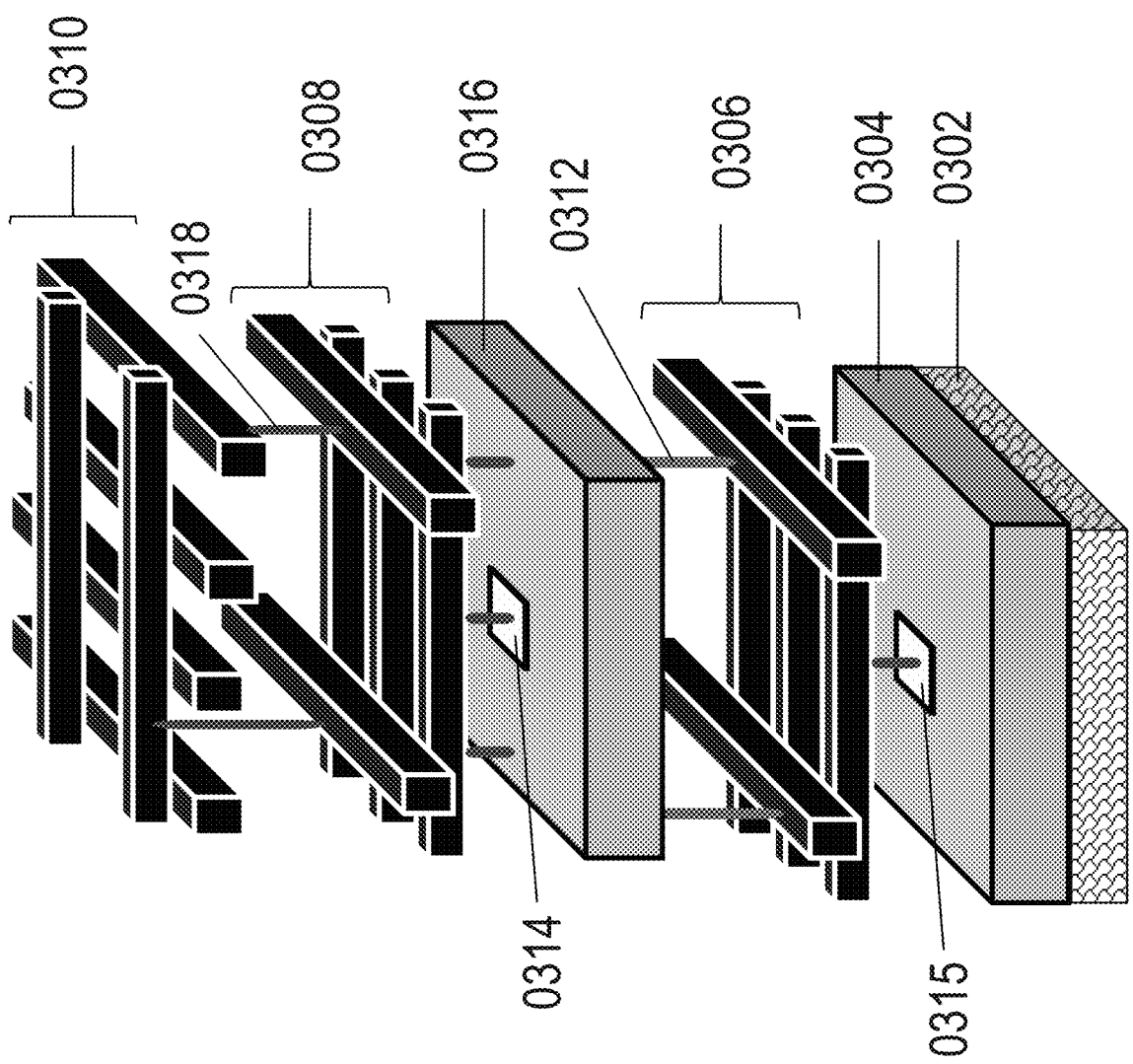
FIG. 3 is an exemplary drawing illustration of the power distribution network of a 3D integrated circuit.
Figure 4:
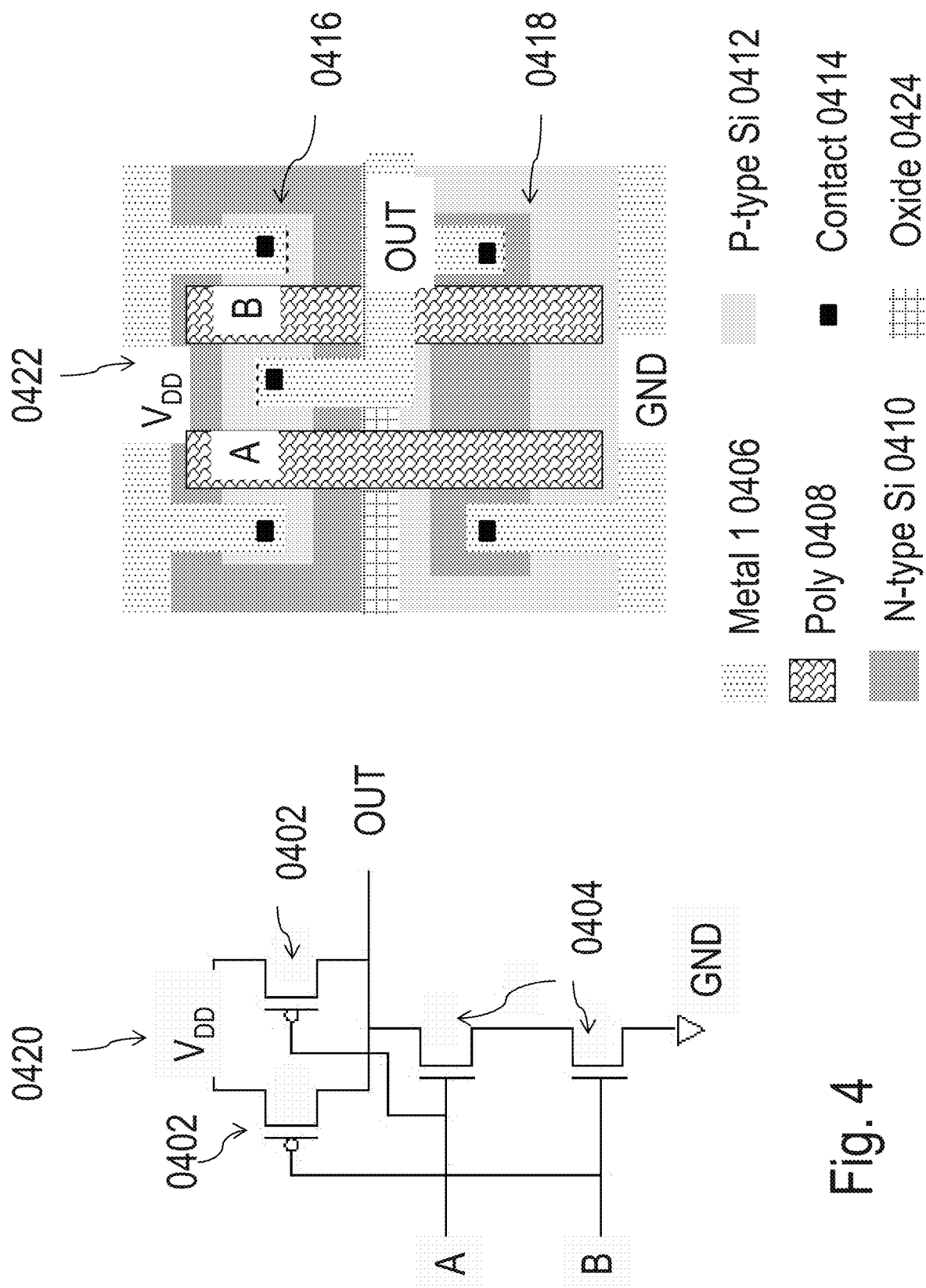
FIG. 4 is an exemplary drawing illustration of a NAND gate.

FIG. 3 and FIG. 4 illustrate how the power or ground distribution network of a 3D integrated circuit could assist heat removal. FIG. 3 illustrates an exemplary power distribution network or structure of the 3D integrated circuit. As shown in FIGS. 1 and 2, a 3D integrated circuit, could, for example, be constructed with two silicon layers, first silicon layer 0304 and second silicon layer 0316. The heat removal apparatus 0302 could include, for example, a heat spreader and/or a heat sink. The power distribution network or structure could consist of a global power grid 0310 that takes the supply voltage (denoted as $V_{DD}$) from the chip/circuit power pads and transfers $V_{DD}$ to second local power grid 0308 and first local power grid 0306, which transfers the supply voltage to logic/memory cells, transistors, and/or gates such as second transistor 0314 and first transistor 0315. Second layer vias 0318 and first layer vias 0312, such as the previously described TSV or TLV, could be used to transfer the supply voltage from the global power grid 0310 to second local power grid 0308 and first local power grid 0306. The global power grid 0310 may also be present among first silicon layer 0304 and second silicon layer 0316. The 3D integrated circuit could have a similarly designed and laid-out distribution networks, such as for ground and other supply voltages, as well. The power grid may be designed and constructed such that each layer or strata of transistors and devices may be supplied with a different value Vdd. For example, first silicon layer 0304 may be supplied by its power grid to have a Vdd value of 1.0 volts and second silicon layer 0316 a Vdd value of 0.8 volts. Furthermore, the global power grid 0310 wires may be constructed with substantially higher current conduction, for example 30% higher, 50% higher, 2× higher, than local power grids, for example, such as first local power grid 0306 wires and second local power grid 0308 wires. The thickness, linewidth, and material composition for the global power grid 0310 wires may provide for the higher current conduction, for example, the thickness of the global power grid 0310 wires may be twice that of the local power grid wires and/or the linewidth of the global power grid 0310 wires may be 2× that of the local power grid wires. Moreover, the global power grid 0310 may be optimally located in the top strata or layer of transistors and devices. Noise on the power grids, such as the Vss and/or Vdd supply grids, may be mitigated by attaching/connecting decoupling capacitors onto the power conducting lines of the grid(s), such as global power grid 0310, first local power grid 0306 wires and second local power grid 0308 wires. The decoupling caps may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal).

Typically, many contacts may be made among the supply and ground distribution networks and first silicon layer 0304. Due to this, there could exist a low thermal resistance among the power/ground distribution network and the heat removal apparatus 0302. Since power/ground distribution networks may be typically constructed of conductive metals and could have low effective electrical resistance, the power/ground distribution networks could have a low thermal resistance as well. Each logic/memory cell or gate on the 3D integrated circuit (such as, for example, second transistor 0314) is typically connected to $V_{DD}$ and ground, and therefore could have contacts to the power and ground distribution network. The contacts could help transfer heat efficiently (for example, with low thermal resistance) from each logic/memory cell or gate on the 3D integrated circuit (such as, for example, second transistor 0314) to the heat removal apparatus 0302 through the power/ground distribution network and the silicon layer 0304. Silicon layer 0304 and silicon layer 0316 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0302 may include an external surface from which heat transfer may take place by methods such as air cooling, liquid cooling, or attachment to another heat sink or heat spreader structure.

FIG. 4 illustrates an exemplary NAND logic cell or NAND gate 0420 and how substantially all portions of this logic cell or gate could be designed and laid-out with low thermal resistance to the $V_{DD}$ or ground (GND) contacts. The NAND gate 0420 could include two pMOS transistors 0402 and two nMOS transistors 0404. The layout of the NAND gate 0420 is indicated in exemplary layout 0422. Various regions of the layout may include metal regions 0406, poly regions 0408, n type silicon regions 0410, p type silicon regions 0412, contact regions 0414, and oxide regions 0424. pMOS transistors 0416 and nMOS transistors 0418 may be present in the layout. It can be observed that substantially all parts of the exemplary NAND gate 0420 could have low thermal resistance to $V_{DD}$ or GND contacts since they may be physically very close to them, within a few design rule lambdas, wherein lamda is the basic minimum layout rule distance for a given set of circuit layout design rules. Thus, substantially all transistors in the NAND gate 0420 can be maintained at desirable temperatures, such as, for example, less than 25 or 50 or 70 degrees Centigrade, if the $V_{DD}$ or ground contacts are maintained at desirable temperatures.

While the previous paragraph described how an existing power distribution network or structure can transfer heat efficiently from logic/memory cells or gates in 3D-ICs to their heat sink, many techniques to enhance this heat transfer capability will be described herein. Many embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. The heat transfer capability enhancement techniques may be useful and applied to different methodologies and implementations of 3D-ICs, including monolithic 3D-ICs and TSV-based 3D-ICs. The heat removal apparatus employed, which may include heat sinks and heat spreaders, may include an external surface from which heat transfer may take place by methods such as air cooling, liquid cooling, or attachment to another heat sink or heat spreader structure.

Figure 5:
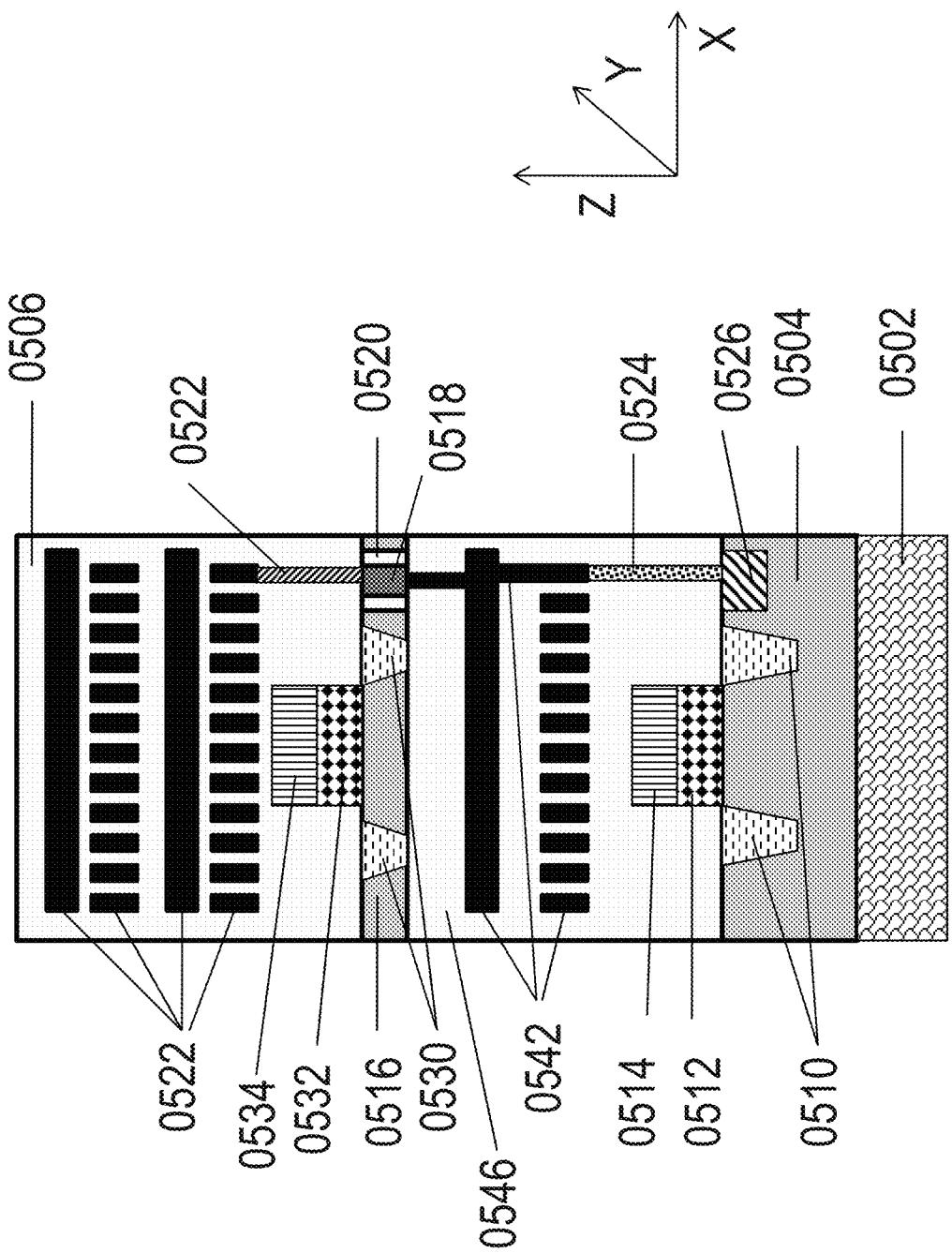
FIG. 5 is an exemplary drawing illustration of a thermal contact concept.

FIG. 5 illustrates an embodiment of the invention, wherein thermal contacts in a 3D-IC is described. The 3D-IC and associated power and ground distribution network may be formed as described in FIGS. 1, 2, 3, and 4 herein. For example, two crystalline layers, 0504 and 0516, which may include semiconductor materials such as, for example, mono-crystalline silicon, germanium, GaAs, InP, and graphene, may have transistors. For this illustration, mono-crystalline (single crystal) silicon may be used. Silicon layer 0516 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0504 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0504 may also be of thicknesses greater than 100 um, depending on, for example, the strength of bonding to heat removal apparatus 0202. Silicon layer 0504 may include transistors such as, for example, MOSFETS, FinFets, BJTs, HEMTs, HBTs, which may include STI regions 0510, gate dielectric regions 0512, gate electrode regions 0514 and several other regions that may be necessary for transistors such as source and drain junction regions (not shown for clarity). Silicon layer 0516 may include transistors such as, for example, MOSFETS, FinFets, BJTs, HEMTs, HBTs, which may include STI regions 0530, gate dielectric regions 0532, gate electrode regions 0534 and several other regions that may be necessary for transistors such as source and drain junction regions (not shown for clarity). Heat removal apparatus 0502 may include, for example, heat spreaders and/or heat sinks. In the example shown in FIG. 5, silicon layer 0504 is closer to the heat removal apparatus 0502 than other silicon layers such as silicon layer 0516. Wiring layers 0542 for silicon layer 0504 and wiring dielectric 0546 may be present and may form an associated interconnect layer or layers. Wiring layers 0522 for silicon layer 0516 and wiring dielectric 0506 may be present and may form an associated interconnect layer or layers. Through-layer vias (TLVs) 0518 for power delivery and interconnect and their associated dielectric regions 0520 are shown. Dielectric regions 0520 may include STI regions, such as STI regions 0530. A thermal contact 0524 may connect the local power distribution network or structure to the silicon layer 0504. The local power distribution network or structure may include wiring layers 0542 used for transistors in the silicon layer 0504. Thermal junction region 0526 can be, for example, a doped or undoped region of silicon, and further details of thermal junction region 0526 will be given in FIG. 6. The thermal contact 0524 can be suitably placed close to the corresponding through-layer via 0518; this helps transfer heat efficiently as a thermal conduction path from the through-layer via 0518 to thermal junction region 0526 and silicon layer 0504 and ultimately to the heat removal apparatus 0502. For example, the thermal contact 0524 could be located within approximately 2 um distance of the through-layer via 0518 in the X-Y plane (the through-layer via 0518 vertical length direction is considered the Z plane in FIG. 5). While the thermal contact 0524 is described above as being between the power distribution network or structure and the silicon layer closest to the heat removal apparatus, it could also be between the ground distribution network and the silicon layer closest to the heat sink. Furthermore, more than one thermal contact 0524 can be placed close to the through-layer via 0518. The thermal contacts can improve heat transfer from transistors located in higher layers of silicon such as silicon layer 0516 to the heat removal apparatus 0502. While mono-crystalline silicon has been mentioned as the transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may not be stacked in a vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. Silicon layer 0504 and silicon layer 0516 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0502 may include an external surface from which heat transfer may take place by methods such as air cooling, liquid cooling, or attachment to another heat sink or heat spreader structure.

Figure 6:
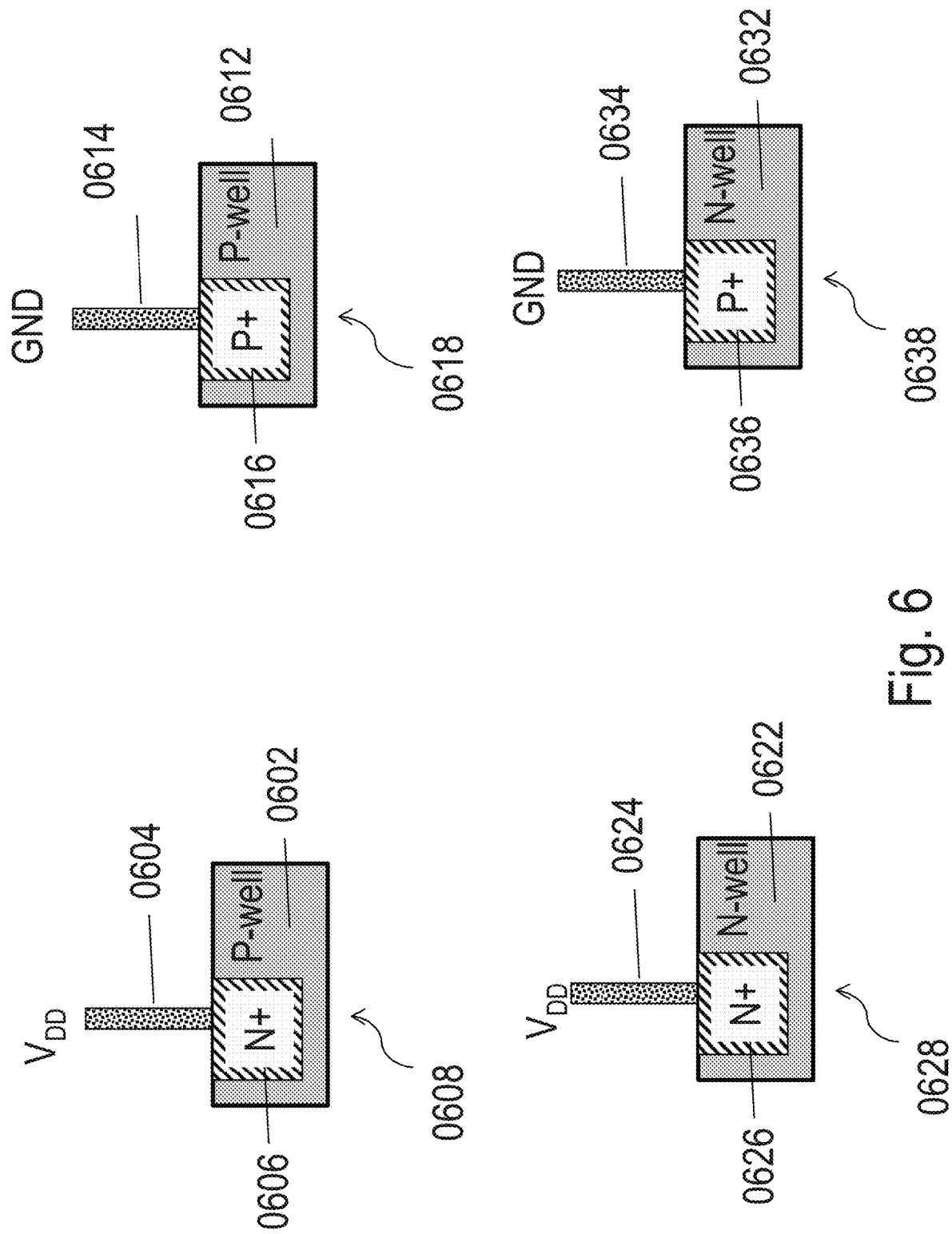
FIG. 6 is an exemplary drawing illustration of various types of thermal contacts.

FIG. 6 describes an embodiment of the invention, wherein various implementations of thermal junctions and associated thermal contacts are illustrated. P-wells in CMOS integrated circuits may be typically biased to ground and N-wells may be typically biased to the supply voltage $V_{DD}$. A thermal contact 0604 between the power ($V_{DD}$) distribution network and a P-well 0602 can be implemented as shown in N+ in P-well thermal junction and contact example 0608, where an n+ doped region thermal junction 0606 may be formed in the P-well region at the base of the thermal contact 0604. The n+ doped region thermal junction 0606 ensures a reverse biased p-n junction can be formed in N+ in P-well thermal junction and contact example 0608 and makes the thermal contact viable (for example, not highly conductive) from an electrical perspective. The thermal contact 0604 could be formed of a conductive material such as copper, aluminum or some other material with a thermal conductivity of at least 100 W/m-K. A thermal contact 0614 between the ground (GND) distribution network and a P-well 0612 can be implemented as shown in P+ in P-well thermal junction and contact example 0618, where a p+ doped region thermal junction 0616 may be formed in the P-well region at the base of the thermal contact 0614. The p+ doped region thermal junction 0616 makes the thermal contact viable (for example, not highly conductive) from an electrical perspective. The p+ doped region thermal junction 0616 and the P-well 0612 may typically be biased at ground potential. The thermal contact 0614 could be formed of a conductive material such as copper, aluminum or some other material with a thermal conductivity of at least 100 W/m-K. A thermal contact 0624 between the power ($V_{DD}$) distribution network and an N-well 0622 can be implemented as shown in N+ in N-well thermal junction and contact example 0628, wherein an n+ doped region thermal junction 0626 may be formed in the N-well region at the base of the thermal contact 0624. The n+ doped region thermal junction 0626 makes the thermal contact viable (for example, not highly conductive) from an electrical perspective. The n+ doped region thermal junction 0626 and the N-well 0622 may typically be biased at $V_{DD}$ potential. The thermal contact 0624 could be formed of a conductive material such as copper, aluminum or some other material with a thermal conductivity of at least 100 W/m-K. A thermal contact 0634 between the ground (GND) distribution network and an N-well 0632 can be implemented as shown in P+ in N-well thermal junction and contact example 0638, where a p+ doped region thermal junction 0636 may be formed in the N-well region at the base of the thermal contact 0634. The p+ doped region thermal junction 0636 makes the thermal contact viable (for example, not highly conductive) from an electrical perspective due to the reverse biased p-n junction formed in P+ in N-well thermal junction and contact example 0638. The thermal contact 0634 could be formed of a conductive material such as copper, aluminum or some other material with a thermal conductivity of at least 100 W/m-K. Note that the thermal contacts are designed to conduct negligible electricity, and the current flowing through them is several orders of magnitude lower than the current flowing through a transistor when it is switching. Therefore, the thermal contacts can be considered to be designed to conduct heat and conduct negligible (or no) electricity.

Figure 7:
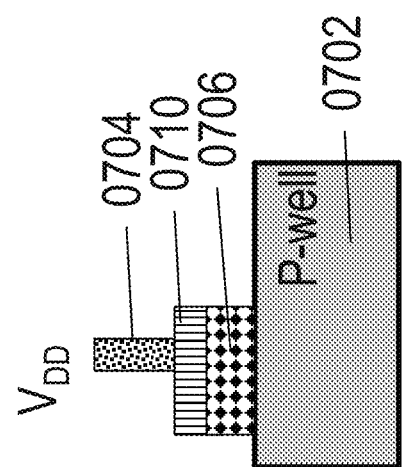
FIG. 7 is an exemplary drawing illustration of another type of thermal contact.

FIG. 7 describes an embodiment of the invention, wherein an additional type of thermal contact structure is illustrated. The embodiment shown in FIG. 7 could also function as a decoupling capacitor to mitigate power supply noise. It could consist of a thermal contact 0704, an electrode 0710, a dielectric 0706 and P-well 0702. The dielectric 0706 may be electrically insulating, and could be optimized to have high thermal conductivity. Dielectric 0706 could be formed of materials, such as, for example, hafnium oxide, silicon dioxide, other high k dielectrics, carbon, carbon based material, or various other dielectric materials with electrical conductivity below 1 nano-amp per square micron.

A thermal connection may be defined as the combination of a thermal contact and a thermal junction. The thermal connections illustrated in FIG. 6, FIG. 7 and other figures in this document are designed into a chip to remove heat, and are designed to not conduct electricity. Essentially, a semiconductor device including power distribution wires is described wherein some of said wires have a thermal connection designed to conduct heat to the semiconductor layer and the wires do not substantially conduct electricity through the thermal connection to the semiconductor layer.

Thermal contacts similar to those illustrated in FIG. 6 and FIG. 7 can be used in the white spaces of a design, for example, locations of a design where logic gates or other useful functionality may not be present. The thermal contacts may connect white-space silicon regions to power and/or ground distribution networks. Thermal resistance to the heat removal apparatus can be reduced with this approach. Connections among silicon regions and power/ground distribution networks can be used for various device layers in the 3D stack, and may not be restricted to the device layer closest to the heat removal apparatus. A Schottky contact or diode may also be utilized for a thermal contact and thermal junction. Moreover, thermal contacts and vias may not have to be stacked in a vertical line through multiple stacks, layers, strata of circuits.

Figure 8:
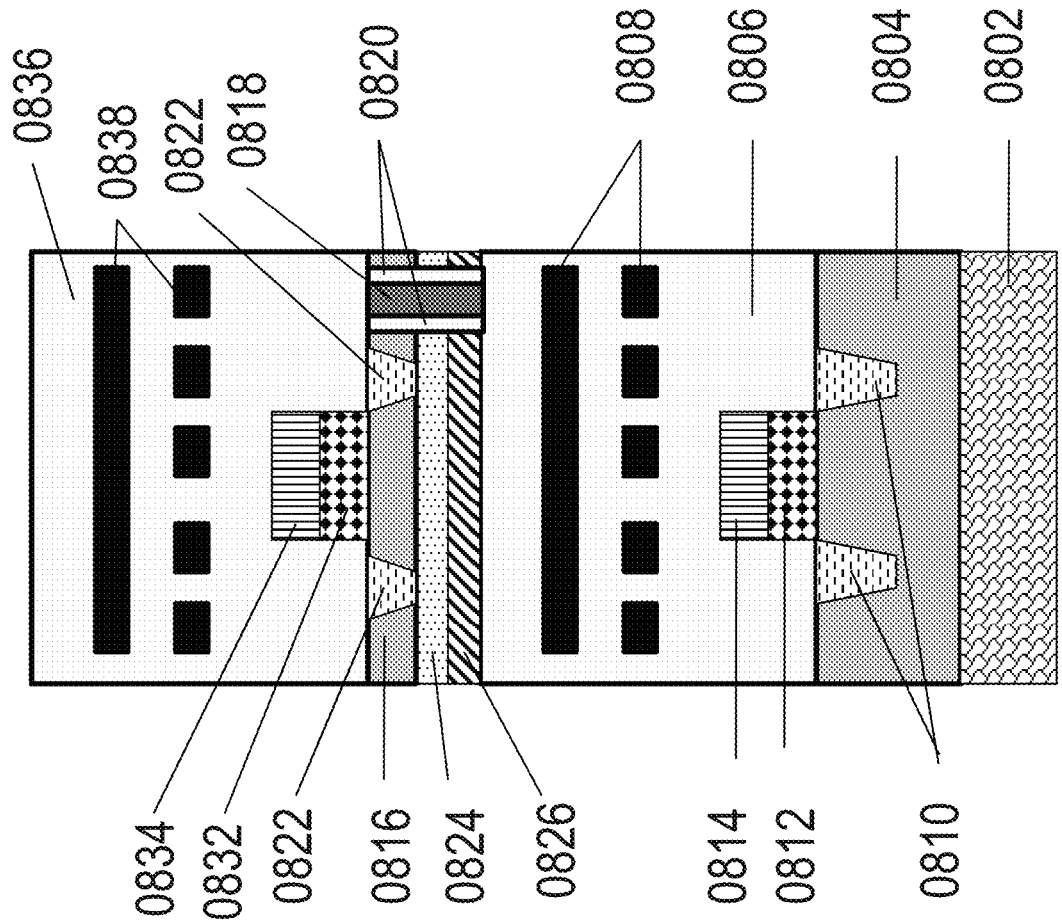
FIG. 8 is an exemplary drawing illustration of the use of heat spreaders in 3D stacked device layers.

FIG. 8 illustrates an embodiment of the invention, which can provide enhanced heat removal from 3D-ICs by integrating heat spreader regions in stacked device layers. The 3D-IC and associated power and ground distribution network may be formed as described in FIGS. 1, 2, 3, 4, and 5 herein. For example, two crystalline layers, 0804 and 0816, which may include semiconductor materials such as, for example, mono-crystalline silicon, germanium, GaAs, InP, and graphene, are shown. For this illustration, mono-crystalline (single crystal) silicon may be used. Silicon layer 0816 could be thinned from its original thickness, and its final thickness could be in the range of about 0.01 um to about 50 um, for example, 10 nm, 100 nm, 200 nm, 0.4 um, 1 um, 2 um or 5 um. Silicon layer 0804 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0804 may also be of thicknesses greater than 100 um, depending on, for example, the strength of bonding to heat removal apparatus 0802. Silicon layer 0804 may include transistors such as, for example, MOSFETS, FinFets, BJTs, HEMTs, HBTs, which may include gate electrode region 0814, gate dielectric region 0812, shallow trench isolation (STI) regions 0810 and several other regions that may be necessary for transistors such as source and drain junction regions (not shown for clarity). Silicon layer 0816 may include transistors such as, for example, MOSFETS, FinFets, BJTs, HEMTs, HBTs, which may include gate electrode region 0834, gate dielectric region 0832, shallow trench isolation (STI) regions 0822 and several other regions that may be necessary for transistors such as source and drain junction regions (not shown for clarity). A through-layer via (TLV) 0818 may be present and may include an associated surrounding dielectric region 0820. Wiring layers 0808 for silicon layer 0804 and wiring dielectric 0806 may be present and may form an associated interconnect layer or layers. Wiring layers 0838 for silicon layer 0816 and wiring dielectric 0836 may be present and may form an associated interconnect layer or layers. Through-layer via (TLV) 0818 may connect to wiring layers 0808 and wiring layers 0838 (not shown). The heat removal apparatus 0802 may include, for example, a heat spreader and/or a heat sink. It can be observed that the STI regions 0822 can go right through to the bottom of silicon layer 0816 and provide good electrical isolation. This, however, may cause challenges for heat removal from the STI surrounded transistors since STI regions 0822 are typically composed of insulators that do not conduct heat well. The buried oxide layer 0824 typically does not conduct heat well. To tackle heat removal issues with the structure shown in FIG. 8, a heat spreader 0826 may be integrated into the 3D stack. The heat spreader 0826 material may include, for example, copper, aluminum, graphene, diamond, carbon or any other material with a high thermal conductivity (defined as greater than 10 W/m-K). While the heat spreader concept for 3D-ICs is described with an architecture similar to FIG. 2, similar heat spreader concepts could be used for architectures similar to FIG. 1, and also for other 3D IC architectures. Silicon layer 0804 and silicon layer 0816 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus

0802 may include an external surface from which heat transfer may take place by methods such as air cooling, liquid cooling, or attachment to another heat sink or heat spreader structure.

Figure 9:
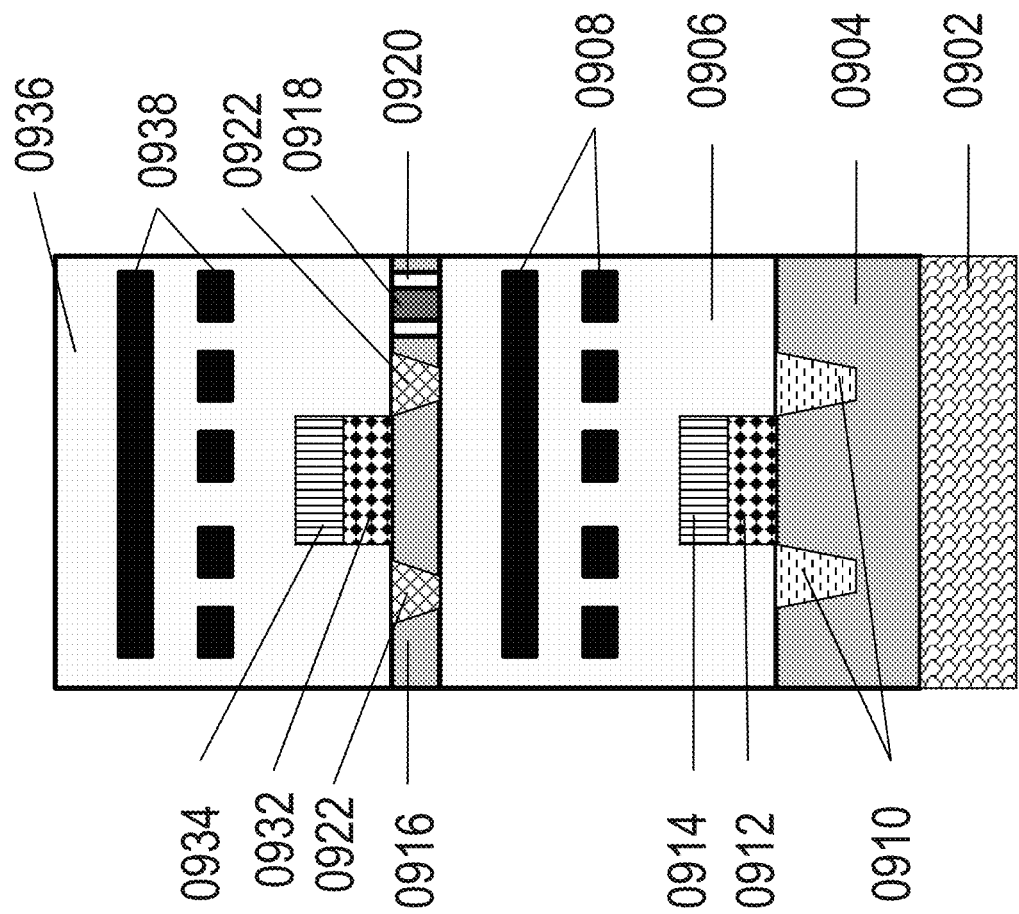
FIG. 9 is an exemplary drawing illustration of the use of thermally conductive shallow trench isolation (STI) in 3D stacked device layers.

FIG. 9 illustrates an embodiment of the invention, which can provide enhanced heat removal from 3D-ICs by using thermally conductive shallow trench isolation (STI) regions in stacked device layers. The 3D-IC and associated power and ground distribution network may be formed as described in FIGS. 1, 2, 3, 4, 5 and 8 herein. For example, two crystalline layers, 0904 and 0916, which may include semiconductor materials such as, for example, mono-crystalline silicon, germanium, GaAs, InP, and graphene, are shown. For this illustration, mono-crystalline (single crystal) silicon may be used. Silicon layer 0916 could be thinned from its original thickness, and its final thickness could be in the range of about 0.01 um to about 50 um, for example, 10 nm, 100 nm, 200 nm, 0.4 um, 1 um, 2 um or 5 um. Silicon layer 0904 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0904 may also be of thicknesses greater than 100 um, depending on, for example, the strength of bonding to heat removal apparatus 0802. Silicon layer 0904 may include transistors such as, for example, MOSFETS, FinFets, BJTs, HEMTs, HBTs, which may include gate electrode region 0914, gate dielectric region 0912, shallow trench isolation (STI) regions 0910 and several other regions that may be necessary for transistors such as source and drain junction regions (not shown for clarity). Silicon layer 0916 may include transistors such as, for example, MOSFETS, FinFets, BJTs, HEMTs, HBTs, which may include gate electrode region 0934, gate dielectric region 0932, shallow trench isolation (STI) regions 0922 and several other regions that may be necessary for transistors such as source and drain junction regions (not shown for clarity). A through-layer via (TLV) 0918 may be present and may include an associated surrounding dielectric region 0920. Dielectric region 0920 may include a shallow trench isolation region. Wiring layers 0908 for silicon layer 0904 and wiring dielectric 0906 may be present and may form an associated interconnect layer or layers. Wiring layers 0938 for silicon layer 0916 and wiring dielectric 0936 may be present and may form an associated interconnect layer or layers. Through-layer via (TLV) 0918 may connect to wiring layers 0908 and wiring layers 0938 (not shown). The heat removal apparatus 0902 may include a heat spreader and/or a heat sink. It can be observed that the STI regions 0922 can go right through to the bottom of silicon layer 0916 and provide good electrical isolation. This, however, may cause challenges for heat removal from the STI surrounded transistors since STI regions 0922 are typically composed of insulators such as silicon dioxide that do not conduct heat well. To tackle possible heat removal issues with the structure shown in FIG. 9, the STI regions 0922 in stacked silicon layers such as silicon layer 0916 could be formed substantially of thermally conductive dielectrics including, for example, diamond, carbon, or other dielectrics that have a thermal conductivity higher than silicon dioxide and/or have a thermal conductivity higher than 0.6 W/m-K. This structure can provide enhanced heat spreading in stacked device layers. Thermally conductive STI dielectric regions could be used in the vicinity of the transistors in stacked 3D device layers and may also be utilized as the dielectric that surrounds TLV 0918, such as dielectric region 0920. While the thermally conductive shallow trench isolation (STI) regions concept for 3D-ICs is described with an architecture similar to FIG. 2, similar thermally conductive shallow trench isolation (STI) regions concepts could be used for architectures similar to FIG. 1, and also for other 3D IC architectures and 2D IC as well. Silicon layer 0904 and silicon layer 0916 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0902 may include an external surface from which heat transfer may take place by methods such as air cooling, liquid cooling, or attachment to another heat sink or heat spreader structure.

Figure 10:
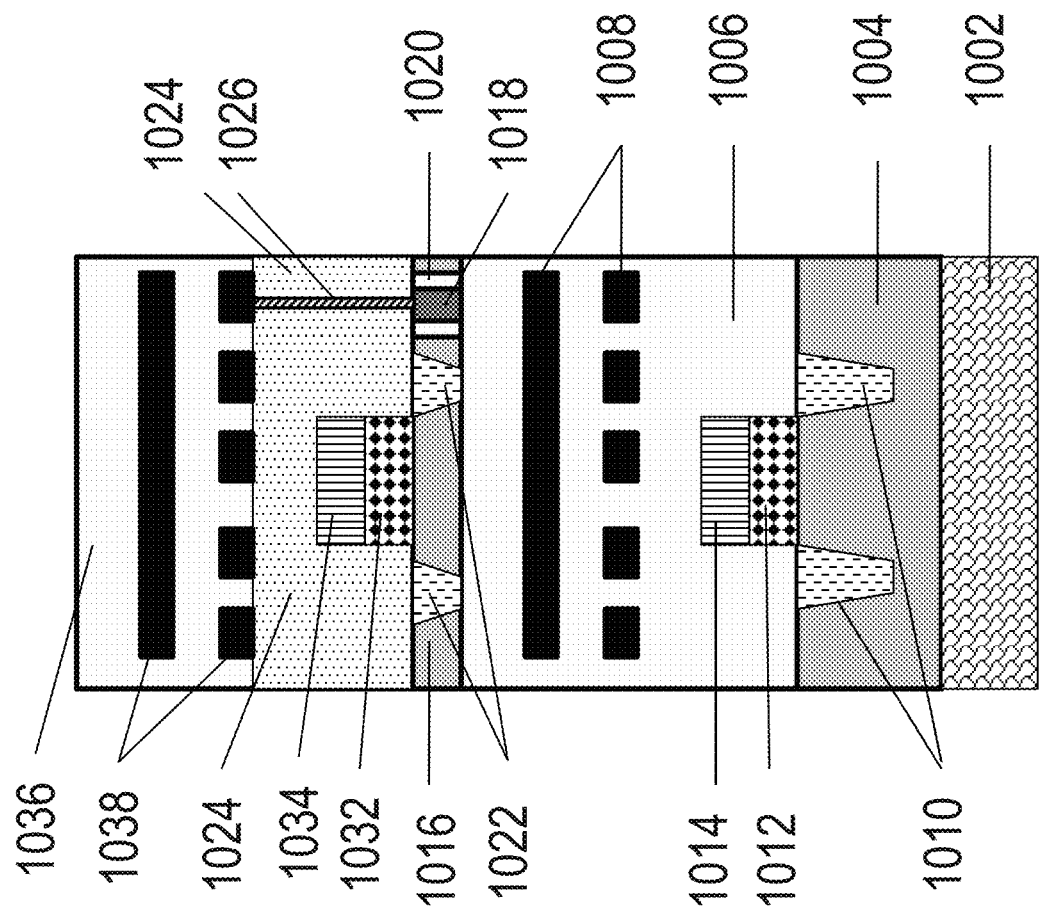
FIG. 10 is an exemplary drawing illustration of the use of thermally conductive pre-metal dielectric regions in 3D stacked device layers.

FIG. 10 illustrates an embodiment of the invention, which can provide enhanced heat removal from 3D-ICs using thermally conductive pre-metal dielectric regions in stacked device layers. The 3D-IC and associated power and ground distribution network may be formed as described in FIGS. 1, 2, 3, 4, 5, 8 and 9 herein. For example, two crystalline layers, 1004 and 1016, which may include semiconductor materials such as, for example, mono-crystalline silicon, germanium, GaAs, InP, and graphene, are shown. For this illustration, mono-crystalline (single crystal) silicon may be used. Silicon layer 1016 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1004 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1004 may also be of thicknesses greater than 100 um, depending on, for example, the strength of bonding to heat removal apparatus 1002. Silicon layer 1004 may include transistors such as, for example, MOSFETS, FinFets, BJTs, HEMTs, HBTs, which may include gate electrode region 1014, gate dielectric region 1012, shallow trench isolation (STI) regions 1010 and several other regions that may be necessary for transistors such as source and drain junction regions (not shown for clarity). Silicon layer 1016 may include transistors such as, for example, MOSFETS, FinFets, BJTs, HEMTs, HBTs, which may include gate electrode region 1034, gate dielectric region 1032, shallow trench isolation (STI) regions 1022 and several other regions that may be necessary for transistors such as source and drain junction regions (not shown for clarity). A through-layer via (TLV) 1018 may be present and may include an associated surrounding dielectric region 1020, which may include an STI region. Wiring layers 1008 for silicon layer 1004 and wiring dielectric 1006 may be present and may form an associated interconnect layer or layers. Wiring layers 1038 for silicon layer 1016 and wiring dielectric 1036 may be present and may form an associated interconnect layer or layers. Through-layer via (TLV) 1018 may connect to wiring layers 1008 (not shown). The heat removal apparatus 1002 may include, for example, a heat spreader and/or a heat sink. It can be observed that the STI regions 1022 can go right through to the bottom of silicon layer 1016 and provide good electrical isolation. This, however, can cause challenges for heat removal from the STI surrounded transistors since STI regions 1022 are typically filled with insulators such as silicon dioxide that do not conduct heat well. To tackle this issue, the inter-layer dielectrics (ILD) 1024 for contact region 1026 could be constructed substantially with a thermally conductive material, such as, for example, insulating carbon, diamond, diamond like carbon (DLC), and various other materials that provide better thermal conductivity than silicon dioxide or have a thermal conductivity higher than 0.6 W/m-K. Thermally conductive pre-metal dielectric regions could be used around some of the transistors in stacked 3D device layers. While the thermally conductive pre-metal dielectric regions concept for 3D-ICs is described with an architecture similar to FIG. 2, similar thermally conductive pre-metal dielectric region concepts could be used for architectures similar to FIG. 1, and also for other 3D IC architectures and 2D IC as well. Silicon layer 1004 and silicon layer 1016 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 1002 may include an external surface from which heat transfer may take place by methods such as air cooling, liquid cooling, or attachment to another heat sink or heat spreader structure.

Figure 11:
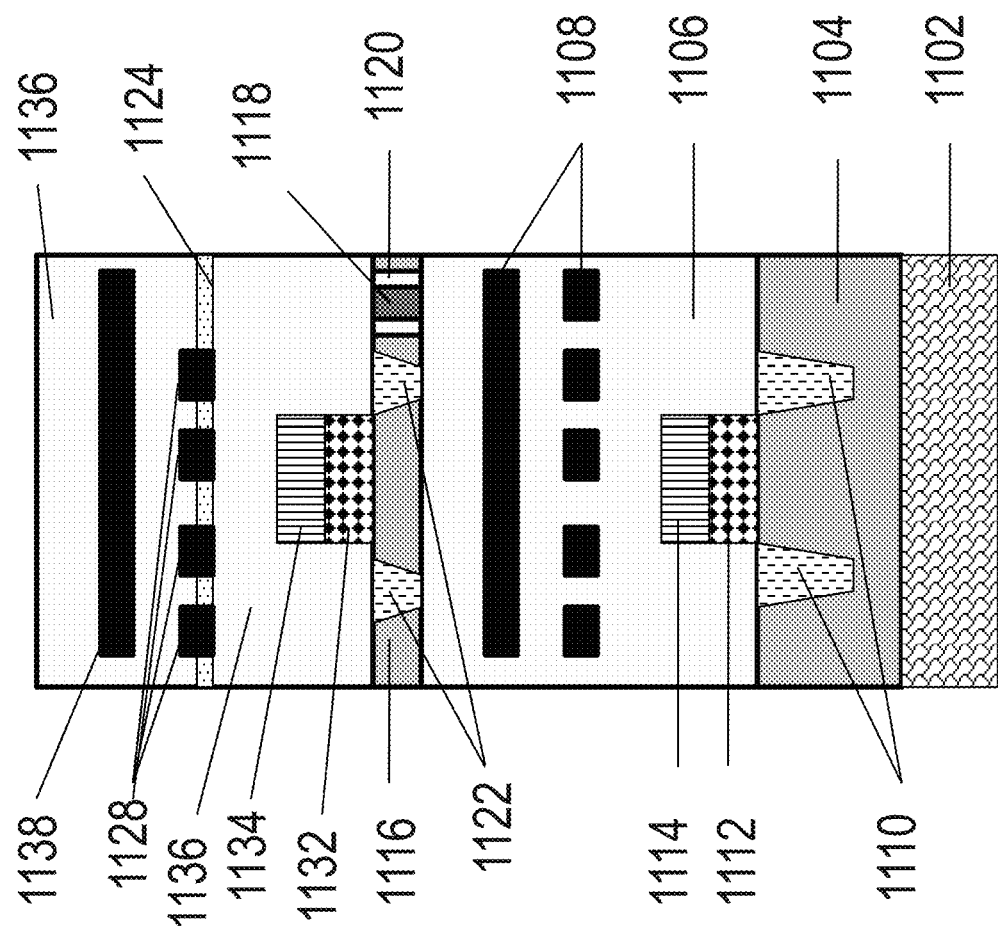
FIG. 11 is an exemplary drawing illustration of the use of thermally conductive etch stop layers for the first metal layer of 3D stacked device layers.

FIG. 11 describes an embodiment of the invention, which can provide enhanced heat removal from 3D-ICs using thermally conductive etch stop layers or regions for the first metal level of stacked device layers. The 3D-IC and associated power and ground distribution network may be formed as described in FIGS. 1, 2, 3, 4, 5, 8, 9 and 10 herein. For example, two crystalline layers, 1104 and 1116, which may include semiconductor materials such as, for example, mono-crystalline silicon, germanium, GaAs, InP, and graphene, are shown. For this illustration, mono-crystalline (single crystal) silicon may be used. Silicon layer 1116 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1104 may also be of thicknesses greater than 100 um, depending on, for example, the strength of bonding to heat removal apparatus 1102. Silicon layer 1104 may include transistors such as, for example, MOSFETS, FinFets, BJTs, HEMTs, HBTs, which may include gate electrode region 1114, gate dielectric region 1112, shallow trench isolation (STI) regions 1110 and several other regions that may be necessary for transistors such as source and drain junction regions (not shown for clarity). Silicon layer 1116 may include transistors such as, for example, MOSFETS, FinFets, BJTs, HEMTs, HBTs, which may include gate electrode region 1134, gate dielectric region 1132, shallow trench isolation (STI) regions 1122 and several other regions that may be necessary for transistors such as source and drain junction regions (not shown for clarity). A through-layer via (TLV) 1118 may be present and may include an associated surrounding dielectric region 1120. Wiring layers 1108 for silicon layer 1104 and wiring dielectric 1106 may be present and may form an associated interconnect layer or layers. Wiring layers for silicon layer 1116 may include first metal layer 1128 and other metal layers 1138 and wiring dielectric 1136 and may form an associated interconnect layer or layers. The heat removal apparatus 1102 may include, for example, a heat spreader and/or a heat sink. It can be observed that the STI regions 1122 can go right through to the bottom of silicon layer 1116 and provide good electrical isolation. This, however, can cause challenges for heat removal from the STI surrounded transistors since STI regions 1122 are typically filled with insulators such as silicon dioxide that do not conduct heat well. To tackle this issue, etch stop layer 1124 as part of the process of constructing the first metal layer 1128 of silicon layer 1116 can be substantially constructed out of a thermally conductive but electrically isolative material. Examples of such thermally conductive materials could include insulating carbon, diamond, diamond like carbon (DLC), and various other materials that provide better thermal conductivity than silicon dioxide and silicon nitride, and/or have thermal conductivity higher than 0.6 W/m-K. Thermally conductive etch-stop layer dielectric regions could be used for the first metal layer above transistors in stacked 3D device layers. While the thermally conductive etch stop layers or regions concept for 3D-ICs is described with an architecture similar to FIG. 2, similar thermally conductive etch stop layers or regions concepts could be used for architectures similar to FIG. 1, and also for other 3D IC architectures and 2D IC as well. Silicon layer 1104 and silicon layer 1116 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 1102 may include an external surface from which heat transfer may take place by methods such as air cooling, liquid cooling, or attachment to another heat sink or heat spreader structure.

Figure 12A:
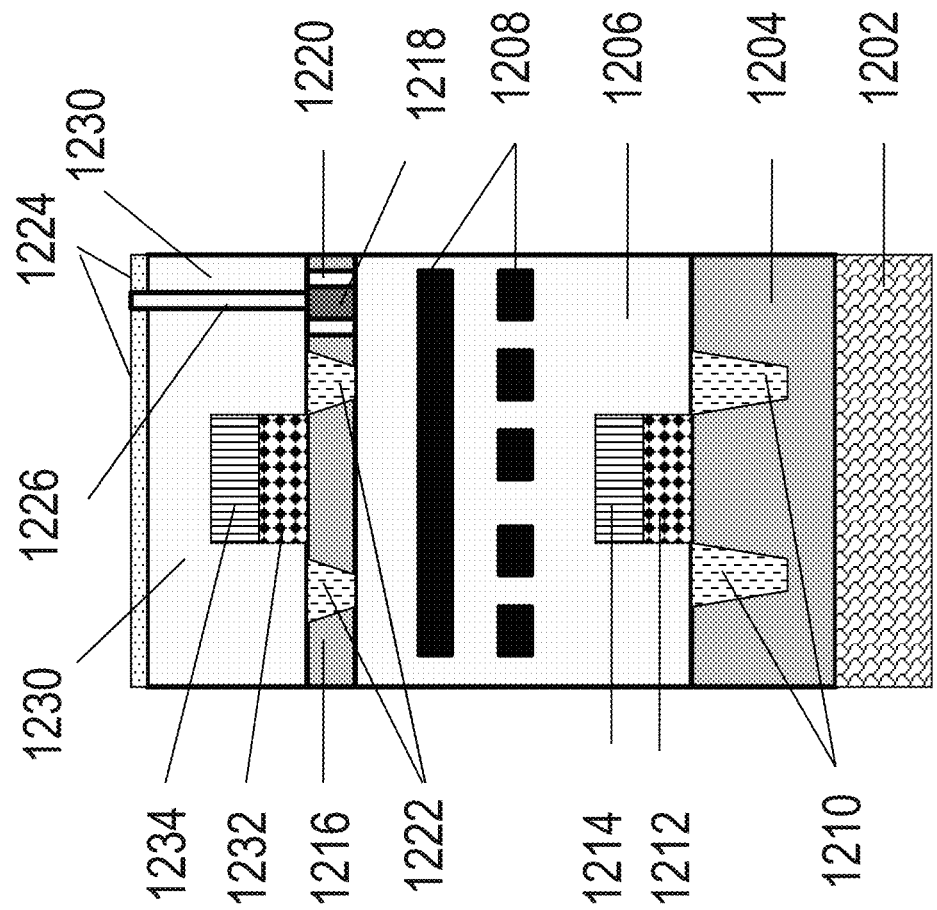
FIG. 12A-12B are exemplary drawing illustrations of the use and retention of thermally conductive hard mask layers for patterning contact layers of 3D stacked device layers.
Figure 12B:
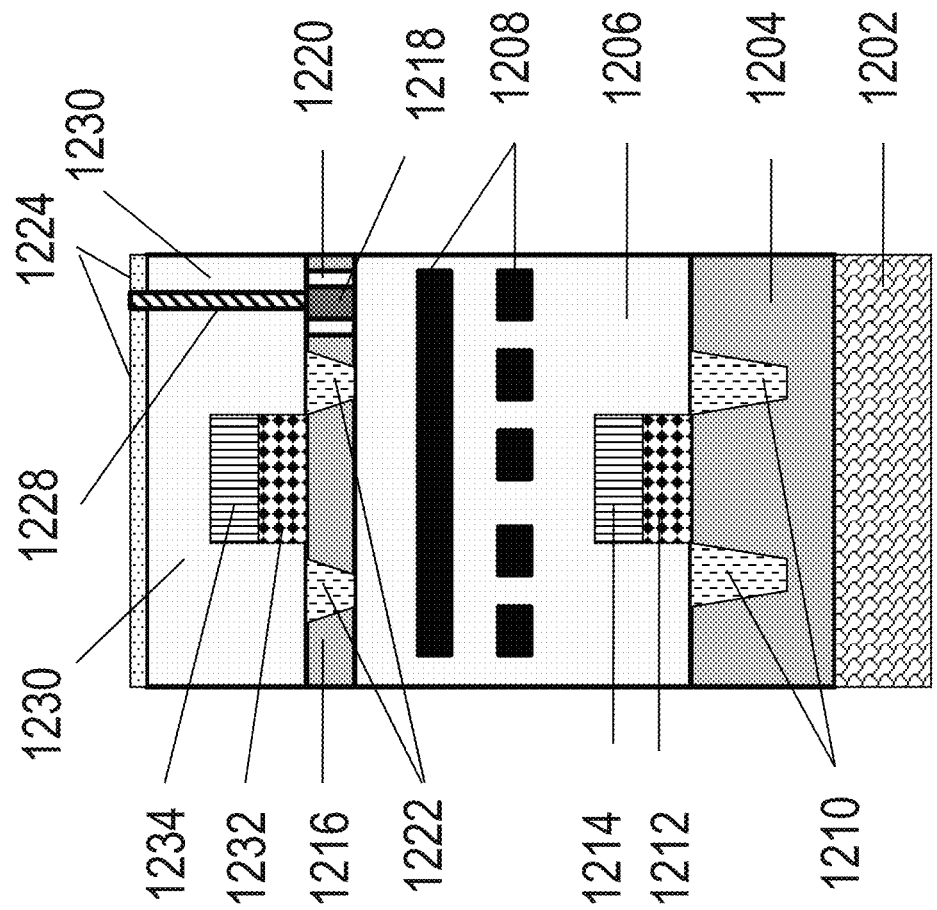

FIG. 12A-B describes an embodiment of the invention, which can provide enhanced heat removal from 3D-ICs using thermally conductive layers or regions as part of pre-metal dielectrics for stacked device layers. The 3D-IC and associated power and ground distribution network may be formed as described in FIGS. 1, 2, 3, 4, 5, 8, 9, 10 and 11 herein. For example, two crystalline layers, 1204 and 1216, are shown and may have transistors. For this illustration, mono-crystalline (single crystal) silicon may be used. Silicon layer 1216 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1204 may also be of thicknesses greater than 100 um, depending on, for example, the strength of bonding to heat removal apparatus 1202. Silicon layer 1204 may include transistors such as, for example, MOSFETS, FinFets, BJTs, HEMTs, HBTs, which may include gate electrode region 1214, gate dielectric region 1212, shallow trench isolation (STI) regions 1210 and several other regions that may be necessary for transistors such as source and drain junction regions (not shown for clarity). Silicon layer 1216 may include transistors such as, for example, MOSFETS, FinFets, BJTs, HEMTs, HBTs, which may include gate electrode region 1234, gate dielectric region 1232, shallow trench isolation (STI) regions 1222 and several other regions that may be necessary for transistors such as source and drain junction regions (not shown for clarity). A through-layer via (TLV) 1218 may be present and may include an associated surrounding dielectric region 1220. Wiring layers 1208 for silicon layer 1204 and wiring dielectric 1206 may be present and may form an associated interconnect layer or layers. Through-layer via (TLV) 1218 may connect to wiring layers 1208 and future wiring layers such as those for interconnection of silicon layer 1216 transistors (not shown). The heat removal apparatus 1202 may include a heat spreader and/or a heat sink. It can be observed that the STI regions 1222 can go right through to the bottom of silicon layer 1216 and provide good electrical isolation. This, however, can cause challenges for heat removal from the STI surrounded transistors since STI regions 1222 are typically filled with insulators such as silicon dioxide that do not conduct heat well. To tackle this issue, a technique is described in FIG. 12A-B. FIG. 12A illustrates the formation of openings for making contacts to the transistors of silicon layer 1216. A hard mask layer 1224 or region is typically used during the lithography step for contact formation and hard mask layer 1224 or region may be utilized to define contact opening regions 1226 of the pre-metal dielectric 1230 that is etched away. FIG. 12B illustrates the contact 1228 formed after metal is filled into the contact opening regions 1226 shown in FIG. 12A, and after a chemical mechanical polish (CMP) process. The hard mask layer 1224 or region used for the process shown in FIG. 12A-B may include a thermally conductive but electrically isolative material. Examples of such thermally conductive materials could include insulating carbon, diamond, diamond like carbon (DLC), and various other materials that provide better thermal conductivity than silicon dioxide and silicon nitride, and/or have thermal conductivity higher than 0.6 W/m-K and can be left behind after the process step shown in FIG. 12B (hence, electrically non-conductive). Further steps for forming the 3D-IC (such as forming additional metal layers) may be performed (not shown). While the thermally conductive materials for hard mask concept for 3D-ICs is described with an architecture similar to FIG. 2, similar thermally conductive materials for hard mask concepts could be used for architectures similar to FIG. 1, and also for other 3D IC architectures and 2D IC as well. Silicon layer 1204 and silicon layer 1216 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 1202 may include an external surface from which heat transfer may take place by methods such as air cooling, liquid cooling, or attachment to another heat sink or heat spreader structure.

FIG. 13 illustrates the layout of an exemplary 4-input NAND gate 1300, where the output OUT is a function of inputs A, B, C and D. 4-input NAND gate 1300 may include metal 1 regions 1306, gate regions 1308, N-type silicon regions 1310, P-type silicon regions 1312, contact regions 1314, and oxide isolation regions 1316. If the 4-input NAND gate 1300 is used in 3D IC stacked device layers, some regions of the NAND gate (such as, for example, sub-region 1318 of N-type silicon regions 1310) are far away from $V_{DD}$ and GND contacts of 4-input NAND gate 1300. The regions, such as sub-region 1318, could have a high thermal resistance to $V_{DD}$ and GND contacts, and could heat up to undesired temperatures. This is because the regions of the NAND gate far away from $V_{DD}$ and GND contacts cannot effectively use the low-thermal resistance power delivery network to transfer heat to the heat removal apparatus.

Figure 14:
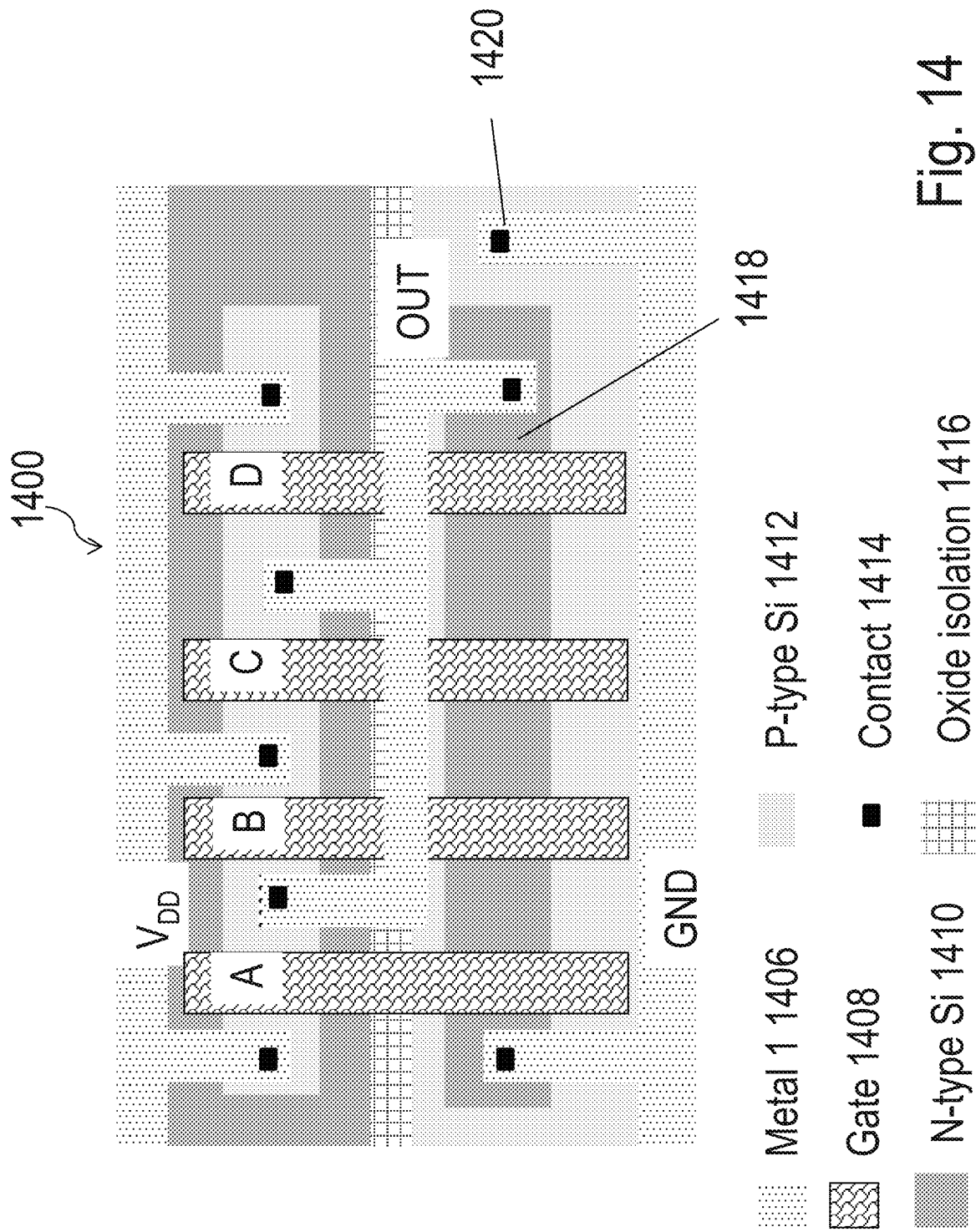
FIG. 14 is an exemplary drawing illustration of a 4 input NAND gate where substantially all parts of the logic cell can be within desirable temperature limits.

FIG. 14 illustrates an embodiment of the invention wherein the layout of exemplary 3D stackable 4-input NAND gate 1400 can be modified so that substantially all parts of the gate are at desirable temperatures during chip operation. Desirable temperatures during chip operation may depend on the type of transistors, circuits, and product application & use, and may be, for example, sub-150° C., sub-100° C., sub-75° C., sub-50° C. or sub-25° C. Inputs to the 3D stackable 4-input NAND gate 1400 are denoted as A, B, C and D, and the output is denoted as OUT. The 4-input NAND gate 1400 may include metal 1 regions 1406, gate regions 1408, N-type silicon regions 1410, P-type silicon regions 1412, contact regions 1414, and oxide isolation regions 1416. As discussed above, sub-region 1418 could have a high thermal resistance to $V_{DD}$ and GND contacts and could heat up to undesired temperatures. Thermal contact 1420 (whose implementation can be similar to those described in FIG. 6 and FIG. 7) may be added to the layout, for example as shown in FIG. 13, to keep the temperature of sub-region 1418 within desirable limits by reducing the thermal resistance from sub-region 1418 to the GND distribution network. Several other implementations of adding and placement of thermal contacts that would be appreciated by persons of ordinary skill in the art can be used to make the exemplary layout shown in FIG. 14 more desirable from a thermal perspective.

Figure 15:
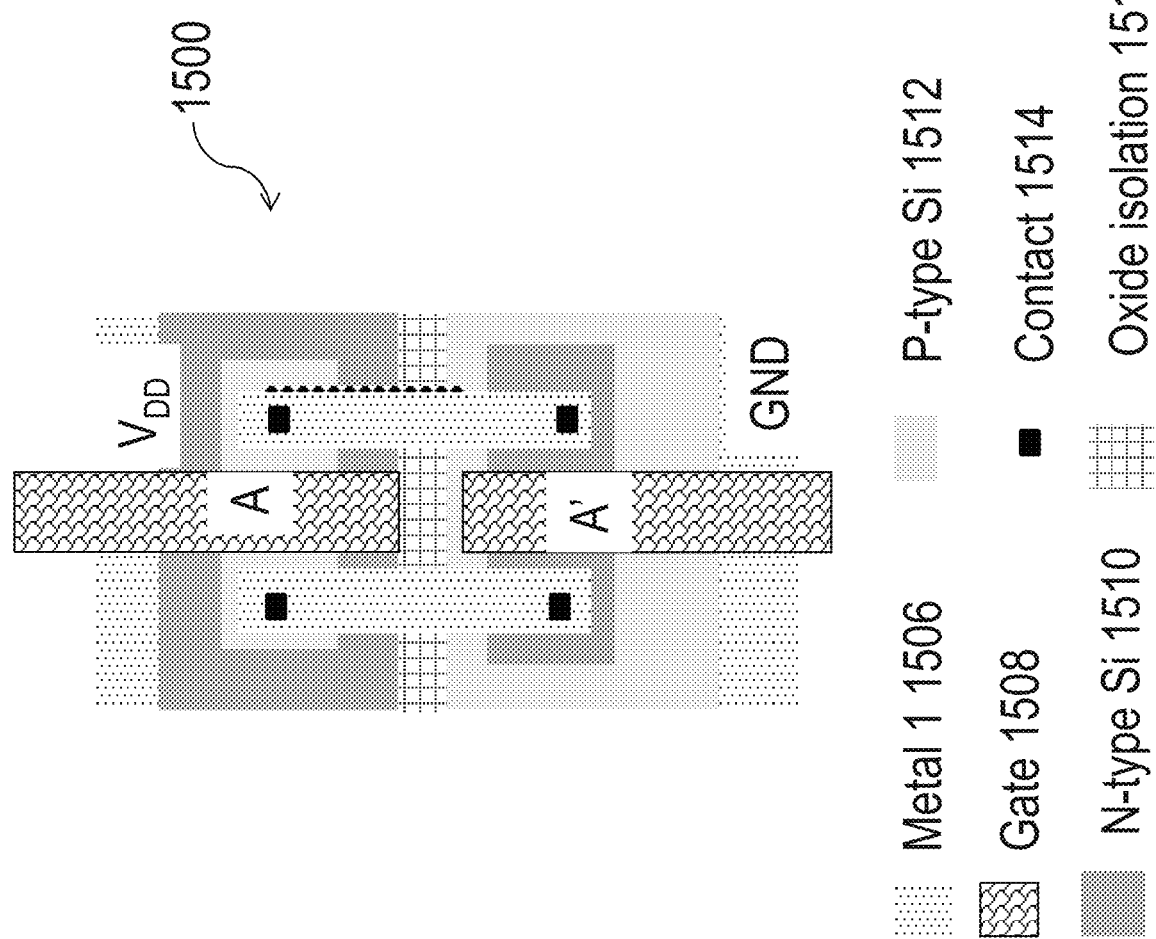
FIG. 15 is an exemplary drawing illustration of a transmission gate.

FIG. 15 illustrates the layout of an exemplary transmission gate 1500 with control inputs A and A' (A' typically the inversion of A). Transmission gate 1500 may include metal 1 regions 1506, gate regions 1508, N-type silicon regions 1510, P-type silicon regions 1512, contact regions 1514, and oxide isolation regions 1516. If transmission gate 1500 is used in 3D IC stacked device layers, some regions of the transmission gate could heat up to undesired temperatures since there are no $V_{DD}$ and GND contacts. There could be a high thermal resistance to $V_{DD}$ and GND distribution networks. Thus, the transmission gate cannot effectively use the low-thermal resistance power delivery network to transfer heat to the heat removal apparatus. Transmission gate is one example of transistor function that might not include any connection to the power grid and accordingly there may not be a good thermal path to remove the built-up heat. Sometimes in a 3D structure the transistor isolation may be achieved by etching around the transistor or transistor function substantially all of the silicon and filling it with an electrically isolative material, such as, for example, silicon oxides, which might have a poor thermal conduction. As such, the transistor or transistor function may not have an effective thermal path to remove heat build-up. There are other functions, such as, for example, SRAM select transistors and Look-Up-Table select transistors, which may use transistors with no power grid (Vdd, Vss) connections (may only have signal connections) which may be subject to the same heat removal problem.

Figure 16:
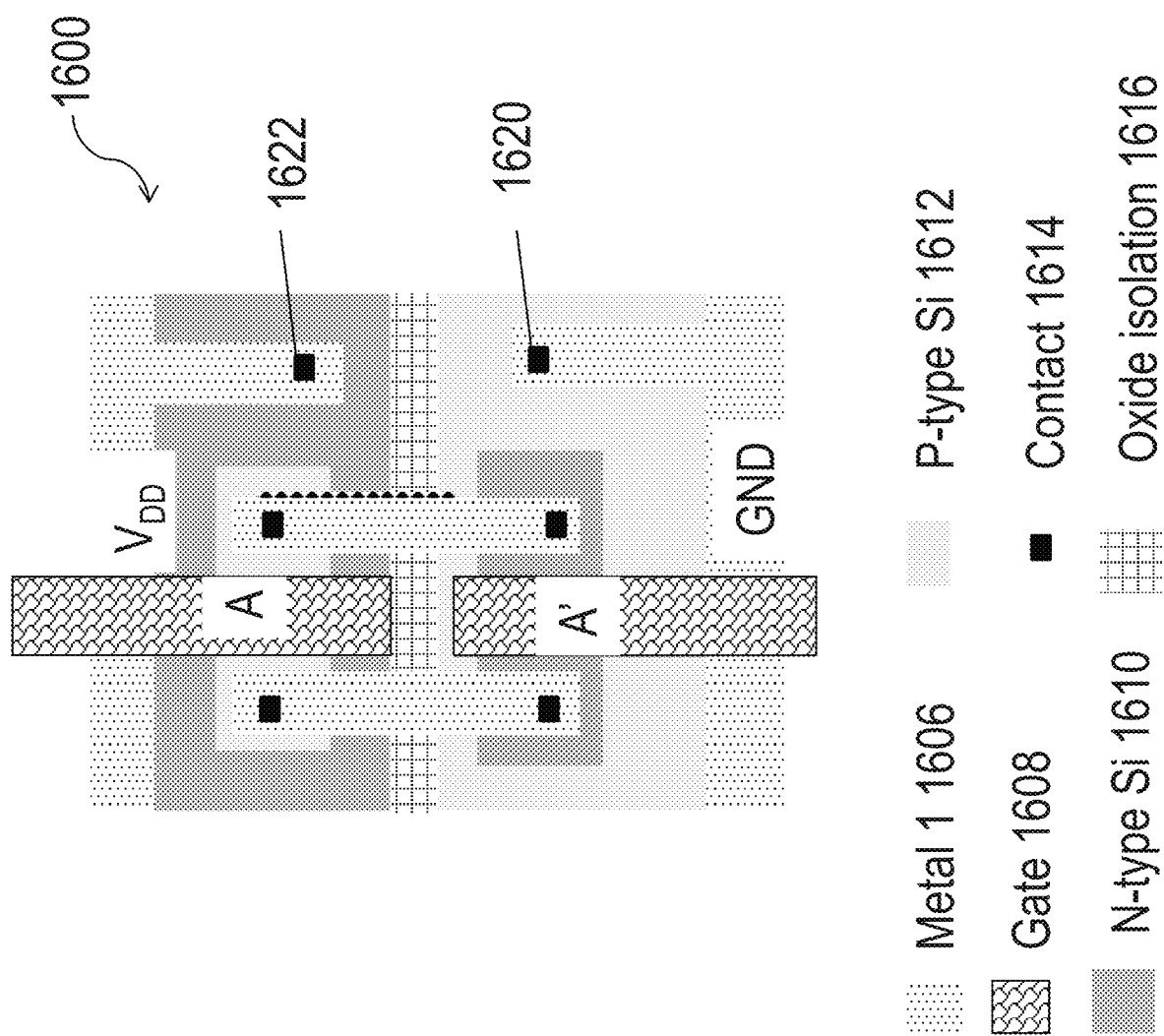
FIG. 16 is an exemplary drawing illustration of a transmission gate where substantially all parts of the logic cell can be within desirable temperature limits.

FIG. 16 illustrates an embodiment of the invention wherein the layout of exemplary 3D stackable transmission gate 1600 can be modified so that substantially all parts of the gate, channel, and transistor body are at desirable temperatures during chip operation. Desirable temperatures during chip operation may depend on the type of transistors, circuits, and product application & use, and may be, for example, sub-150° C., sub-100° C., sub-75° C., sub-50° C. or sub-25° C. Control signals to the 3D stackable transmission gate 1600 are denoted as A and A' (A' typically the inversion of A). 3D stackable transmission gate 1600 may include metal 1 regions 1606, gate regions 1608, N-type silicon regions 1610, P-type silicon regions 1612, contact regions 1614, and oxide isolation regions 1616. Thermal contacts, such as, for example thermal contact 1620 and second thermal contact 1622 (whose implementation can be similar to those described in FIG. 6 and FIG. 7) may be added to the layout shown in FIG. 15 to keep the temperature of 3D stackable transmission gate 1600 within desirable limits (by reducing the thermal resistance to the $V_{DD}$ and GND distribution networks). The thermal paths may use a reverse bias diode in at least one portion so that the thermal path may conduct heat but does not conduct current or an electric signal, and accordingly does not interfere with the proper operation of the transistor function. Several other implementations of adding and placement of thermal contacts that would be appreciated by persons of ordinary skill in the art can be used to make the exemplary layout, such as shown in FIG. 16, more desirable from a thermal perspective.

The techniques illustrated with FIG. 14 and FIG. 16 are not restricted to cells such as transmission gates and NAND gates, and can be applied to a number of cells such as, for example, SRAMs, CAMs, multiplexers and many others. Furthermore, the techniques illustrated with at least FIG. 14 and FIG. 16 can be applied and adapted to various techniques of constructing 3D integrated circuits and chips, including those described in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference. Furthermore, techniques illustrated with FIG. 14 and FIG. 16 (and other similar techniques) need not be applied to substantially all such gates on the chip, but could be applied to a portion of gates of that type, such as, for example, gates with higher activity factor, lower threshold voltage or higher drive current. Moreover, thermal contacts and vias may not have to be stacked in a vertical line through multiple stacks, layers, strata of circuits.

When a chip is typically designed a cell library consisting of various logic cells such as NAND gates, NOR gates and other gates is created, and the chip design flow proceeds using this cell library. It will be clear to one skilled in the art that a cell library may be created wherein each cell's layout can be optimized from a thermal perspective and based on heat removal criteria such as maximum allowable transistor channel temperature (for example, where each cell's layout can be optimized such that substantially all portions of the cell have low thermal resistance to the $V_{DD}$ and GND contacts, and therefore, to the power bus and the ground bus).

Figure 24:
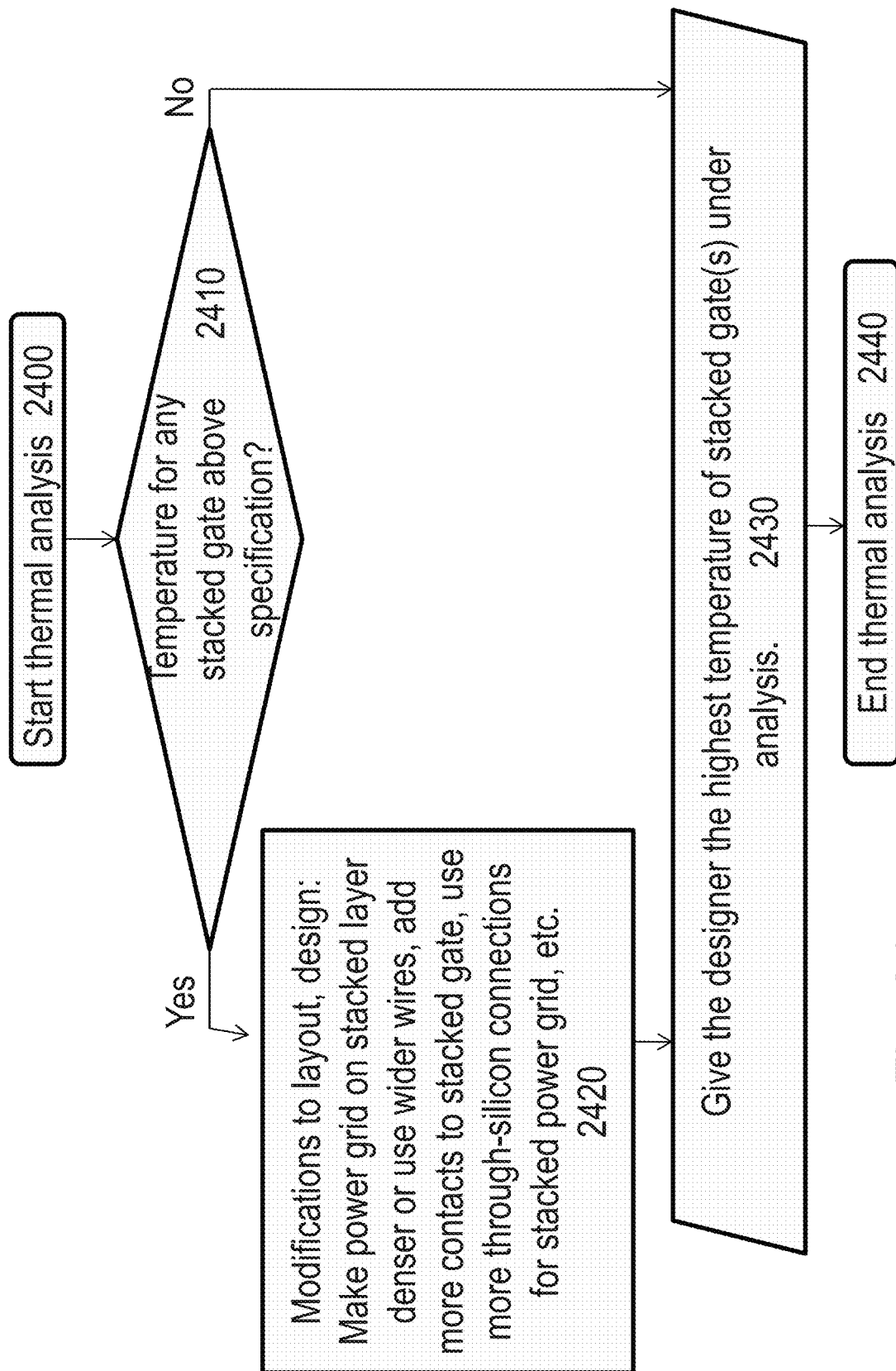
FIG. 24 is an exemplary procedure for a chip designer to ensure a good thermal profile for a design.

FIG. 24 illustrates a procedure for a chip designer to ensure a good thermal profile for his or her design. After a first pass or a portion of the first pass of the desired chip layout process is complete, a thermal analysis may be conducted to determine temperature profiles for active or passive elements, such as gates, on the 3D chip. The thermal analysis may be started (2400). The temperature of any stacked gate, or region of gates, may be calculated, for example, by simulation such as a multi-physics solver, and compared to a desired specification value (2410). If the gate, or region of gates, temperature is higher than the specification, which may, for example, be in the range of 65° C.-150° C., modifications (2420) may be made to the layout or design, such as, for example, power grids for stacked layers may be made denser or wider, additional contacts to the gate may be added, more through-silicon (TLV and/or TSV) connections may be made for connecting the power grid in stacked layers to the layer closest to the heat sink, or any other method to reduce stacked layer temperature that may be described herein or in referenced documents, which may be used alone or in combination. The output (2430) may give the designer the temperature of the modified stacked gate ('Yes' tree), or region of gates, or an unmodified one ('No' tree), and may include the original un-modified gate temperature that was above the desired specification. The thermal analysis may end (2440) or may be iterated. Alternatively, the power grid may be designed (based on heat removal criteria) simultaneously with the logic gates and layout of the design, or for various regions of any layer of the 3D integrated circuit stack. The density of TLVs may be greater than 104 per cm², and may be 10×, 100×, 1000×, denser than TSVs.

Figure 22:
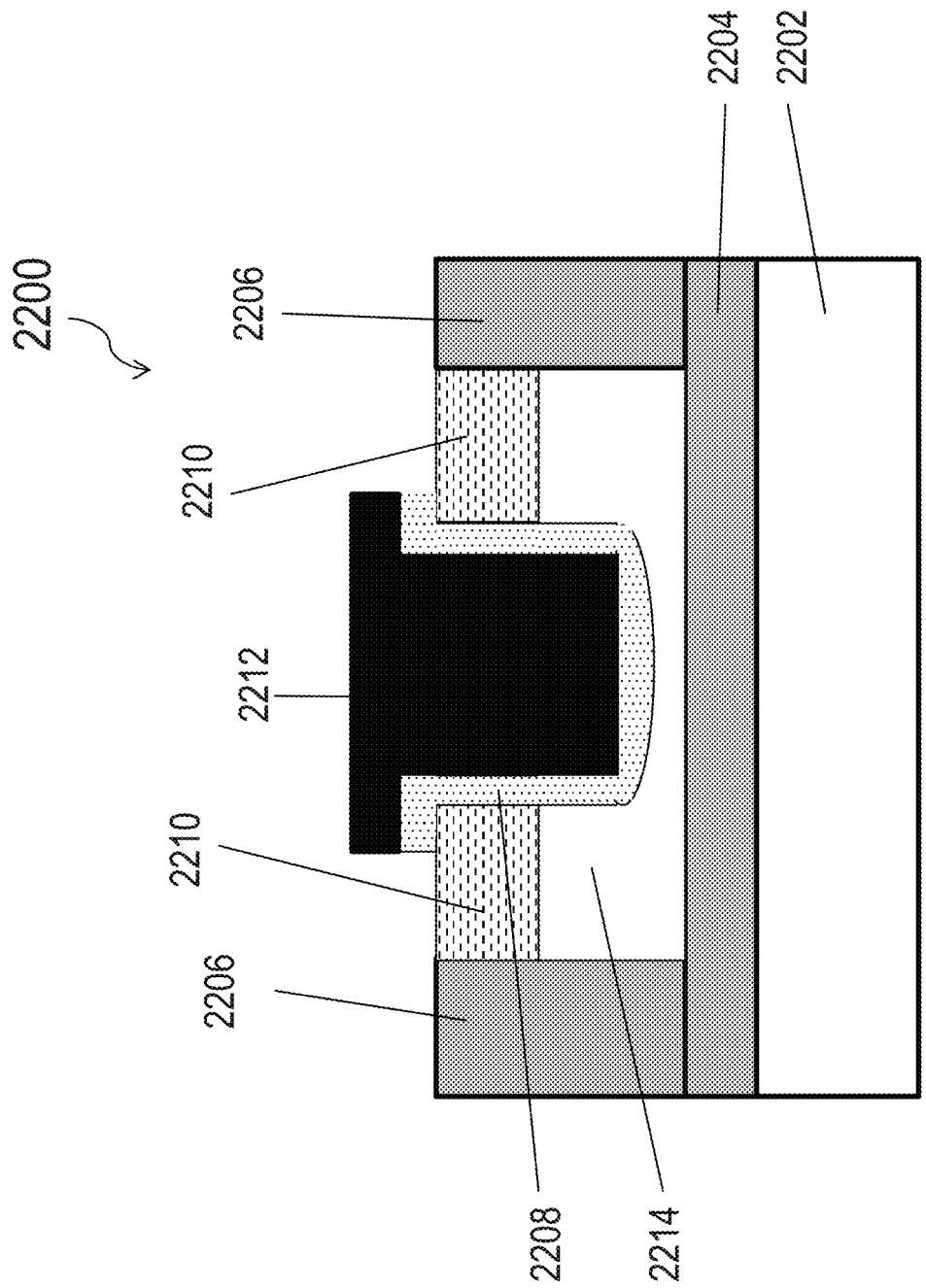
FIG. 22 is an exemplary drawing illustration of a recessed channel transistor (RCAT)

Recessed channel transistors form a transistor family that can be stacked in 3D. FIG. 22 illustrates an exemplary Recessed Channel Transistor 2200 which may be constructed in a 3D stacked layer using procedures outlined in U.S. Pat. No. 8,273,610, US patent publications 2012/0091587 and 2013/0020707, and pending U.S. patent application Ser. Nos. 13/441,923 and 13/099,010. The contents of the foregoing patent and applications are incorporated herein by reference. Recessed Channel Transistor 2200 may include 2202 a bottom layer of transistors and wires 2202, oxide layer 2204, oxide regions 2206, gate dielectric 2208, n+ silicon regions 2210, gate electrode 2212 and region of p− silicon region 2214. The recessed channel transistor is surrounded on substantially all sides by thermally insulating oxide layers oxide layer 2204 and oxide regions 2206, and heat removal may be a serious issue. Furthermore, to contact the p− silicon region 2214, a p+ region may be needed to obtain low contact resistance, which may not be easy to construct at temperatures lower than approximately 400° C.

Figure 17C:
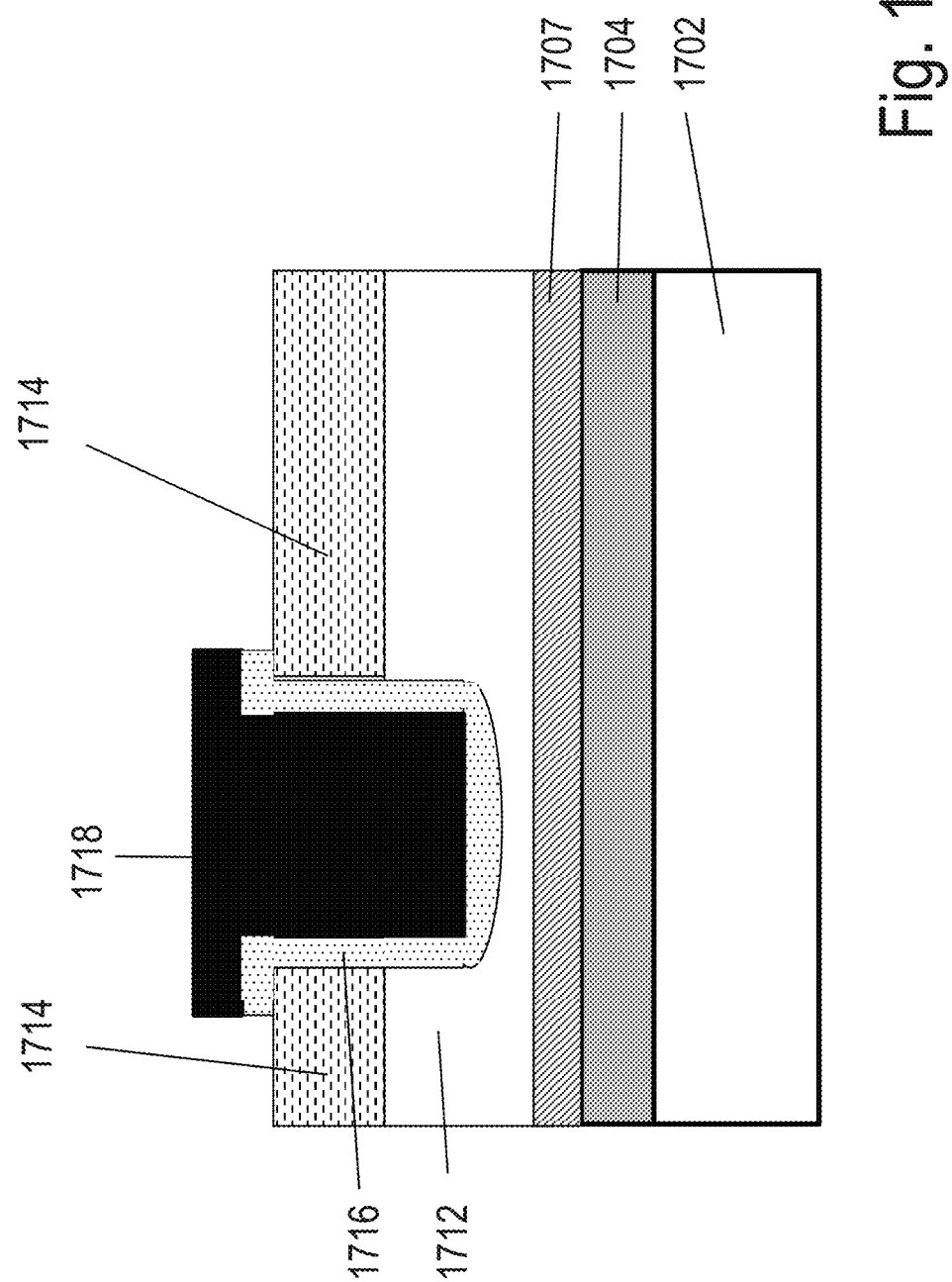
Figure 17D:
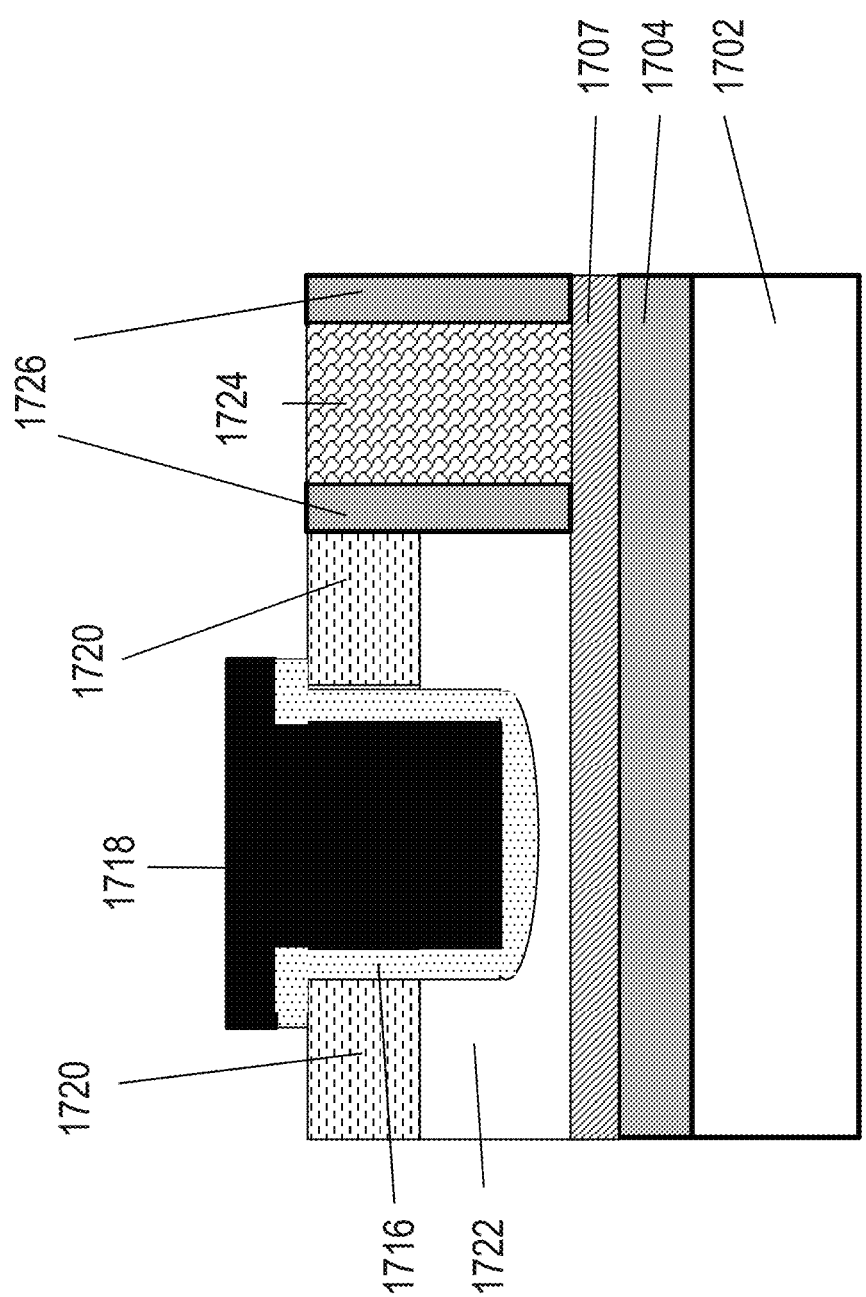

FIG. 17A-D illustrates an embodiment of the invention wherein thermal contacts can be constructed to a recessed channel transistor. Note that numbers used in FIG. 17A-D are inter-related. For example, if a certain number is used in FIG. 17A, it has the same meaning if present in FIG. 17B. The process flow may begin as illustrated in FIG. 17A with a bottom layer or layers of transistors and copper interconnects 1702 being constructed with a silicon dioxide layer 1704 atop it. Layer transfer approaches similar to those described in U.S. Pat. No. 8,273,610, US patent publications 2012/0091587 and 2013/0020707, and pending U.S. patent application Ser. Nos. 13/441,923 and 13/099,010 may be utilized. The contents of the foregoing patent and applications are incorporated herein by reference. An activated layer of p+ silicon 1706, an activated layer of p− silicon 1708 and an activated layer of n+ silicon 1710 can be transferred atop the structure illustrated in FIG. 17A to form the structure illustrated in FIG. 17B. FIG. 17C illustrates a next step in the process flow. After forming isolation regions such as, for example, STI-Shallow Trench Isolation (not shown in FIG. 17C for simplicity) and thus forming p+ regions 1707, gate dielectric regions 1716 and gate electrode regions 1718 could be formed, for example, by etch and deposition processes, using procedures similar to those described in U.S. Pat. No. 8,273,610, US patent publications 2012/0091587 and 2013/0020707, and pending U.S. patent application Ser. Nos. 13/441,923 and 13/099,010. Thus, p− silicon region 1712 and n+ silicon regions 1714 may be formed. FIG. 17C thus illustrates an RCAT (recessed channel transistor) formed with a p+ silicon region atop copper interconnect regions where the copper interconnect regions are not exposed to temperatures higher than approximately 400° C. FIG. 17D illustrates a next step of the process where thermal contacts could be made to the p+ silicon region 1707. FIG. 17D may include final p− silicon region 1722 and final n+ silicon regions 1720. Via 1724 may be etched and constructed, for example, of metals (such as Cu, Al, W, degenerately doped Si), metal silicides ($WSi_2$) or a combination of the two, and may include oxide isolation regions 1726. Via 1724 can connect p+ region 1707 to the ground (GND) distribution network. Via 1724 could alternatively be connected to a body bias distribution network. Via 1724 and final n+ silicon regions 1720 may be electrically coupled, such as by removal of a portion of an oxide isolation regions 1726, if desired for circuit reasons (not shown). The nRCAT could have its body region connected to GND potential (or body bias circuit) and operate correctly or as desired, and the heat produced in the device layer can be removed through the low-thermal resistance GND distribution network to the heat removal apparatus (not shown for clarity).

Figure 18:
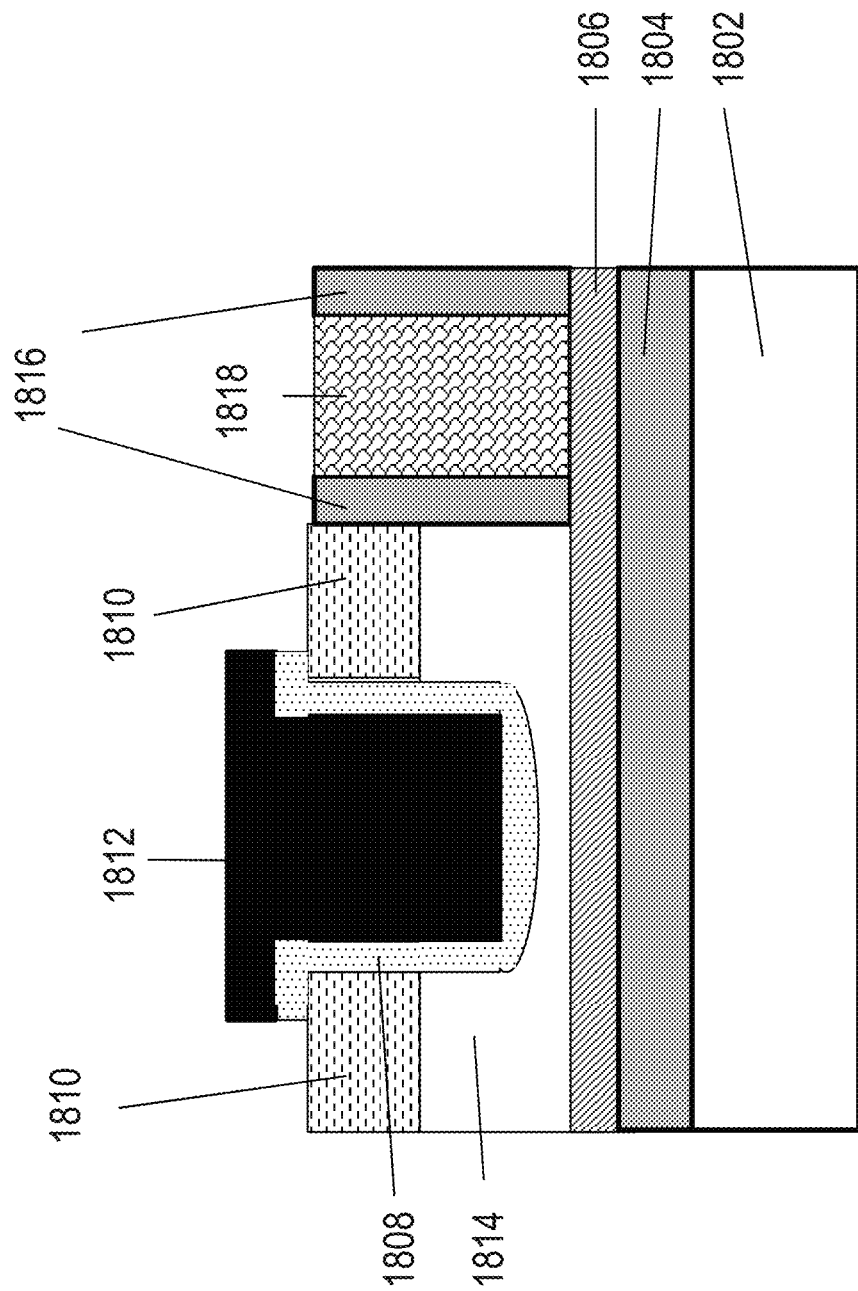
FIG. 18 is an exemplary drawing illustration of a pMOS recessed channel transistor with thermal contacts.

FIG. 18 illustrates an embodiment the invention, which illustrates the application of thermal contacts to remove heat from a pRCAT device layer that is stacked above a bottom layer of transistors and wires 1802. The p-RCAT layer may include 1804 buried oxide region 1804, n+ silicon region 1806, n− silicon region 1814, p+ silicon region 1810, gate dielectric 1808 and gate electrode 1812. The structure shown in FIG. 18 can be constructed using methods similar to those described in respect to FIG. 17A-D above. The thermal contact 1818 could be constructed of, for example, metals (such as Cu, Al, W, degenerately doped Si), metal silicides ($WSi_2$) or a combination of two or more types of materials, and may include oxide isolation regions 1816. Thermal contact 1818 may connect n+ region 1806 to the power ($V_{DD}$) distribution network. The pRCAT could have its body region connected to the supply voltage ($V_{DD}$) potential (or body bias circuit) and operate correctly or as desired, and the heat produced in the device layer can be removed through the low-thermal resistance $V_{DD}$ distribution network to the heat removal apparatus. Thermal contact 1818 could alternatively be connected to a body bias distribution network (not shown for clarity). Thermal contact 1818 and p+ silicon region 1810 may be electrically coupled, such as by removal of a portion of an oxide isolation regions 1816, if desired for circuit reasons (not shown).

Figure 19:
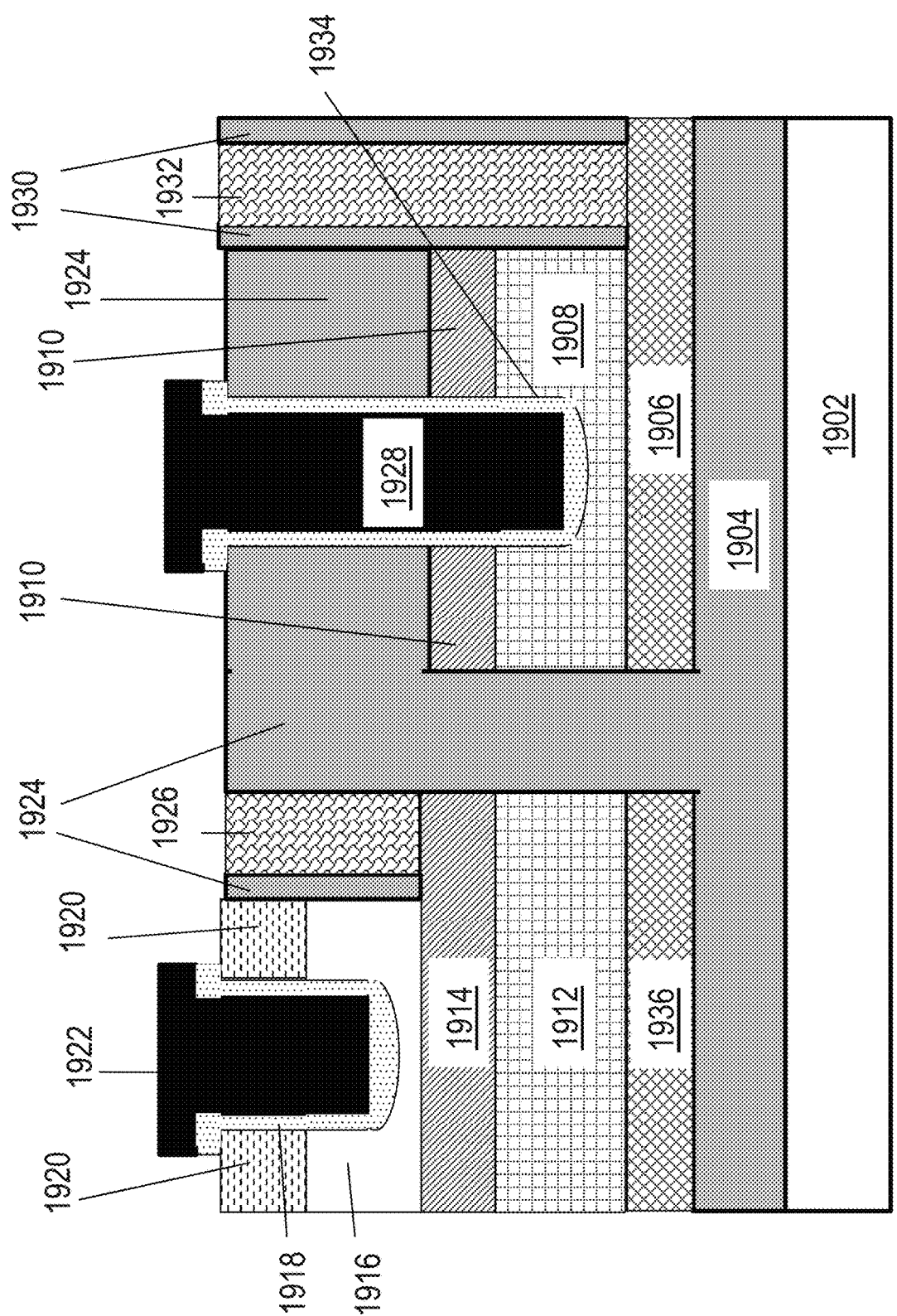
FIG. 19 is an exemplary drawing illustration of a CMOS circuit with recessed channel transistors and thermal contacts.

FIG. 19 illustrates an embodiment of the invention that describes the application of thermal contacts to remove heat from a CMOS device layer that could be stacked atop a bottom layer of transistors and wires 1902. The CMOS device layer may include insulator regions 1904, sidewall insulator regions 1924, thermal via insulator regions 1930, such as silicon dioxide. The CMOS device layer may include nMOS p+ silicon region 1906, pMOS p+ silicon region 1936, nMOS p− silicon region 1908, pMOS buried p− silicon region 1912, nMOS n+ silicon regions 1910, pMOS n+ silicon 1914, pMOS n− silicon region 1916, p+ silicon regions 1920, pMOS gate dielectric region 1918, pMOS gate electrode region 1922, nMOS gate dielectric region 1934 and nMOS gate electrode region. A nMOS transistor could therefore be formed of regions 1934, 1928, 1910, 1908 and 1906. A pMOS transistor could therefore be formed of regions 1914, 1916, 1918, 1920 and 1922. This stacked CMOS device layer could be formed with procedures similar to those described in U.S. Pat. No. 8,273,610, US patent publications 2012/0091587 and 2013/0020707, and pending U.S. patent application Ser. Nos. 13/441,923 and 13/099,010 and at least FIG. 17A-D herein. The thermal contact 1926 may be connected between n+ silicon region 1914 and the power ($V_{DD}$) distribution network and helps remove heat from the pMOS transistor. This is because the pMOSFET could have its body region connected to the supply voltage ($V_{DD}$) potential or body bias distribution network and operate correctly or as desired, and the heat produced in the device layer can be removed through the low-thermal resistance $V_{DD}$ distribution network to the heat removal apparatus as previously described. The thermal contact 1932 may be connected between p+ silicon region 1906 and the ground (GND) distribution network and helps remove heat from the nMOS transistor. This is because the nMOSFET could have its body region connected to GND potential or body bias distribution network and operate correctly or as desired, and the heat produced in the device layer can be removed through the low-thermal resistance GND distribution network to the heat removal apparatus as previously described.

Figure 20:
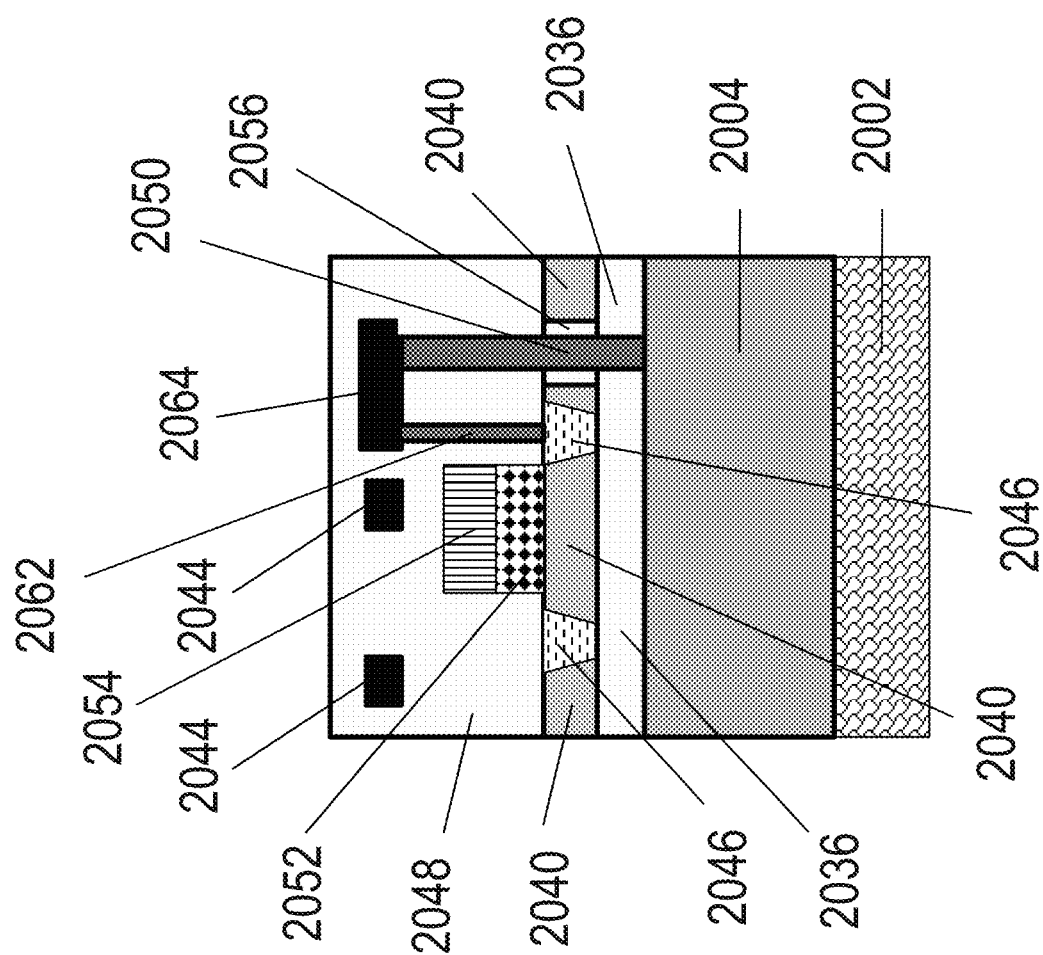
FIG. 20 is an exemplary drawing illustration of a technique to remove heat more effectively from silicon-on-insulator (SOI) circuits.

FIG. 20 illustrates an embodiment of the invention that describes a technique that could reduce heat-up of transistors fabricated on silicon-on-insulator (SOI) substrates. SOI substrates have a buried oxide (BOX) or other insulator between the silicon transistor regions and the heat sink. This BOX region may have a high thermal resistance, and makes heat transfer from the transistor regions to the heat sink difficult. The nMOS transistor in SOI may include buried oxide regions 2036, BEOL metal insulator regions 2048, and STI insulator regions 2056, such as silicon dioxide. The nMOS transistor in SOI may include n+ silicon regions 2046, p− silicon regions 2040, gate dielectric region 2052, gate electrode region 2054, interconnect wiring regions 2044, and highly doped silicon substrate 2004. Use of silicon-on-insulator (SOI) substrates may lead to low heat transfer from the transistor regions to the heat removal apparatus 2002 through the buried oxide regions 2036 (generally a layer) that may have low thermal conductivity. The ground contact 2062 of the nMOS transistor shown in FIG. 20 can be connected to the ground distribution network wiring 2064 which in turn can be connected with a low thermal resistance connection 2050 to highly doped silicon substrate 2004. This enables low thermal conductivity, a thermal conduction path, between the transistor shown in FIG. 20 and the heat removal apparatus 2002. While FIG. 20 described how heat could be transferred among an nMOS transistor and the heat removal apparatus, similar approaches can also be used for pMOS transistors, and many other transistors, for example, FinFets, BJTs, HEMTs, and HBTs. Many of the aforementioned transistors may be constructed as fully depleted channel devices. The heat removal apparatus 2002 may include an external surface from which heat transfer may take place by methods such as air cooling, liquid cooling, or attachment to another heat sink or heat spreader structure.

Figure 21:
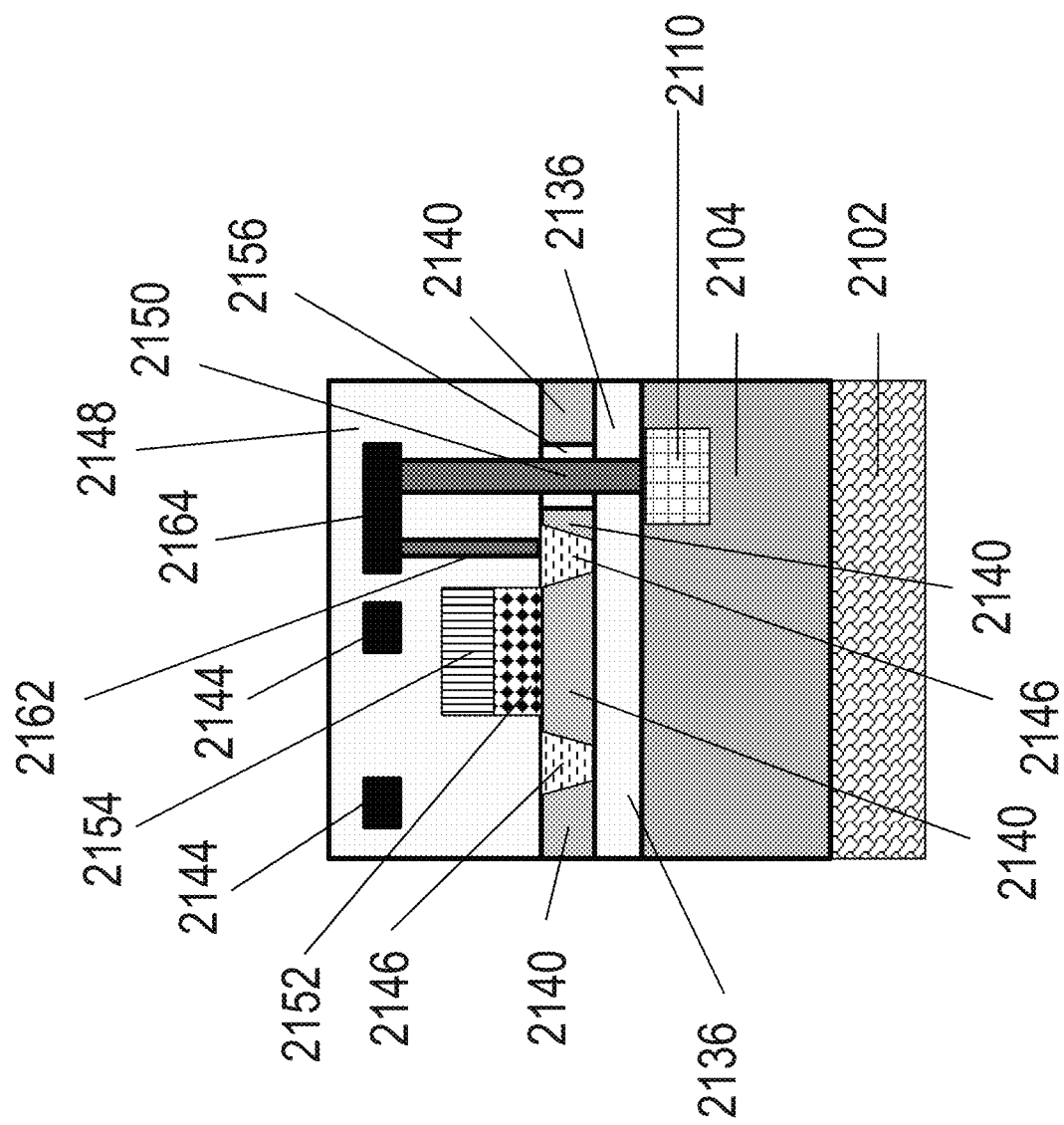
FIG. 21 is an exemplary drawing illustration of an alternative technique to remove heat more effectively from silicon-on-insulator (SOI) circuits.

FIG. 21 illustrates an embodiment of the invention which describes a technique that could reduce heat-up of transistors fabricated on silicon-on-insulator (SOI) substrates. The nMOS transistor in SOI may include buried oxide regions 2136, BEOL metal insulator regions 2148, and STI insulator regions 2156, such as silicon dioxide. The nMOS transistor in SOI may include n+ silicon regions 2146, p− silicon regions 2140, gate dielectric region 2152, gate electrode region 2154, interconnect wiring regions 2144, and highly doped silicon substrate 2104. Use of silicon-on-insulator (SOI) substrates may lead to low heat transfer from the transistor regions to the heat removal apparatus 2102 through the buried oxide regions 2136 (generally a layer) that may have low thermal conductivity. The ground contact 2162 of the nMOS transistor shown in FIG. 21 can be connected to the ground distribution network 2164 which in turn can be connected with a low thermal resistance connection 2150 to highly doped silicon substrate 2104 through an implanted and activated region 2110. The implanted and activated region 2110 could be such that thermal contacts similar to those in FIG. 6 can be formed. This may enable low thermal conductivity, a thermal conduction path, between the transistor shown in FIG. 21 and the heat removal apparatus 2102. This thermal conduction path, whilst thermally conductive, may not be electrically conductive (due to the reverse biased junctions that could be constructed in the path), and thus, not disturb the circuit operation. While FIG. 21 described how heat could be transferred among the nMOS transistor and the heat removal apparatus, similar approaches can also be used for pMOS transistors, and other transistors, for example, FinFets, BJTs, HEMTs, and HBTs.

Figure 23:
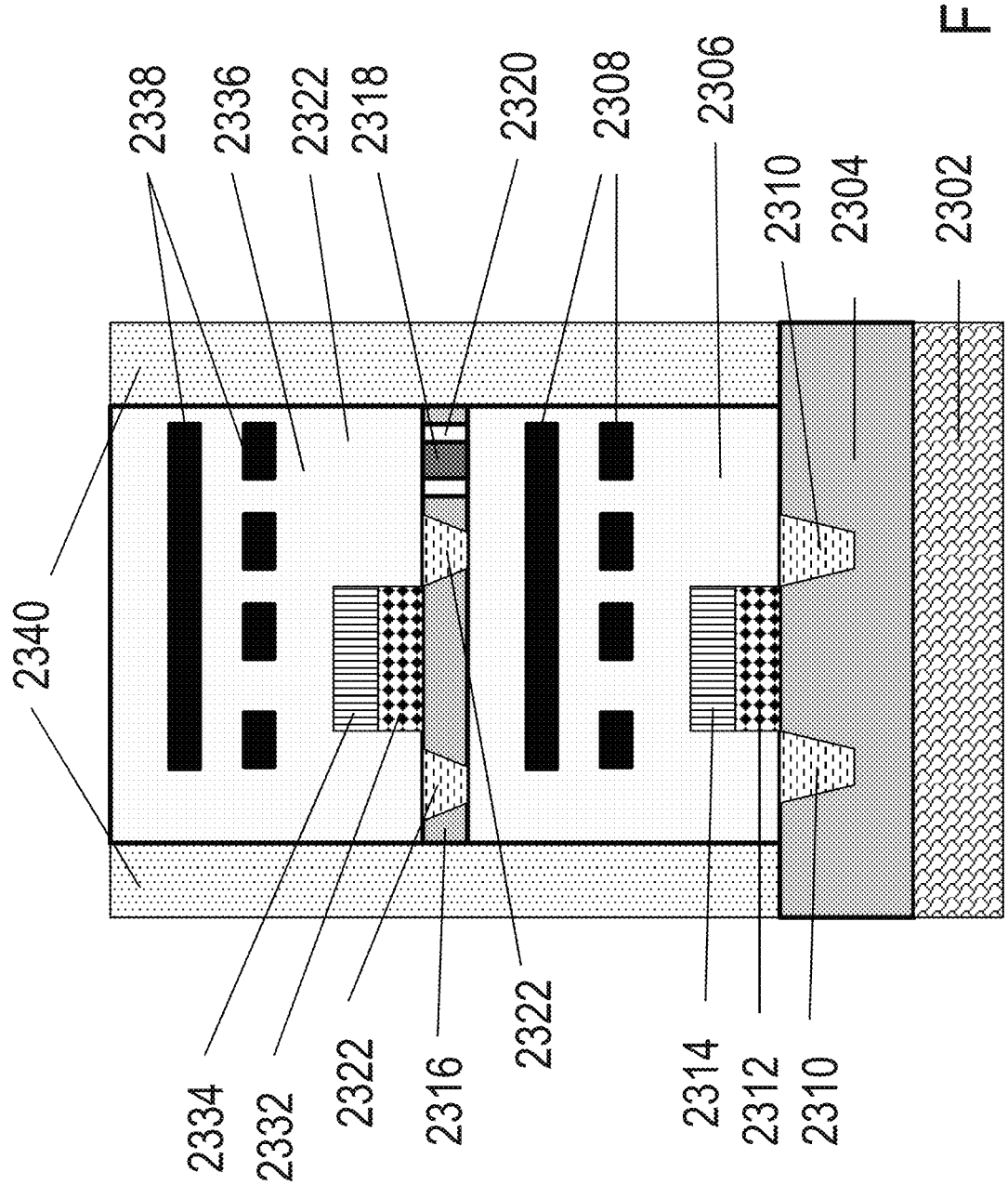
FIG. 23 is an exemplary drawing illustration of a 3D-IC with thermally conductive material on the sides.

FIG. 23 illustrates an embodiment of the invention wherein heat spreading regions may be located on the sides of 3D-ICs. The 3D integrated circuit shown in FIG. 23 could be potentially constructed using techniques described in U.S. Pat. No. 8,273,610, US patent publications 2012/0091587 and 2013/0020707, and pending U.S. patent application Ser. Nos. 13/441,923 and 13/099,010. For example, two crystalline layers, 2304 and 2316, which may include semiconductor materials such as, for example, mono-crystalline silicon, germanium, GaAs, InP, and graphene, are shown. For this illustration, mono-crystalline (single crystal) silicon may be used. Silicon layer 2316 could be thinned from its original thickness, and its final thickness could be in the range of about 0.01 um to about 50 um, for example, 10 nm, 100 nm, 200 nm, 0.4 um, 1 um, 2 um or 5 um. Silicon layer 2304 could be thinned down from its original thickness, and its final thickness could be in the range of about 0.01 um to about 50 um, for example, 0 nm, 100 nm, 200 nm, 0.4 um, 1 um, 2 um or 5 um; however, due to strength considerations, silicon layer 2304 may also be of thicknesses greater than 100 um, depending on, for example, the strength of bonding to heat removal apparatus 2302. Silicon layer 2304 may include transistors such as, for example, MOSFETS, FinFets, BJTs, HEMTs, HBTs, which may include gate electrode region 2314, gate dielectric region 2312, and shallow trench isolation (STI) regions 2310 and several other regions that may be necessary for transistors such as source and drain junction regions (not shown for clarity). Silicon layer 2316 may include transistors such as, for example, MOSFETS, FinFets, BJTs, HEMTs, HBTs, which may include gate electrode region 2334, gate dielectric region 2332, and shallow trench isolation (STI) regions 2322 and several other regions that may be necessary for transistors such as source and drain junction regions (not shown for clarity). It can be observed that the STI regions 2322 can go right through to the bottom of silicon layer 2316 and provide good electrical isolation. A through-layer via (TLV) 2318 may be present and may include an associated surrounding dielectric region 2320. Dielectric region 2320 may include a shallow trench isolation region. Wiring layers 2308 for silicon layer 2304 and wiring dielectric 2306 may be present and may form an associated interconnect layer or layers. Wiring layers 2338 for silicon layer 2316 and wiring dielectric 2336 may be present and may form an associated interconnect layer or layers. Through-layer via (TLV) 2318 may connect to wiring layers 2308 and wiring layers 2338 (not shown). The heat removal apparatus 2302 may include a heat spreader and/or a heat sink. Thermally conductive material regions 2340 could be present at the sides of the 3D-IC shown in FIG. 23. Thermally conductive material regions 2340 may be formed by sequential layer by layer etch and fill, or by an end of process etch and fill. Thus, a thermally conductive heat spreading region could be located on the sidewalls of a 3D-IC. The thermally conductive material regions 2340 could include dielectrics such as, for example, insulating carbon, diamond, diamond like carbon (DLC), and other dielectrics that have a thermal conductivity higher than silicon dioxide and/or have a thermal conductivity higher than 0.6 W/m-K. Another method that could be used for forming thermally conductive material regions 2340 could involve depositing and planarizing the thermally conductive material at locations on or close to the dicing regions, such as potential dicing scribe lines (described in U.S. Patent Application Publication 2012/0129301) of a 3D-IC after an etch process. The wafer could be diced. Those of ordinary skill in the art will appreciate that one could combine the concept of having thermally conductive material regions on the sidewalls of 3D-ICs with concepts shown in other figures of this patent application, such as, for example, the concept of having lateral heat spreaders shown in FIG. 8. Silicon layer 2304 and silicon layer 2316 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 2302 may include an external surface from which heat transfer may take place by methods such as air cooling, liquid cooling, or attachment to another heat sink or heat spreader structure.

Figure 25:
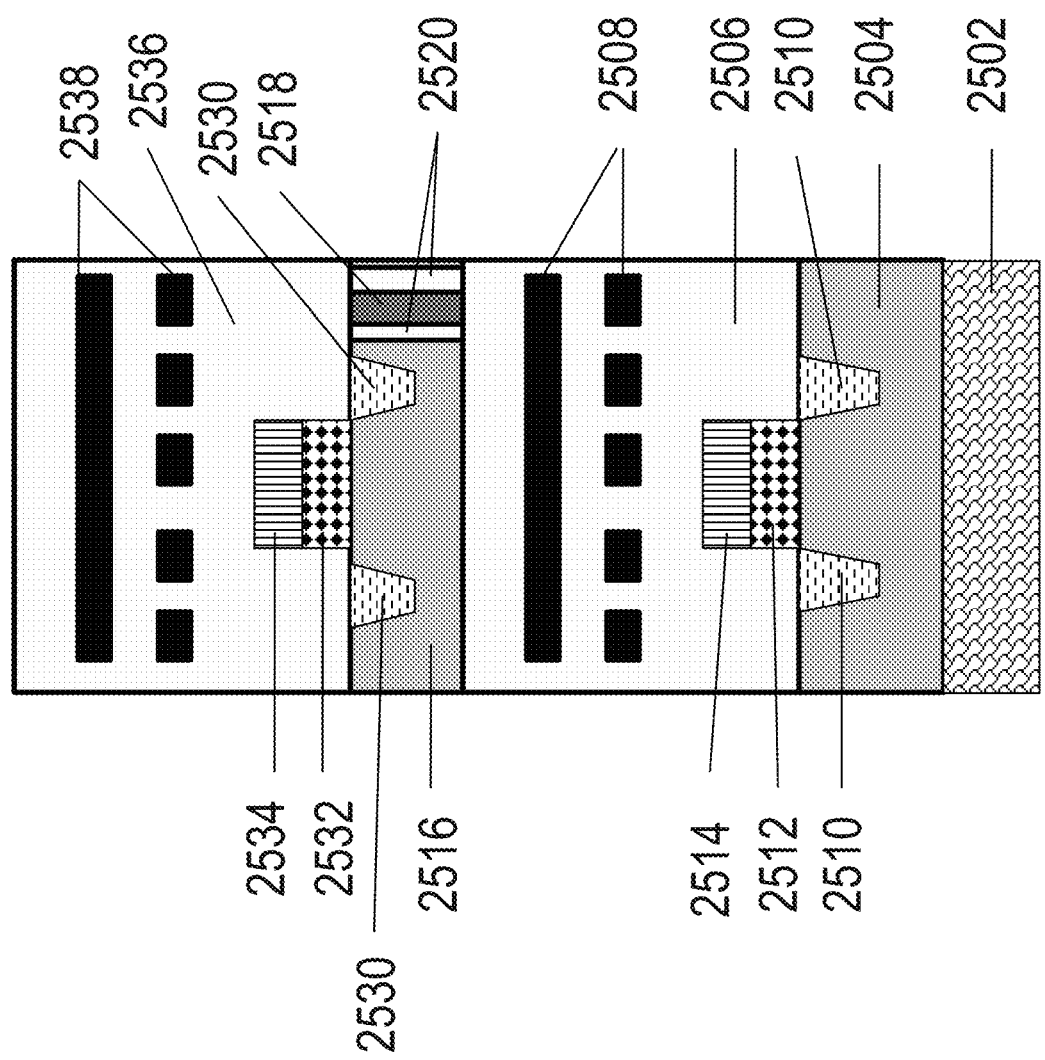
FIG. 25 is an exemplary drawing illustration of a monolithic 3D-IC structure with CTE adjusted through layer connections.

FIG. 25 illustrates an exemplary monolithic 3D integrated circuit. The 3D integrated circuit shown in FIG. 25 could be potentially constructed using techniques described in U.S. Pat. No. 8,273,610, US patent publications 2012/0091587 and 2013/0020707, and pending U.S. patent application Ser. Nos. 13/441,923 and 13/099,010. For example, two crystalline layers, 2504 and 2516, which may include semiconductor materials such as, for example, mono-crystalline silicon, germanium, GaAs, InP, and graphene, are shown. For this illustration, mono-crystalline (single crystal) silicon may be used. Silicon layer 2516 could be thinned from its original thickness, and its final thickness could be in the range of about 0.01 um to about 50 um, for example, 10 nm, 100 nm, 200 nm, 0.4 um, 1 um, 2 um or 5 um. Silicon layer 2504 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 2504 may also be of thicknesses greater than 100 um, depending on, for example, the strength of bonding to heat removal apparatus 2502. Silicon layer 2504, or silicon substrate, may include transistors such as, for example, MOSFETS, FinFets, BJTs, HEMTs, HBTs, which may include gate electrode region 2514, gate dielectric region 2512, transistor junction regions 2510 and several other regions that may be necessary for transistors such as source and drain junction regions (not shown for clarity). Silicon layer 2516 may include transistors such as, for example, MOSFETS, FinFets, BJTs, HEMTs, HBTs, which may include gate electrode region 2534, gate dielectric region 2532, transistor junction regions 2530 and several other regions that may be necessary for transistors such as source and drain junction regions (not shown for clarity). A through-silicon connection 2518, or TLV (through-silicon via) could be present and may have a surrounding dielectric region 2520. Surrounding dielectric region 2520 may include a shallow trench isolation (STI) region, such as one of the shallow trench isolation (STI) regions typically in a 3D integrated circuit stack (not shown). Silicon layer 2504 may have wiring layers 2508 and wiring dielectric 2506. Wiring layers 2508 and wiring dielectric 2506 may form an associated interconnect layer or layers. Silicon layer 2516 may have wiring layers 2538 and wiring dielectric 2536. Wiring layers 2538 and wiring dielectric 2536 may form an associated interconnect layer or layers. Wiring layers 2538 and wiring layers 2508 may be constructed of copper, aluminum or other materials with bulk resistivity lower than 2.8 uohm-cm. The choice of materials for through-silicon connection 2518 may be challenging. If copper is chosen as the material for through-silicon connection 2518, the coefficient of thermal expansion (CTE) mismatch between copper and the surrounding mono-crystalline silicon layer 2516 may become an issue. Copper has a CTE of approximately 16.7 ppm/K while silicon has a CTE of approximately 3.2 ppm/K. This large CTE mismatch may cause reliability issues and the need for large keep-out zones around the through-silicon connection 2518 wherein transistors cannot be placed. If transistors are placed within the keep-out zone of the through-silicon connection 2518, their current-voltage characteristics may be different from those placed in other areas of the chip. Similarly, if Aluminum (CTE=23 ppm/K) is used as the material for through-silicon connection 2518, its CTE mismatch with the surrounding mono-crystalline silicon layer 2516 could cause large keep-out zones and reliability issues. Silicon layer 2504 and silicon layer 2516 may be may be substantially absent of semiconductor dopants to form an undoped silicon region or layer, or doped, such as, for example, with elemental or compound species that form a p+, or p, or p−, or n+, or n, or n− silicon layer or region.

An embodiment of the invention utilizes a material for the through-silicon connection 2518 (TSV or TLV) that may have a CTE closer to silicon than, for example, copper or aluminum. The through-silicon connection 2518 may include materials such as, for example, tungsten (CTE approximately 4.5 ppm/K), highly doped polysilicon or amorphous silicon or single crystal silicon (CTE approximately 3 ppm/K), conductive carbon, or some other material with CTE less than 15 ppm/K. Wiring layers 2538 and wiring layers 2508 may have materials with CTE greater than 15 ppm/K, such as, for example, copper or aluminum.

Persons of ordinary skill in the art will appreciate that the illustrations in FIG. 25 are exemplary only and are not drawn to scale. Such skilled persons will further appreciate that many variations are possible such as, for example, the through-silicon connection 2518 may include materials in addition to those (such as Tungsten, conductive carbon) described above, for example, liners and barrier metals such as TiN, TaN, and other materials known in the art for via, contact, and through silicon via formation. Moreover, the transistors in silicon layer 2504 may be formed in a manner similar to silicon layer 2516. Furthermore, through-silicon connection 2518 may be physically and electrically connected (not shown) to wiring layers 2508 and wiring layers 2538 by the same material as the wiring layers 2508/2538, or by the same materials as the through-silicon connection 2518 composition, or by other electrically and/or thermally conductive materials not found in the wiring layers 2508/2538 or the through-silicon connection 2518. Many other modifications within the scope of the invention will suggest themselves to such skilled persons after reading this specification. Thus the invention is to be limited only by the appended claims.

Alignment is a basic step in semiconductor processing. In most cases it is part of the flow that every successive layer is patterned and aligned to a previous or underneath layer. This alignment of each layer could all be done to one common alignment mark, such as for example the zero mark utilized by some ASML equipment, or to some other alignment mark or marks that are embedded in a layer underneath the masking layer being aligned. In today's equipment such alignment would be precise to below 40 nanometers, or 10 nanometers or a few nanometers. In general such alignment could be observed outside the manufacturing fabrication facility by comparing two devices processed using the same mask set. If two layers in one device maintain their relative positions the same—to few nanometers—as the other device, it is a clear indication that these layers are one aligned to the other. This could be achieve by either aligning to the same alignment mark or one is using alignment mark embedded in the other or using different alignment marks of layers that are aligned to each other. Within the manufacturing fabrication facility alignment may be observed and measured by scanning the post develop, and sometime post etch, alignment structures such as for example fiducial marks, or box in box, crosses, etc. as understood by those skilled in the art.

When formation of a 3D-IC is discussed herein, crystalline layers, for example, two crystalline layers, 2504 and 2516, are utilized to form the monolithic 3D-IC, generally utilizing layer transfer techniques. Similarly, donor layers and acceptor layers of crystalline materials which are referred to and utilized in the referenced US patent documents including U.S. Pat. Nos. 8,273,610, 9,099,526, 9,219,005, 8,557,632 and 8,581,349 may be utilized to form a monolithic 3D-IC, generally utilizing layer transfer techniques. The crystalline layers, whether donor or acceptor layer, may include regions of compound semiconductors, such as, for example, InP, GaAs, and/or GaN, and regions of mono-crystalline silicon and/or silicon dioxide. Heterogeneous integration with short interconnects between the compound semiconductor transistors and the silicon based transistors (such as CMOS) could be enabled by placing or constructing Si-CS hetero-layers into a monolithic 3D-IC structure.

One compelling advantage of the Excico's laser annealing machine is its output optical system. This optical system forms a large rectangular window of uniform laser energy with less than 10% variation over the surface to be annealed, and with sharp edges of less than 100 micron between the uniform energy and almost no energy as illustrated in FIG. 49 of incorporated patent reference U.S. Pat. No. 9,385,058. Accordingly a whole die or even reticle could be exposed in one shot. By setting the window size and aligning the laser to the wafer properly, it could allow the laser annealing process to have the stitching of optical energy, such as pulsed laser exposures, at a desired area, such as the scribe street, such as for example lines 104, potential dicing line 104-1, potential dicing lines 104-2, in FIG. 10 of incorporated patent reference U.S. Pat. No. 8,273,610 to Or-Bach, et al. Thus, the laser stitch may be placed between dies, thereby reducing the risk from uneven exposure at the stitching area affecting any of the desired circuit transistors or elements. Additionally, the window size may be set to cover a multiplicity of dice or tiles, such as end-device 3611 of FIG. 36 of incorporated patent reference U.S. Pat. No. 8,273,610 to Or-Bach, et al., which may also have potential dice lines, such as potential dice lines 3602 and/or actual dice lines, such as actual dice lines 3612. The optical annealing could be done sequentially across the wafer or in steppings that substantially cover the entire wafer area but spread the heat generation to allow better heat removal. Such spreading of heat generation could be done, for example, by scanning the wafer surface like a checkerboard, first exposing rectangles or areas such as the 'blacks' of the checkerboard, and then the 'white' locations.

A planar fully depleted n-channel Recessed Channel Array Transistor (FD-RCAT) suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an un-doped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. FIG. 26A-F illustrates an exemplary n-channel FD-RCAT which may be constructed in a 3D stacked layer using procedures outlined below and in U.S. Pat. Nos. 8,273,610, 9,099,526, 9,219,005, 8,557,632 and 8,581,349. The contents of the foregoing patent and applications are incorporated herein by reference.

As illustrated in FIG. 26A, a P− substrate donor wafer 2600 may be processed to include wafer sized layers of N+ doping 2602, P− doping 2606, channel 2603 and P+ doping 2604 across the wafer. The N+ doped layer 2602, P− doped layer 2606, channel layer 2603 and P+ doped layer 2604 may be formed by ion implantation and thermal anneal. P− substrate donor wafer 2600 may include a crystalline material, for example, mono-crystalline (single crystal) silicon. P− doped layer 2606 and channel layer 2603 may have additional ion implantation and anneal processing to provide a different dopant level than P− substrate donor wafer 2600. P− substrate donor wafer 2600 may be very lightly doped (less than 1e15 atoms/cm$^3$) or nominally un-doped (less than e14 atoms/cm$^3$). P− doped layer 2606, channel layer 2603, and P+ doped layer 2604 may have graded or various layers doping to mitigate transistor performance issues, such as, for example, short channel effects, after the FD-RCAT is formed, and to provide effective body biasing, whether adaptive or dynamic. The layer stack may alternatively be formed by successive epitaxially deposited doped silicon layers of N+ doped layer 2602, P− doped layer 2606, channel layer 2603 and P+ doped layer 2604, or by a combination of epitaxy and implantation. Annealing of implants and doping may include, for example, conductive/inductive thermal, optical annealing techniques or types of Rapid Thermal Anneal (RTA or spike). The N+ doped layer 2602 may have a doping concentration that may be more than 10× the doping concentration of P− doped layer 2606 and/or channel layer 2603. The P+ doped layer 2604 may have a doping concentration that may be more than 10× the doping concentration of P− doped layer 2606 and/or channel layer 2603. The P− doped layer 2606 may have a doping concentration that may be more than 10× the doping concentration of channel layer 2603. Channel layer 2603 may have a thickness and/or doping that may allow fully-depleted channel operation when the FD-RCAT transistor is substantially completely formed, such as, for example, less than 5 nm, less than 10 nm, or less than 20 nm.

As illustrated in FIG. 26B, the top surface of the P− substrate donor wafer 2600 layer stack may be prepared for oxide wafer bonding with a deposition of an oxide or by thermal oxidation of P+ doped layer 2604 to form oxide layer 2680. A layer transfer demarcation plane (shown as dashed line) 2699 may be formed by hydrogen implantation or other methods as described in the incorporated references. The P− substrate donor wafer 2600 and acceptor wafer 2610 may be prepared for wafer bonding as previously described and low temperature (less than approximately 400° C.) bonded. Acceptor wafer 2610, as described in the incorporated references, may include, for example, transistors, circuitry, and metal, such as, for example, aluminum or copper, interconnect wiring, a metal shield/heat sink layer, and thru layer via metal interconnect strips or pads. Acceptor wafer 2610 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. The portion of the N+ doped layer 2602 and the P− substrate donor wafer 2600 that may be above (when the layer stack is flipped over and bonded to the acceptor wafer) the layer transfer demarcation plane 2699 may be removed by cleaving or other low temperature processes as described in the incorporated references, such as, for example, ion-cut or other layer transfer methods.

Figure 26C:
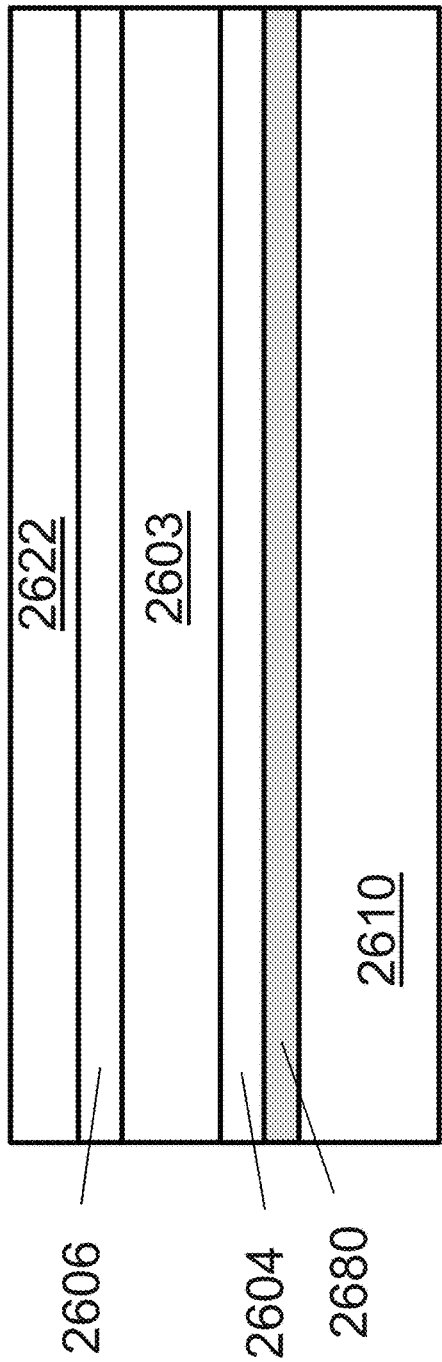

As illustrated in FIG. 26C, oxide layer 2680, P+ doped layer 2604, channel layer 2603, P− doped layer 2606, and remaining N+ layer 2622 have been layer transferred to acceptor wafer 2610. The top surface of N+ layer 2622 may be chemically or mechanically polished. Now transistors may be formed with low effective temperature (less than approximately 400° C. exposure to the acceptor wafer 2610 sensitive layers, such as interconnect and device layers) processing and aligned to the acceptor wafer alignment marks (not shown) as described in the incorporated references.

Figure 26D:
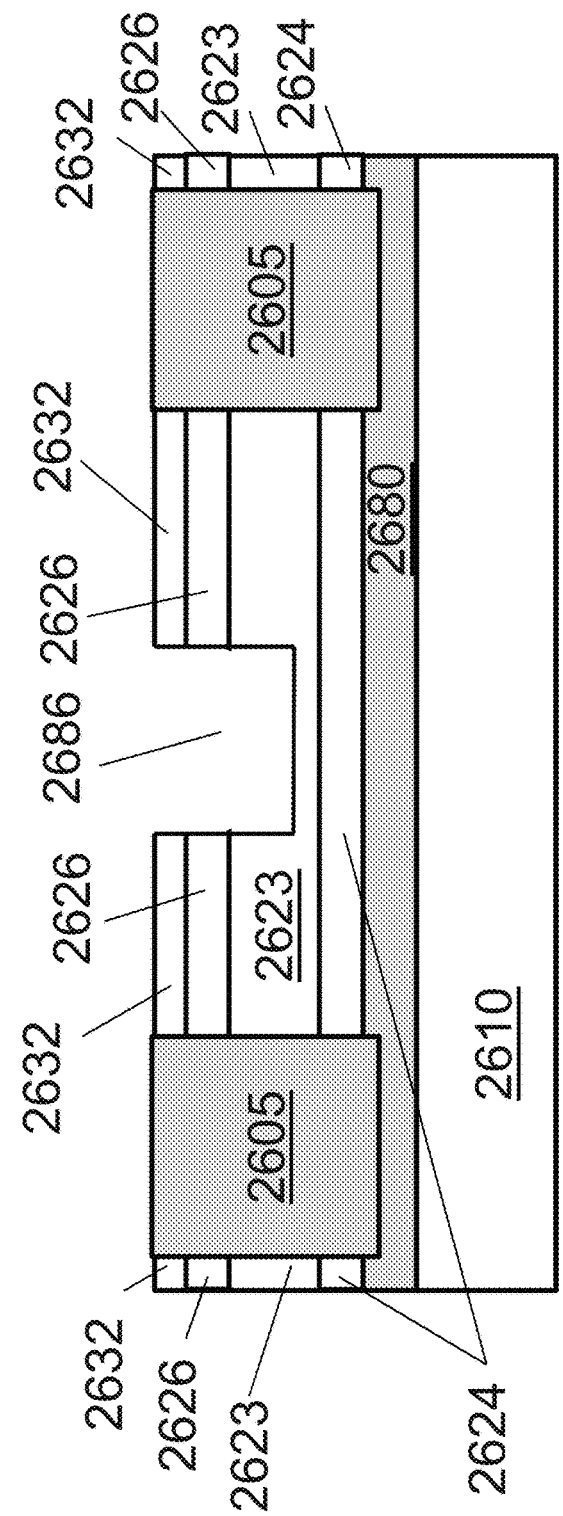

As illustrated in FIG. 26D, the transistor isolation regions 2605 may be formed by mask defining and plasma/RIE etching remaining N+ layer 2622, P− doped layer 2606, channel layer 2603, and P+ doped layer 2604 substantially to the top of oxide layer 2680 (not shown), substantially into oxide layer 2680, or into a portion of the upper oxide layer of acceptor wafer 2610 (not shown). Additionally, a portion of the transistor isolation regions 2605 may be etched (separate step) substantially to P+ doped layer 2604, thus allowing multiple transistor regions to be connected by the same P+ doped region 2624. A low-temperature gap fill oxide may be deposited and chemically mechanically polished, the oxide remaining in isolation regions 2605. The recessed channel 2686 may be mask defined and etched thru remaining N+ doped layer 2622, P− doped layer 2606 and partially into channel layer 2603. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 2632, P− regions 2626, and channel region 2623 may be formed, which may substantially form the transistor body. The doping concentration of N+ source and drain regions 2632 may be more than 10× the concentration of channel region 2623. The doping concentration of the N− channel region 2623 may include gradients of concentration or layers of differing doping concentrations. The doping concentration of N+ source and drain regions 2632 may be more than 10× the concentration of P− regions 2626. The etch formation of recessed channel 2686 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 2623 in the region below recessed channel 2686 may be of a thickness that allows fully-depleted channel operation. The thickness of channel region 2623 in the region below N+ source and drain regions 2632 may be of a thickness that allows fully-depleted transistor operation.

Figure 26E:
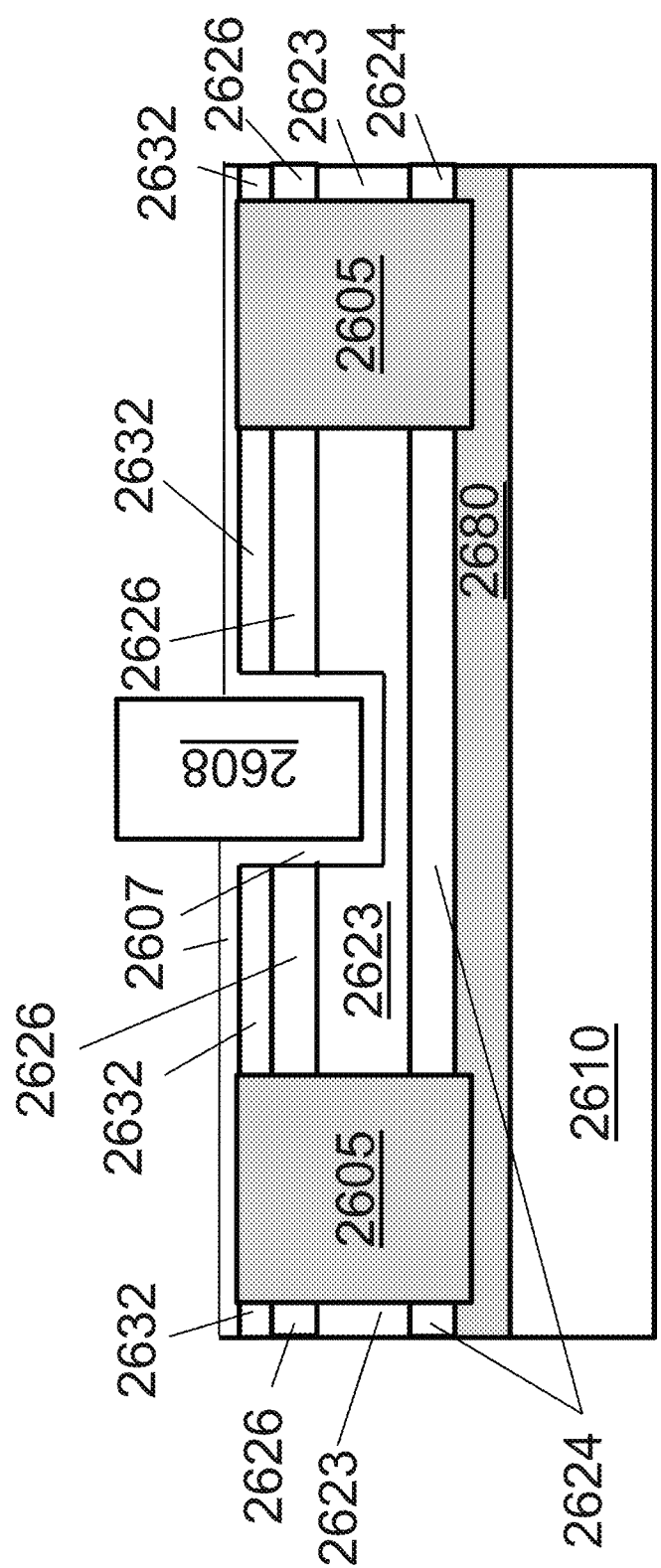

As illustrated in FIG. 26E, a gate dielectric 2607 may be formed and a gate metal material may be deposited. The gate dielectric 2607 may be an atomic layer deposited (ALD)

gate dielectric that may be paired with a work function specific gate metal in the industry standard high k metal gate process schemes described in the incorporated references. Alternatively, the gate dielectric 2607 may be formed with a low temperature processes including, for example, LPCVD SiO2 oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 2608. The shape of gate electrode 2608 is illustrative; the gate electrode may also overlap a portion of N+ source and drain regions 2632.

As illustrated in FIG. 26F, a low temperature thick oxide 2609 may be deposited and planarized, and source, gate, and drain contacts, P+ doped region contact (not shown) and thru layer via (not shown) openings may be masked and etched preparing the transistors to be connected via metallization. P+ doped region contact may be constructed thru isolation regions 2605, suitably when the isolation regions 2605 is formed to a shared P+ doped region 2624. Thus gate contact 2611 connects to gate electrode 2608, and source & drain contacts 2640 connect to N+ source and drain regions 2632. The thru layer via (not shown) provides electrical coupling among the donor wafer transistors and the acceptor wafer metal connect pads or strips (not shown) as described in the incorporated references.

Persons of ordinary skill in the art will appreciate that the illustrations in FIGS. 26A through 26F are exemplary only and are not drawn to scale. Such skilled persons will further appreciate that many variations are possible such as, for example, a p-channel FD-RCAT may be formed with changing the types of dopings appropriately. Moreover, the P– substrate donor wafer 2600 may be n type or un-doped. Further, P– doped channel layer 2603 may include multiple layers of different doping concentrations and gradients to fine tune the eventual FD-RCAT channel for electrical performance and reliability characteristics, such as, for example, off-state leakage current and on-state current. Furthermore, isolation regions 2605 may be formed by a hard mask defined process flow, wherein a hard mask stack, such as, for example, silicon oxide and silicon nitride layers, or silicon oxide and amorphous carbon layers, may be utilized. Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, P+ doped regions 2624 may be utilized for a double gate structure for the FD-RCAT and may utilize techniques described in the incorporated references. Further, efficient heat removal and transistor body biasing may be accomplished on a FD-RCAT by adding an appropriately doped buried layer (N– in the case of a n-FD-RCAT), forming a buried layer region underneath the P+ doped region 2624 for junction isolation, and connecting that buried region to a thermal and electrical contact, similar to what is described for layer 1606 and region 1646 in FIGS. 16A-G in the incorporated reference pending U.S. patent application Ser. No. 13/441,923 and U.S. Patent Publication 2012/0091587. Many other modifications within the scope of the invention will suggest themselves to such skilled persons after reading this specification. Thus the invention is to be limited only by the appended claims.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting or absorbent material layer or layers (which may be called a shield) is incorporated between the sensitive metal interconnect layers and the layer or regions being optically irradiated and annealed, or annealed from the top of the 3D-IC stack using other methods. An exemplary generalized process flow is shown in FIGS. 27A-F. An exemplary process flow for an FD-RCAT with an optional integrated heat shield/spreader is shown in FIGS. 28A-G. An exemplary process flow for a FD-MOSFET with an optional integrated heat shield/spreader is shown in FIGS. 29A-G. An exemplary process flow for a planar fully depleted n-channel MOSFET (FD-MOSFET) with an optional integrated heat shield/spreader and back planes and body bias taps is shown in FIGS. 30A-G. An exemplary process flow for a horizontally oriented JFET or JLT with an optional integrated heat shield/spreader is shown in FIGS. 31A-G. The 3D-ICs may be constructed in a 3D stacked layer using procedures outlined herein (such as, for example, FIGS. 39, 40, 41 of incorporated patent reference U.S. Pat. No. 9,385,058) and in U.S. Pat. Nos. 8,273,610, 9,099,526, 9,219,005, 8,557, 632 and 8,581,349. The contents of the foregoing applications are incorporated herein by reference. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength), or a short pulse laser (such as 160 ns), with 308 nm wavelength, and large area (die or step-field sized, including 1 cm$^2$) irradiation such as offered by Excico of Gennevilliers, France, may be utilized (for example, see Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012). Additionally, the defect anneal may include, for example, laser anneals (such as suggested in Rajendran, B., "Sequential 3D IC Fabrication: Challenges and Prospects", Proceedings of VLSI Multi Level Interconnect Conference 2006, pp. 57-64), Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or reducing atmospheres (such as nitrogen or argon). The topside defect anneal may include temperatures of the layer being annealed above about 400° C. (a high temperature thermal anneal), including, for example, 600° C., 800° C., 900° C., 1000° C., 1050° C., 1100° C. and/or 1120° C., and the sensitive metal interconnect (for example, may be copper or aluminum containing) and/or device layers below may not be damaged by the annealing process, for example, which may include sustained temperatures that do not exceed 200° C., exceed 300° C., exceed 370° C., or exceed 400° C. As understood by those of ordinary skill in the art, short-timescale (nanosceonds to miliseconds) temperatures above 400° C. may also be acceptable for damage avoidance, depending on the acceptor layer interconnect metal systems used. The topside defect anneal may include activation of semiconductor dopants, such as, for example, ion implanted dopants or PLAD applied dopants. It will also be understood by one of ordinary skill in the art that the methods, such as the heat sink/shield layer and/or use of short pulse and short wavelength optical anneals, may allow almost any type of transistor, for example, such as FinFets, bipolar, nanowire transistors, to be constructed in a monolithic 3D fashion as the thermal limit of damage to the underlying metal interconnect systems is overcome. Moreover, multiple pulses of the laser, other optical annealing techniques, or other anneal treatments such as microwave, may be utilized to improve the anneal, activation, and yield of the process. The transistors formed as described herein may include many types of materials; for example, the channel and/or source and drain may include single crystal materials such as silicon, germanium, or compound semiconductors such as GaAs, InP, GaN, SiGe, and although the structures may be doped with the tailored dopants and concentrations, they may still be substantially crystalline or mono-crystalline.

As illustrated in FIG. 27A, a generalized process flow may begin with a donor wafer 2700 that may be preprocessed with wafer sized layers 2702 of conducting, semi-conducting or insulating materials that may be formed by deposition, ion implantation and anneal, oxidation, epitaxial growth, combinations of above, or other semiconductor processing steps and methods. For example, donor wafer 2700 and wafer sized layers 2702 may include semiconductor materials such as, for example, mono-crystalline silicon, germanium, GaAs, InP, and graphene. For this illustration, mono-crystalline (single crystal) silicon and associated silicon oriented processing may be used. The donor wafer 2700 may be preprocessed with a layer transfer demarcation plane (shown as dashed line) 2799, such as, for example, a hydrogen implant cleave plane, before or after (typical) wafer sized layers 2702 are formed. Layer transfer demarcation plane 2799 may alternatively be formed within wafer sized layers 2702. Other layer transfer processes, some described in the referenced patent documents, may alternatively be utilized. Damage/defects to the crystalline structure of donor wafer 2700 may be annealed by some of the annealing methods described, for example the short wavelength pulsed laser techniques, wherein the donor wafer 2700 wafer sized layers 2702 and portions of donor wafer 2700 may be heated to defect annealing temperatures, but the layer transfer demarcation plane 2799 may be kept below the temperate for cleaving and/or significant hydrogen diffusion. Dopants in at least a portion of wafer sized layers 2702 may also be electrically activated. Thru the processing, donor wafer 2700 and/or wafer sized layers 2702 could be thinned from its original thickness, and their/its final thickness could be in the range of about 0.01 um to about 50 um, for example, 10 nm, 100 nm, 200 nm, 0.4 um, 1 um, 2 um or 5 um. Donor wafer 2700 and wafer sized layers 2702 may include preparatory layers for the formation of horizontally or vertically oriented types of transistors such as, for example, MOSFETS, FinFets, FD-RCATs, BJTs, HEMTs, HBTs, JFETs, JLTs, or partially processed transistors (for example, the replacement gate HKMG process described in the referenced patent documents). Donor wafer 2700 and wafer sized layers 2702 may include the layer transfer devices and/or layer or layers contained herein this document or referenced patent documents, for example, DRAM Si/SiO2 layers, RCAT doped layers, multi-layer doped structures, or starting material doped or undoped monocrystalline silicon, or polycrystalline silicon. Donor wafer 2700 and wafer sized layers 2702 may have alignment marks (not shown). Acceptor wafer 2710 may be a preprocessed wafer, for example, including monocrystalline bulk silicon or SOI, that may have fully functional circuitry including metal layers (including aluminum or copper metal interconnect layers that may connect acceptor wafer 2710 transistors and metal structures, such as TLV landing strips and pads, prepared to connect to the transferred layer devices) or may be a wafer with previously transferred layers, or may be a blank carrier or holder wafer, or other kinds of substrates suitable for layer transfer processing. Acceptor wafer 2710 may have alignment marks 2790 and metal connect pads or strips 2780 and ray blocked metal interconnect 2781. Acceptor wafer 2710 may include transistors such as, for example, MOSFETS, FinFets, FD-RCATs, BJTs, JFETs, JLTs, HEMTs, and/or HBTs. Acceptor wafer 2710 may include shield/heat sink layer 2788, which may include materials such as, for example, Aluminum, Tungsten (a refractory metal), Copper, silicon or cobalt based silicides, or forms of carbon such as carbon nanotubes or DLC (Diamond Like Carbon), and may be layered itself as described herein FIG. 50. Shield/heat sink layer 2788 may have a thickness range of about 50 nm to about mm, for example, 50 nm, 100 nm, 200 nm, 300 nm, 500 nm, 0.1 um, 1 um, 2 um, and 10 um. Shield/heat sink layer 2788 may include isolation openings 2786, and alignment mark openings 2787, which may be utilized for short wavelength alignment of top layer (donor) processing to the acceptor wafer alignment marks 2790. Shield/heat sink layer 2788 may include shield path connect 2785 and shield path via 2783. Shield path via 2783 may thermally and/or electrically couple and connect shield path connect 2785 to acceptor wafer 2710 interconnect metallization layers such as, for example, metal connect pads or strips 2780 (shown). If two shield/heat sink layers 2788 are utilized, one on top of the other and separated by an isolation layer common in semiconductor BEOL, such as carbon doped silicon oxide, shield path connect 2785 may also thermally and/or electrically couple and connect each shield/heat sink layer 2788 to the other and to acceptor wafer 2710 interconnect metallization layers such as, for example, metal connect pads or strips 2780, thereby creating a heat conduction path from the shield/heat sink layer 2788 to the acceptor wafer substrate, and a heat sink (shown in FIG. 27F). The topmost shield/heat sink layer may include a higher melting point material, for example a refractory metal such as Tungsten, and the lower heat shield layer may include a lower melting point material such as copper.

Figures 1, 27B:
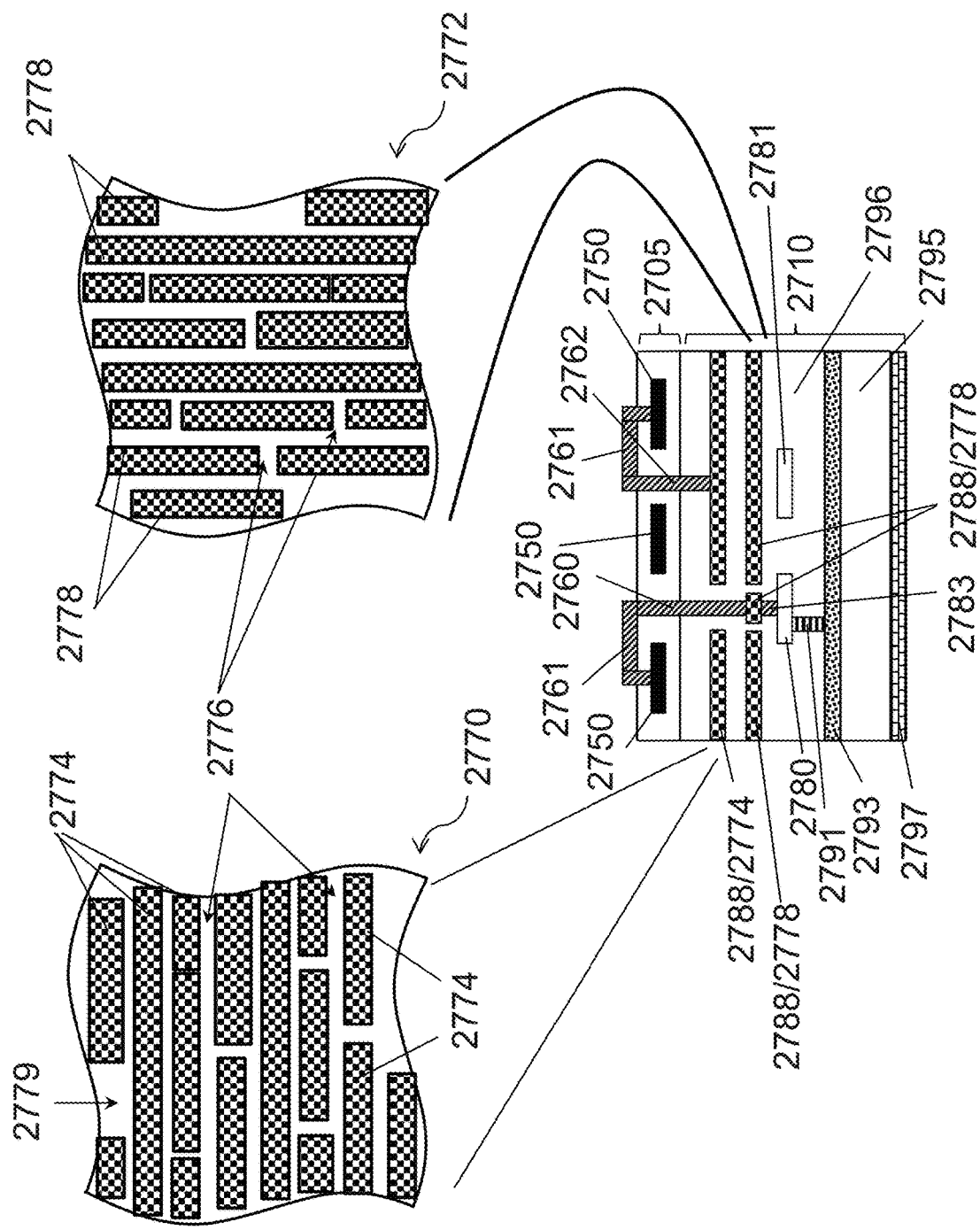

As illustrated in FIG. 27B, two exemplary top views of shield/heat sink layer 2788 are shown. In shield/heat sink portion 2720 a shield area 2722 of the shield/heat sink layer 2788 materials described above and in the incorporated references may include TLV/TSV connects 2724 and isolation openings 2786. Isolation openings 2786 may be the absence of the material of shield area 2722. TLV/TSV connects 2724 are an example of a shield path connect 2785.

TLV/TSV connects 2724 and isolation openings 2786 may be drawn in the database of the 3D-IC stack and may formed during the acceptor wafer 2710 processing. In shield/heat sink portion 2730 a shield area 2732 of the shield/heat sink layer 2788 materials described above and in the incorporated references may have metal interconnect strips 2734 and isolation openings 2786. Metal interconnect strips 2734 may be surrounded by regions, such as isolation openings 2786, where the material of shield area 2732 may be etched away, thereby stopping electrical conduction from metal interconnect strips 2734 to shield area 2732 and to other metal interconnect strips. Metal interconnect strips 2734 may be utilized to connect/couple the transistors formed in the donor wafer layers, such as 2702, to themselves from the 'backside' or 'underside' and/or to transistors in the acceptor wafer level/layer. Metal interconnect strips 2734 and shield/heat sink layer 2788 regions such as shield area 2722 and shield area 2732 may be utilized as a ground plane for the transistors above it residing in the donor wafer layer or layers and/or may be utilized as power supply or back-bias, such as Vdd or Vsb, for the transistors above it residing in the transferred donor wafer layer or layers. The strips and/or regions of shield/heat sink layer 2788 may be controlled by second layer transistors when supplying power or other signals such as data or control. For example, as illustrated in FIG. 27B-1, the topmost shield/heat sink layer 2788 may include a topmost shield/heat sink portion 2770, which may be configured as fingers or stripes of conductive material, such as top strips 2774 and strip isolation spaces 2776, which may be utilized, for example, to provide back-bias, power, or ground to the second layer transistors above it residing in the donor wafer layer or layers (for example donor wafer device structures 2750). A second shield/heat sink layer 2788, below the topmost shield/heat sink layer, may include a second shield/heat sink portion 2772, which may be configured as fingers or stripes of conductive material, such as second strips 2778 and strip isolation spaces 2776, may be oriented in a different direction (although not necessarily so) than the topmost strips, and may be utilized, for example, to provide back-bias, power, or ground to the second layer transistors above it residing in the donor wafer layer or layers (for example donor wafer device structures 2750). Openings, such as opening 2779, in the topmost shield/heat sink layer may be designed to allow connection from the second layer of transistors to the second shield/heat sink layer, such as from donor wafer device structures 2750 to second strips 2778. The strips or fingers may be illustrated as orthogonally oriented layer to layer, but may also take other drawn shapes and forms; for example, such as diagonal running shapes as in the X-architecture, overlapping parallel strips, and so on. The portions of the shield/heat sink layer 2788 or layers may include a combination of the strip/finger shapes of FIG. 27B-1 and the illustrated via connects and fill-in regions of FIG. 27B.

Bonding surfaces, donor bonding surface 2701 and acceptor bonding surface 2711, may be prepared for wafer bonding by depositions (such as silicon oxide), polishes, plasma, or wet chemistry treatments to facilitate successful wafer to wafer bonding. The insulation layer, such as deposited bonding oxides and/or before bonding preparation existing oxides, between the donor wafer transferred layer and the acceptor wafer topmost metal layer, may include thicknesses of less than 1 um, less than 500 nm, less than 400 nm, less than 300 nm, less than 200 nm, or less than 100 nm.

As illustrated in FIG. 27C, the donor wafer 2700 with wafer sized layers 2702 and layer transfer demarcation plane 2799 may be flipped over, aligned, and bonded to the acceptor wafer 2710. The donor wafer 2700 with wafer sized layers 2702 may have alignment marks (not shown). Various topside defect anneals may be utilized. For this illustration, an optical beam such as the laser annealing previously described is used. Optical anneal beams may be optimized to focus light absorption and heat generation at or near the layer transfer demarcation plane (shown as dashed line) 2799 to provide a hydrogen bubble cleave with exemplary cleave ray 2751. The laser assisted hydrogen bubble cleave with the absorbed heat generated by exemplary cleave ray 2751 may also include a pre-heat of the bonded stack to, for example, about 100° C. to about 400° C., and/or a thermal rapid spike to temperatures above about 200° C. to about 600° C. The laser assisted ion-cut cleave may provide a smoother cleave surface upon which better quality transistors may be manufactured. Reflected ray 2753 may be reflected and/or absorbed by shield/heat sink layer 2788 regions thus blocking the optical absorption of ray blocked metal interconnect 2781 and potentially enhancing the efficiency of optical energy absorption of the wafer sized layers 2702. Additionally, shield/heat sink layer 2788 may laterally spread and conduct the heat generated by the topside defect anneal, and in conjunction with the dielectric materials (low heat conductivity) above and below shield/heat sink layer 2788, keep the interconnect metals and low-k dielectrics of the acceptor wafer interconnect layers cooler than a damage temperature, such as, for example, 400° C. Annealing of dopants or annealing of damage, such as from the H cleave implant damage, may be accomplished by optical annealing rays, such as repair ray 2755. A small portion of the optical energy, such as unblocked ray 2757, may hit and heat, or be reflected, by (a few rays as the area of the heat shield openings, such as 2724, is small compared to the die or device area) such as metal connect pads or strips 2780. Heat generated by absorbed photons from, for example, cleave ray 2751, reflected ray 2753, and/or repair ray 2755 may also be absorbed by shield/heat sink layer 2788 regions and dissipated laterally and may keep the temperature of underlying metal layers, such as ray blocked metal interconnect 2781, and other metal layers below it, cooler and prevent damage. Shield/heat sink layer 2788 may act as a heat spreader. A second layer of shield/heat sink layer 2788 (not shown) may have been constructed (during the acceptor wafer 2710 formation) with a low heat conductive material sandwiched between the two heat sink layers, such as silicon oxide or carbon doped 'low-k' silicon oxides, for improved thermal protection of the acceptor wafer interconnect layers, metal and dielectrics. Electrically conductive materials may be used for the two layers of shield/heat sink layer 2788 and thus may provide, for example, a Vss and a Vdd plane and/or grid for power delivery that may be connected to the donor layer transistors above, as well may be connected to the acceptor wafer transistors below. Shield/heat sink layer 2788 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 2788 may be sandwiched and/or substantially enclosed by materials with a low thermal conductivity less than 10 W/m-K, for example, silicon dioxide (about 1.4 W/m-K). The sandwiching of high and low thermal conductivity materials in layers, such as shield/heat sink layer 2788 and under & overlying dielectric layers, spreads the localized heat/light energy of the topside anneal laterally and protect the underlying layers of interconnect metallization & dielectrics, such as in the acceptor wafer, from harmful temperatures or damage. Further, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Photoresist may also be utilized to attenuate the optical energy. For example, pre-processed layers 2702 may include a layer or region of optical absorbers such as transferred absorber region 2775, acceptor wafer 2710 may include a layer or region of optical absorbers such as acceptor absorber region 2773, and second device layer 2705 may include a layer or region of optical absorbers such as post transfer absorber regions 2777 (shown in FIG. 27E). Transferred absorber region 2775, acceptor absorber region 2773, and/or post transfer absorber regions 2777 may be permanent (could be found within the device when manufacturing is complete) or temporary so is removed during the manufacturing process.

As illustrated in FIG. 27D, the donor wafer 2700 may be cleaved at or thinned to (or past, not shown) the layer transfer demarcation plane 2799, leaving donor wafer portion 2703 and the pre-processed layers 2702 bonded to the acceptor wafer 2710, by methods such as, for example, ion-cut or other layer transfer methods. The layer transfer demarcation plane 2799 may instead be placed in the pre-processed layers 2702. Optical anneal beams, in conjunction with reflecting layers and regions and absorbing enhancement layers and regions, may be optimized to focus light absorption and heat generation within or at the surface of donor wafer portion 2703 and provide surface smoothing and/or defect annealing (defects may be from the cleave and/or the ion-cut implantation), and/or post ion-implant dopant activation with exemplary smoothing/annealing ray 2766. The laser assisted smoothing/annealing with the absorbed heat generated by exemplary smoothing/annealing ray 2766 may also include a pre-heat of the bonded stack to, for example, about 100° C. to about 400° C., and/or a thermal rapid spike to temperatures above about 200° C. to about 600° C. Moreover, multiple pulses of the laser may be utilized to improve the anneal, activation, and yield of the process. Reflected ray 2763 may be reflected and/or absorbed by shield/heat sink layer 2788 regions thus blocking the optical absorption of ray blocked metal interconnect 2781. Annealing of dopants or annealing of damage, such as from the H cleave implant damage, may be also accomplished by a set of rays such as repair ray 2765. A small portion of the optical energy, such as unblocked ray 2767, may hit and heat, or be reflected, by a few rays (as the area of the heat shield openings, such as 2724, is small) such as metal connect pads or strips 2780. Heat generated by absorbed photons from, for example, smoothing/annealing ray 2766, reflected ray 2763, and/or repair ray 2765 may also be absorbed by shield/heat sink layer 2788 regions and dissipated laterally and may keep the temperature of underlying metal layers, such as ray blocked metal interconnect 2781, and other metal layers below it, cooler and prevent damage. A second layer of shield/heat sink layer 2788 may be constructed with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 2788 may act as a heat spreader. When there may be more than one shield/heat sink layer 2788 in the device, the heat conducting layer closest to the second crystalline layer may be constructed with a different material, for example a high melting point material, for example a refractory metal such as tungsten, than the other heat conducting layer or layers, which may be constructed with, for example, a lower melting point material such as aluminum or copper. Electrically conductive materials may be used for the two layers of shield/heat sink layer 2788 and thus may provide, for example, a Vss and a Vdd plane and/or grid that may be connected to the donor layer transistors above, as well may be connected to the acceptor wafer transistors below. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures 2750) or first layer (acceptor, for example acceptor wafer transistors and devices 2793), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Furthermore, some or all of the layers utilized as shield/heat sink layer 2788, which may include shapes of material such as the strips or fingers as illustrated in FIG. 27B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 2788 layer or layers. Moreover, some or all of the layers utilized as shield/heat sink layer 2788, which may include strips or fingers as illustrated in FIG. 27B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 2788 layer or layers. The Vsupply on line 17C12 and the control signals on control line 17C16 may be controlled by and/or generated in the second layer transistors (donor, for example donor wafer device structures 2750) or first layer transistors (acceptor, for example acceptor wafer transistors and devices 2793), or off chip circuits. Furthermore, some or all of the layers utilized as shield/heat sink layer 2788, which may include strips or fingers as illustrated in FIG. 27B-1 or other shapes such as those in FIG. 27B, may be utilized to distribute independent power supplies to various portions of the second layer transistors (donor, for example donor wafer device structures 2750) or first layer transistors (acceptor, for example acceptor wafer transistors and devices 2793) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 2788 or layers can impact their heat-shielding capacity. This impact may be mitigated, for example, by enhancing the top shield/heat sink layer 2788 areal density, creating more of the secondary shield/heat sink layers 2788, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, donor wafer device structures 2750, may include I/O logic devices, such as SerDes (Serialiser/Deserialiser), and conductive bond pads (not shown). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the heat shield/heat sink layer 2788. Placement of the I/O circuits on the same stack layer as the conductive bond pad may enable close coupling of the desired I/O energy and lower signal loss. Furthermore, the second layer of circuits and transistors, for example, donor wafer device structures 2750, may include RF (Radio Frequency) circuits and/or at least one antenna. For example, the second layer of circuits and transistors, for example, donor wafer device structures 2750, may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the heat shield/heat sink layer 2788.

Figure 27E:
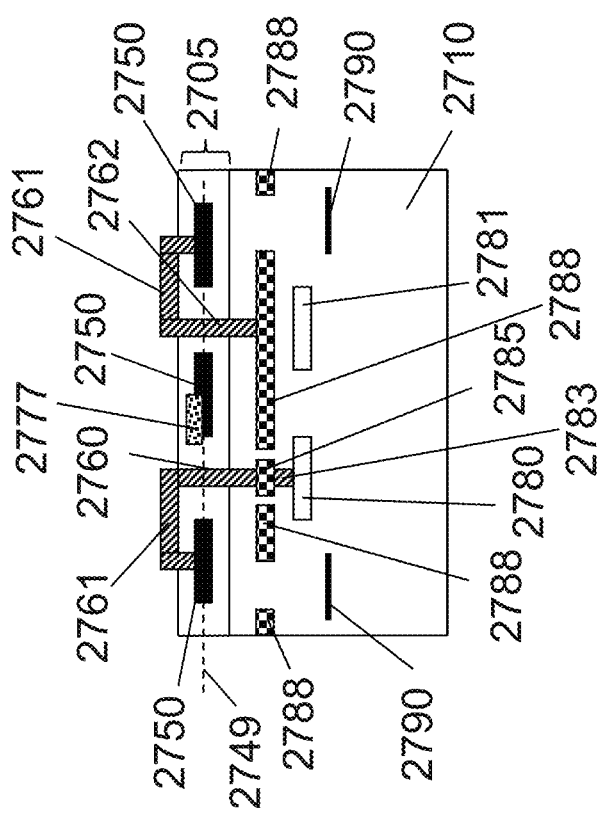

As illustrated in FIG. 27E, the remaining donor wafer portion 2703 may be removed by polishing or etching and the transferred layers 2702 may be further processed to create second device layer 2705 which may include donor wafer device structures 2750 and metal interconnect layers (such as second device layer metal interconnect 2761) that may be precisely aligned to the acceptor wafer alignment marks 2790. Donor wafer device structures 2750 may include, for example, CMOS transistors such as N type and P type transistors, or at least any of the other transistor or device types discussed herein this document or referenced patent documents. The details of CMOS in one transferred layer and the orthogonal connect strip methodology may be found as illustrated in at least FIGS. 30-27, 73-80, and 94 and related specification sections of U.S. Pat. No. 8,273,610. As discussed above and herein this document and referenced patent documents, annealing of dopants or annealing of damage, such as from the dopant application such as ion-implantation, or from etch processes during the formation of the transferred layer transistor and device structures, may be accomplished by optical annealing. Donor wafer device structures 2750 may include transistors and/or semiconductor regions wherein the dopant concentration of the regions in the horizontal plane, such as shown as exemplary dopant plane 2749, may have regions that differ substantially in dopant concentration, for example, 10× greater, and/or may have a different dopant type, such as, for example p-type or n-type dopant. Additionally, the annealing of deposited dielectrics and etch damage, for example, oxide depositions and silicon etches utilized in the transferred layer isolation processing, for example, STI (Shallow Trench Isolation) processing or strained source and drain processing, may be accomplished by optical annealing. An optical step may be performed to densify and/or remove defects from gate dielectric, anneal defects and activate dopants such as LDD and S/D implants, densify ILDs, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Second device layer metal interconnect 2761 may include electrically conductive materials such as copper, aluminum, conductive forms of carbon, and tungsten. Donor wafer device structures 2750 may utilize second device layer metal interconnect 2761 and thru layer vias (TLVs) 2760 to electrically couple (connection paths) the donor wafer device structures 2750 to the acceptor wafer metal connect pads or strips 2780, and thus couple donor wafer device structures (the second layer transistors) with acceptor wafer device structures (first layer transistors). Thermal TLVs 2762 may be constructed of thermally conductive but not electrically conductive materials, for example, DLC (Diamond Like Carbon), and may connect donor wafer device structures 2750 thermally to shield/heat sink layer 2788. TLVs 2760 may be constructed out of electrically and thermally conductive materials, such as Tungsten, Copper, or aluminum, and may provide a thermal and electrical connection path from donor wafer device structures 2750 to shield/heat sink layer 2788, which may be a ground or Vdd plane in the design/layout. TLVs 2760 and thermal TLVs 2762 may be also constructed in the device scribelanes (pre-designed in base layers or potential dicelines) to provide thermal conduction to the heat sink, and may be sawed/diced off when the wafer is diced for packaging. Shield/heat sink layer 2788 may be configured to act as an emf (electro-motive force) shield to prevent direct layer to layer cross-talk between transistors in the donor wafer layer and transistors in the acceptor wafer. In addition to static ground or Vdd biasing, shield/heat sink layer 2788 may be actively biased with an anti-interference signal from circuitry residing on, for example, a layer of the 3D-IC or off chip. TLVs 2760 may be formed through the transferred layers 2702. As the transferred layers 2702 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 2702, the smaller the thru layer via diameter obtainable, which may result from maintaining manufacturable via aspect ratios. Thus, the transferred layers 2702 (and hence, TLVs 2760) may be, for example, less than about 2 microns thick, less than about 1 micron thick, less than about 0.4 microns thick, less than about 200 nm thick, less than about 150 nm thick, less than about 100 nm thick, less than about 50 nm thick, less than about 20 nm thick, or less than about 5 nm thick. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/ error, of the manufacturing process employed to create the thru layer vias or any other structures on the transferred layer or layers. The above TLV dimensions and alignment capability and transferred layer thicknesses may be also applied to any of the discussed TLVs or transferred layers described elsewhere herein. Transferred layers 2702 may be considered to be overlying the metal layer or layers of acceptor wafer 2710. Alignment marks in acceptor wafer 2710 and/or in transferred layers 2702 may be utilized to enable reliable contact to transistors and circuitry in transferred layers 2702 and donor wafer device structures 2750 and electrically couple them to the transistors and circuitry in the acceptor wafer 2710. Transferred layer or layers may have regions of STI or other transistor elements within it or on it when transferred, but would then use alignment and connection schemes for layer transfer of patterned layers as described in incorporated patent references. The donor wafer 2700 may now also be processed, such as smoothing and annealing, and reused for additional layer transfers. The transferred layers 2702 and other additional regions created in the transferred layers during transistor processing are thin and small, having small volumes on the order of $2\times10^{-16}$ cm$^3$ ($2\times10^5$ nm$^3$ for a 100 nm by 100 nm×20 nm thick device). As a result, the amount of energy to manufacture with known in the art transistor and device formation processing, for example, annealing of ion-cut created defects or activation of dopants and annealing of doping or etching damages, is very small and may lead to only a small amount of shield layer or layers or regions or none to effectively shield the underlying interconnect metallization and dielectrics from the manufacturing processing generated heat. The energy may be supplied by, for example, pulsed and short wavelength optical annealing techniques described herein and incorporated references, and may include the use of optical absorbers and reflectors and optical/thermal shielding and heat spreaders, some of which are described herein and incorporated references. The optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process.

Figure 27F:
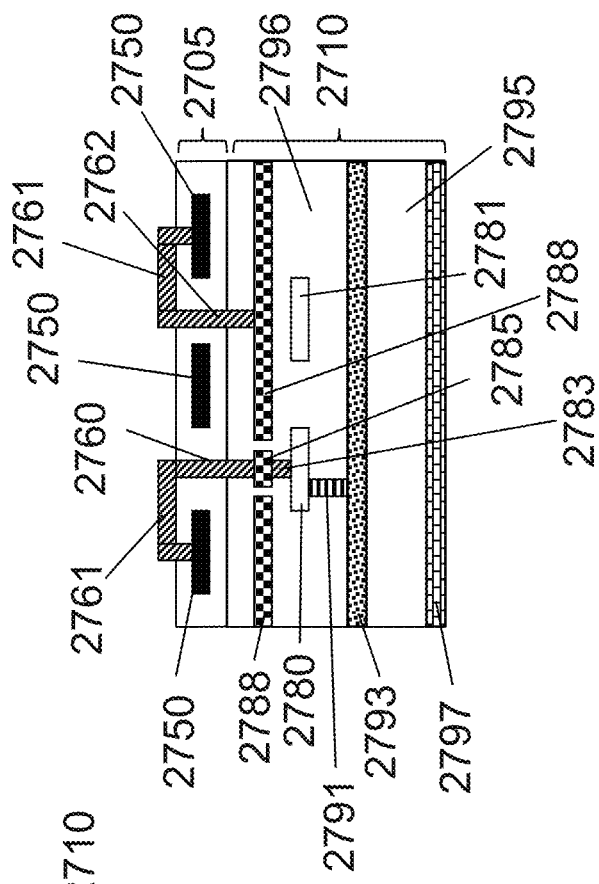

As illustrated in FIG. 27F, a thermal conduction path may be constructed from the devices in the upper layer, the transferred donor layer and formed transistors, to the acceptor wafer substrate and associated heat sink. The thermal conduction path from the donor wafer device structures 2750 to the acceptor wafer heat sink 2797 may include second device layer metal interconnect 2761, TLVs 2760, shield path connect 2785, shield path via 2783, metal connect pads or strips 2780, first (acceptor) layer metal interconnect 2791, acceptor wafer transistors and devices 2793, and acceptor substrate 2795. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 2795. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL dielectric 2796. In general, within the active device or devices (that are generating the heat that is desired to be conducted away thru at least the thermal conduction path), it would be advantageous to have an effective conduction path to reduce the overall space and area that a designer would allocate for heat transfer out of the active circuitry space and area. A designer may select to use only materials with a high thermal conductivity (such as greater than 10 W/m-K), much higher for example than that for monocrystalline silicon, for the desired thermal conduction path. However, there may need to be lower than desired thermal conductivity materials in the heat conduction path due to requirements such as, for example, the mechanical strength of a thick silicon substrate, or another heat spreader material in the stack. The area and volume allocated to that structure, such as the silicon substrate, is far larger than the active circuit area and volume. Accordingly, since a copper wire of 1 um$^2$ profile is about the same as a 286 um$^2$ profile of a column of silicon, and the thermal conduction path may include both a copper wire/TLV/via and the bulk silicon substrate, a proper design may take into account and strive to align the different elements of the conductive path to achieve effective heat transfer and removal, for example, may attempt to provide about 286 times the silicon substrate area for each Cu thermal via utilized in the thermal conduction path. The heat removal apparatus, which may include acceptor wafer heat sink 2797, may include an external surface from which heat transfer may take place by methods such as air cooling, liquid cooling, or attachment to another heat sink or heat spreader structure.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 27 formation techniques. Transferred layer or layers may have regions of STI or other transistor elements within it or on it when transferred, but would then use alignment and connection schemes for layer transfer of patterned layers as described in incorporated patent references.

A planar fully depleted n-channel Recessed Channel Array Transistor (FD-RCAT) with an integrated shield/heat sink layer suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an undoped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 28A-G illustrates an exemplary n-channel FD-RCAT which may be constructed in a 3D stacked layer using procedures outlined below and in U.S. Pat. Nos. 8,273,610, 9,099,526, 9,219,005, 8,557,632 and 8,581,349. The contents of the foregoing applications are incorporated herein by reference.

As illustrated in FIG. 28A, a P− substrate donor wafer 2800 may be processed to include wafer sized layers of N+ doping 2802, P− doping 2806, channel 2803 and P+ doping 2804 across the wafer. The N+ doped layer 2802, P− doped layer 2806, channel layer 2803 and P+ doped layer 2804 may be formed by ion implantation and thermal anneal. P− substrate donor wafer 2800 may include a crystalline material, for example, mono-crystalline (single crystal) silicon. P− doped layer 2806 and channel layer 2803 may have additional ion implantation and anneal processing to provide a different dopant level than P− substrate donor wafer 2800. P− substrate donor wafer 2800 may be very lightly doped (less than 1e15 atoms/cm$^3$) or nominally un-doped (less than 1e14 atoms/cm$^3$). P− doped layer 2806, channel layer 2803, and P+ doped layer 2804 may have graded or various layers doping to mitigate transistor performance issues, such as, for example, short channel effects, after the FD-RCAT is formed, and to provide effective body biasing, whether adaptive or dynamic. The layer stack may alternatively be formed by successive epitaxially deposited doped silicon layers of N+ doped layer 2802, P− doped layer 2806, channel layer 2803 and P+ doped layer 2804, or by a combination of epitaxy and implantation, or by layer transfer. Annealing of implants and doping may include, for example, conductive/inductive thermal, optical annealing techniques or types of Rapid Thermal Anneal (RTA or spike). The N+ doped layer 2802 may have a doping concentration that may be more than 10× the doping concentration of P− doped layer 2806 and/or channel layer 2803. The P+ doped layer 2804 may have a doping concentration that may be more than Ox the doping concentration of P− doped layer 2806 and/or channel layer 2803. The P− doped layer 2806 may have a doping concentration that may be more than Ox the doping concentration of channel layer 2803. Channel layer 2803 may have a thickness and/or doping that may allow fully-depleted channel operation when the FD-RCAT transistor is substantially completely formed, such as, for example, less than 5 nm, less than 10 nm, or less than 20 nm.

As illustrated in FIG. 28B, the top surface of the P− substrate donor wafer 2800 layer stack may be prepared for oxide wafer bonding with a deposition of an oxide or by thermal oxidation of P+ doped layer 2804 to form oxide layer 2880. A layer transfer demarcation plane (shown as dashed line) 2899 may be formed by hydrogen implantation or other methods as described in the incorporated references. The P− substrate donor wafer 2800 and acceptor wafer 2810 may be prepared for wafer bonding as previously described and low temperature (less than approximately 400° C.) bonded. Acceptor wafer 2810, as described in the incorporated references, may include, for example, transistors, circuitry, and metal, such as, for example, aluminum or copper, interconnect wiring, a metal shield/heat sink layer, and thru layer via metal interconnect strips or pads. Acceptor wafer 2810 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. SOI Acceptor wafer 2810 may include transistors such as, for example, MOSFETS, FinFets, FD-RCATs, BJTs, HEMTs, and/or HBTs. The portion of the N+ doped layer 2802 and the P− substrate donor wafer 2800 that may be above (when the layer stack is flipped over and bonded to the acceptor wafer) the layer transfer demarcation plane 2899 may be removed by cleaving or other low temperature processes as described in the incorporated references, such as, for example, ion-cut or other layer transfer methods. Damage/defects to crystalline structure of N+ doped layer 2802, P− doped layer 2806, channel layer 2803 and P+ doped layer 2804 may be annealed by some of the annealing methods described, for example the short wavelength pulsed laser techniques, wherein the N+ doped layer 2802, P− doped layer 2806, channel layer 2803 and P+ doped layer 2804 or portions of them may be heated to defect annealing temperatures, but the layer transfer demarcation plane 2899 may be kept below the temperate for cleaving and/or significant hydrogen diffusion. The optical energy may be deposited in the upper layer of the stack, for example in P+ doped layer 2804, and annealing of the other layer may take place via heat diffusion. Dopants in at least a portion of N+ doped layer 2802, P− doped layer 2806, channel layer 2803 and P+ doped layer 2804 may also be electrically activated by the anneal.

Figure 28C:
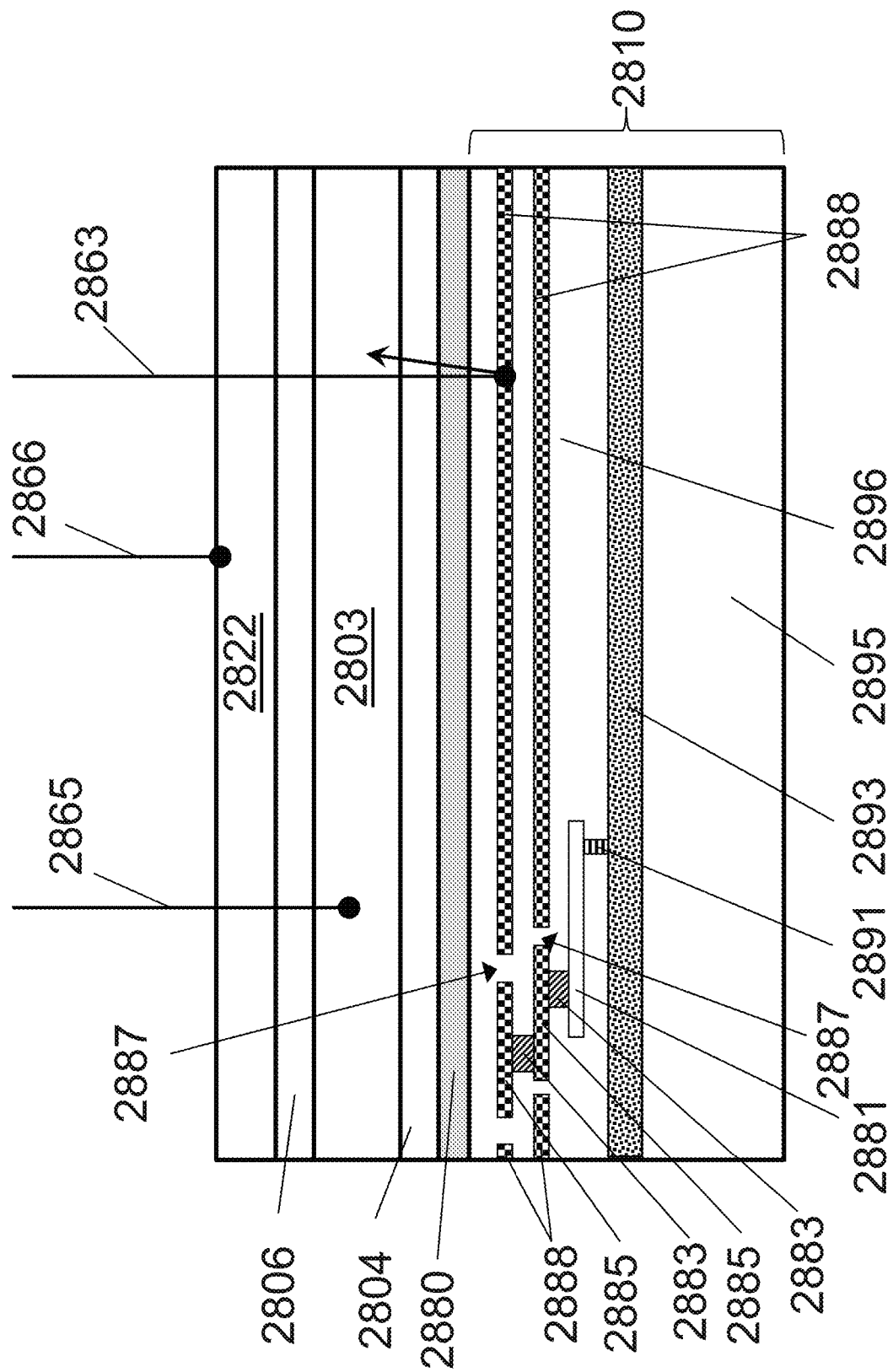

As illustrated in FIG. 28C, oxide layer 2880, P+ doped layer 2804, channel layer 2803, P− doped layer 2806, and remaining N+ layer 2822 have been layer transferred to acceptor wafer 2810. The top surface of N+ layer 2822 may be chemically or mechanically polished. Thru the processing, the wafer sized layers such as N+ layer 2822 P+ doped layer 2804, channel layer 2803, and P− doped layer 2806, could be thinned from its original total thickness, and their/its final total thickness could be in the range of about 0.01 um to about 50 um, for example, 10 nm, 100 nm, 200 nm, 0.4 um, 1 um, 2 um or 5 um. Acceptor wafer 2810 may include one or more (two are shown in this example) shield/heat sink layers 2888, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 2888 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 2888 may include isolation openings 2887, and alignment mark openings (not shown), which may be utilized for short wavelength alignment of top layer (donor) processing to the acceptor wafer alignment marks (not shown). Shield/heat sink layer 2888 may include one or more shield path connect 2885 and shield path via 2883. Shield path via 2883 may thermally and/or electrically couple and connect shield path connect 2885 to acceptor wafer 2810 interconnect metallization layers such as, for example, acceptor metal interconnect 2881 (shown). Shield path connect 2885 may also thermally and/or electrically couple and connect each shield/heat sink layer 2888 to the other and to acceptor wafer 2810 interconnect metallization layers such as, for example, acceptor metal interconnect 2881, thereby creating a heat conduction path from the shield/heat sink layer 2888 to the acceptor substrate 2895, and a heat sink (shown in FIG. 28G). Isolation openings 2887 may include dielectric materials, similar to those of BEOL isolation 2896. Acceptor wafer 2810 may include first (acceptor) layer metal interconnect 2891, acceptor wafer transistors and devices 2893, and acceptor substrate 2895. Various topside defect anneals may be utilized. For this illustration, an optical beam such as the laser annealing previously described is used. Optical anneal beams may be optimized to focus light absorption and heat generation within or at the surface of N+ layer 2822 and provide surface smoothing and/or defect annealing (defects may be from the cleave and/or the ion-cut implantation) with exemplary smoothing/annealing ray 2866. The laser assisted smoothing/annealing with the absorbed heat generated by exemplary smoothing/annealing ray 2866 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479, 821 to Hawryluk et al. for example), may be utilized to increase the efficiency of the optical energy capture in conversion to heat for the desired annealing or activation processes. Reflected ray 2863 may be reflected and/or absorbed by shield/heat sink layer 2888 regions thus blocking the optical absorption of ray blocked metal interconnect 2881. Annealing of dopants or annealing of damage, such as from the H cleave implant damage, may be also accomplished by a set of rays such as repair ray 2865. Heat generated by absorbed photons from, for example, smoothing/annealing ray 2866, reflected ray 2863, and/or repair ray 2865 may also be absorbed by shield/heat sink layer 2888 regions and dissipated laterally and may keep the temperature of underlying metal layers, such as metal interconnect 2881, and other metal layers below it, cooler and prevent damage. Shield/heat sink layer 2888 and associated dielectrics may laterally spread and conduct the heat generated by the topside defect anneal, and in conjunction with the dielectric materials (low heat conductivity) above and below shield/heat sink layer 2888, keep the interconnect metals and low-k dielectrics of the acceptor wafer interconnect layers cooler than a damage temperature, such as, for example, 400° C. A second layer of shield/heat sink layer 2888 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 2888 may act as a heat spreader. Electrically conductive materials may be used for the two layers of shield/heat sink layer 2888 and thus may provide, for example, a Vss and a Vdd plane and/or grid that may be connected to the donor layer transistors above, as well may be connected to the acceptor wafer transistors below. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 2893), may include, for example, trench capacitors such as described by Pei, C., et al., "A novel, low-cost deep trench decoupling capacitor for high-performance, low-power bulk CMOS applications," ICSICT (9$^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 2888 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 2888 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 2888 and under & overlying dielectric layers, spreads the localized heat/light energy of the topside anneal laterally and protect the underlying layers of interconnect metallization & dielectrics, such as in the acceptor wafer, from harmful temperatures or damage. When there may be more than one shield/heat sink layer 2888 in the device, the heat conducting layer closest to the second crystalline layer or oxide layer 2880 may be constructed with a different material, for example a high melting point material, for example a refractory metal such as tungsten, than the other heat conducting layer or layers, which may be constructed with, for example, a lower melting point material, for example, such as aluminum or copper. Now transistors may be formed with low effective temperature (less than approximately 400° C. exposure to the acceptor wafer 2810 sensitive layers, such as interconnect and device layers) processing, and may be aligned to the acceptor wafer alignment marks (not shown) as described in the incorporated references. This may include further optical defect annealing or dopant activation steps. The donor wafer 2800 may now also be processed, such as smoothing and annealing, and reused for additional layer transfers. The insulator layer, such as deposited bonding oxides (for example oxide layer 2880) and/or before bonding preparation existing oxides (for example the BEOL isolation 2896 on top of the topmost metal layer of shield/heat sink layer 2888), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 28D:
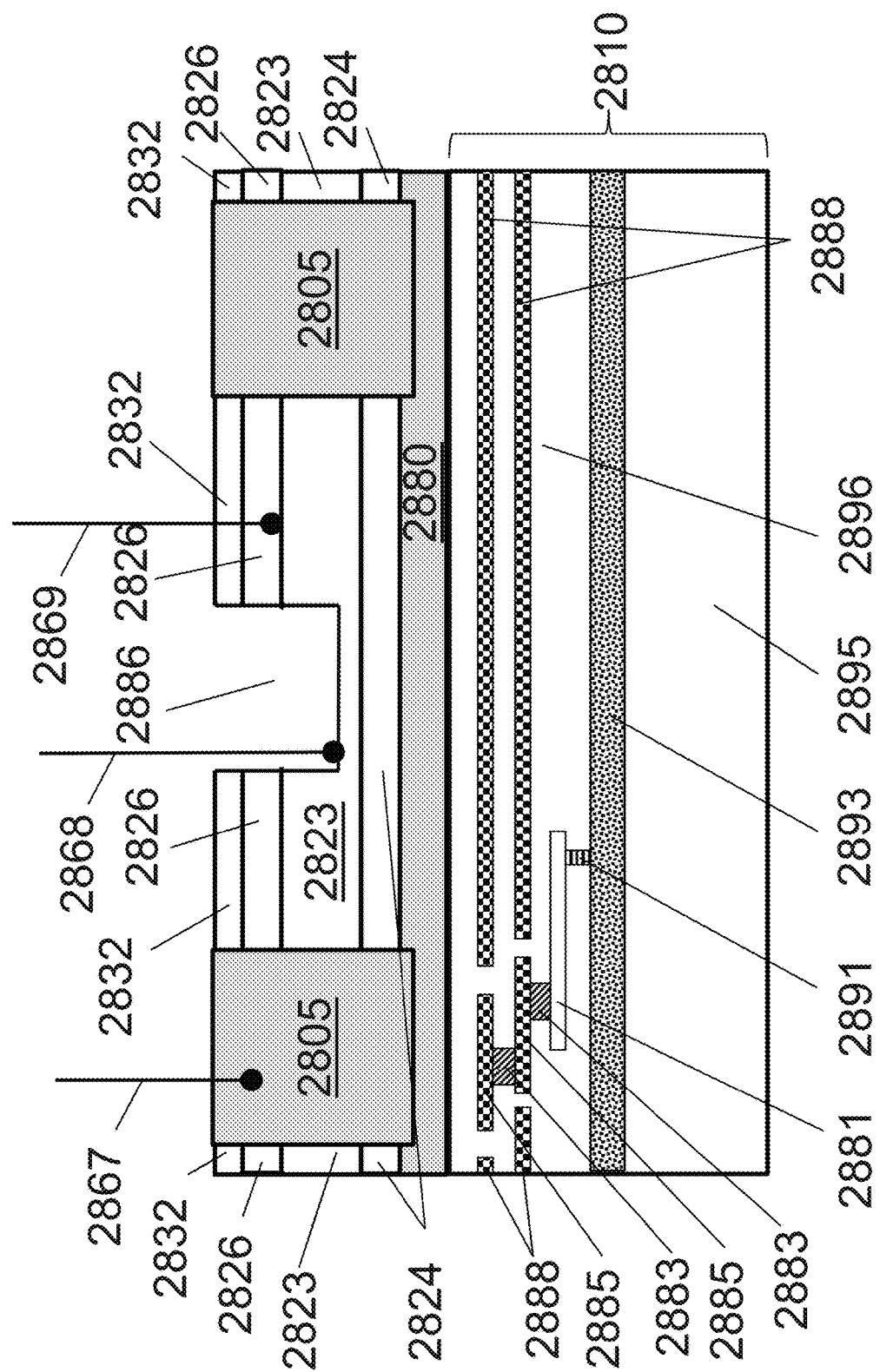

As illustrated in FIG. 28D, transistor isolation regions 2805 may be formed by mask defining and plasma/RIE etching remaining N+ layer 2822, P– doped layer 2806, channel layer 2803, and P+ doped layer 2804 substantially to the top of oxide layer 2880 (not shown), substantially into oxide layer 2880, or into a portion of the upper oxide layer of acceptor wafer 2810 (not shown). Additionally, a portion of the transistor isolation regions 2805 may be etched (separate step) substantially to P+ doped layer 2804, thus allowing multiple transistor regions to be connected by the same P+ doped region 2824. A low-temperature gap fill oxide may be deposited and chemically mechanically polished, the oxide remaining in isolation regions 2805. An optical step, such as illustrated by exemplary STI ray 2867, may be performed to anneal etch damage and densify the STI oxide in isolation regions 2805. The recessed channel 2886 may be mask defined and etched thru remaining N+ doped layer 2822, P– doped layer 2806 and partially into channel layer 2803. The recessed channel surfaces and edges may be smoothed by processes, such as, for example, wet chemical, plasma/RIE etching, low temperature hydrogen plasma, or low temperature oxidation and strip techniques, or optical annealing (such as illustrated by exemplary channel smoothing ray 2868, which may induce local short term high temperatures) as described herein, to mitigate high field effects (see Kim, J. Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, 10-12 Jun. 2003, for CDE (chemical dry etch) smoothing). The low temperature smoothing process may employ, for example, a plasma produced in a TEL (Tokyo Electron Labs) SPA (Slot Plane Antenna) machine. Thus N+ source and drain regions 2832, P− regions 2826, and channel region 2823 may be formed, which may substantially form the transistor body. The doping concentration of N+ source and drain regions 2832 may be more than 10× the concentration of channel region 2823. The doping concentration of the N-channel region 2823 may include gradients of concentration or layers of differing doping concentrations. The doping concentration of N+ source and drain regions 2832 may be more than 10× the concentration of P− regions 2826. The etch formation of recessed channel 2886 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 2823 in the region below recessed channel 2886 may be of a thickness that allows fully-depleted channel operation. The thickness of channel region 2823 in the region below N+ source and drain regions 2832 may be of a thickness that allows fully-depleted transistor operation. Any additional doping, such as ion-implanted halo implants, may be activated and annealed with optical annealing, such as illustrated by exemplary implant ray 2869, as described herein. The optical anneal, such as exemplary STI ray 2867, exemplary channel smoothing ray 2868, and/or exemplary implant ray 2869 may be performed at separate times and processing parameters (such as laser energy, frequency, etc.) or may be done in combination or as one optical anneal.

Figure 28E:
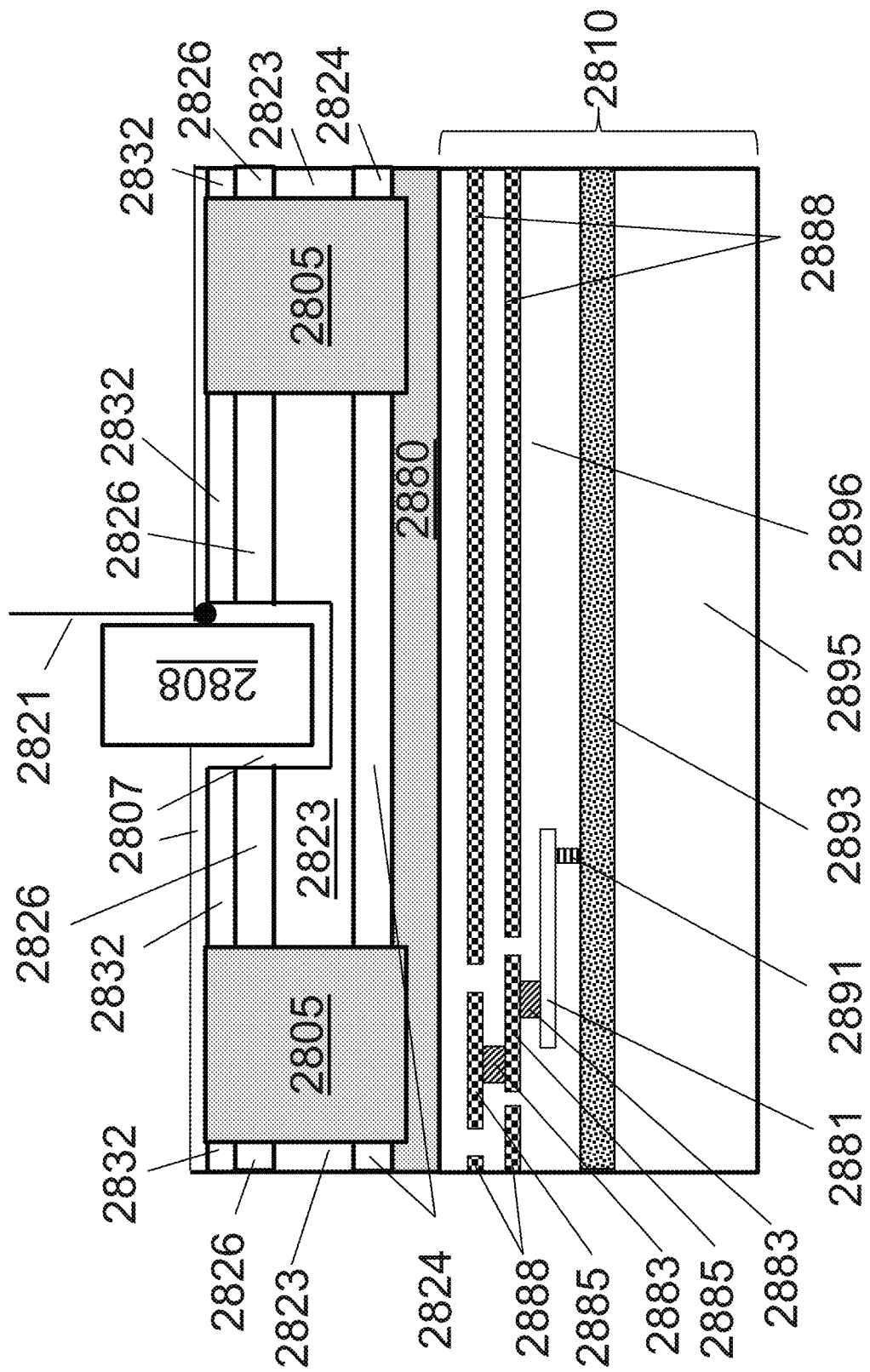

As illustrated in FIG. 28E, a gate dielectric 2807 may be formed and a gate metal material may be deposited. The gate dielectric 2807 may be an atomic layer deposited (ALD) gate dielectric that may be paired with a work function specific gate metal in the industry standard high k metal gate process schemes described in the incorporated references. Alternatively, the gate dielectric 2807 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-28, 25-27 Apr. 2005) and agate material with proper work function and less than approximately 400° C. deposition temperature such as, for example, tungsten or aluminum may be deposited. An optical step, such as represented by exemplary gox ray 2821, may be performed to densify and/or remove defects from gate dielectric 2807. The gate material may be chemically mechanically polished, and the gate area defined by masking and etching, thus forming the gate electrode 2808. The shape of gate electrode 2808 is illustrative, the gate electrode may also overlap a portion of N+ source and drain regions 2832. An optical step, such as represented by exemplary gox ray 2821, may be performed to anneal defects and activate dopants such as LDD and S/D implants, densify an ILD thick oxide 2809, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process.

Figure 28F:
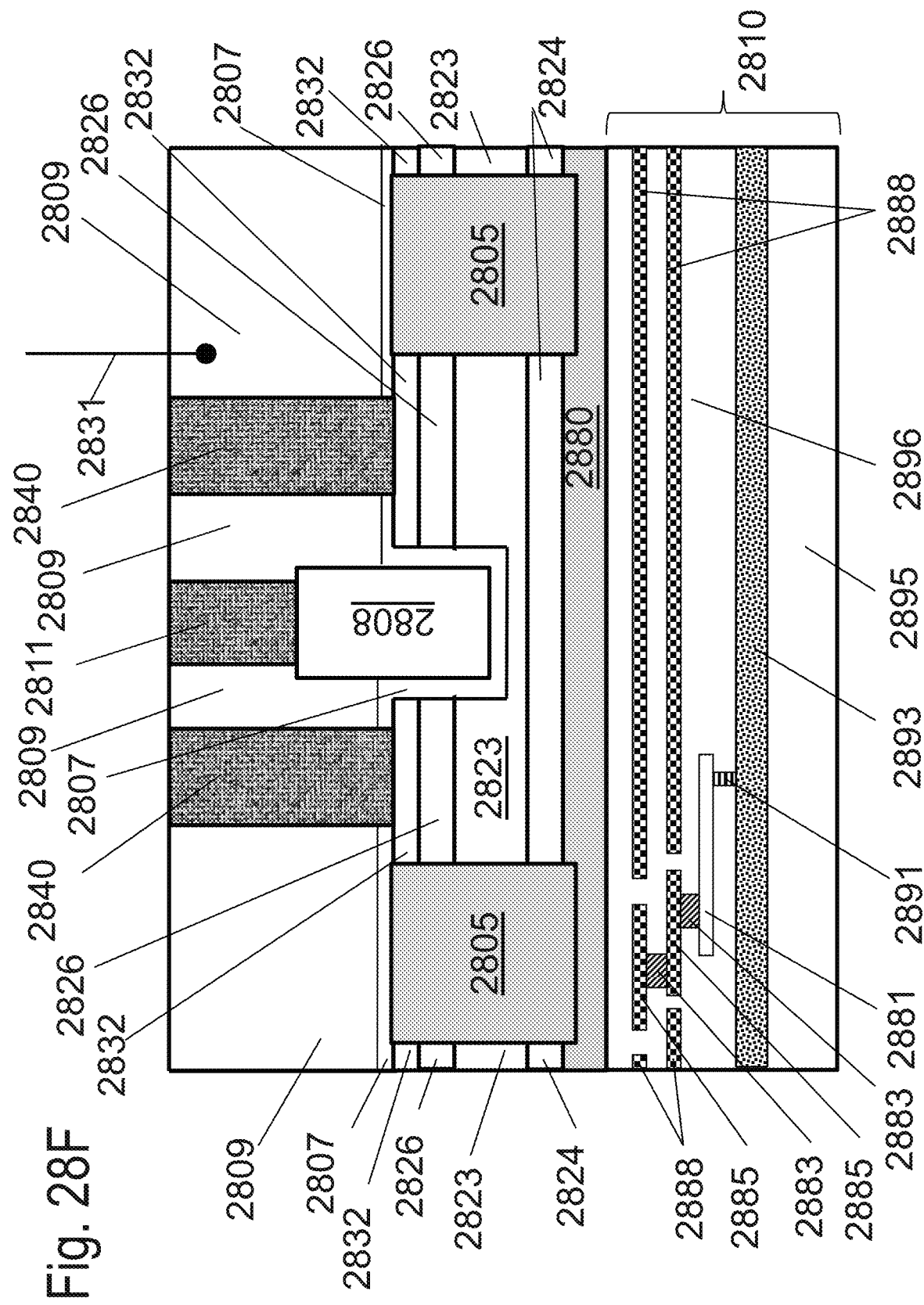

As illustrated in FIG. 28F, a low temperature thick oxide 2809 may be deposited and planarized. Source, gate, and drain contacts, P+ doped region contact (not shown) openings may be masked and etched preparing the transistors to be connected via metallization. P+ doped region contact may be constructed thru isolation regions 2805, suitably when the isolation regions 2805 is formed to a shared P+ doped region 2824. Thus gate contact 2811 connects to gate electrode 2808, and source & drain contacts 2840 connect to N+ source and drain regions 2832. An optical step, such as illustrated by exemplary STI ray 2831, may be performed to anneal contact etch damage and densify the thick oxide 2809.

Figure 28G:
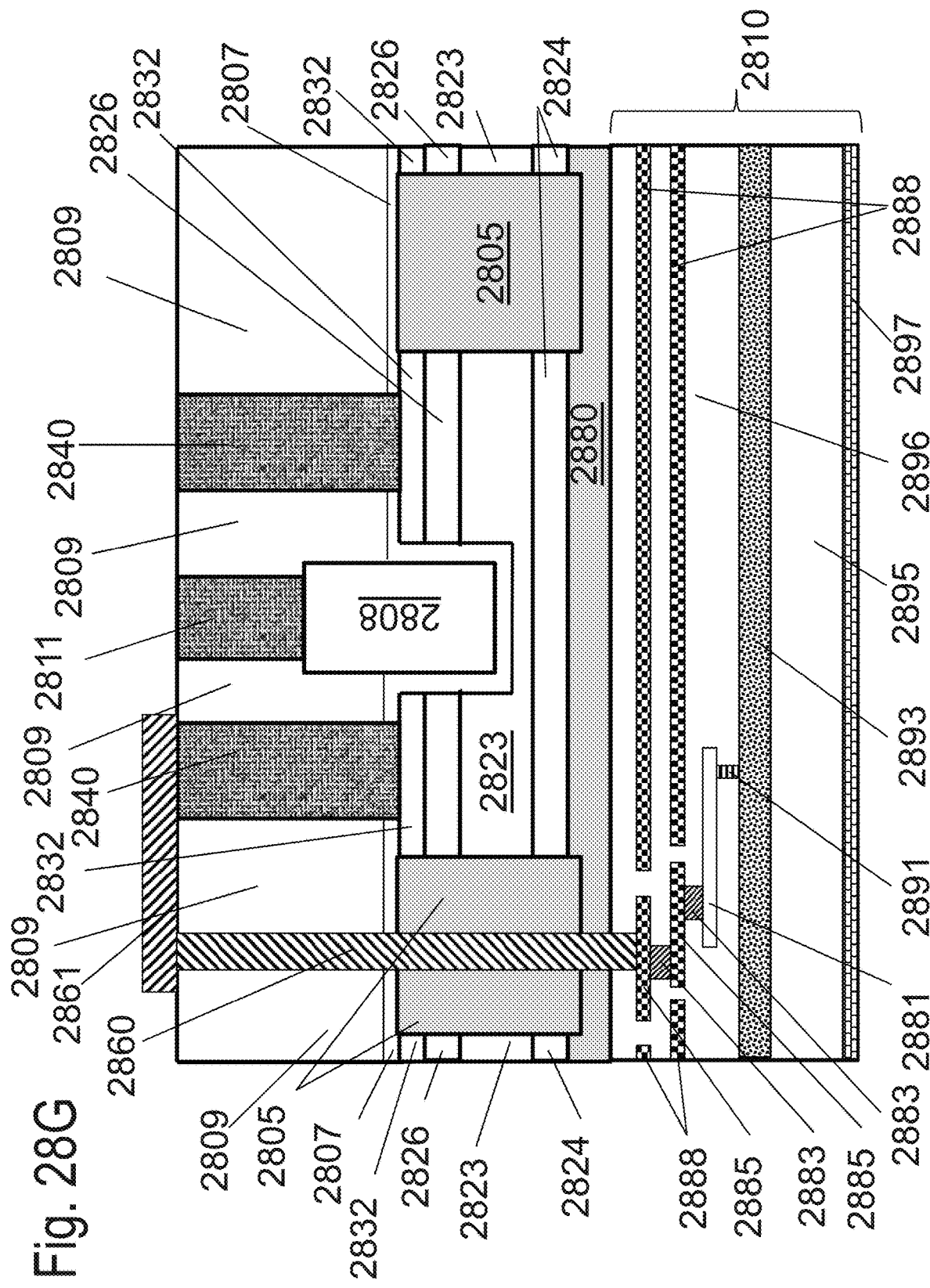

As illustrated in FIG. 28G, thru layer vias (TLVs) 2860 may be formed by etching thick oxide 2809, gate dielectric 2807, isolation regions 2805, oxide layer 2880, into a portion of the upper oxide layer BEOL isolation 2896 of acceptor wafer 2810 BEOL, and filling with an electrically and thermally conducting material or an electrically non-conducting but thermally conducting material. Second device layer metal interconnect 2861 may be formed by conventional processing. TLVs 2860 may be constructed of thermally conductive but not electrically conductive materials, for example, DLC (Diamond Like Carbon), and may connect the FD-RCAT transistor device and other devices on the top (second) crystalline layer thermally to shield/heat sink layer 2888. TLVs 2860 may be constructed out of electrically and thermally conductive materials, such as Tungsten, Copper, or aluminum, and may provide a thermal and electrical connection path from the FD-RCAT transistor device and other devices on the top (second) crystalline layer to shield/heat sink layer 2888, which may be a ground or Vdd plane in the design/layout. TLVs 2860 may be also constructed in the device scribelanes (pre-designed in base layers or potential dicelines) to provide thermal conduction to the heat sink, and may be sawed/diced off when the wafer is diced for packaging not shown). Shield/heat sink layer 2888 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 2888 may be actively biased with an anti-interference signal from circuitry residing on, for example, a layer of the 3D-IC or off chip. A thermal conduction path may be constructed from the devices in the upper layer, the transferred donor layer and formed transistors, to the acceptor wafer substrate and associated heat sink. The thermal conduction path from the FD-RCAT transistor device and other devices on the top (second) crystalline layer, for example, N+ source and drain regions 2832, to the acceptor wafer heat sink 2897 may include source & drain contacts 2840, second device layer metal interconnect 2861, TLV 2860, shield path connect 2885 (shown as twice), shield path via 2883 (shown as twice), metal interconnect 2881, first (acceptor) layer metal interconnect 2891, acceptor wafer transistors and devices 2893, and acceptor substrate 2895. The elements of the thermal conduction path may include materials that have a thermal conductivity greater than 10 W/m-K, for example, copper (about 400 W/m-K), aluminum (about 237 W/m-K), and Tungsten (about 173 W/m-K). The heat removal apparatus, which may include acceptor wafer heat sink 2897, may include an external surface from which heat transfer may take place by methods such as air cooling, liquid cooling, or attachment to another heat sink or heat spreader structure.

It should be noted that one of the design requirements for a monolithic 3D IC design may be that substantially all of the stacked layers and the base or substrate would have their respective dice lines (may be called scribelines) aligned. As the base wafer or substrate is processed and multiple circuits may be constructed on semiconductor layers that overlay each other, the overall device may be designed wherein each overlaying layer would have its respective dice lines overlying the dice lines of the layer underneath, thus at the end of processing the entire layer stacked wafer/substrate could be diced in a dicing step. There may be test structures in the streets between dice lines, which overall may be called scribelanes or dicelanes. These scribelanes or dicelanes may be 10 um wide, 20 um wide, 50 um wide 100 um wide, or greater than 100 um wide depending on design choice and die singulation process capability. The scribelanes or dicelanes may include guard-ring structures and/or other die border structures. In a monolithic 3D design each layer test structure could be connected through each of the overlying layers and then to the top surface to allow access to these 'buried' test structure before dicing the wafer. Accordingly the design may include these vertical connections and may offset the layer test structures to enable such connection. In many cases the die borders comprise a protection structure, such as, for example, a guard-ring structure, die seal structure, ESD structure, and others elements. Accordingly in a monolithic 3D device these structures, such as guard rings, would be designed to overlay each other and may be aligned to each other during the course of processing. The die edges may be sealed by a process and structure such as, for example, described in relation to FIG. 183C of incorporated U.S. Pat. No. 8,273,610, and may include aspects as described in relation to FIGS. 183A and 183B of same reference. One skilled in the art would recognize that the die seal can be passive or electrically active. On each 3D stack layer, or stratum, the electronic circuits within one die, that may be circumscribed by a dicelane, may not be connected to the electronic circuits of a second die on that same wafer, that second die also may be circumscribed by a dicelane. Further, the dicelane/scribelane of one stratum in the 3D stack may be aligned to the dicelane/scribelane of another stratum in the 3D stack, thus providing a direct die singulation vector for the 3D stack of stratums/layers.

Furthermore, some or all of the layers utilized as shield/heat sink layer 2888, which may include shapes of material such as the strips or fingers as illustrated in FIG. 27B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 2888 layer or layers. Moreover, some or all of the layers utilized as shield/heat sink layer 2888, which may include strips or fingers as illustrated in FIG. 27B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 2888 layer or layers. The Vsupply on line 17C12 and the control signals on control line 17C16 may be controlled by and/or generated in the second layer transistors (for example donor wafer device structures such as the FD-RCATs formed as described in relation to FIG. 28) or first layer transistors (acceptor, for example acceptor wafer transistors and devices 2893), or off chip circuits. Furthermore, some or all of the layers utilized as shield/heat sink layer 2888, which may include strips or fingers as illustrated in FIG. 27B-1 or other shapes such as those in FIG. 27B, may be utilized to distribute independent power supplies to various portions of the second layer transistors (for example donor wafer device structures such as the FD-RCATs formed as described in relation to FIG. 28 of incorporated patent reference U.S. Pat. No. 9,385,058) or first layer transistors (acceptor, for example acceptor wafer transistors and devices 2893 of incorporated patent reference U.S. Pat. No. 9,385,058) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 2888 or layers can impact their heat-shielding capacity. This impact may be mitigated, for example, by enhancing the top shield/heat sink layer 2888 areal density, creating more of the secondary shield/heat sink layers 2888, or attending to special CAD rules regarding their metal density, similar to CAD rules that are required to accommodate Chemical-Mechanical Planarization (CMP). These constraints would be integrated into a design and layout EDA tool TLVs 2860 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

As illustrated in FIG. 28G-1, at least one conductive bond pad 2864 for interfacing electrically (and may thermally) to external devices may be formed on top of the completed device and may include at least one metal layer of second device layer metal interconnect 2861. Bond pad 2864 may overlay second device layer metal interconnect 2861 or a portion of (some of the metal and insulator layers of) second device layer metal interconnect 2861. Bond pad 2864 may be directly aligned to the acceptor wafer alignment marks (not shown) and the I/O driver circuitry may be formed by the second layer (donor) transistors, for example, donor wafer device structures such as the FD-RCATs formed as described in relation to FIG. 28. Bond pad 2864 may be connected to the second layer transistors thru the second device layer metal interconnect 2861 which may include vias 2862. The I/O driver circuitry may be formed by transistors from the acceptor wafer transistors and devices 2893, or from transistors in other strata if the 3DIC device has more than two layers of transistors. I/O pad control metal segment 2867 may be formed directly underneath bond pad 2864 and may influence the noise and ESD (Electro Static Discharge) characteristics of bond pad 2864. The emf influence of I/O pad control metal segment 2867 may be controlled by circuitry formed from a portion of the second layer transistors. I/O pad control metal segment 2867 may be formed with second device layer metal interconnect 2861.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 28 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 28A through 28G are exemplary only and are not drawn to scale. Such skilled persons will further appreciate that many variations are possible such as, for example, a p-channel FD-RCAT may be formed with changing the types of dopings appropriately. Moreover, the P− substrate donor wafer 2800 may be n type or un-doped. Further, P− doped channel layer 2803 may include multiple layers of different doping concentrations and gradients to fine tune the eventual FD-RCAT channel for electrical performance and reliability characteristics, such as, for example, off-state leakage current and on-state current. Furthermore, isolation regions 2805 may be formed by a hard mask defined process flow, wherein a hard mask stack, such as, for example, silicon oxide and silicon nitride layers, or silicon oxide and amorphous carbon layers, may be utilized. Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, P+ doped regions 2824 may be utilized for a double gate structure for the FD-RCAT and may utilize techniques described in the incorporated references. Further, efficient heat removal and transistor body biasing may be accomplished on a FD-RCAT by adding an appropriately doped buried layer (N− in the case of a n-FD-RCAT), forming a buried layer region underneath the P+ doped regions 2824 for junction isolation, and connecting that buried region to a thermal and electrical contact, similar to what is described for layer 1606 and region 1646 in FIGS. 16A-G in the incorporated reference pending U.S. patent application Ser. No. 13/441,923 and U.S. Patent Publication 2012/0091587. Moreover, implants after the formation of the isolation regions 2805 may be annealed by optical (such as pulsed laser) means as previously described and the acceptor wafer metallization may be protected by the shield/heat sink layer 2888. Furthermore, raised source and drain contact structures, such as etch and epi SiGe and SiC, may be utilized for strain and contact resistance improvements and the damage from the processes may be optically annealed. Moreover, the optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process. Many other modifications within the scope of the invention will suggest themselves to such skilled persons after reading this specification. Thus the invention is to be limited only by the appended claims.

A planar fully depleted n-channel MOSFET (FD-MOSFET) with an optional integrated heat shield/spreader suitable for a monolithic 3D IC may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 29A-G illustrates an exemplary n-channel FD-MOSFET which may be constructed in a 3D stacked layer using procedures outlined below and in U.S. Pat. Nos. 8,273,610, 9,099,526, 9,219,005, 8,557,632 and 8,581,349. The contents of the foregoing applications are incorporated herein by reference.

Figure 29A:
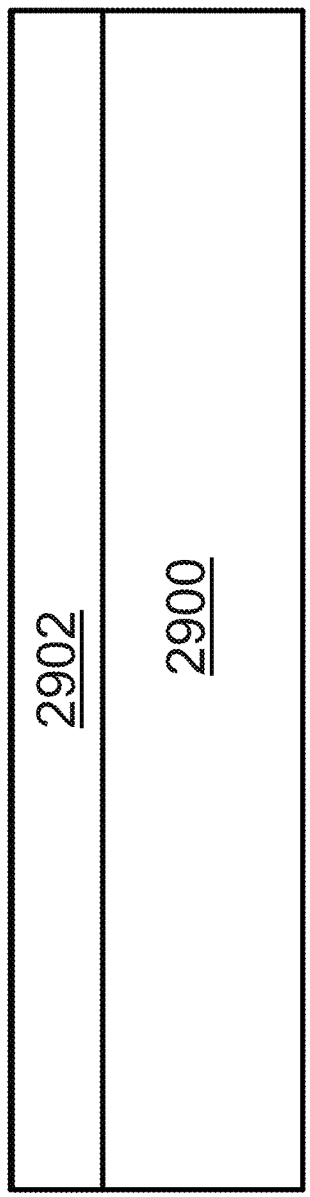

As illustrated in FIG. 29A, a P− substrate donor wafer 2900 may be processed to include a wafer sized layer of doping across the wafer. The channel layer 2902 may be formed by ion implantation and thermal anneal. P− substrate donor wafer 2900 may include a crystalline material, for example, mono-crystalline (single crystal) silicon. P− substrate donor wafer 2900 may be very lightly doped (less than 1e15 atoms/cm$^3$) or nominally un-doped (less than 1e14 atoms/cm$^3$). Channel layer 2902 may have additional ion implantation and anneal processing to provide a different dopant level than P− substrate donor wafer 2900 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred crystalline channel layer 2902 will be undoped to eventually create an FD-MOSFET transistor with an updoped conduction channel.

Figure 29B:
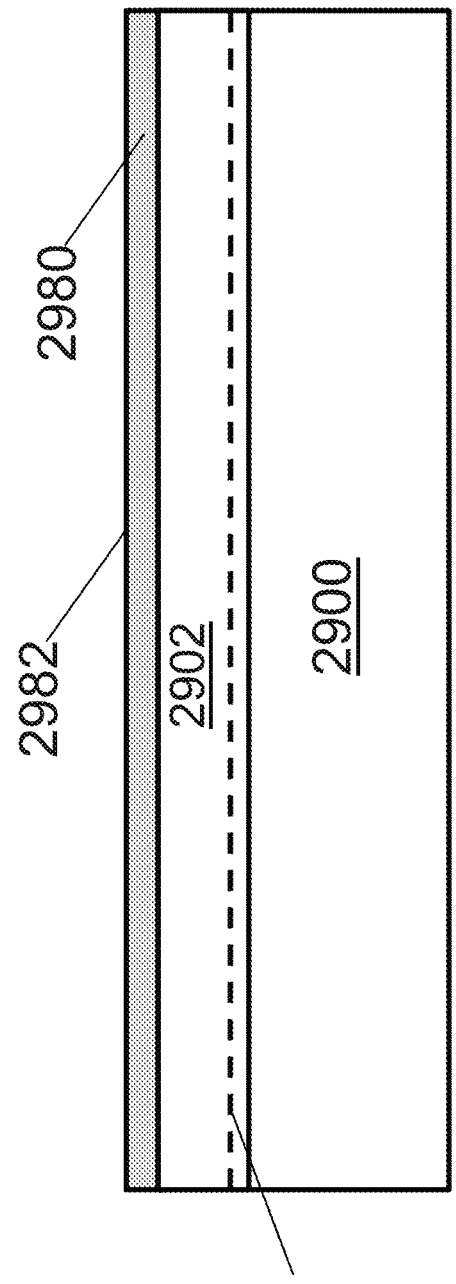

As illustrated in FIG. 29B, the top surface of the P−substrate donor wafer 2900 layer stack may be prepared for oxide wafer bonding with a deposition of an oxide or by thermal oxidation of channel layer 2902 to form oxide layer 2980. A layer transfer demarcation plane (shown as dashed line) 2999 may be formed by hydrogen implantation or other methods as described in the incorporated references. The P−substrate donor wafer 2900, such as surface 2982, and acceptor wafer 2910 may be prepared for wafer bonding as previously described and low temperature (less than approximately 400° C.) bonded. Acceptor wafer 2910, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 2910 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 2910 may include transistors such as, for example, MOSFETS, FD-MOSFETS, FinFets, FD-RCATs, BJTs, HEMTs, and/or HBTs. The portion of the channel layer 2902 and the P− substrate donor wafer 2900 that may be above (when the layer stack is flipped over and bonded to the acceptor wafer 2910) the layer transfer demarcation plane 2999 may be removed by cleaving or other low temperature processes as described in the incorporated references, such as, for example, ion-cut with mechanical or thermal cleave or other layer transfer methods, thus forming remaining channel layer 2903. Damage/defects to crystalline structure of channel layer 2902 may be annealed by some of the annealing methods described, for example the short wavelength pulsed laser techniques, wherein the channel layer 2902 or portions of channel layer 2902 may be heated to defect annealing temperatures, but the layer transfer demarcation plane 2999 may be kept below the temperate for cleaving and/or significant hydrogen diffusion. The optical energy may be deposited in the upper layer of the stack, for example near surface 2982, and annealing of a portion of channel layer 2902 may take place via heat diffusion.

Figure 29C:
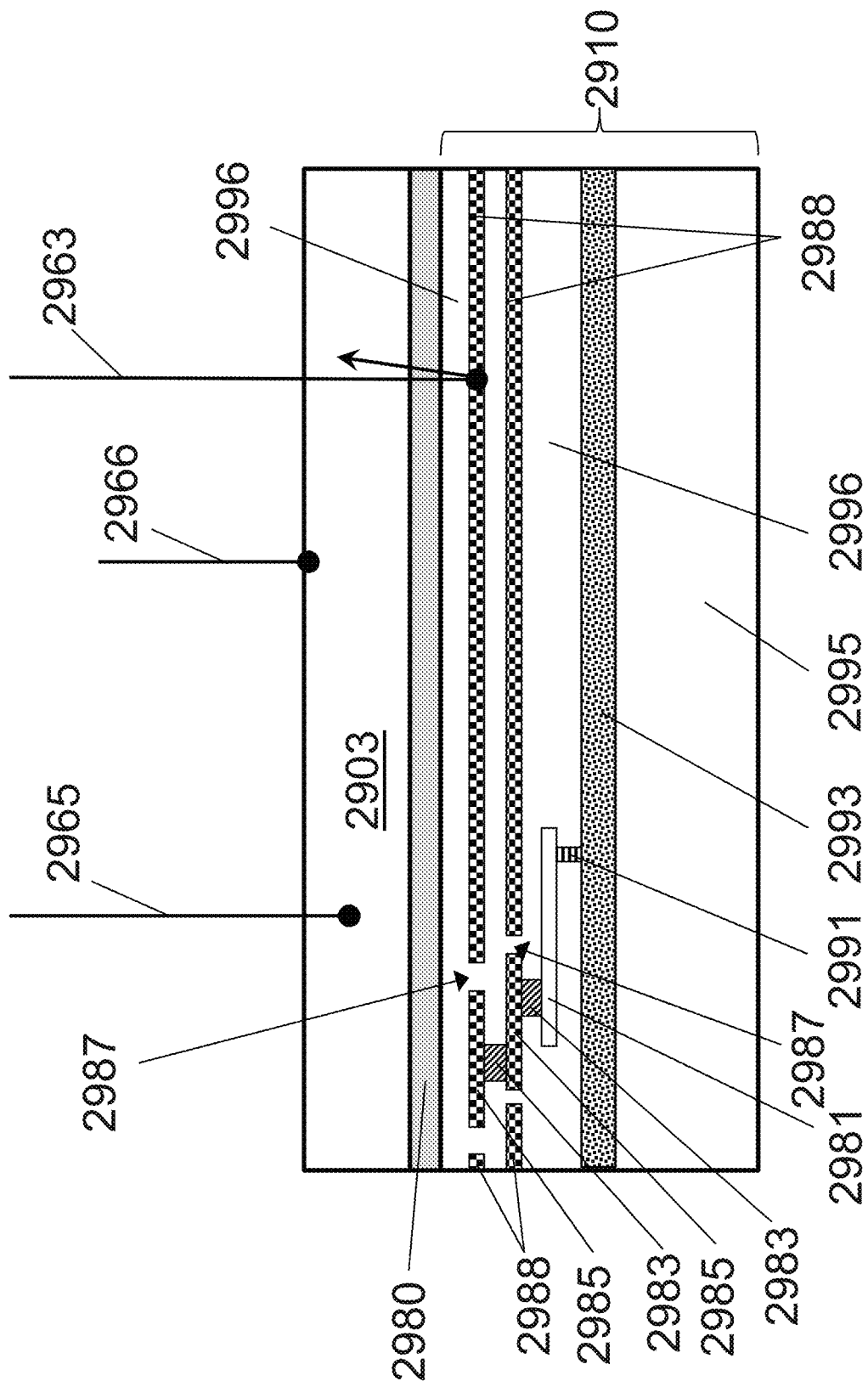

As illustrated in FIG. 29C, oxide layer 2980 and remaining channel layer 2903 have been layer transferred to acceptor wafer 2910. The top surface of remaining channel layer 2903 may be chemically or mechanically polished, and/or may be thinned by low temperature oxidation and strip processes, such as the TEL SPA tool radical oxidation and HF:$H_2O$ solutions as described herein and in referenced patents and patent applications. Thru the processing, the wafer sized layer remaining channel layer 2903 could be thinned from its original total thickness, and its final total thickness could be in the range of about 5 nm to about 20 nm, for example, 5 nm, 7 nm, 10 nm, 12 nm, 15 nm, or 20 nm. Remaining channel layer 2903 may have a thickness and doping that may allow fully-depleted channel operation when the FD-MOSFET transistor is substantially completely formed. Acceptor wafer 2910 may include one or more (two are shown in this example) shield/heat sink layers 2988, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 2988 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 2988 may include isolation openings 2987, and alignment mark openings (not shown), which may be utilized for short wavelength alignment of top layer (donor) processing to the acceptor wafer alignment marks (not shown). Shield/heat sink layer 2988 may include one or more shield path connects 2985 and shield path vias 2983. Shield path via 2983 may thermally and/or electrically couple and connect shield path connect 2985 to acceptor wafer 2910 interconnect metallization layers such as, for example, exemplary acceptor metal interconnect 2981 (shown). Shield path connect 2985 may also thermally and/or electrically couple and connect each shield/heat sink layer 2988 to the other and to acceptor wafer 2910 interconnect metallization layers such as, for example, acceptor metal interconnect 2981, thereby creating a heat conduction path from the shield/heat sink layer 2988 to the acceptor substrate 2995, and a heat sink (shown in FIG. 29G). Isolation openings 2987 may include dielectric materials, similar to those of BEOL isolation 2996. Acceptor wafer 2910 may include first (acceptor) layer metal interconnect 2991, acceptor wafer transistors and devices 2993, and acceptor substrate 2995. Various topside defect anneals may be utilized. For this illustration, an optical beam such as the laser annealing previously described is used. Optical anneal beams may be optimized to focus light absorption and heat generation within or at the surface of remaining channel layer 2903 and provide surface smoothing and/or defect annealing (defects may be from the cleave and/or the ion-cut implantation) with exemplary smoothing/annealing ray 2966. The laser assisted smoothing/annealing with the absorbed heat generated by exemplary smoothing/annealing ray 2966 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 2963 may be reflected and/or absorbed by shield/heat sink layer 2988 regions thus blocking the optical absorption of ray blocked metal interconnect 2981. Annealing of dopants or annealing of damage, such as from the H cleave implant damage, may be also accomplished by a set of rays such as repair ray 2965. Heat generated by absorbed photons from, for example, smoothing/annealing ray 2966, reflected ray 2963, and/or repair ray 2965 may also be absorbed by shield/heat sink layer 2988 regions and dissipated laterally and may keep the temperature of underlying metal layers, such as metal interconnect 2981, and other metal layers below it, cooler and prevent damage. Shield/heat sink layer 2988 and associated dielectrics may laterally spread and conduct the heat generated by the topside defect anneal, and in conjunction with the dielectric materials (low heat conductivity) above and below shield/heat sink layer 2988, keep the interconnect metals and low-k dielectrics of the acceptor wafer interconnect layers cooler than a damage temperature, such as, for example, 400° C. A second layer of shield/heat sink layer 2988 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 2988 may act as a heat spreader. Electrically conductive materials may be used for the two layers of shield/heat sink layer 2988 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 2993), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 2988 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 2988 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 2988 and under & overlying dielectric layers, spreads the localized heat/light energy of the topside anneal laterally and protects the underlying layers of interconnect metallization & dielectrics, such as in the acceptor wafer 2910, from harmful temperatures or damage. When there may be more than one shield/heat sink layer 2988 in the device, the heat conducting layer closest to the second crystalline layer or oxide layer 2980 may be constructed with a different material, for example a high melting point material, for example a refractory metal such as tungsten, than the other heat conducting layer or layers, which may be constructed with, for example, a lower melting point material, for example, such as aluminum or copper. Now transistors may be formed with low effective temperature (less than approximately 400° C. exposure to the acceptor wafer 2910 sensitive layers, such as interconnect and device layers) processing, and may be aligned to the acceptor wafer alignment marks (not shown) as described in the incorporated references. This may include further optical defect annealing or dopant activation steps. The donor wafer 2900 may now also be processed, such as smoothing and annealing, and reused for additional layer transfers. The insulator layer, such as deposited bonding oxides (for example oxide layer 2980) and/or before bonding preparation existing oxides (for example the BEOL isolation 2996 on top of the topmost metal layer of shield/heat sink layer 2988), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 29D:
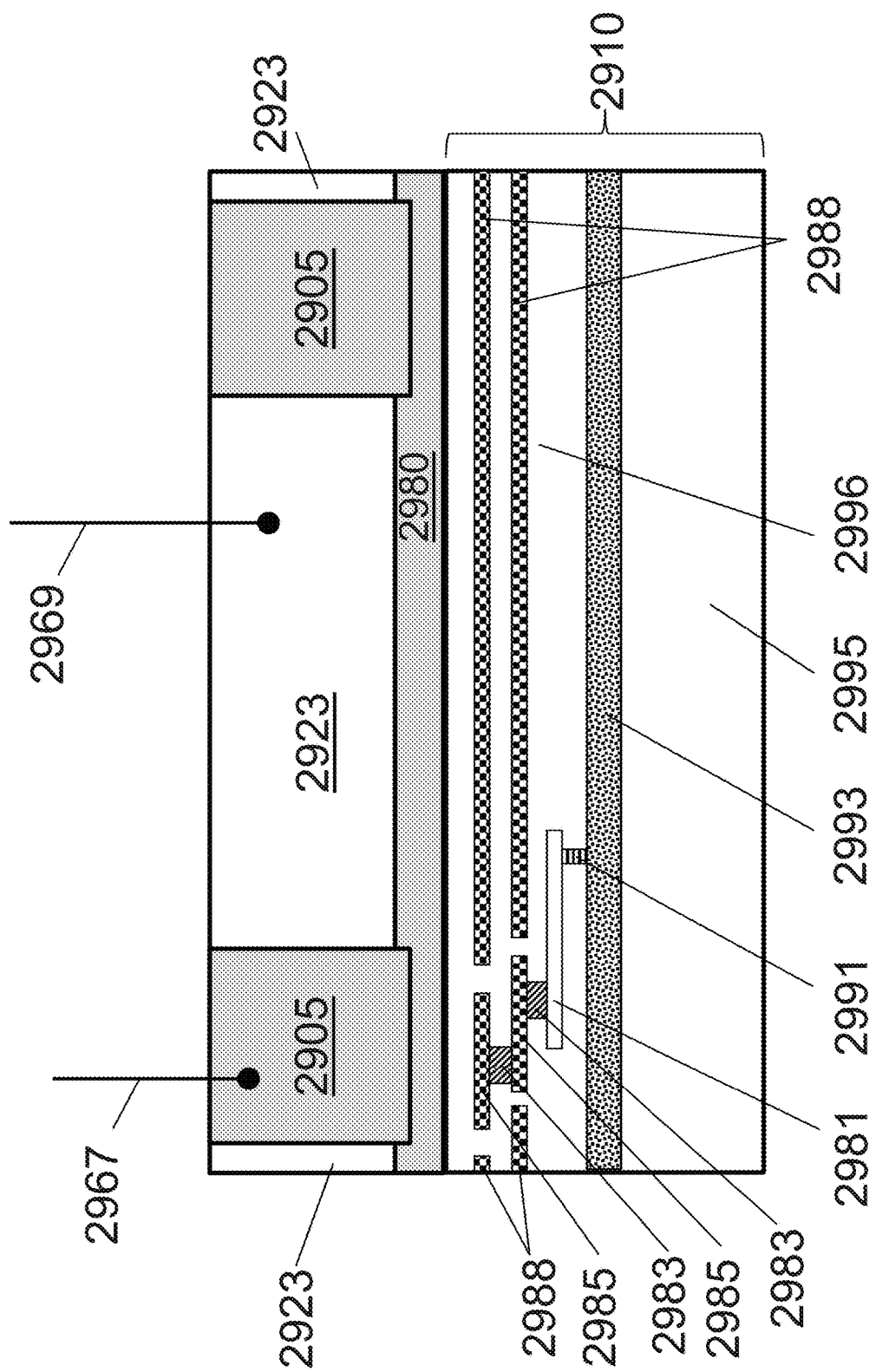

As illustrated in FIG. 29D, transistor isolation regions 2905 may be formed by mask defining and plasma/RIE etching remaining channel layer 2903 substantially to the top of oxide layer 2980 (not shown), substantially into oxide layer 2980, or into a portion of the upper oxide layer of acceptor wafer 2910 (not shown). Thus channel region 2923 may be formed, which may substantially form the transistor body. A low-temperature gap fill dielectric, such as SACVD oxide, may be deposited and chemically mechanically polished, the oxide remaining in isolation regions 2905. An optical step, such as illustrated by exemplary STI ray 2967, may be performed to anneal etch damage and densify the STI oxide in isolation regions 2905. The doping concentration of the channel region 2923 may include gradients of concentration or layers of differing doping concentrations. Any additional doping, such as ion-implanted channel implants, may be activated and annealed with optical annealing, such as illustrated by exemplary implant ray 2969, as described herein. The optical anneal, such as exemplary STI ray 2967, and/or exemplary implant ray 2969 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process.

Figure 29E:
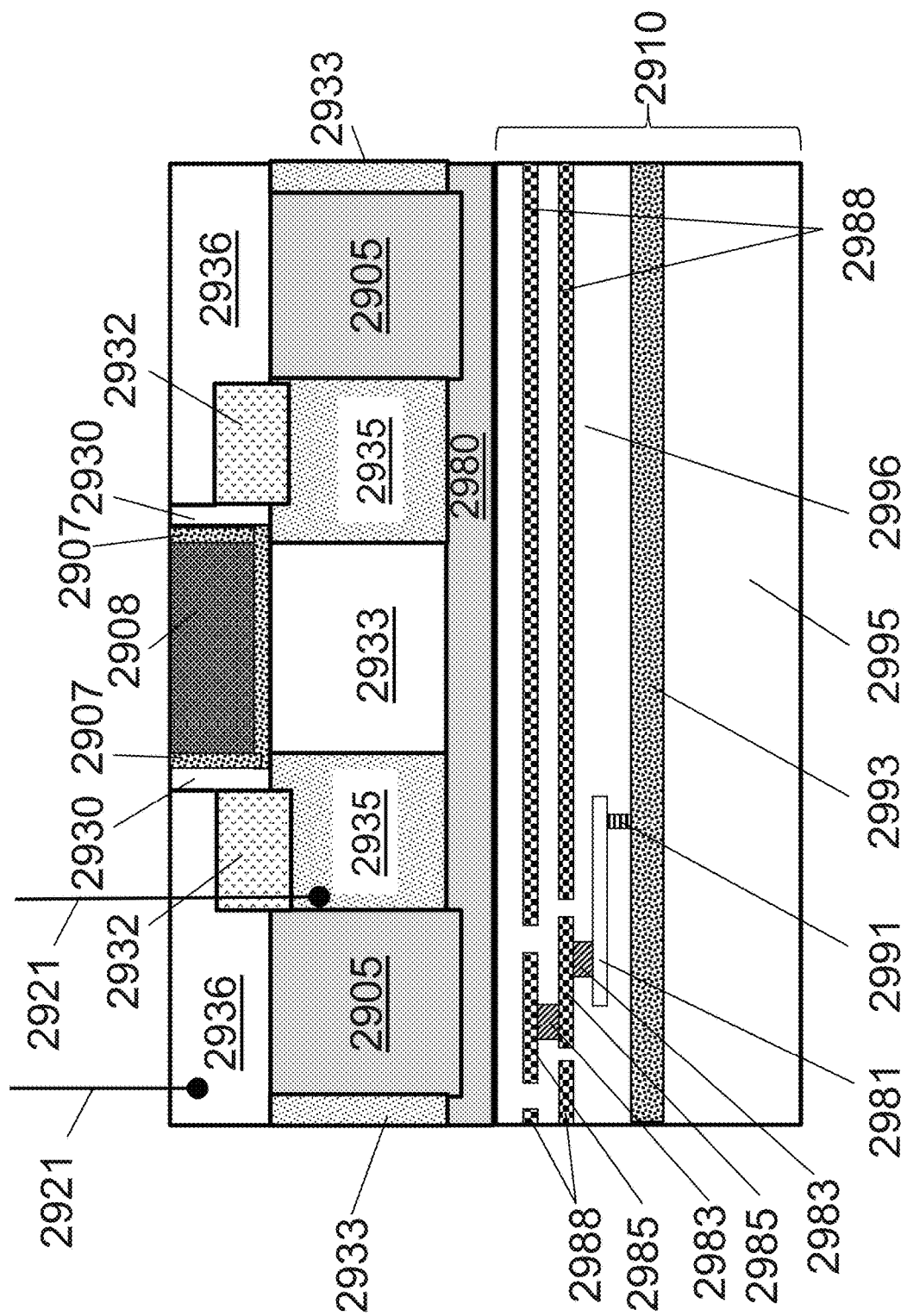
Figure 29F:
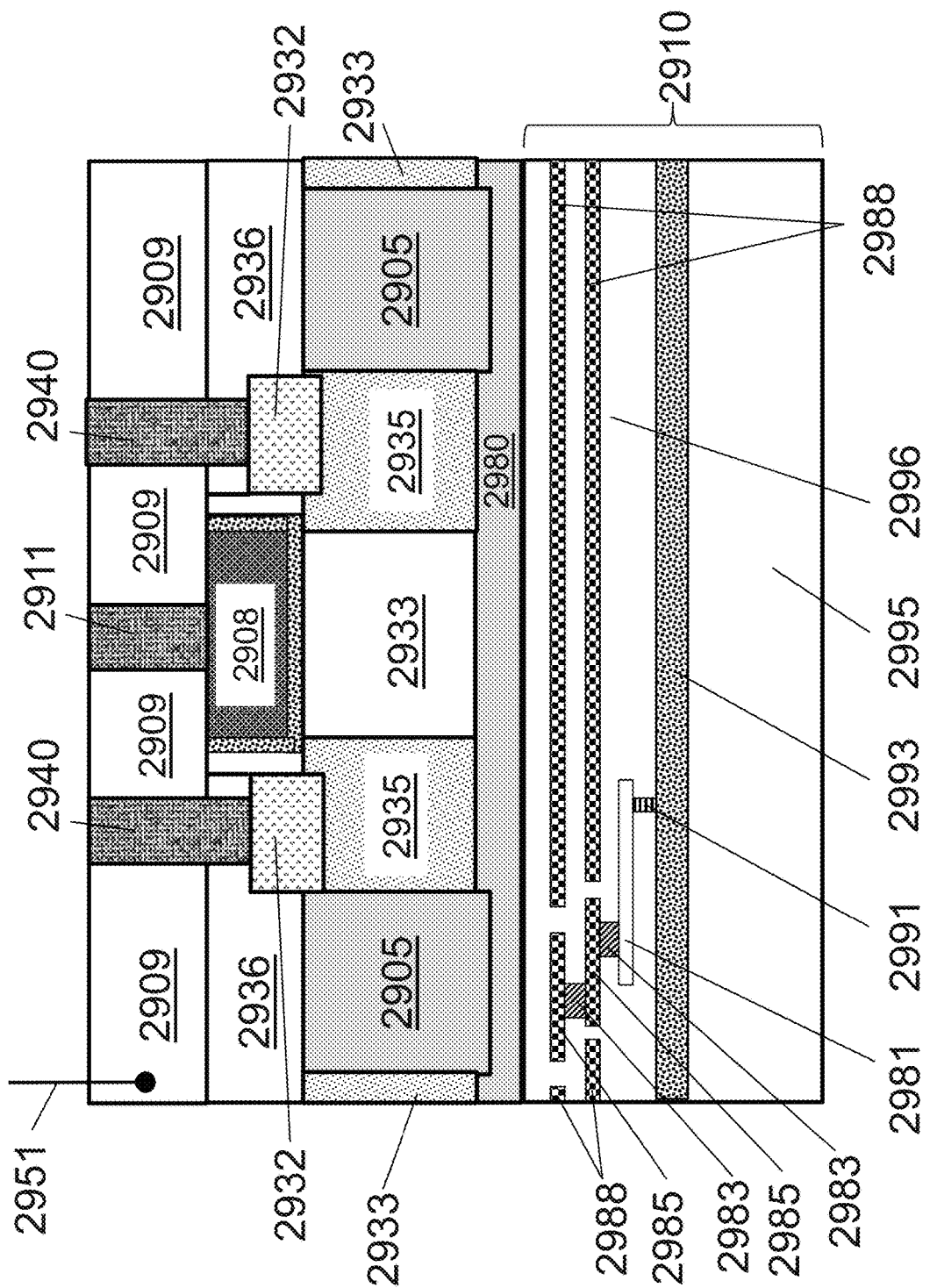

As illustrated in FIG. 29E, a transistor forming process, such as a conventional HKMG with raised source and drains (S/D), may be performed. For example, a dummy gate stack (not shown), utilizing oxide and polysilicon, may be formed, gate spacers 2930 may be formed, raised S/D regions 2932 and channel stressors may be formed by etch and epitaxial deposition, for example, of SiGe and/or SiC depending on P or N channel, LDD and S/D ion-implantations may be performed, and first ILD 2936 may be deposited and CMP'd to expose the tops of the dummy gates. Thus transistor channel 2933 and S/D & LDD regions 2935 may be formed. The dummy gate stack may be removed and a gate dielectric 2907 may be formed and a gate metal material gate electrode 2908, including a layer of proper work function metal ($Ti_xAl_yN_z$ for example) and a conductive fill, such as aluminum, and may be deposited and CMP'd. The gate dielectric 2907 may be an atomic layer deposited (ALD) gate dielectric that may be paired with a work function specific gate metal in the industry standard high k metal gate process schemes, for example, as described in the incorporated references. Alternatively, the gate dielectric 2907 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-29, 25-27 Apr. 2005) and a gate material with proper work function and less than approximately 400° C. deposition temperature such as, for example, tungsten or aluminum may be deposited. An optical step, such as represented by exemplary anneal ray 2921, may be performed to densify and/or remove defects from gate dielectric 2907, anneal defects and activate dopants such as LDD and S/D implants, densify the first ILD 2936, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process. Raised S/D regions 2932 may be formed by low temperature (less than 400° C.) deposition of in-situ doped polysilicon or amorphous silicon into the S/D openings, an optical anneal to further crystallize and dopant activate the raised S/D material, and removal of excess raised S/D material As illustrated in FIG. 29F, a low temperature thick oxide 2909 may be deposited and planarized. Source, gate, and drain contacts openings may be masked and etched preparing the transistors to be connected via metallization. Thus gate contact 2911 connects to gate electrode 2908, and source & drain contacts 2940 connect to raised S/D regions 2932. An optical step, such as illustrated by exemplary ILD anneal ray 2951, may be performed to anneal contact etch damage and densify the thick oxide 2909.

Figure 29G:
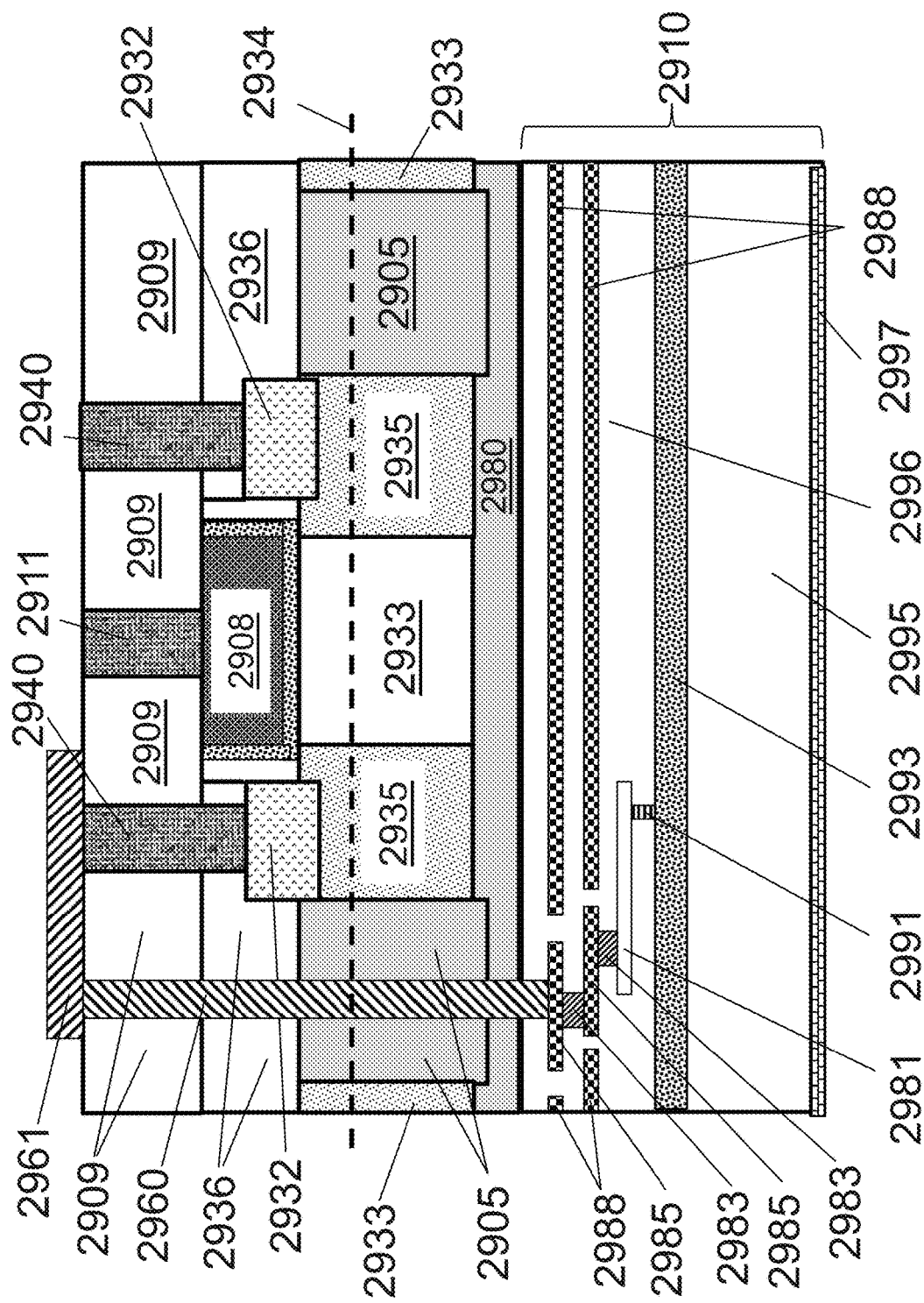
Figures 1, 29G:
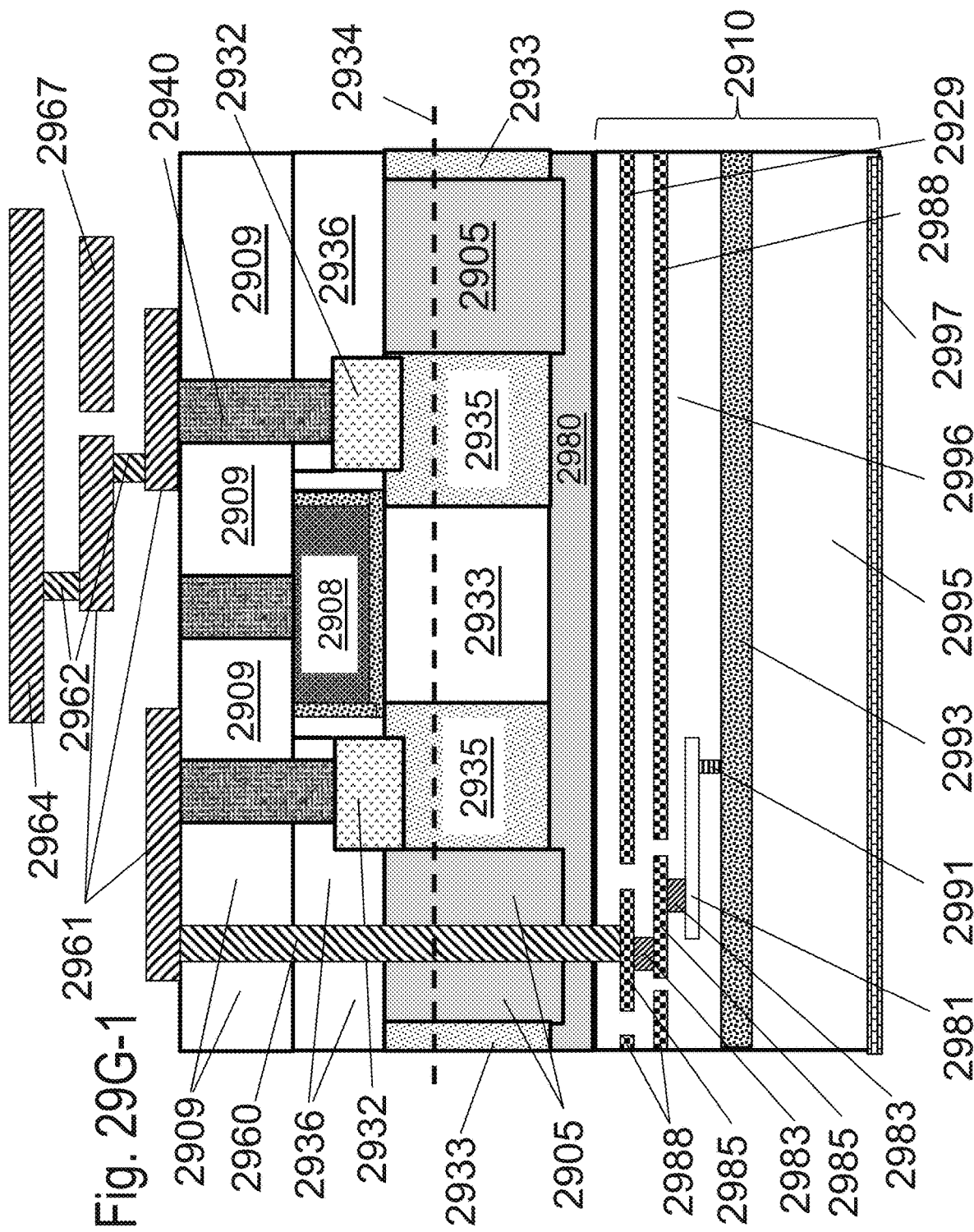

As illustrated in FIG. 29G, thru layer vias (TLVs) 2960 may be formed by etching thick oxide 2909, first ILD 2936, isolation regions 2905, oxide layer 2980, into a portion of the upper oxide layer BEOL isolation 2996 of acceptor wafer 2910 BEOL, and filling with an electrically and thermally conducting material (such as tungsten or cooper) or an electrically non-conducting but thermally conducting material (such as described elsewhere within). Second device layer metal interconnect 2961 may be formed by conventional processing. TLVs 2960 may be constructed of thermally conductive but not electrically conductive materials, for example, DLC (Diamond Like Carbon), and may connect the FD-MOSFET transistor device and other devices on the top (second) crystalline layer thermally to shield/heat sink layer 2988. TLVs 2960 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 2988, which may be a ground or Vdd plane in the design/layout. TLVs 2960 may be also constructed in the device scribelanes (pre-designed in base layers or potential dicelines) to provide thermal conduction to the heat sink, and may be sawed/diced off when the wafer is diced for packaging not shown). Shield/heat sink layer 2988 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 2988 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 2934, may have regions, for example, transistor channel 2933 and S/D & LDD regions 2935, that differ substantially in dopant concentration, for example, a 10 times greater doping concentration in S/D & LDD regions 2935 than in transistor channel 2933, and/or may have a different dopant type, such as, for example p-type or n-type dopant, and/or may be doped and substantially undoped in the neighboring regions. For example, transistor channel 2933 may be very lightly doped (less than 1e15 atoms/cm$^3$) or nominally un-doped (less than 1e14 atoms/cm$^3$) and S/D & LDD regions 2935 may be doped at greater than 1e15 atoms/cm$^3$ or greater than 1e16 atoms/cm$^3$. For example, transistor channel 2933 may be doped with p-type dopant and S/D & LDD regions 2935 may be doped with n-type dopant.

A thermal conduction path may be constructed from the devices in the upper layer, the transferred donor layer and formed transistors, to the acceptor wafer substrate and associated heat sink. The thermal conduction path from the FD-MOSFET transistor device and other devices on the top (second) crystalline layer, for example, raised S/D regions 2932, to the acceptor wafer heat sink 2997 may include source & drain contacts 2940, second device layer metal interconnect 2961, TLV 2960, shield path connect 2985 (shown as twice), shield path via 2983 (shown as twice), metal interconnect 2981, first (acceptor) layer metal interconnect 2991, acceptor wafer transistors and devices 2993, and acceptor substrate 2995. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 2995. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 2996 dielectric. The heat removal apparatus, which may include acceptor wafer heat sink 2997, may include an external surface from which heat transfer may take place by methods such as air cooling, liquid cooling, or attachment to another heat sink or heat spreader structure.

Furthermore, some or all of the layers utilized as shield/heat sink layer 2988, which may include shapes of material such as the strips or fingers as illustrated in FIG. 27B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 2988 layer or layers. Moreover, some or all of the layers utilized as shield/heat sink layer 2988, which may include strips or fingers as illustrated in FIG. 27B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 2988 layer or layers. The Vsupply on line 17C12 and the control signals on control line 17C16 may be controlled by and/or generated in the second layer transistors (for example donor wafer device structures such as the FD-MOSFETs formed as described in relation to FIG. 29) or first layer transistors (acceptor, for example acceptor wafer transistors and devices 2993), or off chip circuits. Furthermore, some or all of the layers utilized as shield/heat sink layer 2988, which may include strips or fingers as illustrated in FIG. 27B-1 or other shapes such as those in FIG. 27B, may be utilized to distribute independent power supplies to various portions of the second layer transistors (for example donor wafer device structures such as the FD-MOSFETs formed as described in relation to FIG. 29 of incorporated patent reference U.S. Pat. No. 9,385,058) or first layer transistors (acceptor, for example acceptor wafer transistors and devices 2993 of incorporated patent reference U.S. Pat. No. 9,385,058) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 2988 or layers can impact their heat-shielding capacity. This impact may be mitigated, for example, by enhancing the top shield/heat sink layer 2988 areal density, creating more of the secondary shield/heat sink layers 2988, or attending to special CAD rules regarding their metal density, similar to CAD rules that are required to accommodate Chemical-Mechanical Planarization (CMP). These constraints would be integrated into a design and layout EDA tool. Second layer metallization and power grid wires (such as second device layer metal interconnect 2961) may be constructed thicker and wider than the first layer metal interconnect (such as metal interconnect 2981), and hence have a higher current conduction capacity. Moreover, the second layer of circuits and transistors, for example, for example donor wafer device structures such as the FD-MOSFETs formed as described in relation to FIG. 29, may include I/O logic devices, such as SerDes (Serialiser/Deserialiser), and conductive bond pads (not shown) (herein such as FIG. 33). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 2988. Placement of the I/O circuits on the same stack layer as the conductive bond pad may enable close coupling of the desired I/O energy and lower signal loss. Furthermore, the second layer of circuits and transistors, for example donor wafer device structures such as the FD-MOSFETs formed as described in relation to FIG. 29, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the shield/heat sink layer 2988.

TLVs 2960 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

As illustrated in FIG. 29G-1, at least one conductive bond pad 2964 for interfacing electrically (and may thermally) to external devices may be formed on top of the completed device and may include at least one metal layer of second device layer metal interconnect 2961. Bond pad 2964 may overlay second device layer metal interconnect 2961 or a portion of (some of the metal and insulator layers of) second device layer metal interconnect 2961. Bond pad 2964 may be directly aligned to the acceptor wafer alignment marks (not shown) and the I/O driver circuitry may be formed by the second layer (donor) transistors, for example, donor wafer device structures such as the FD-MOSFETs formed as described in relation to FIG. 29. Bond pad 2964 may be connected to the second layer transistors thru the second device layer metal interconnect 2961 which may include vias 2962. The I/O driver circuitry may be formed by transistors from the acceptor wafer transistors and devices 2993, or from transistors in other strata if the 3DIC device has more than two layers of transistors. I/O pad control metal segment 2967 may be formed directly underneath bond pad 2964 and may influence the noise and ESD (Electro Static Discharge) characteristics of bond pad 2964. The emf influence of I/O pad control metal segment 2967 may be controlled by circuitry formed from a portion of the second layer transistors. I/O pad control metal segment 2967 may be formed with second device layer metal interconnect 2961. Furthermore, metal segment 2989 of the topmost shield/heat sink layer 2988 may be used to influence the FD-MOSFET transistor or transistors above it by emf, and influence the noise and ESD (Electro Static Discharge) characteristics of bond pad 2964. Metal segment 2989 may be controlled by second layer (donor) transistors, for example, donor wafer device structures such as the FD-MOSFETs formed as described in relation to FIG. 29 and/or by transistors from the acceptor wafer transistors and devices 2993, or from transistors in other strata if the 3DIC device has more than two layers of transistors. Power from external sources may be routed to conductive bond pad 2964 to the 3D device, wherein at least a portion of the second layer interconnections such as second device layer metal interconnect 2961 and associated vias, may be constructed as a power distribution grid/network, and the power distribution grid/network may be connected electrically and thermally via TLVs 2960 to the transistor layer below's (such as acceptor wafer transistors and devices 2993) power distribution grid/network, the power distribution grid/network may include for example, shield/heat sink layer 2988 or Vss/Vdd strategy as described herein at least FIG. 32, and it's associated portion of a thermal conduction path (shield path connect 2985, shield path vias 2983, metal interconnect 2981, first (acceptor) layer metal interconnect 2991) to acceptor wafer transistors and devices 2993, acceptor substrate 2995, and acceptor wafer heat sink 2997.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 29 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 29A through 29G are exemplary only and are not drawn to scale. Such skilled persons will further appreciate that many variations are possible such as, for example, a p-channel FD-MOSFET may be formed with changing the types of dopings appropriately. Moreover, the P− substrate donor wafer 2900 may be n type or un-doped. Furthermore, isolation regions 2905 may be formed by a hard mask defined process flow, wherein a hard mask stack, such as, for example, silicon oxide and silicon nitride layers, or silicon oxide and amorphous carbon layers, may be utilized. Moreover, CMOS FD MOSFET s may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Many other modifications within the scope of the invention will suggest themselves to such skilled persons after reading this specification. Thus the invention is to be limited only by the appended claims.

A planar fully depleted n-channel MOSFET (FD-MOSFET) with an optional integrated heat shield/spreader and back planes and body bias taps suitable for a monolithic 3D IC may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. In this embodiment, a ground plane is constructed that may provide improved electrostatics and/or Vt adjustment and/or back-bias of the FD-MOSFET. In addition, selective regions may be constructed to provide body bias and/or partially depleted/bulk-like transistors. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 30A-G illustrates an exemplary n-channel FD-MOSFET which may be constructed in a 3D stacked layer using procedures outlined below and in U.S. Pat. Nos. 8,273,610, 9,099,526, 9,219, 005, 8,557,632 and 8,581,349. The contents of the foregoing applications are incorporated herein by reference.

Figure 30A:
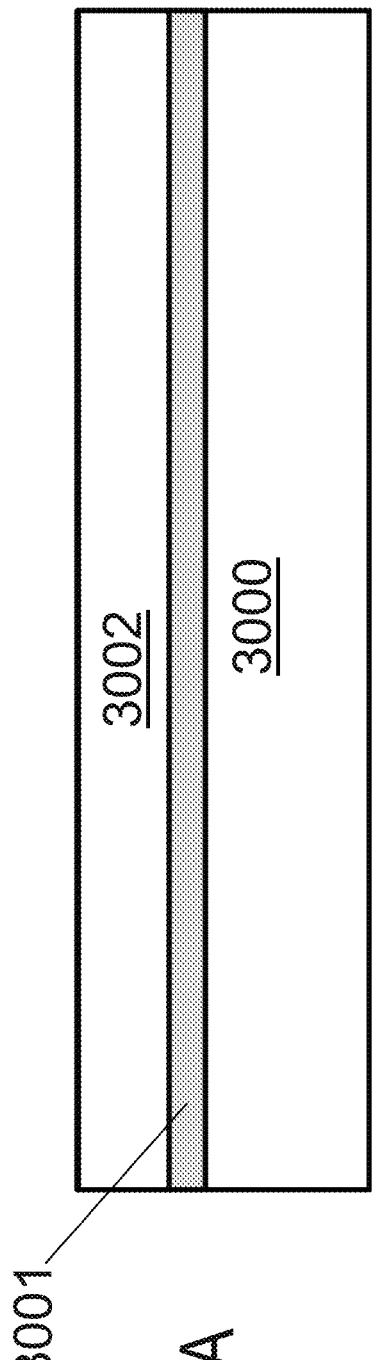
FIGS. 30A-30G are exemplary drawing illustrations of another process flow for manufacturing fully depleted MOSFET (FD-MOSFET) with an integrated shield/heat sink layer.

As illustrated in FIG. 30A, SOI donor wafer substrate 3000 may include back channel layer 3002 above Buried Oxide BOX layer 3001. Back channel layer 3002 may be doped by ion implantation and thermal anneal, may include a crystalline material, for example, mono-crystalline (single crystal) silicon and may be heavily doped (greater than 1e16 atoms/cm$^3$), lightly doped (less than 1e16 atoms/cm$^3$) or nominally un-doped (less than 1e14 atoms/cm$^3$). SOI donor wafer substrate 3000 may include a crystalline material, for example, mono-crystalline (single crystal) silicon and at least the upper layer near BOX layer 3001 may be very lightly doped (less than 1e15 atoms/cm$^3$) or nominally un-doped (less than 1e14 atoms/cm$^3$). Back channel layer 3002 may have additional ion implantation and anneal processing to provide a different dopant level than SOI donor wafer substrate 3000 and may have graded or various layers of doping concentration. SOI donor wafer substrate 3000 may have additional ion implantation and anneal processing to provide a different dopant level than back channel layer 3002 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 3000 doping will be undoped to eventually create an FD-MOSFET transistor with an updoped conduction channel. SOI donor wafer may be constructed by layer transfer techniques described herein or elsewhere as known in the art, or by laser annealed SIMOX at a post donor layer transfer to acceptor wafer step. BOX layer 3001 may be thin enough to provide for effective back and/or body bias, for example, 25 nm, or 20 nm, or 10 nm, or 35 nm.

Figure 30B:
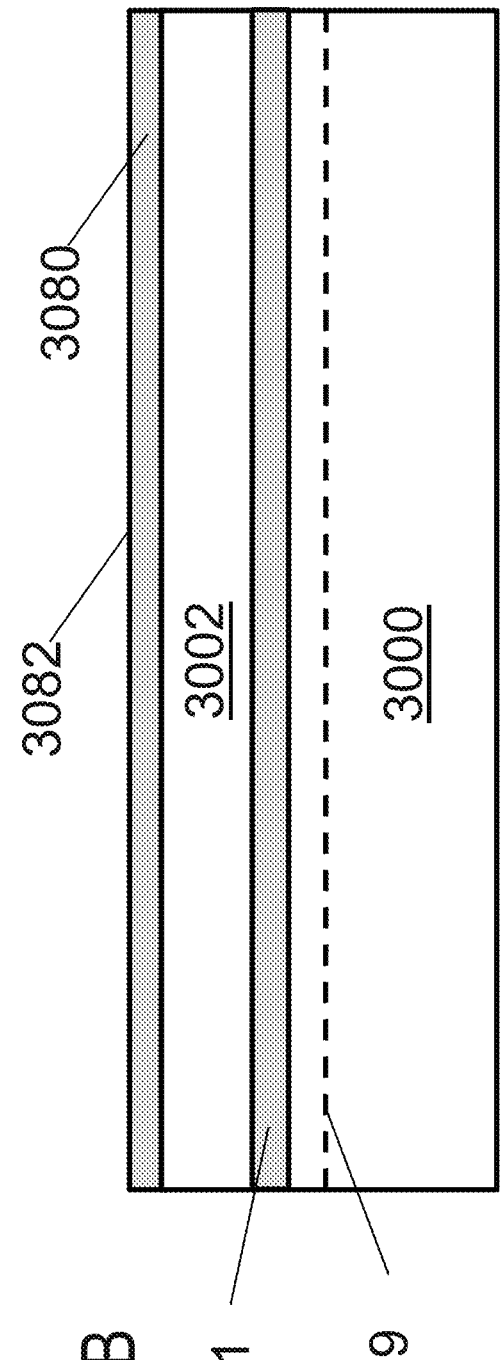

As illustrated in FIG. 30B, the top surface of the SOI donor wafer substrate 3000 layer stack may be prepared for oxide wafer bonding with a deposition of an oxide or by thermal oxidation of back channel layer 3002 to form oxide layer 3080. A layer transfer demarcation plane (shown as dashed line) 3099 may be formed by hydrogen implantation or other methods as described in the incorporated references, and may reside within the SOI donor wafer substrate 3000. The SOI donor wafer substrate 3000 stack, such as surface 3082, and acceptor wafer 3010 may be prepared for wafer bonding as previously described and low temperature (less than approximately 400° C.) bonded. Acceptor wafer 3010, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 3010 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 3010 may include transistors such as, for example, MOSFETS, FD-MOSFETS, FinFets, FD-RCATs, BJTs, HEMTs, and/or HBTs. The portion of the SOI donor wafer substrate 3000 that may be above (when the layer stack is flipped over and bonded to the acceptor wafer 3010) the layer transfer demarcation plane 3099 may be removed by cleaving or other low temperature processes as described in the incorporated references, such as, for example, ion-cut with mechanical or thermal cleave or other layer transfer methods, thus forming remaining channel layer 3003. Damage/defects to crystalline structure of back channel layer 3002 may be annealed by some of the annealing methods described, for example the short wavelength pulsed laser techniques, wherein the back channel layer 3002 and/or portions of the SOI donor wafer substrate 3000 may be heated to defect annealing temperatures, but the layer transfer demarcation plane 3099 may be kept below the temperate for cleaving and/or significant hydrogen diffusion. The optical energy may be deposited in the upper layer of the stack, for example near surface 3082, and annealing of back channel layer 3002 and/or portions of the SOI donor wafer substrate 3000 may take place via heat diffusion. Moreover, multiple pulses of the laser may be utilized to improve the anneal, activation, and yield of the process and/or to control the maximum temperature of various structures in the stack.

Figure 30C:
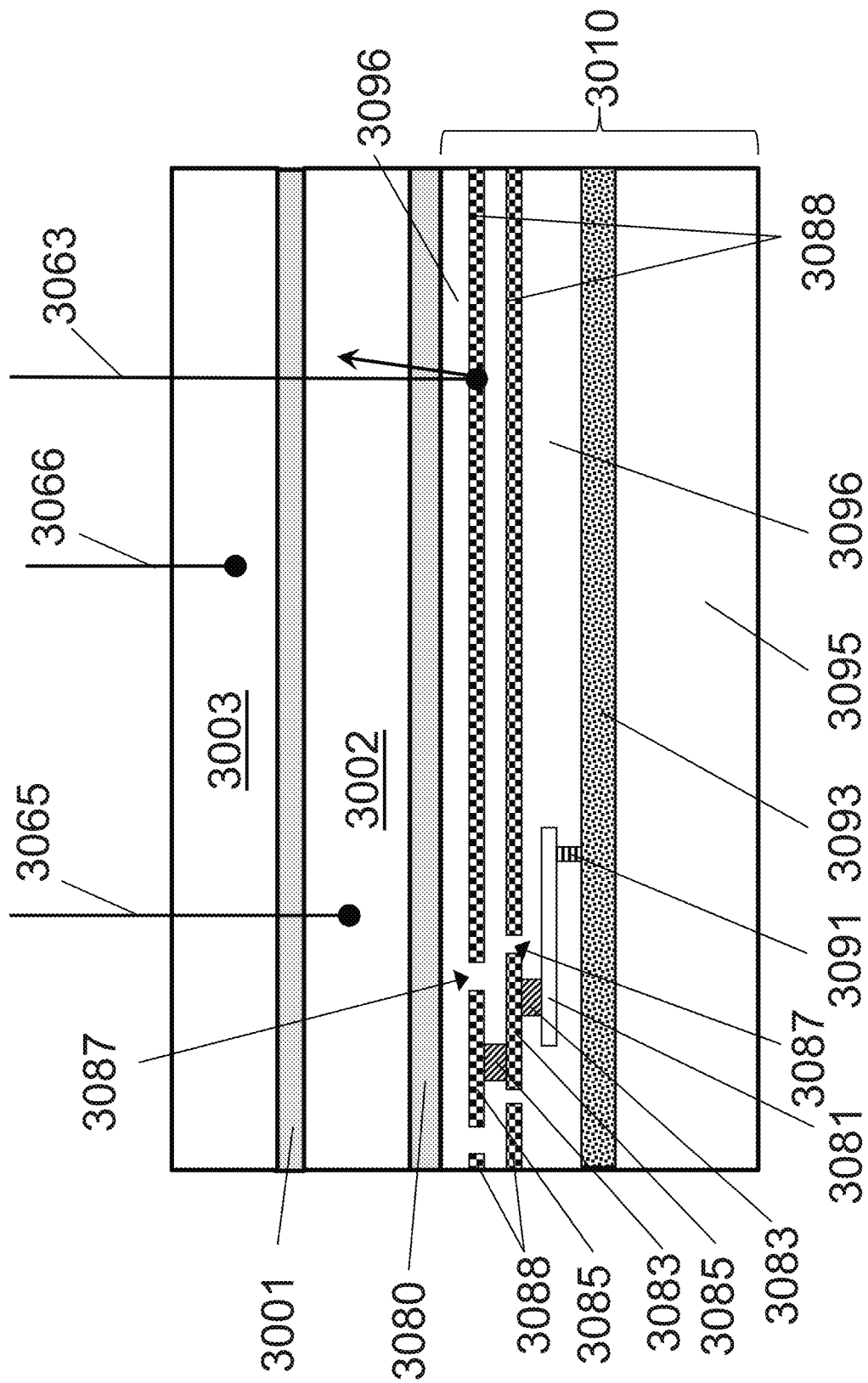

As illustrated in FIG. 30C, oxide layer 3080, back channel layer 3002, BOX layer 3001 and channel layer 3003 may be layer transferred to acceptor wafer 3010. The top surface of channel layer 3003 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer channel layer 3003 could be thinned from its original total thickness, and its final total thickness could be in the range of about 5 nm to about 20 nm, for example, 5 nm, 7 nm, 10 nm, 12 nm, 15 nm, or 20 nm. Channel layer 3003 may have a thickness and/or doping that may allow fully-depleted channel operation when the FD-MOSFET transistor is substantially completely formed. Acceptor wafer 3010 may include one or more (two are shown in this example) shield/heat sink layers 3088, which may include materials such as, for example, Aluminum, Tungsten (a refractory metal), Copper, silicon or cobalt based silicides, or forms of carbon such as carbon nanotubes, and may be layered itself as described in FIG. 50 of incorporated patent reference U.S. Pat. No. 9,385,058. Each shield/heat sink layer 3088 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 3088 may include isolation openings 3087, and alignment mark openings (not shown), which may be utilized for short wavelength alignment of top layer (donor) processing to the acceptor wafer alignment marks (not shown). Shield/heat sink layer 3088 may include one or more shield path connects 3085 and shield path vias 3083. Shield path via 3083 may thermally and/or electrically couple and connect shield path connect 3085 to acceptor wafer 3010 interconnect metallization layers such as, for example, exemplary acceptor metal interconnect 3081 (shown). Shield path connect 3085 may also thermally and/or electrically couple and connect each shield/heat sink layer 3088 to the other and to acceptor wafer 3010 interconnect metallization layers such as, for example, acceptor metal interconnect 3081, thereby creating a heat conduction path from the shield/heat sink layer 3088 to the acceptor substrate 3095, and a heat sink (shown in FIG. 30G). Isolation openings 3087 may include dielectric materials, similar to those of BEOL isolation 3096. Acceptor wafer 3010 may include first (acceptor) layer metal interconnect 3091, acceptor wafer transistors and devices 3093, and acceptor substrate 3095. Various topside defect anneals may be utilized. For this illustration, an optical beam such as the laser annealing previously described is used. Optical anneal beams may be optimized to focus light absorption and heat generation within or at the surface of channel layer 3003 and provide surface smoothing and/or defect annealing (defects may be from the cleave and/or the ion-cut implantation) with exemplary smoothing/annealing ray 3066. The laser assisted smoothing/annealing with the absorbed heat generated by exemplary smoothing/annealing ray 3066 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 3063 may be reflected and/or absorbed by shield/heat sink layer 3088 regions thus blocking the optical absorption of ray blocked metal interconnect 3081. Annealing of dopants or annealing of damage in back channel layer 3002 and/or BOX 3010 and/or channel layer 3003, such as from the H cleave implant damage, may be also accomplished by a set of rays such as repair ray 3065, illustrated is focused on back channel layer 3002. Heat generated by absorbed photons from, for example, smoothing/annealing ray 3066, reflected ray 3063, and/or repair ray 3065 may also be absorbed by shield/heat sink layer 3088 regions and dissipated laterally and may keep the temperature of underlying metal layers, such as metal interconnect 3081, and other metal layers below it, cooler and prevent damage. Shield/heat sink layer 3088 and associated dielectrics may laterally spread and conduct the heat generated by the topside defect anneal, and in conjunction with the dielectric materials (low heat conductivity) above and below shield/heat sink layer 3088, keep the interconnect metals and low-k dielectrics of the acceptor wafer interconnect layers cooler than a damage temperature, such as, for example, 400° C. A second layer of shield/heat sink layer 3088 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 3088 may act as a heat spreader. Electrically conductive materials may be used for the two layers of shield/heat sink layer 3088 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 3093), may include, for example, trench capacitors such as described by Pei, C., et al., "A novel, low-cost deep trench decoupling capacitor for high-performance, low-power bulk CMOS applications," ICSICT (9$^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 3088 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 3088 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 3088 and under & overlying dielectric layers, spreads the localized heat/light energy of the topside anneal laterally and protects the underlying layers of interconnect metallization & dielectrics, such as in the acceptor wafer 3010, from harmful temperatures or damage. When there may be more than one shield/heat sink layer 3088 in the device, the heat conducting layer closest to the second crystalline layer or oxide layer 3080 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 3010 sensitive layers, such as interconnect and device layers) processing, and may be aligned to the acceptor wafer alignment marks (not shown) as described in the incorporated references. This may include further optical defect annealing or dopant activation steps. The remaining SOI donor wafer substrate 3000 may now also be processed, such as smoothing and annealing, and reused for additional layer transfers. The insulator layer, such as deposited bonding oxides (for example oxide layer 3080) and/or before bonding preparation existing oxides (for example the BEOL isolation 3096 on top of the topmost metal layer of shield/heat sink layer 3088), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 30D:
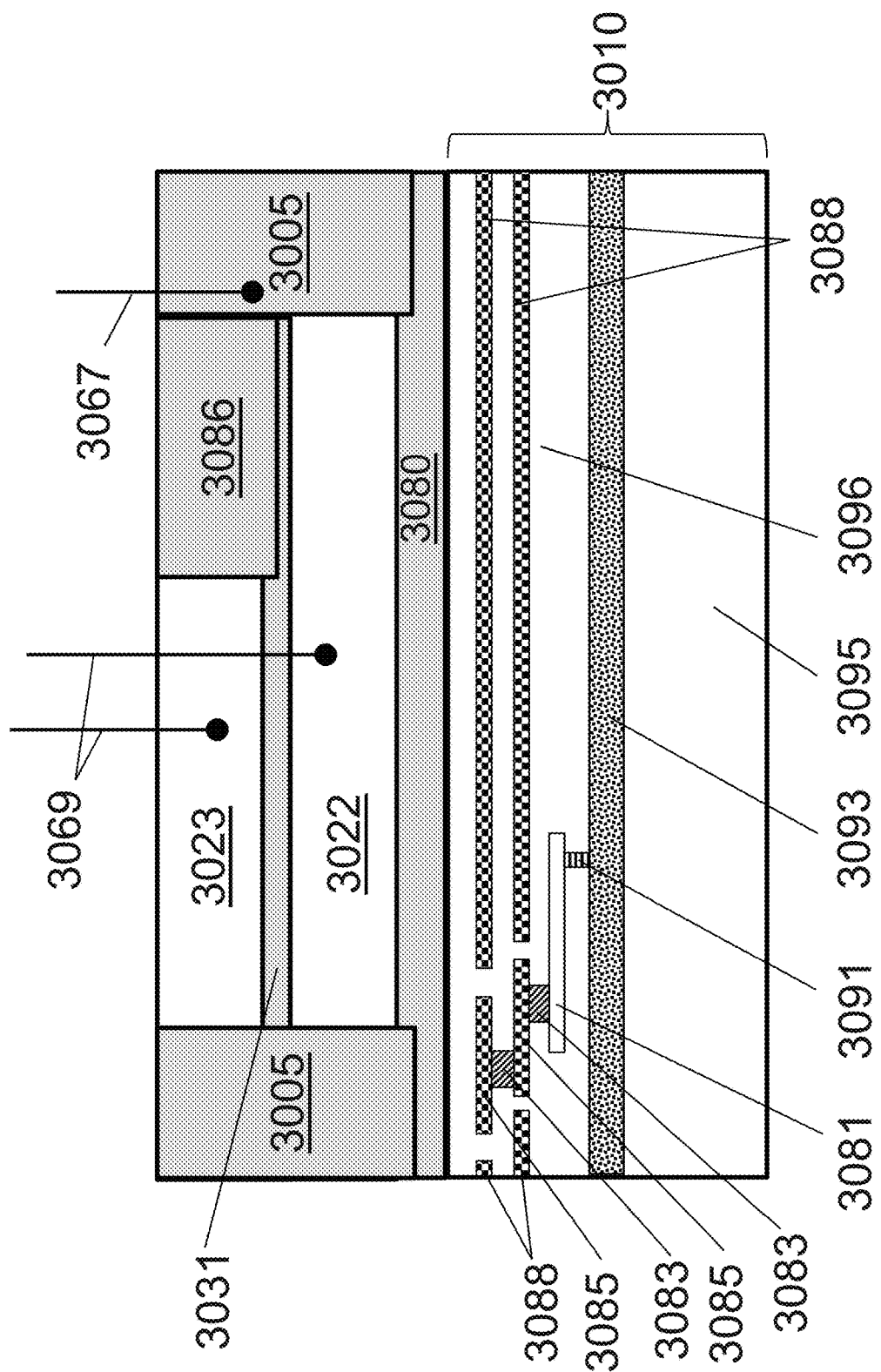

As illustrated in FIG. 30D, transistor and back channel isolation regions 3005 and/or transistor isolation regions 3086 may be formed. Transistor isolation region 3086 may be formed by mask defining and plasma/RIE etching channel layer 3003, substantially to the top of BOX layer 3001 (not shown), substantially into BOX layer 3001, or back channel layer 3002 (not shown). Transistor and back channel isolation regions 3005 may be formed by mask defining and plasma/RIE etching channel layer 3003, BOX layer 3001 and back channel layer 3002, substantially to the top of oxide layer 3080 (not shown), substantially into oxide layer 3080, or further into the top BEOL dielectric layer in acceptor wafer 3010 (not shown). Thus channel region 3023 may be formed, which may substantially form the transistor body, back-channel region 3022 may be formed, which may provide a back bias and/or Vt control by doping or bias to one or more channel regions 3023, and BOX region 3031. Back-channel region 3022 may be ion implanted for Vt control and/or body bias efficiency. A low-temperature gap fill dielectric, such as SACVD oxide, may be deposited and chemically mechanically polished, the oxide remaining in transistor and back channel isolation regions 3005 and transistor isolation regions 3086. Back-channel region 3022 may be ion implanted for Vt control and/or body bias efficiency. An optical step, such as illustrated by exemplary STI ray 3067, may be performed to anneal etch damage and densify the STI oxide in transistor and back channel isolation regions 3005. The doping concentration of channel region 3023 may include vertical or horizontal gradients of concentration or layers of differing doping concentrations. The doping concentration of back-channel region 3022 may include vertical or horizontal gradients of concentration or layers of differing doping concentrations. Any additional doping, such as ion-implanted channel implants, may be activated and annealed with optical annealing, such as illustrated by exemplary implant ray 3069, as described herein. The optical anneal, such as exemplary STI ray 3067, and/or exemplary implant ray 3069 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process. BOX region 3031 may be a relatively thin dielectric, including the thickness range of 5 nm to 100 nm, at least a portion of which being between the back-channel region 3022 and channel region 3023. Back-channel region 3022 could be constructed from a material that would not be damaged by the optical anneal process. Such could be a refractory metal or doped silicon in crystallized form, poly or amorphous, or other conductive material that are acceptable for semiconductor processing and can withstand high temperature of 700° C. or higher.

Figure 30E:
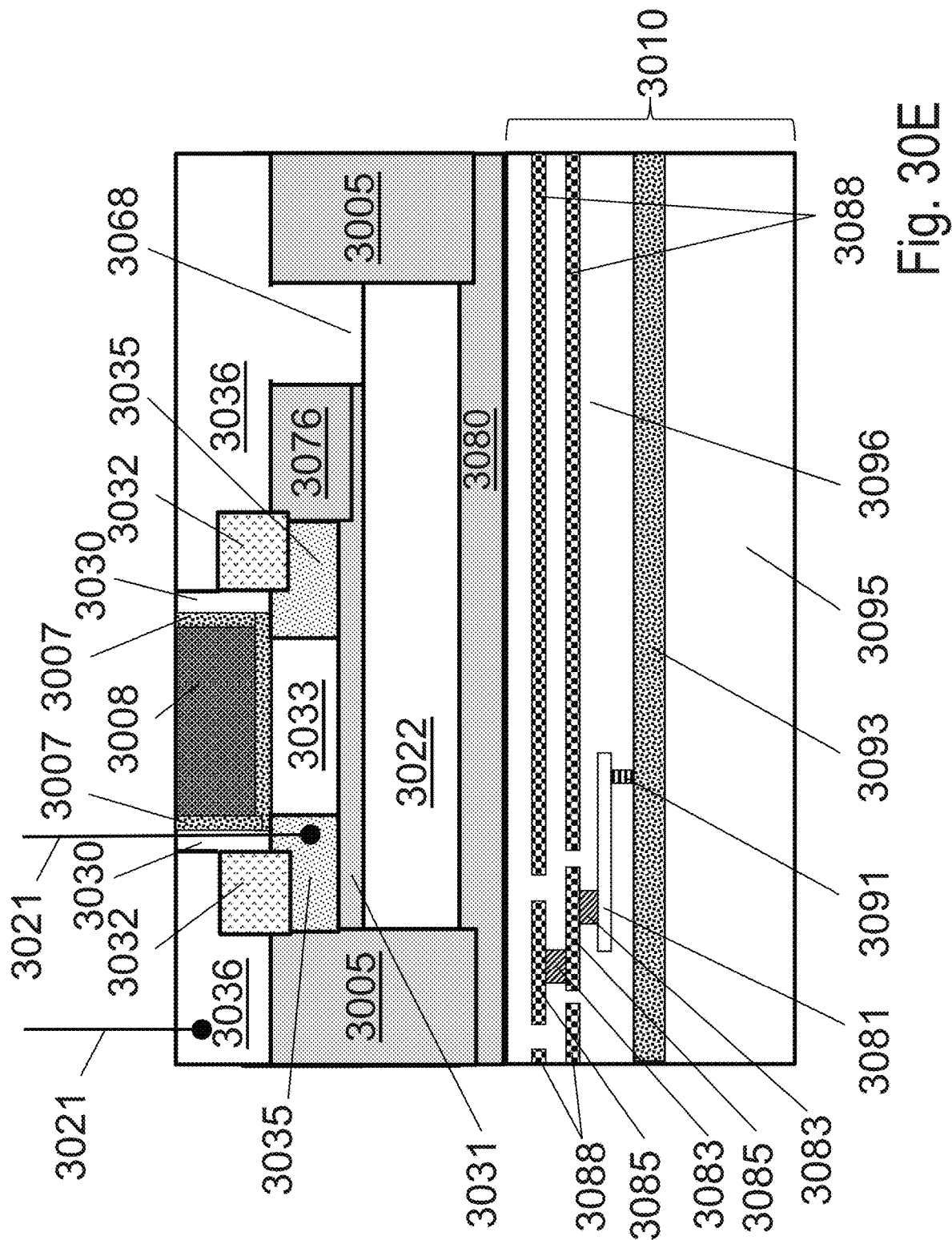

As illustrated in FIG. 30E, a transistor forming process, such as a conventional HKMG with raised source and drains (S/D), may be performed. For example, a dummy gate stack (not shown), utilizing oxide and polysilicon, may be formed, gate spacers 3030 may be formed, raised S/D regions 3032 and channel stressors may be formed by etch and epitaxial deposition, for example, of SiGe and/or SiC depending on P or N channel (and may be doped in-situ or ion-implantation and optical anneal activation), LDD and S/D ion-implantations may be performed, and first ILD 3036 may be deposited and CMP'd to expose the tops of the dummy gates. Thus transistor channel region 3033 and S/D & LDD regions 3035 may be formed. The dummy gate stack may be removed and a gate dielectric 3007 may be formed and a gate metal material gate electrode 3008, including a layer of proper work function metal ($Ti_xAl_yN_z$ for example) a conductive fill, such as aluminum, and may be deposited and CMP'd. The gate dielectric 3007 may be an atomic layer deposited (ALD) gate dielectric that may be paired with a work function specific gate metal in the industry standard high k metal gate process schemes, for example, as described in the incorporated references. Alternatively, the gate dielectric 3007 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-30, 25-27 Apr. 2005) and agate material with proper work function and less than approximately 400° C. deposition temperature such as, for example, tungsten or aluminum may be deposited. An optical step, such as represented by exemplary anneal ray 3021, may be performed to densify and/or remove defects from gate dielectric 3007, anneal defects and activate dopants such as LDD and S/D implants, densify the first ILD 3036, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Optionally, portions of transistor isolation region 3086 and BOX region 3031 may be lithographically defined and etched away, thus forming second transistor isolation regions 3076 and PD transistor area 3068. Partially depleted transistors (not shown) may be constructed in a similar manner as the FD-MOSFETs constructed on transistor channel region 3033 herein, but now with the thicker back-channel region 3022 silicon as its channel body. PD transistor area 3068 may also be utilized to later form a direct connection thru a contact to the back-channel region 3022 for back bias and Vt control of the transistor with transistor channel region 3033. If no PD devices are desired, then it may be more efficient to later form a direct connection thru a contact to the back-channel region 3022 for back bias and Vt control of the transistor with transistor channel region 3033 by etching a contact thru transistor isolation region 3086. Raised S/D regions 3032 may be formed by low temperature (less than 400° C.) deposition of in-situ doped polysilicon or amorphous silicon into the S/D openings, an optical anneal to further crystallize and dopant activate the raised S/D material, and removal of excess raised S/D material.

Figure 30F:
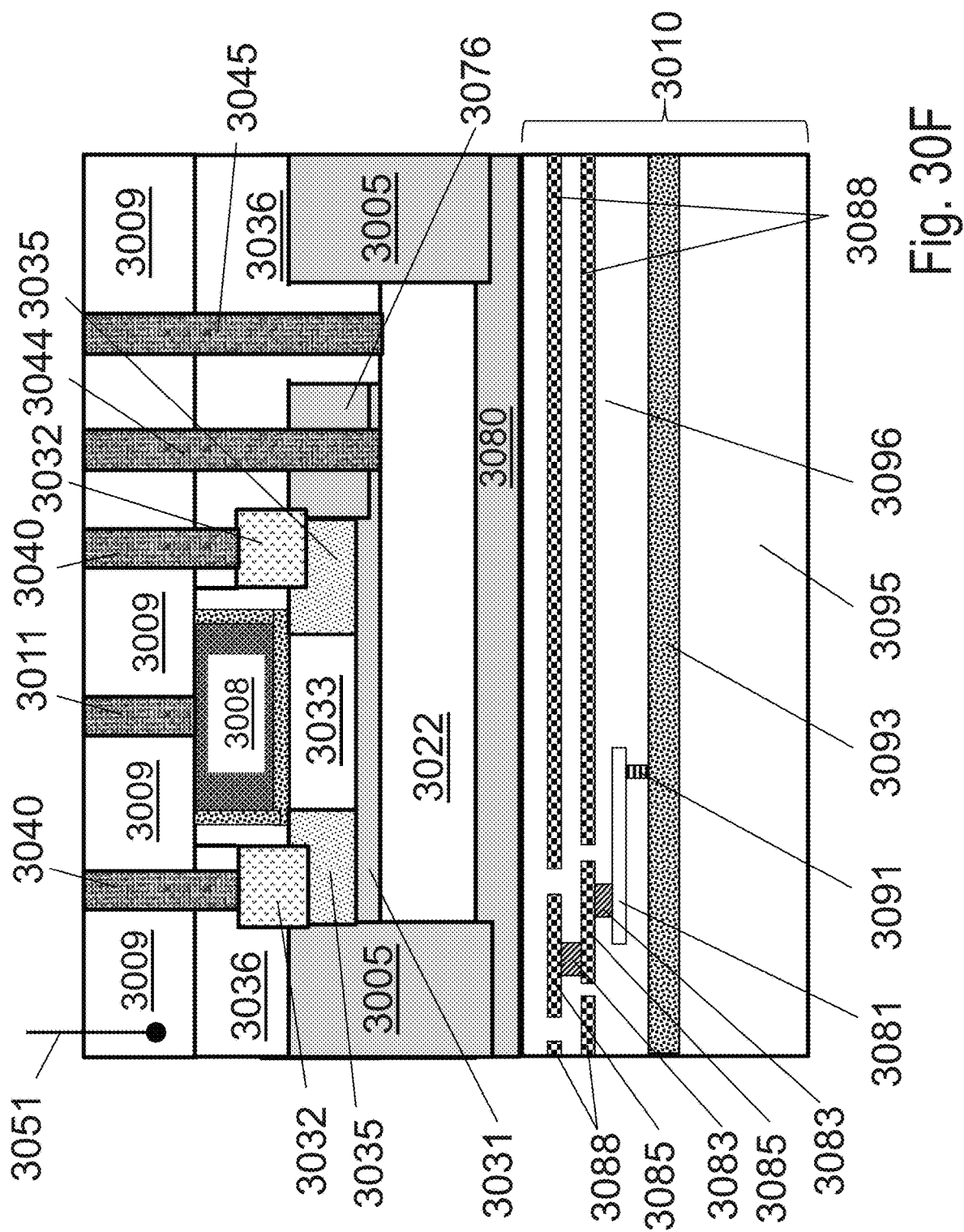

As illustrated in FIG. 30F, a low temperature thick oxide 3009 may be deposited and planarized. Source, gate, drain, two types of back contact openings may be masked, etched, and filled with electrically conductive materials preparing the transistors to be connected via metallization. Thus gate contact 3011 connects to gate electrode 3008, source & drain contacts 3040 connect to raised S/D regions 3032, back channel contact 3044 may connect to back-channel region 3022, and direct back contact 3045 may connect to back-channel region 3022. An optical step, such as illustrated by exemplary ILD anneal ray 3051, may be performed to anneal contact etch damage and densify the thick oxide 3009. Back channel contact 3044 and direct back contact 3045 may be formed to connect to shield/heat sink layer 3088 by further etching, and may be useful for hard wiring a back bias that may be controlled by, for example, the second layer or first layer circuitry into the FD MOSFET.

Figure 30G:
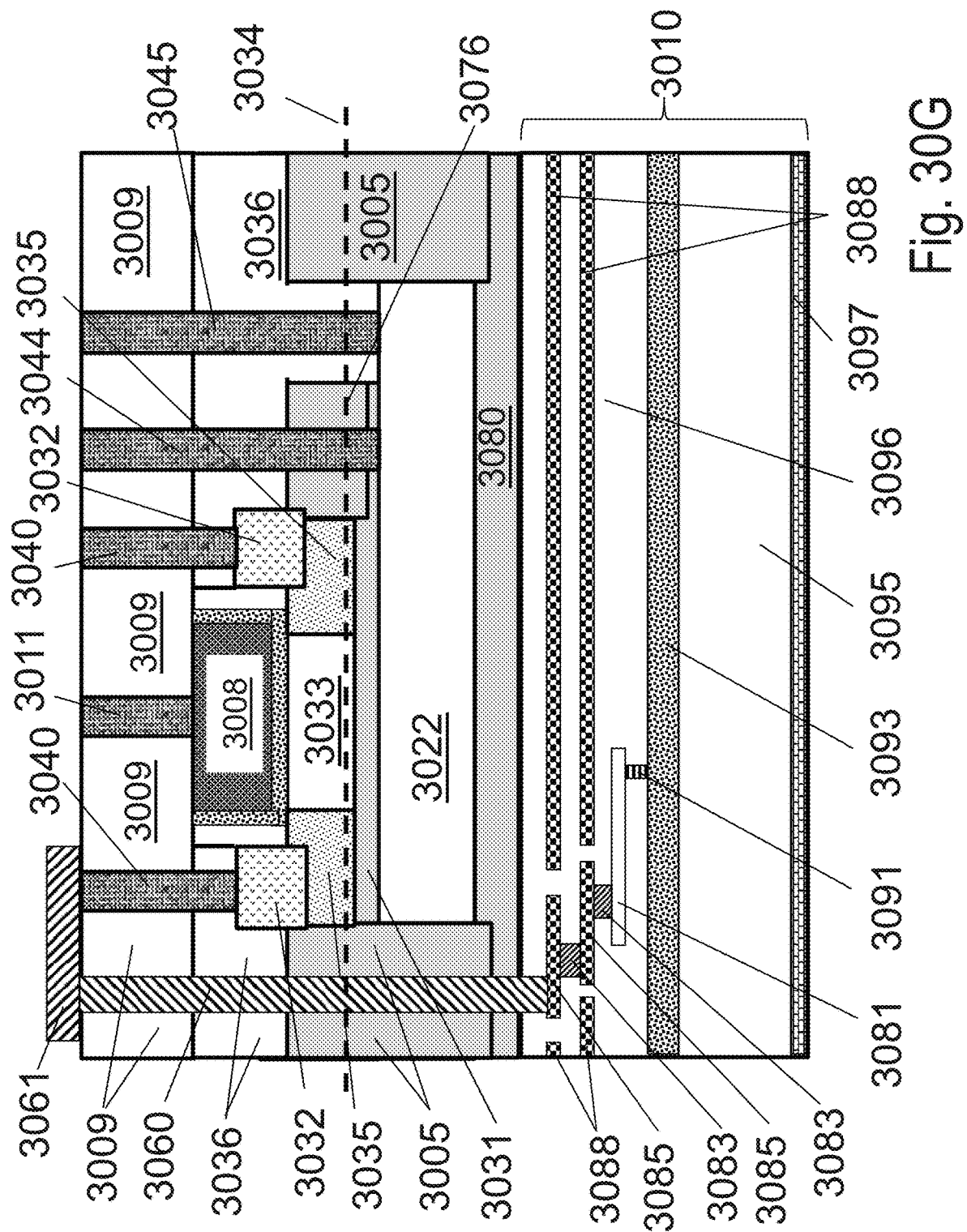

As illustrated in FIG. 30G, thru layer vias (TLVs) 3060 may be formed by etching thick oxide 3009, first ILD 3036, transistor and back channel isolation regions 3005, oxide layer 3080, into a portion of the upper oxide layer BEOL isolation 3096 of acceptor wafer 3010 BEOL, and filling with an electrically and thermally conducting material (such as tungsten or cooper) or an electrically non-conducting but thermally conducting material (such as described elsewhere within). Second device layer metal interconnect 3061 may be formed by conventional processing. TLVs 3060 may be constructed of thermally conductive but not electrically conductive materials, for example, DLC (Diamond Like Carbon), and may connect the FD-MOSFET transistor device and other devices on the top (second) crystalline layer thermally to shield/heat sink layer 3088. TLVs 3060 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 3088, which may be a ground or Vdd plane in the design/layout. TLVs 3060 may be also constructed in the device scribelanes (pre-designed in base layers or potential dice-lines) to provide thermal conduction to the heat sink, and may be sawed/diced off when the wafer is diced for packaging not shown). Shield/heat sink layer 3088 may be configured to act (or adapted to act) as an emf (electromotive force) shield to prevent direct layer to layer crosstalk between transistors in the donor wafer layer and transistors in the acceptor wafer. In addition to static ground or Vdd biasing, shield/heat sink layer 3088 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 3034, may have regions, for example, transistor channel region 3033 and S/D & LDD regions 3035, that differ substantially in dopant concentration, for example, a 10 times greater doping concentration in S/D & LDD regions 3035 than in transistor channel region 3033, and/or may have a different dopant type, such as, for example p-type or n-type dopant, and/or may be doped and substantially undoped in the neighboring regions. For example, transistor channel region 3033 may be very lightly doped (less than 1e15 atoms/$cm^3$) or nominally un-doped (less than 1e14 atoms/$cm^3$) and S/D & LDD regions 3035 may be doped at greater than 1e15 atoms/$cm^3$ or greater than 1e16 atoms/$cm^3$. For example, transistor channel region 3033 may be doped with p-type dopant and S/D & LDD regions 3035 may be doped with n-type dopant.

A thermal conduction path may be constructed from the devices in the upper layer, the transferred donor layer and formed transistors, to the acceptor wafer substrate and associated heat sink. The thermal conduction path from the FD-MOSFET transistor device and other devices on the top (second) crystalline layer, for example, raised S/D regions 3032, to the acceptor wafer heat sink 3097 may include source & drain contacts 3040, second device layer metal interconnect 3061, TLV 3060, shield path connect 3085 (shown as twice), shield path via 3083 (shown as twice), metal interconnect 3081, first (acceptor) layer metal interconnect 3091, acceptor wafer transistors and devices 3093, and acceptor substrate 3095. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 3095. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 3096, which may be a dielectric such as, for example, carbon doped silicon oxides. The heat removal apparatus, which may include acceptor wafer heat sink 3097, may include an external surface from which heat transfer may take place by methods such as air cooling, liquid cooling, or attachment to another heat sink or heat spreader structure.

Furthermore, some or all of the layers utilized as shield/heat sink layer 3088, which may include shapes of material such as the strips or fingers as illustrated in FIG. 27B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 3088 layer or layers. Moreover, some or all of the layers utilized as shield/heat sink layer 3088, which may include strips or fingers as illustrated in FIG. 27B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 3088 layer or layers. The Vsupply on line 17C12 and the control signals on control line 17C16 may be controlled by and/or generated in the second layer transistors (for example donor wafer device structures such as the FD-MOSFETs formed as described in relation to FIG. 30) or first layer transistors (acceptor, for example acceptor wafer transistors and devices 3093), or off chip circuits. Furthermore, some or all of the layers utilized as shield/heat sink layer 3088, which may include strips or fingers as illustrated in FIG. 27B-1 or other shapes such as those in FIG. 27B, may be utilized to distribute independent power supplies to various portions of the second layer transistors (for example donor wafer device structures such as the FD-MOSFETs formed as described in relation to FIG. 30) or first layer transistors (acceptor, for example acceptor wafer transistors and devices 3093) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 3088 or layers can impact their heat-shielding capacity. This impact may be mitigated, for example, by enhancing the top shield/heat sink layer 3088 areal density, creating more of the secondary shield/heat sink layers 3088, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, for example donor wafer device structures such as the FD-MOSFETs formed as described in relation to FIG. 30, may include I/O logic devices, such as SerDes (Serialiser/Deserialiser), and conductive bond pads (not shown) (herein such as FIG. 33). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 3088. Placement of the I/O circuits on the same stack layer as the conductive bond pad may enable close coupling of the desired I/O energy and lower signal loss. Furthermore, the second layer of circuits and transistors, for example donor wafer device structures such as the FD-MOSFETs formed as described in relation to FIG. 30, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the shield/heat sink layer 3088.

TLVs 3060 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 30 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 30A through 30G are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 3000 may be n type or un-doped. Furthermore, transistor and back channel isolation regions 3005 and transistor isolation region 3086 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Many other modifications within the scope of the invention will suggest themselves to such skilled persons after reading this specification. Thus the invention is to be limited only by the appended claims.

A planar n-channel JFET or JLT with an optional integrated heat shield/spreader suitable for a monolithic 3D IC may be constructed as follows. Being bulk conduction devices rather than surface conduction devices, the JFET and JLT may provide an improved transistor variability control and conduction channel electrostatic control. Subthreshold slope, DIBL, and other short channel effects are greatly improved due to the firm gate electrostatic control over the channel. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. Furthermore, a buried doped layer and channel dopant shaping, even to an un-doped channel, may allow for efficient adaptive and dynamic body biasing to control the transistor threshold and threshold variations, the concepts shown in FIG. 26 herein may be applied to the JFET. As well, the back plane and body bias tap concepts shown in FIG. 30 herein may be utilized for the JFET and JLT devices. As one of ordinary skill in the art would understand, many other types of transistors, such as a FinFet transistor, could be made utilizing similar concepts in their construction. FIG. 31A-G illustrates an exemplary n-channel JFET which may be constructed in a 3D stacked layer using procedures outlined below and in U.S. Pat. Nos. 8,273,610, 9,099,526, 9,219, 005, 8,557,632 and 8,581,349. The contents of the foregoing applications are incorporated herein by reference.

Figure 31A:
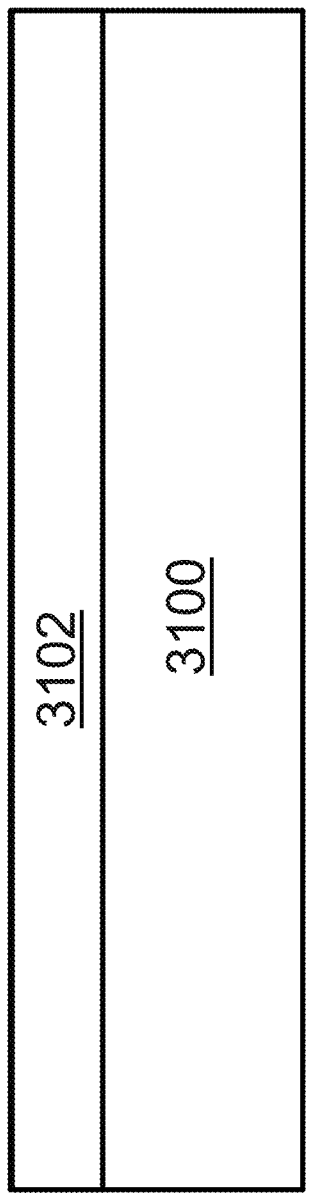

As illustrated in FIG. 31A, an N− substrate donor wafer 3100 may be processed to include a wafer sized layer of doping across the wafer, N− doped layer 3102. The N− doped layer 3102 may be formed by ion implantation and thermal anneal. N− substrate donor wafer 3100 may include a crystalline material, for example, mono-crystalline (single crystal) silicon. N− doped layer 3102 may be very lightly doped (less than 1e15 atoms/cm$^3$) or lightly doped (less than 1e16 atoms/cm$^3$) or nominally un-doped (less than 1e14 atoms/cm$^3$). N− doped layer 3102 may have additional ion implantation and anneal processing to provide a different dopant level than N− substrate donor wafer 3100 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike).

Figure 31B:
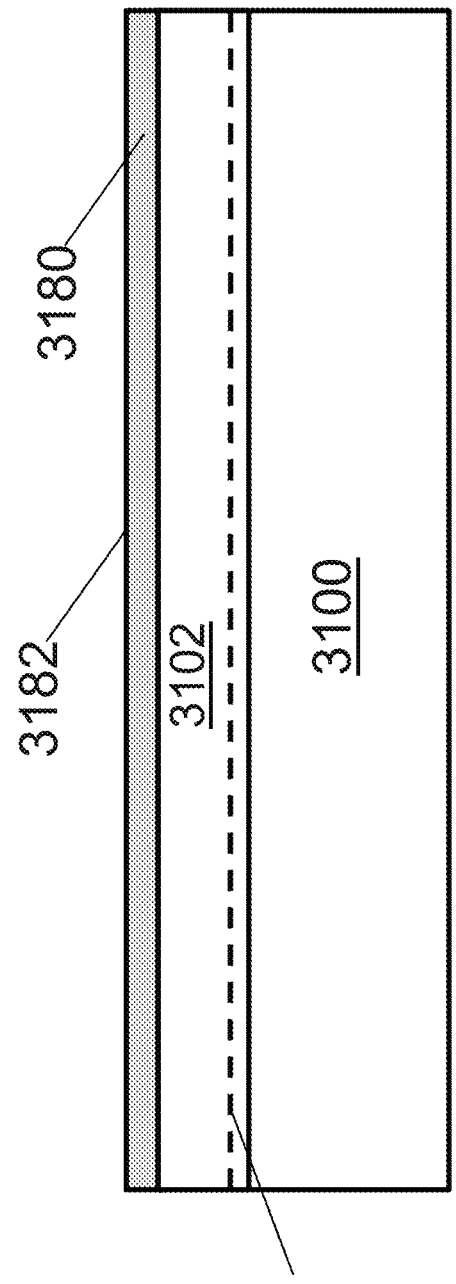

As illustrated in FIG. 31B, the top surface of N− substrate donor wafer 3100 layer stack may be prepared for oxide wafer bonding with a deposition of an oxide or by thermal oxidation of N− doped layer 3102 to form oxide layer 3180. A layer transfer demarcation plane (shown as dashed line) 3199 may be formed by hydrogen implantation or other methods as described in the incorporated references. The N− substrate donor wafer 3100, such as surface 3182, and acceptor wafer 3110 may be prepared for wafer bonding as previously described and low temperature (less than approximately 400° C.) bonded. Acceptor wafer 3110, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 3110 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 3110 may include transistors such as, for example, MOSFETS, FD-MOSFETS, FinFets, FD-RCATs, BJTs, HEMTs, and/or HBTs. The portion of the N− doped layer 3102 and the N− substrate donor wafer 3100 that may be above (when the layer stack is flipped over and bonded to the acceptor wafer 3110) the layer transfer demarcation plane 3199 may be removed by cleaving or other low temperature processes as described in the incorporated references, such as, for example, ion-cut with mechanical or thermal cleave or other layer transfer methods, thus forming remaining N− layer 3103. Damage/defects to crystalline structure of N− doped layer 3102 may be annealed by some of the annealing methods described herein, for example the short wavelength pulsed laser techniques, wherein the N− doped layer 3102 may be heated to defect annealing temperatures, but the layer transfer demarcation plane 3199 may be kept below the temperate for cleaving and/or significant hydrogen diffusion. The optical energy may be deposited in the upper layer of the stack, for example near surface 3182, and annealing of the N− doped layer 3102 may take place via heat diffusion. Moreover, multiple pulses of the laser may be utilized to improve the anneal, activation, and yield of the process.

Figure 31C:
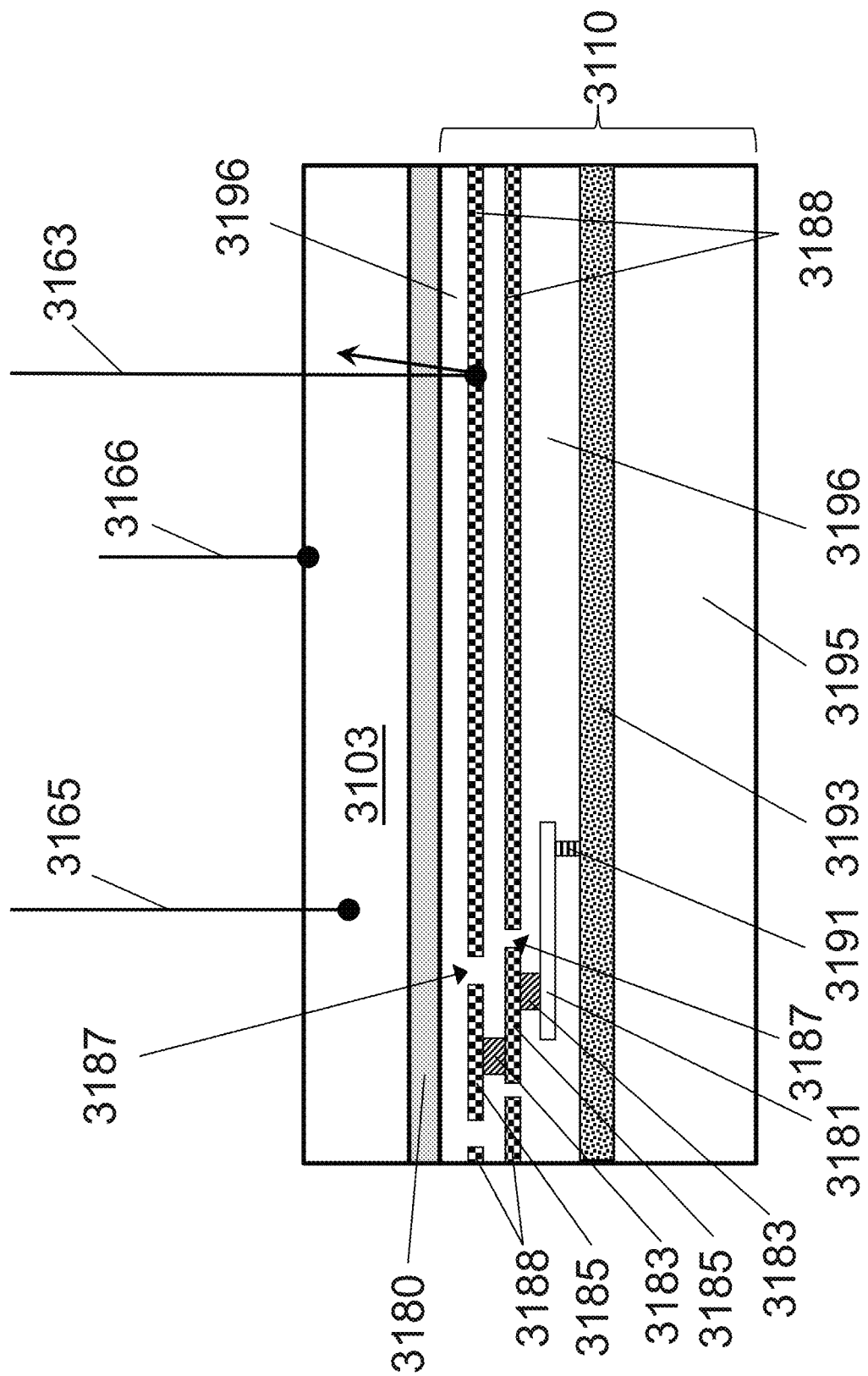

As illustrated in FIG. 31C, oxide layer 3180 and remaining N− layer 3103 have been layer transferred to acceptor wafer 3110. The top surface of remaining N− layer 3103 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer remaining N− layer 3103 could be thinned from its original total thickness, and its final total thickness could be in the range of about 3 nm to about 30 nm, for example, 3 nm, 5 nm, 7 nm, 10 nm, 150 nm, 20 nm, or 30 nm. Remaining N− layer 3103 may have a thickness that may allow full gate control of channel operation when the JFET (or JLT) transistor is substantially completely formed. Acceptor wafer 3110 may include one or more (two are shown in this example) shield/heat sink layers 3188, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 3188 may have a thickness range of about 50 nm to about mm, for example, 50 nm, 100 nm, 200 nm, 300 nm, 500 nm, 0.1 um, 1 um, 2 um, and 10 um. Shield/heat sink layer 3188 may include isolation openings 3187, and alignment mark openings (not shown), which may be utilized for short wavelength alignment of top layer (donor) processing to the acceptor wafer alignment marks (not shown). Shield/heat sink layer 3188 may include one or more shield path connects 3185 and shield path vias 3183.

Shield path via 3183 may thermally and/or electrically couple and connect shield path connect 3185 to acceptor wafer 3110 interconnect metallization layers such as, for example, exemplary acceptor metal interconnect 3181 (shown). Shield path connect 3185 may also thermally and/or electrically couple and connect each shield/heat sink layer 3188 to the other and to acceptor wafer 3110 interconnect metallization layers such as, for example, acceptor metal interconnect 3181, thereby creating a heat conduction path from the shield/heat sink layer 3188 to the acceptor substrate 3195, and a heat sink (shown in FIG. 31G). Isolation openings 3187 may include dielectric materials, similar to those of BEOL isolation 3196. Acceptor wafer 3110 may include first (acceptor) layer metal interconnect 3191, acceptor wafer transistors and devices 3193, and acceptor substrate 3195. Various topside defect anneals may be utilized. For this illustration, an optical beam such as the laser annealing previously described is used. Optical anneal beams may be optimized to focus light absorption and heat generation within or at the surface of remaining N− layer 3103 and provide surface smoothing and/or defect annealing (defects may be from the cleave and/or the ion-cut implantation) with exemplary smoothing/annealing ray 3166. The laser assisted smoothing/annealing with the absorbed heat generated by exemplary smoothing/annealing ray 3166 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,319,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 3163 may be reflected and/or absorbed by shield/heat sink layer 3188 regions thus blocking the optical absorption of ray blocked metal interconnect 3181. Annealing of dopants or annealing of damage in remaining N− layer 3103, such as from the H cleave implant damage, may be also accomplished by a set of rays such as repair ray 3165. Heat generated by absorbed photons from, for example, smoothing/annealing ray 3166, reflected ray 3163, and/or repair ray 3165 may also be absorbed by shield/heat sink layer 3188 regions and dissipated laterally and may keep the temperature of underlying metal layers, such as metal interconnect 3181, and other metal layers below it, cooler and prevent damage. Shield/heat sink layer 3188 and associated dielectrics may laterally spread and conduct the heat generated by the topside defect anneal, and in conjunction with the dielectric materials (low heat conductivity) above and below shield/heat sink layer 3188, keep the interconnect metals and low-k dielectrics of the acceptor wafer interconnect layers cooler than a damage temperature, such as, for example, 400° C. A second layer of shield/heat sink layer 3188 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 3188 may act as a heat spreader. Electrically conductive materials may be used for the two layers of shield/heat sink layer 3188 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 3193), may include, for example, trench capacitors such as described by Pei, C., et al., "A novel, low-cost deep trench decoupling capacitor for high-performance, low-power bulk CMOS applications," ICSICT (9$^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 3188 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 3188 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 3188 and under & overlying dielectric layers, spreads the localized heat/light energy of the topside anneal laterally and protects the underlying layers of interconnect metallization & dielectrics, such as in the acceptor wafer 3110, from harmful temperatures or damage. When there may be more than one shield/heat sink layer 3188 in the device, the heat conducting layer closest to the second crystalline layer or oxide layer 3180 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 3110 sensitive layers, such as interconnect and device layers) processing, and may be aligned to the acceptor wafer alignment marks (not shown) as described in the incorporated references. This may include further optical defect annealing or dopant activation steps. The N− donor wafer 3100 may now also be processed, such as smoothing and annealing, and reused for additional layer transfers. The insulator layer, such as deposited bonding oxides (for example oxide layer 3180) and/or before bonding preparation existing oxides (for example the BEOL isolation 3196 on top of the topmost metal layer of shield/heat sink layer 3188), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 31D:
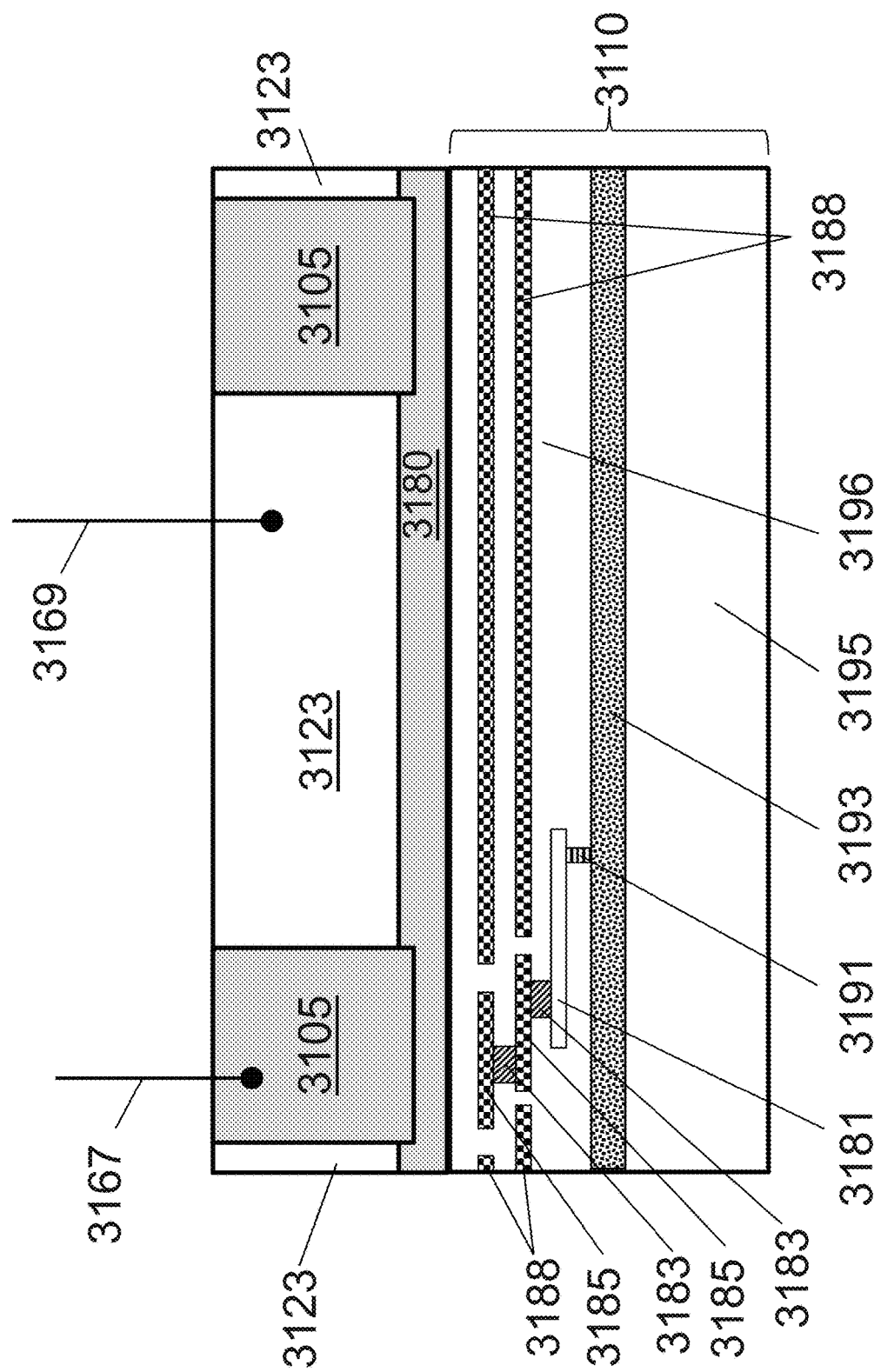

As illustrated in FIG. 31D, transistor isolation regions 3105 may be formed by mask defining and plasma/RIE etching remaining N− layer 3102 substantially to the top of oxide layer 3180 (not shown), substantially into oxide layer 3180, or into a portion of the upper oxide layer of acceptor wafer 3110 (not shown). Thus N− channel region 3123 may be formed. A low-temperature gap fill dielectric, such as SACVD oxide, may be deposited and chemically mechanically polished, the oxide remaining in isolation regions

3105. An optical step, such as illustrated by exemplary STI ray 3167, may be performed to anneal etch damage and densify the STI oxide in isolation regions 3105. The doping concentration of N− channel region 3123 may include gradients of concentration or layers of differing doping concentrations. Any additional doping, such as ion-implanted channel implants, may be activated and annealed with optical annealing, such as illustrated by exemplary implant ray 3169, as described herein. The optical anneal, such as exemplary STI ray 3167, and/or exemplary implant ray 3169 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process.

Figure 31E:
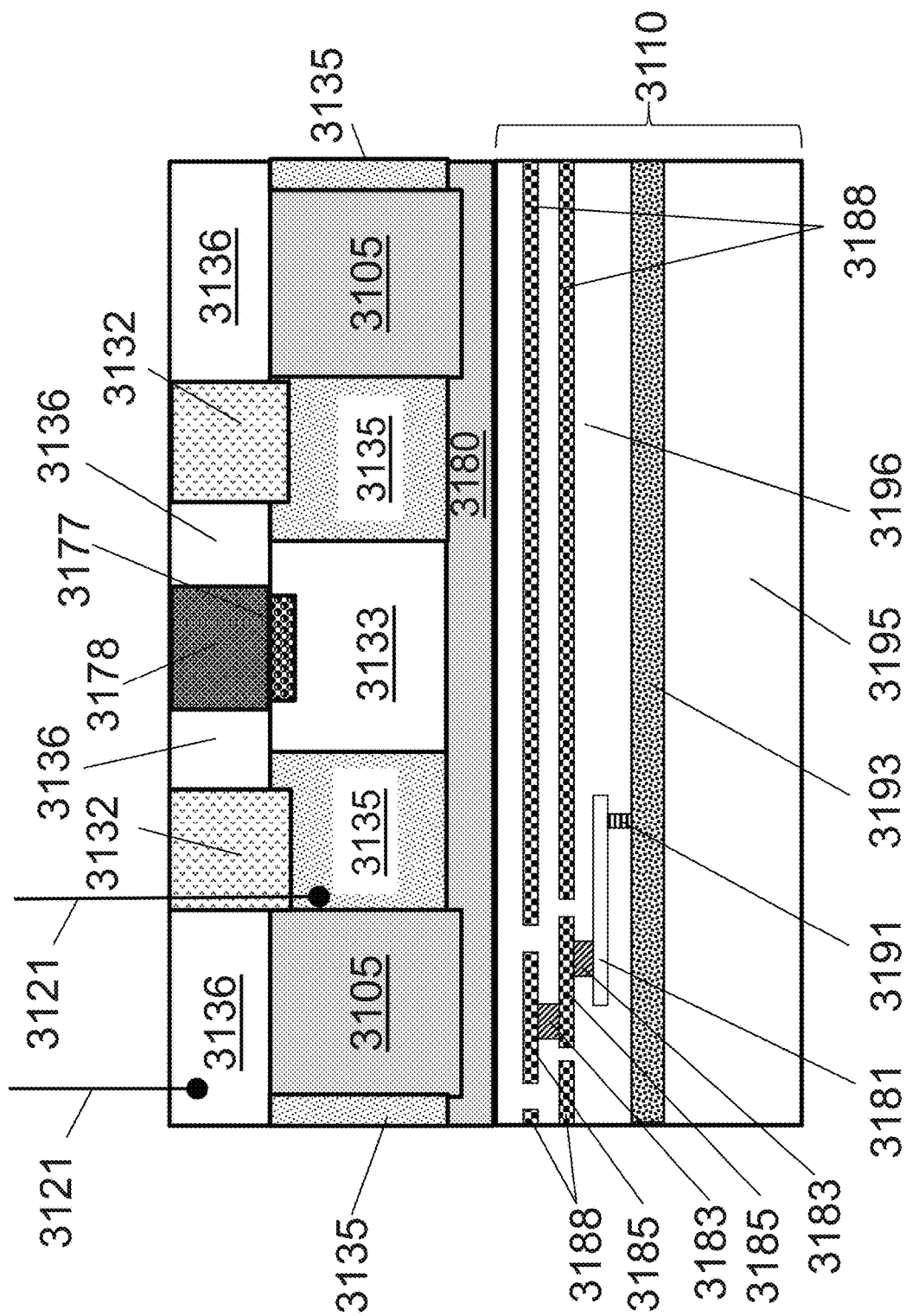
Figures 1, 31E:
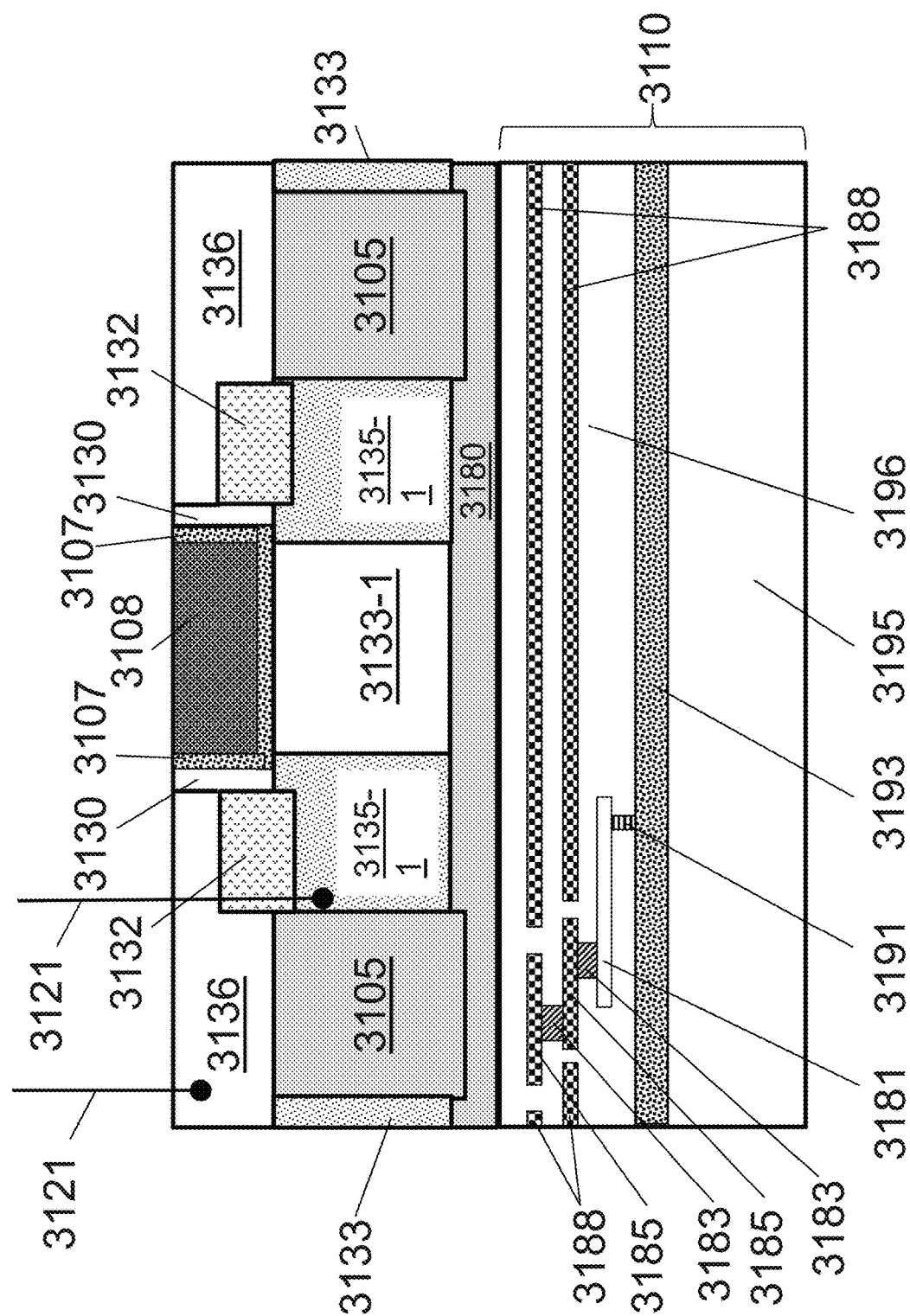

As illustrated in FIG. 31E, a JFET transistor forming process with raised source and drains (S/D), may be performed. For example, a shallow P+ region 3177 may be performed to create a JFET gate by utilizing a mask defined implant of P+ type dopant, such as, for example, Boron. A laser or other method of optical annealing may be utilized to activate the P+ implanted dopant. Alternatively, a directly in contact with the silicon channel P+ doped poly gate may be formed, with appropriate isolation from the source and drains, and dopant from that gate may also be utilized to form shallow P+ region 3177, for example, by diffusion from an optical anneal. S/D ion-implantations may be performed and laser annealed to create N+ regions 3135, and thus forming N− channel region 3133. The N+ regions 3135 may have a doping concentration that may be more than Ox the doping concentration of N-channel region 3133. First ILD 3136 may be deposited and CMP'd, and then openings may be etched to enable formation of gate 3178 and raised S/D regions 3132. Raised S/D regions 3132 and channel stressors may be formed by etch and epitaxial deposition, for example, of SiGe and/or SiC depending on P or N channel, and may be doped in-situ or ion-implantation and optical anneal activation. Gate 3178 may be formed with a metal to enable an optimal Schottky contact, for example aluminum, or may make an electrical connection to shallow P+ region 3177. An optical step, such as represented by exemplary anneal ray 3121, may be performed to densify and/or remove defects from gate 3178 and its connection to shallow P+ region 3177, anneal defects and activate dopants such as S/D and other buried channel tailoring implants, densify the first ILD 3136, form DSS junctions (Dopant Segregated Schottky such as NiSi$_2$), and/or form contact and S/D silicides (not shown). The optical anneal may be performed at each sub-step as desired, or may be done at prior to Schottky metal deposition, or various combinations. Moreover, multiple pulses of the laser may be utilized to improve the anneal, activation, and yield of the process. Raised S/D regions 3132 may be formed by low temperature (less than 400° C.) deposition of in-situ doped polysilicon or amorphous silicon into the S/D openings, an optical anneal to further crystallize and dopant activate the raised S/D material, and removal of excess raised S/D material.

As illustrated in FIG. 31E-1, an alternate transistor forming process to form a JLT with a conventional HKMG with raised source and drains (S/D), may be performed. For example, a dummy gate stack (not shown), utilizing oxide and polysilicon, may be formed, gate spacers 3130 may be formed, raised S/D regions 3132 and channel stressors may be formed by etch and epitaxial deposition, for example, of SiGe and/or SiC depending on P or N channel (and may be doped in-situ or ion-implantation and optical anneal activation), LDD and N++S/D ion-implantations may be performed, and first ILD 3136 may be deposited and CMP'd to expose the tops of the dummy gates. Thus JLT transistor channel 3133-1 and N++ S/D & LDD regions 3135-1 may be formed. N-doped layer in FIG. 31A may be doped to N+, concentrations in excess of $1 \times 10^{19}$ atms/cm$^3$, to enable a conductive JLT channel (JLT transistor channel 3133-1) and has been described elsewhere in referenced patents and patent applications. JLT transistor channel 3133-1 may also be doped by implantation after the layer transfer, and activated/annealed with optical techniques. The dummy gate stack may be removed and a gate dielectric 3107 may be formed and a gate metal material gate electrode 3108, including a layer of proper work function metal to enable channel cut-off at 0 gate bias (described in referenced U.S. Pat. No. 8,273,610) and a conductive fill, such as aluminum, and may be deposited and CMP'd. The gate dielectric 3107 may be an atomic layer deposited (ALD) gate dielectric that may be paired with a work function specific gate metal in the industry standard high k metal gate process schemes, for example, as described in the incorporated references. Alternatively, the gate dielectric 3107 may be formed with a low temperature processes including, for example, LPCVD SiO$_2$ oxide deposition (see Am, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-31, 25-27 Apr. 2005) and a gate material with proper work function and less than approximately 400° C. deposition temperature such as, for example, tungsten or aluminum may be deposited. An optical step, such as represented by exemplary anneal ray 3121, may be performed to densify and/or remove defects from gate dielectric 3107, anneal defects and activate dopants such as N+ channel, LDD and N++S/D implants, densify the first ILD 3136, form DSS junctions (Dopant Segregated Schottky such as NiSi$_2$), and/or form contact and S/D silicides (not shown). The optical anneal may be performed at each sub-step as desired, or may be done at prior to the HKMG deposition (such as after the dummy gate but before the HKMG formation), or various combinations. Raised S/D regions 3132 may be formed by low temperature (less than 400° C.) deposition of in-situ doped polysilicon or amorphous silicon into the S/D openings, an optical anneal to further crystallize and dopant activate the raised S/D material, and removal of excess raised S/D material. The following steps may be applied to the JFET or JLT flows.

Figure 31F:
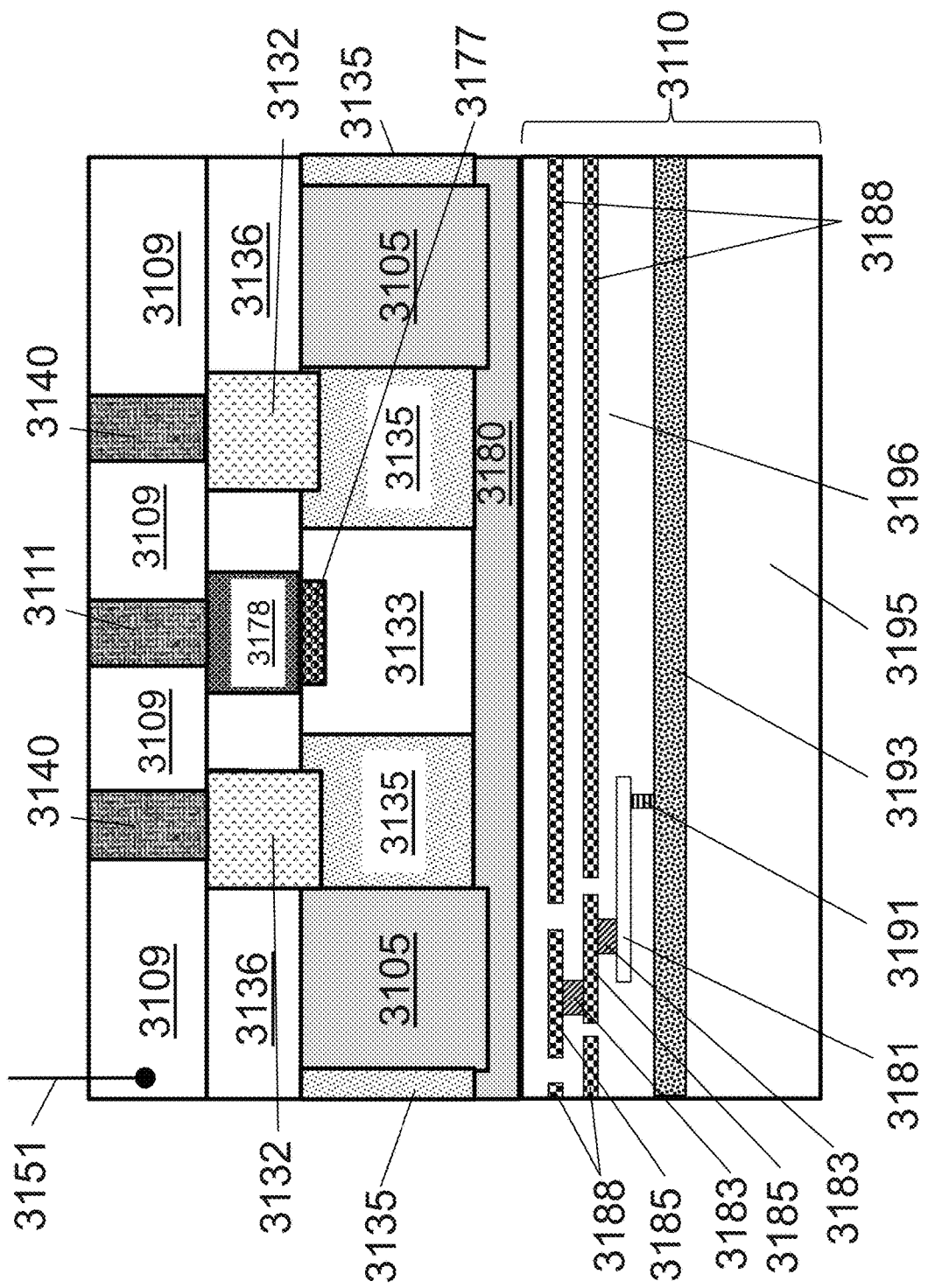

As illustrated in FIG. 31F, a low temperature thick oxide 3109 may be deposited and planarized. Source, gate, and drain contacts openings may be masked and etched preparing the transistors to be connected via metallization. Thus gate contact 3111 connects to gate 3178, and source & drain contacts 3140 connect to raised S/D regions 3132. An optical step, such as illustrated by exemplary ILD anneal ray 3151, may be performed to anneal contact etch damage and densify the thick oxide 3109.

Figure 31G:
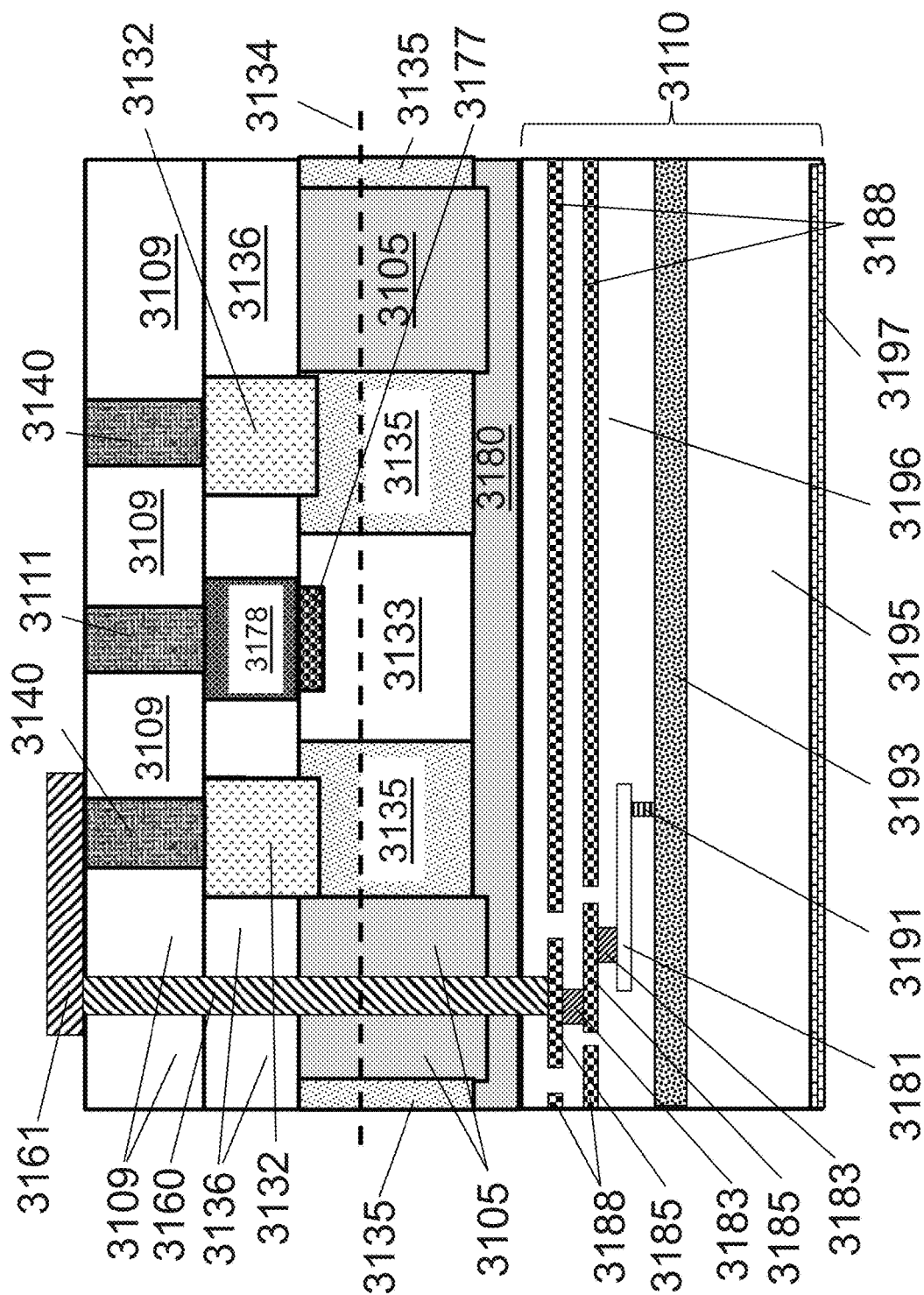

As illustrated in FIG. 31G, thru layer vias (TLVs) 3160 may be formed by etching thick oxide 3109, first ILD 3136, isolation regions 3105, oxide layer 3180, into a portion of the upper oxide layer BEOL isolation 3196 of acceptor wafer 3110 BEOL, and filling with an electrically and thermally conducting material (such as tungsten or cooper)

or an electrically non-conducting but thermally conducting material (such as described elsewhere within). Second device layer metal interconnect 3161 may be formed by conventional processing. TLVs 3160 may be constructed of thermally conductive but not electrically conductive materials, for example, DLC (Diamond Like Carbon), and may connect the JFET or JLT transistor device and other devices on the top (second) crystalline layer thermally to shield/heat sink layer 3188. TLVs 3160 may be constructed out of electrically and thermally conductive materials, such as Tungsten, Copper, or aluminum, and may provide a thermal and electrical connection path from the JFET or JLT transistor device and other devices on the top (second) crystalline layer to shield/heat sink layer 3188, which may be a ground or Vdd plane in the design/layout. TLVs 3160 may be also constructed in the device scribelanes (pre-designed in base layers or potential dicelines) to provide thermal conduction to the heat sink, and may be sawed/diced off when the wafer is diced for packaging not shown). Shield/heat sink layer 3188 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 3188 may be actively biased with an anti-interference signal from circuitry residing on, for example, a layer of the 3D-IC or off chip. The formed JFET (or JLT) transistor device may include semiconductor regions wherein the dopant concentration of neighboring regions of the transistor in the horizontal plane, such as traversed by exemplary dopant plane 3134, may have regions, for example, N− channel region 3133 and S/D N+ regions 3135, that differ substantially in dopant concentration, for example, a 10 times greater doping concentration in N+ regions 3135 than in N− channel region 3133, and/or may be doped and substantially undoped in the neighboring regions.

A thermal conduction path may be constructed from the devices in the upper layer, the transferred donor layer and formed transistors, to the acceptor wafer substrate and associated heat sink. The thermal conduction path from the JFET or JLT transistor device and other devices on the top (second) crystalline layer, for example, raised S/D regions 3132, to the acceptor wafer heat sink 3197 may include source & drain contacts 3140, second device layer metal interconnect 3161, TLV 3160, shield path connect 3185 (shown as twice), shield path via 3183 (shown as twice), metal interconnect 3181, first (acceptor) layer metal interconnect 3191, acceptor wafer transistors and devices 3193, and acceptor substrate 3195. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 3195. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 3196. The heat removal apparatus, which may include acceptor wafer heat sink 3197, may include an external surface from which heat transfer may take place by methods such as air cooling, liquid cooling, or attachment to another heat sink or heat spreader structure.

Furthermore, some or all of the layers utilized as shield/heat sink layer 3188, which may include shapes of material such as the strips or fingers as illustrated in FIG. 27B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 3188 layer or layers. Moreover, some or all of the layers utilized as shield/heat sink layer 3188, which may include strips or fingers as illustrated in FIG. 27B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 3188 layer or layers. The Vsupply on line 17C12 and the control signals on control line 17C16 may be controlled by and/or generated in the second layer transistors (for example donor wafer device structures such as the JFETs or JLTs formed as described in relation to FIG. 31) or first layer transistors (acceptor, for example acceptor wafer transistors and devices 3193), or off chip circuits. Furthermore, some or all of the layers utilized as shield/heat sink layer 3188, which may include strips or fingers as illustrated in FIG. 27B-1 or other shapes such as those in FIG. 27B, may be utilized to distribute independent power supplies to various portions of the second layer transistors (for example donor wafer device structures such as the JFETs or JLTs formed as described in relation to FIG. 31) or first layer transistors (acceptor, for example acceptor wafer transistors and devices 3193) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 3188 or layers can impact their heat-shielding capacity. This impact may be mitigated, for example, by enhancing the top shield/heat sink layer 3188 areal density, creating more of the secondary shield/heat sink layers 3188, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, for example donor wafer device structures such as the JFETs or JLTs formed as described in relation to FIG. 31, may include I/O logic devices, such as SerDes (Serialiser/Deserialiser), and conductive bond pads (not shown) (herein such as FIG. 33). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 3188. Placement of the I/O circuits on the same stack layer as the conductive bond pad may enable close coupling of the desired I/O energy and lower signal loss. Furthermore, the second layer of circuits and transistors, for example donor wafer device structures such as the JFETs or JLTs formed as described in relation to FIG. 31, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the shield/heat sink layer 3188

TLVs 3160 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

Formation of CMOS, such as for the described JFETs or JLTs, in one transferred layer and the orthogonal connect strip methodology may be found as illustrated in at least FIGS. 30-33, 73-80, and 94 and related specification sections of U.S. Pat. No. 8,273,610, and may be applied to at least the FIG. 31 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 31A through 31G are exemplary only and are not drawn to scale. Such skilled persons will further appreciate that many variations are possible such as, for example, a p-channel JFET or JLT may be formed with changing the types of dopings appropriately. Moreover, the N− substrate donor wafer 3100 may be p type or un-doped. Furthermore, isolation regions 3105 may be formed by a hard mask defined process flow, wherein a hard mask stack, such as, for example, silicon oxide and silicon nitride layers, or silicon oxide and amorphous carbon layers, may be utilized. Moreover, CMOS JFETs or JLTs may be constructed with n-JFETs or JLTs in a first mono-crystalline silicon layer and p-JFETs or JLTs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Back gated and/or multi Vt JFETs or JLTs may be constructed utilizing the inventive concepts in FIGS. 46A-G herein. Many other modifications within the scope of the invention will suggest themselves to such skilled persons after reading this specification. Thus the invention is to be limited only by the appended claims.

Figure 32:
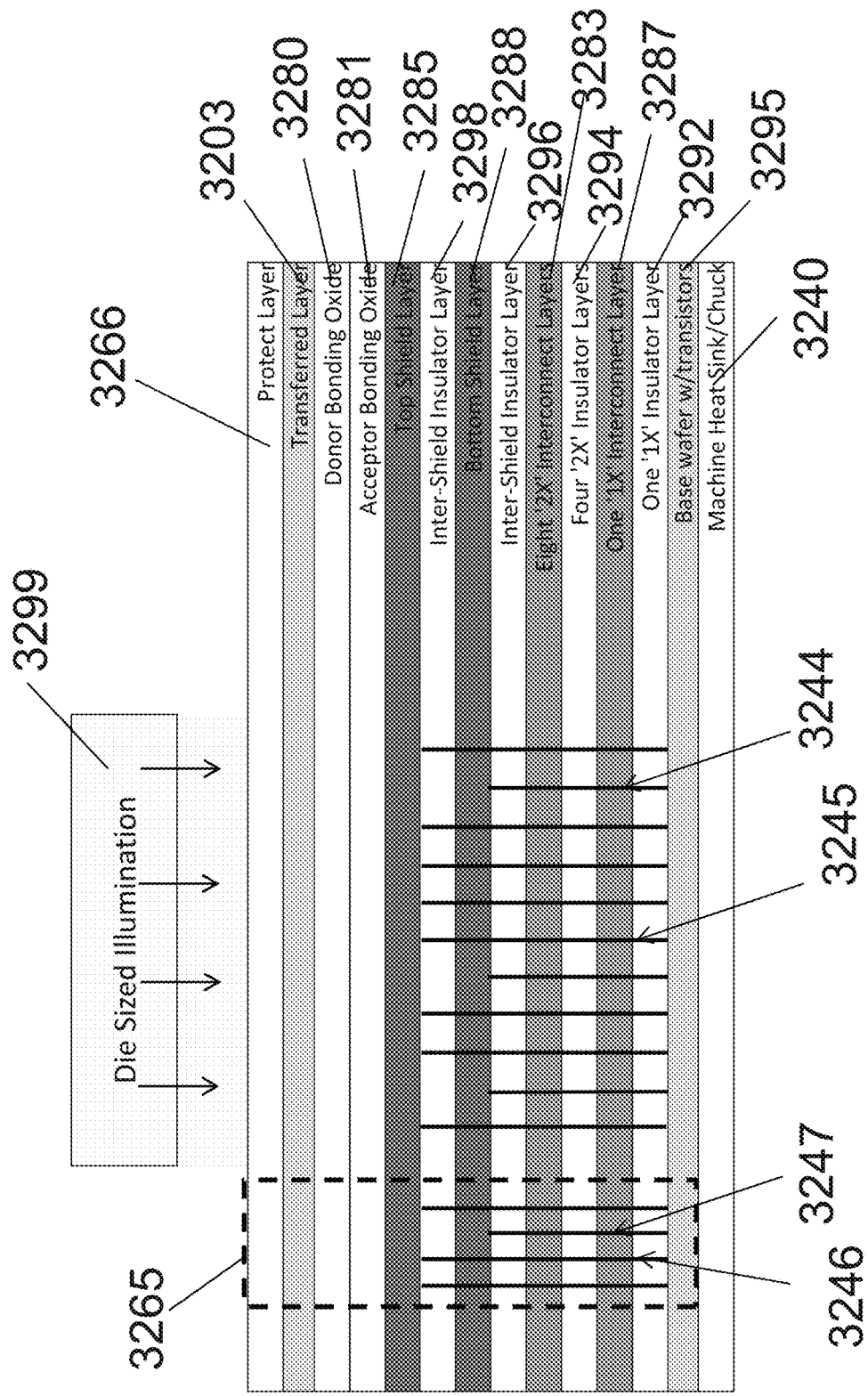
FIG. 32 is an exemplary illustration of a partially processed 3D device with substrate being processed with topside illumination and including thermally conductive paths.

An embodiment of the invention may include an exemplary partially processed 3D device with substrate being processed with topside illumination as illustrated in FIG. 32. The topside illumination 3299 may be an optical anneal for purposes, such as, for example, dopant annealing, STI densification and annealing, silicidation, and/or ion-cut damage repair, which have been described at least herein and in incorporated patents and patent publications. Furthermore, topside illumination 3299 may be an optical anneal that is die sized, or reticle sized, or other size and shape as has been described at least herein and in incorporated patents and patent publications. A transferred layer 3203, which may be a transferred layer or layers as described at least herein and in incorporated patents and patent publications, may have been transferred and bonded to an acceptor wafer or substrate, and may include bonding at the interface between donor bonding oxide 3280 and acceptor bonding oxide 3281. Transferred layer 3203 may have a protect layer 3266 (or region) atop it, which may function as a optical absorber, reflector, or energy spreader as described in at least herein and in incorporated patents and patent publications, and may remain a part of the device at the end of device processing or be sacrificial (removed). Transferred layer 3203 may include its entirety or portions, isotopically enriched silicon (such as, for example, >99% $^{28}$Si) or germanium to enable a greater heat conductivity. The relatively higher cost of the isotopically enriched layer or regions can be mitigated by the reuse of a donor wafer comprised wholly or partially with the material. The acceptor wafer at the time of bonding to the donor wafer and at exposure to topside illumination 3299 may include acceptor bonding oxide 3281, top shield layer 3285, inter-shield insulator layer 3298, bottom shield layer 3288, second inter-shield insulator layer 3296, eight '2×' interconnect layers 3283 that may be interspersed with four '2×' insulator layers 3294, a '1×' interconnect layer 3287, a '1×' insulator layer 3292, device die thermal conduction paths 3245, device scribe-lane thermal conduction paths 3246, second device die thermal conduction paths 3244, second device scribe-lane thermal conduction paths 3247, and a base wafer with transistors and circuits 3295. The acceptor wafer may have another combination of these layers and regions as would be clear to one skilled in the art. The elements of the exemplary acceptor wafer may include the materials, process flows, construction, use, etc. as has been described herein and in incorporated patents and patent publications, for example, transferred layer 3203 may be doped or undoped silicon, and may have regions of STI or other transistor elements within it or on it, and may include multiple layers or regions of doping. Moreover, transferred layer 3203 may include layers or regions that have materials with melting points higher than 900° C. (for example doped mono-crystalline silicon or polysilicon or amorphous silicon, tungsten, tantalum nitride) that may be used, for example, as a back-bias or body bias region or layer, as has been described herein and in incorporated patents and patent publications. Top shield layer 3285 may have layered shield regions wherein the horizontal thermal conduction is substantially greater than the vertical heat conduction. The bonded stack of the acceptor wafer and transferred layers may include scribe regions 3265, either preformed and/or predetermined scribelanes and/or dicelines, or may include custom function definition and etching, or a combination of both. Scribe regions 3265 may be constructed with device scribe-lane thermal conduction paths 3246 that may provide a thermal conduction path from the top shield layer 3285 to the base wafer with transistors and circuits 3295, which could then conduct heat that may be generated from topside illumination 3299 to the illumination machine heat sink/chuck 3240 and thus help prevent damage from the topside illumination 3299 of the acceptor interconnect layers, such as, for example, the eight '2×' interconnect layers 3283, four '2×' insulator layers 3294, 1×' interconnect layer 3287, '1×' insulator layer 3292, and the transistors and circuits of base wafer with transistors and circuits 3295. Second device scribe-lane thermal conduction paths 3247 may thermally conduct from bottom shield layer 3288 to the base wafer with transistors and circuits 3295 and the illumination machine heat sink/chuck 3240. Device die thermal conduction paths 3245 within the device die, may provide a thermal conduction path from the top shield layer 3285 to the base wafer with transistors and circuits 3295, which could then conduct heat that may be generated from topside illumination 3299 to the illumination machine heat sink/chuck 3240 and thus help prevent damage from the topside illumination 3299 of the acceptor interconnect layers, such as, for example, the eight '2×' interconnect layers 3283, four '2×' insulator layers 3294, 1×' interconnect layer 3287, '1×' insulator layer 3292, and the transistors and circuits of base wafer with transistors and circuits 3295, and has been described herein and in incorporated patents and patent publications. Second device die thermal conduction paths 3244 may thermally conduct from bottom shield layer 3288 to the base wafer with transistors and circuits 3295 and the illumination machine heat sink/chuck 3240. Device scribe-lane thermal conduction paths 3246 may be removed in the later dice singulation processes whereas the device die thermal conduction paths 3245 may remain in the finished device and provide cooling of the second layer and above transistor and circuit layers when the device is in operation and generating heat from the device operation. The density of device die thermal conduction paths 3245, device scribe-lane thermal conduction paths 3246, second device die thermal conduction paths 3244, and second device scribe-lane thermal conduction paths 3247 is a device design and thermal architecture calculation, but may be on the order of 1 every 100 um$^2$ (Wei H., et al., "Cooling Three-Dimensional Integrated Circuits Using Power Delivery Networks", IEDM 2012, 14.2, December 2012. incorporated by reference in entirety). Scribelanes (or dicelanes), such as scribe regions 3265, may be 10 um wide, 20 um wide, 50 um wide 100 um wide, or greater than 100 um wide depending on design choice and die singulation process capability.

Persons of ordinary skill in the art will appreciate that the illustrations in FIG. 32 are exemplary and are not drawn to scale. Such skilled persons will further appreciate that many variations may be possible such as, for example, bottom shield layer 3288 may also be formed as a layered shield/heat sink layer or region. Moreover, although many of the elements in the FIG. 32 may be called layers, they main include within them regions. Furthermore, device scribe-lane thermal conduction paths 3246 and device die thermal conduction paths 3245 may be formed so that there is no electrical connection to bottom shield layer 3288, unless they are designed to do so as the same circuit node. Further, the choice of eight '2×' interconnect layers 3283 that may be interspersed with four '2×' insulator layers 3294, a '1×' interconnect layer 3287, a '1×' insulator layer 3292 is a design choice and may be different according to the design considerations, both device functionally and thermally. Moreover, the various semiconductor layers within the 3D device may have various circuitry, functions and connection, for example, as described herein (such as FIG. 33) or in incorporated patent references. Thus the invention is to be limited only by the appended claims.

Figure 33:
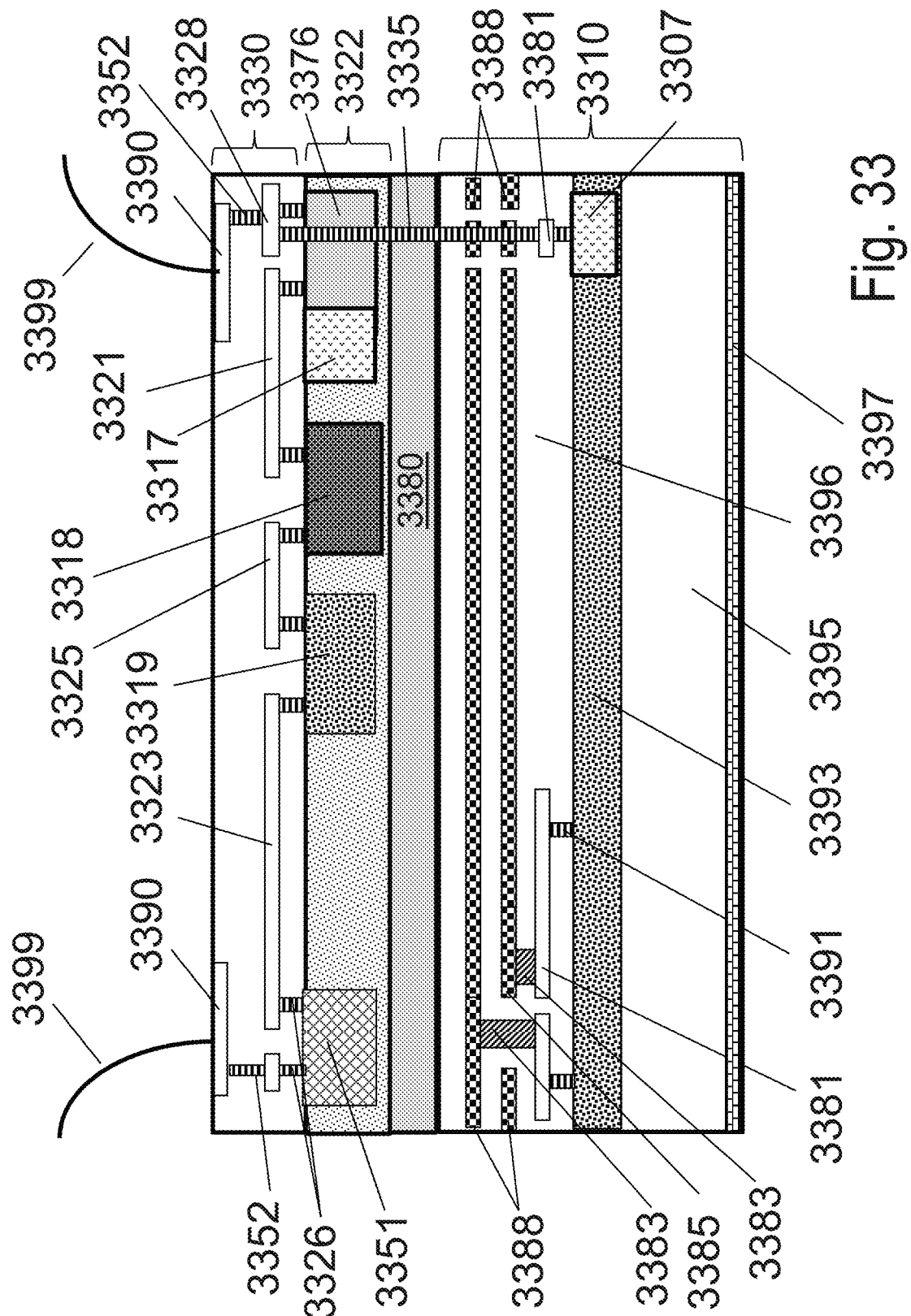
FIG. 33 is an exemplary illustration of some additional embodiments and combinations of devices, circuits, paths, and connections of a 3D device.

The various layers of a 3D device may include many types of circuitry, which may be formed by regions of transistors and other semiconductor device elements within that layer or in combination with other layers of the 3D device, and connections between the transistors within the same region, region to region and vertically (layer to layer) may be provided by layers of interconnect metallization and vertical connections such as TLVs and TSVs. In addition, power routing within the 3D device may utilize thicker and more conductive interconnect metallization than another layer, especially if the layer is closest to the source of external power and/or has a greater current load/supply requirement. Many individual device and interconnect embodiments for 3D devices have been described herein and in the incorporated patent references. As illustrated in FIG. 33, some additional embodiments and combinations (further embodiments) of devices, circuits, paths, and connections are described and may utilize similar materials, constructions and methods as the incorporated references or discussed herein. With reference to embodiments described herein, for example with respect to FIG. 46, and in the incorporated patent references, a substrate layer, which may have a thicker body than other semiconductor layers above or within the 3D device, such as acceptor 3310 may be formed and may include heat sink 3397, acceptor substrate 3395, acceptor wafer transistors and circuits 3393, first (acceptor) layer metal interconnect 3381 which may include first layer contacts 3391, first layer vias 3383, at least one shield layer/region 3388 (two layers and many regions, such as lower level shield layer region 3385, shown), interconnect insulator regions 3396 and ESD diode structures 3307. A second semiconductor layer may be transferred and constructed on top of the first layer with isolation layer 3380 in-between and vertical layer to layer interconnections may be provided by TLV/TSV 3335, only one is shown. A layer of transistors and circuits 3322 may include second layer input device structures 3376, FD ESD structures 3317, Phase Lock Loop circuits PLL 3318, SERDES circuitry 3319, and output device structure 3351. Second interconnections layer 3330 may include at least one layer/regions of metallization and associated contacts and via, for example, second layer metallization M1 segments 3328, 3321, 3323, 3325, second layer contacts 3326, second layer vias 3352, and conductive pads 3390. The 3D device may be connected to external devices utilizing many structures known to those skilled in the art, for example, bond wires 3399. Input device structures 3376 and output device structure 3351 may be connected to external devices through, for example, second layer contacts 3326, second layer metallization M1 segments 3328, second layer vias 3352, conductive pads 3390, and bond wires 3399. A portion of the transistors within input device structures 3376 and output device structure 3351 may be larger in either or both width and length than most transistors within acceptor wafer transistors and circuits 3393. Input device structures 3376 (and output device structure 3351) may be subjected to voltage and/or current transients from external devices or generated externally and traveling to the 3D device along bond wires 3399. Input device structures 3376 (and output device structure 3351) may be protected by dissipating the transient energy in diode structures, such as ESD diode structures 3307 on the relatively thicker (than for example, the second semiconductor layer) acceptor substrate 3395, which may be connected by a multiplicity of connection stacks such as first (acceptor) layer metal interconnect 3381 which may include first layer contacts 3391, first layer vias 3383, at least one shield layer/region 3388, TLV/TSV 3335, and second layer metallization M1 segments 3328. Input device structures 3376 (and output device structure 3351) may be protected by dissipating the transient energy in a transient filtering circuitry such as for example, FD ESD structures 3317, which may reside on a relatively thin semiconductor layer in the 3D device and may effectively utilize fully depleted transistors in the filter circuitry. FD ESD structures 3317 may be coupled to input device structures 3376 (and output device structure 3351) by second layer interconnections (not shown). Input device structures 3376 may be connected to PLL 3318, for example, thru second layer metallization M1 segment 3321 and second layer contacts 3326. Input device structures 3376 may be connected to SERDES circuitry 3319, for example, thru second layer metallization (not shown). Output device structures 3351 may be connected to SERDES circuitry 3319, for example, thru second layer metallization M1 segment 3323 and second layer contacts 3326. Output device structures 3351 may drive signals thru the connection to conductive pads 3390 and then out to external devices thru bond wires 3399. Transistors within a lower layer, for example within acceptor wafer transistors and circuits 3393, may be connected (not shown) to the output device structure 3351 and drive a signal to the output device structure 3351, and a portion of the transistors of output device structure 3351 may have a larger width and/or length than the transistors within acceptor wafer transistors and circuits 3393. Power from external sources may be routed thru bond wires 3399 to conductive pads 3390 to the 3D device, wherein at least a portion of the second interconnections layer 3330 may be constructed with thicker and/or wider metallization wiring (for example 4× wiring as described in incorporated patent references) so to provide the higher current carrying capability required for the second layer power distribution grid/network than that of the lower layer, in this example, first layer metallization wiring (for example 1× or 2× wiring as described in incorporated patent references). The width and/or length of the transistors of the second layer of transistors and circuits 3322, for example a portion of those in second layer input device structures 3376 and/or FD ESD structures 3317 and/or output device structures 3351, may be substantially larger than the width and/or length of transistors in acceptor wafer transistors and circuits 3393.

Persons of ordinary skill in the art will appreciate that the illustrations in FIG. 33 are exemplary and are not drawn to scale. Such skilled persons will further appreciate that many variations may be possible such as, for example, a thick enough semiconductor layer to enable ESD diode style protection circuitry to be constructed need not only be on the base or substrate layer, but may reside elsewhere in the 3D device stack. Moreover, the output circuitry including output device structures 3351 may wholly or partially reside on a semiconductor transistor layer that is not on top, and vertical connections including TLVs/TSV may be utilized to connect the output device structures 3351 to conductive pads 3390. Furthermore, the input circuitry including input device structures 3376 may wholly or partially reside on a semiconductor transistor layer that is not on top, and vertical connections including TLVs/TSV may be utilized to connect the input device structures 3376 to conductive pads 3390. Similarly, SERDES circuitry and 3319 PLL 3318 may wholly or partially reside on a semiconductor transistor layer that is not on top, three choices being one of design choice and device characteristics driven. Furthermore, connection to external devices (signal and/or power supply) may be made on the backside of acceptor substrate 3395. Moreover, connection to external devices form the 3D device may utilize many types of structures other than bond wires 3399 shown in the illustration, for example, flipchip and bumps, wireless circuitry. Thus the invention is to be limited only by the appended claims.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3DIC technology described herein may be found at least in FIG. 156 of U.S. Pat. No. 8,273,610, the contents of which are incorporated by reference.

In this document, the connection made between layers of, generally single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Moreover, epitaxial regrow of source and drains may utilize processes such as liquid phase epitaxial regrowth or solid phase epitaxial regrowth, and may utilize flash or laser processes to freeze dopant profiles in place and may also permit non-equilibrium enhanced activation (superactivation). Further, transferred layer or layers may have regions of STI or other transistor elements within it or on it when transferred. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. A 3D semiconductor device, the device comprising:
a first level,
   wherein said first level comprises a first layer, said first layer comprising first transistors, and
   wherein said first level comprises a second layer, said second layer comprising first interconnections;
a second level overlaying said first level,
   wherein said second level comprises a third layer, said third layer comprising second transistors, and
   wherein said second level comprises a fourth layer, said fourth layer comprising second interconnections; and
a plurality of connection paths,
   wherein said plurality of connection paths provides connections from a plurality of said first transistors to a plurality of said second transistors,
   wherein said second level is bonded to said first level,
   wherein said bonded comprises oxide to oxide bond regions,
   wherein said bonded comprises metal to metal bond regions,
   wherein said second level comprises at least one memory array,
   wherein said second level comprises at least one Phase Lock Loop ("PLL") circuit, and
   wherein said third layer comprises crystalline silicon.

2. The device according to claim 1, wherein at least one of said second transistors comprises a raised source and drain.

3. The device according to claim 1, wherein said second level comprises at least one SerDes circuit.

4. The device according to claim 1, further comprising: a heat removal path from said third level to an external surface of said device.

5. The device according to claim 1,
wherein said first level comprises a plurality of trench capacitors, and
wherein said plurality of trench capacitors are connected to at least one power supply line.

6. The device according to claim 1,
wherein said first level comprises at least one control circuit, and
wherein said at least one control circuit controls read operations of said at least one memory array.

7. The device according to claim 1,
wherein at least one of said second transistors is a FinFET type transistor.

8. A 3D semiconductor device, the device comprising:
a first level,
   wherein said first level comprises a first layer, said first layer comprising first transistors, and
   wherein said first level comprises a second layer, said second layer comprising first interconnections;
a second level overlaying said first level,
   wherein said second level comprises a third layer, said third layer comprising second transistors, and
   wherein said second level comprises a fourth layer, said fourth layer comprising second interconnections;
a plurality of connection paths,
   wherein said plurality of connection paths provides connections from a plurality of said first transistors to a plurality of said second transistors,
   wherein said second level is bonded to said first level,
   wherein said bonded comprises oxide to oxide bond regions,
   wherein said bonded comprises metal to metal bond regions,
   wherein said second level comprises at least one memory array,
   wherein said third layer comprises crystalline silicon,
   wherein a plurality of said first transistors are circumscribed by a first guard ring,
   wherein a plurality of said second transistors are circumscribed by a second guard ring, and
   wherein said second guard ring overlays said first guard ring.

9. The device according to claim 8,
wherein said second level comprises at least one PLL circuit.

10. The device according to claim 8,
wherein said second level comprises at least one SerDes circuit.

11. The device according to claim 8,
wherein at least one of said second transistors comprises a raised source and drain.

12. The device according to claim 8,
wherein said first level comprises a plurality of trench capacitors, and
wherein said plurality of trench capacitors are connected to at least one power supply line.

13. The device according to claim 8,
wherein said first level comprises at least one control circuit, and
wherein said at least one control circuit controls read operations of said memory array.

14. The device according to claim 8,
wherein at least one of said second transistors is a FinFET type transistor.

15. A 3D semiconductor device, the device comprising:
a first level,
  wherein said first level comprises a first layer, said first layer comprising first transistors, and
  wherein said first level comprises a second layer, said second layer comprising first interconnections;
a second level overlaying said first level,
  wherein said second level comprises a third layer, said third layer comprising second transistors, and
  wherein said second level comprises a fourth layer, said fourth layer comprising second interconnections; and
a plurality of connection paths,
  wherein said plurality of connection paths provides connections from a plurality of said first transistors to a plurality of said second transistors,
  wherein said second level is bonded to said first level,
  wherein said bonded comprises oxide to oxide bond regions,
  wherein said bonded comprises metal to metal bond regions,
  wherein said second level comprises at least one memory array,
  wherein said third layer comprises crystalline silicon, and
  wherein said second layer comprises an Electro-Static-Discharge ("ESD") protection structure connected to at least one of said connection paths.

16. The device according to claim 15, further comprising:
a heat removal path from said third level to an external surface of said device.

17. The device according to claim 15,
wherein said second level comprises at least one SerDes circuit.

18. The device according to claim 15,
wherein at least one of said second transistors comprises a raised source and drain.

19. The device according to claim 15,
wherein said first level comprises at least one control circuit, and
wherein said at least one control circuit controls read operations of said memory array.

20. The device according to claim 15,
wherein at least one of said second transistors is a FinFET type transistor.

* * * * *